US012671232B2

(12) United States Patent
Krames et al.

(10) Patent No.: US 12,671,232 B2
(45) Date of Patent: Jun. 30, 2026

(54) SPONTANEOUS AND STIMULATED EMISSION DEVICES BASED ON RELAXED III-NITRIDE MATERIALS

(71) Applicant: OPNOVIX CORP., Palo Alto, CA (US)

(72) Inventors: Michael R. Krames, Palo Alto, CA (US); Jun Wang, Lausanne (CH); Nicolas Grandjean, Lausanne (CH); Yao Chen, Lausanne (CH); Jean-Francois Carlin, Lausanne (CH); Etienne Giraud, Lausanne (CH)

(73) Assignee: OPNOVIX CORP., Palo Alto, CA (US)

( * ) Notice: Subject to any disclaimer, the term of this patent is extended or adjusted under 35 U.S.C. 154(b) by 0 days.

(21) Appl. No.: 19/253,461

(22) Filed: Jun. 27, 2025

(65) Prior Publication Data

US 2026/0011983 A1 Jan. 8, 2026

Related U.S. Application Data

(60) Provisional application No. 63/665,945, filed on Jun. 28, 2024, provisional application No. 63/755,100, filed on Feb. 6, 2025.

(51) Int. Cl.

*H01S 5/343* (2006.01)
*C30B 29/40* (2006.01)
*H01S 5/02* (2006.01)
*H01S 5/183* (2006.01)
(Continued)

(52) U.S. Cl.

CPC ........ *H01S 5/34333* (2013.01); *C30B 29/406* (2013.01); *H01S 5/0211* (2013.01); *H01S 5/183* (2013.01); *H01S 5/18369* (2013.01); *H10H 20/825* (2025.01); *H10H 20/8508* (2025.01)

(58) Field of Classification Search

CPC ... H01S 5/34333; H01S 5/18369; H01S 5/183
See application file for complete search history.

(56) References Cited

U.S. PATENT DOCUMENTS 6,252,261 B1 6/2001 Usui et al.
6,255,198 B1 7/2001 Linthicum et al.
(Continued)

FOREIGN PATENT DOCUMENTS

CN 114930499 A1 8/2022
JP 2000/012976 A 1/2000
(Continued)

OTHER PUBLICATIONS

US 12,107,133 B2, 10/2024, Krames (withdrawn)
(Continued)

*Primary Examiner* — Xinning(Tom) Niu
(74) *Attorney, Agent, or Firm* — Sheppard Mullin Richter & Hampton LLP

(57) ABSTRACT

Spontaneous and stimulated emission devices such as edge emitting laser diodes and vertical cavity surface emitting lasers operating in the visible spectrum and in the infrared spectrum between 380 mm and 1600 nm, and to the application of the light-emitting devices are disclosed. The devices are based on relaxed InGaN to provide strain-balanced epitaxial layer stacks.

14 Claims, 49 Drawing Sheets

(51) Int. Cl.
*H10H 20/825* (2025.01)
*H10H 20/85* (2025.01)

(56) References Cited

U.S. PATENT DOCUMENTS

| | | | | |
|---|---|---|---|---|
| 6,455,340 | B1 * | 9/2002 | Chua | H10H 20/862 438/31 |
| 6,489,221 | B2 | 12/2002 | Gehrke | |
| 6,515,308 | B1 * | 2/2003 | Kneissl | H01S 5/18341 257/E33.044 |
| 7,351,347 | B2 | 4/2008 | Akita et al. | |
| 7,663,148 | B2 | 2/2010 | Yi et al. | |
| 7,670,933 | B1 | 3/2010 | Wang et al. | |
| 7,955,983 | B2 | 6/2011 | Imer et al. | |
| 8,729,559 | B2 | 5/2014 | Krames et al. | |
| 9,076,927 | B2 | 7/2015 | Keller et al. | |
| 9,318,326 | B2 | 4/2016 | Von Kanel et al. | |
| 10,847,625 | B1 | 11/2020 | Krames | |
| 2004/0113166 | A1 | 6/2004 | Tadatomo et al. | |
| 2007/0069225 | A1 | 3/2007 | Krames et al. | |
| 2009/0045394 | A1 | 2/2009 | Smeeton | |
| 2009/0278998 | A1 | 11/2009 | El-Ghoroury et al. | |
| 2011/0175126 | A1 | 7/2011 | Yang et al. | |
| 2012/0104360 | A1 | 5/2012 | Hardy et al. | |
| 2014/0126600 | A1 * | 5/2014 | Kawashima | H01S 5/3063 372/45.01 |
| 2014/0131730 | A1 * | 5/2014 | Keller | H10H 20/825 438/47 |
| 2015/0099348 | A1 | 4/2015 | Lee et al. | |
| 2015/0140710 | A1 * | 5/2015 | McLaurin | H01S 5/0087 438/33 |
| 2017/0110630 | A1 | 4/2017 | Kawakami et al. | |
| 2018/0277713 | A1 | 9/2018 | Ciechonski et al. | |
| 2020/0058489 | A1 | 2/2020 | Ohlsson | |
| 2020/0388723 | A1 | 12/2020 | Ahmed et al. | |
| 2021/0151567 | A1 | 5/2021 | Krames | |
| 2021/0193870 | A1 | 6/2021 | Pernel | |
| 2021/0193873 | A1 | 6/2021 | Pernel | |
| 2022/0246797 | A1 | 8/2022 | Bi | |
| 2022/0285505 | A1 | 9/2022 | Krames | |
| 2022/0393065 | A1 | 12/2022 | Dussaigne | |
| 2022/0399475 | A1 | 12/2022 | Khan | |
| 2023/0238478 | A1 | 7/2023 | David | |
| 2024/0030380 | A1 | 1/2024 | McLaurin | |
| 2024/0162338 | A1 | 5/2024 | Teo | |
| 2024/0258771 | A1 * | 8/2024 | Chan | H01L 21/7806 |
| 2024/0413191 | A1 | 12/2024 | Krames | |
| 2025/0004289 | A1 | 1/2025 | David | |

FOREIGN PATENT DOCUMENTS

| | | | |
|---|---|---|---|
| JP | 2014/090169 | A1 | 5/2014 |
| WO | 2012/075461 | A1 | 6/2012 |
| WO | 2013/121289 | A1 | 8/2013 |
| WO | 2017/137635 | A1 | 8/2017 |
| WO | 2017/168012 | A1 | 10/2017 |
| WO | 2019/068919 | A1 | 4/2019 |
| WO | 2021/102198 | A1 | 5/2021 |
| WO | 2021/195595 | A1 | 9/2021 |
| WO | 2022/060611 | A1 | 3/2022 |
| WO | 2023/064799 | A2 | 4/2023 |
| WO | 2024/020488 | A1 | 1/2024 |

OTHER PUBLICATIONS

Bi et al., Semiconductor template and fabrication method, 2019, foreign priority application EP 19163334.6, pp. 1-26.

Hestroffer et al., Compositionally graded InGaN layers grown on vicinal N-face GaN substrates by plasma-assisted molecular beam epitaxy, Journal of Crystal Growth, vol. 465, Feb. 24, 2017, 8 pages.

Okada et al., Structural and optical evaluation of InGaN/GaN multi-quantum wells on template consisting of in-plane alternatively arranged relaxed InGaN and GaN, Journal of Applied Physics, vol. 111, No. 4, Feb. 15, 2012, 6 pages.

Soh et al., Cool white III-nitride light emitting diodes based on phosphor-free indium-rich InGaN nanostructures, Applied Physics Letters, vol. 92, No. 26, Jul. 1, 2008, 4 pages.

Wurm et al., Demonstration of device-quality InGaN grown on porous GaN tiles by MBE with an in-plane lattice constant equivalent to fully relaxed In0.12Ga0.88N, 2022 Compound Semiconductor Week (CSW), IEEE, Jun. 1, 2022, 2 pages.

International Search Report and Written Opinion for International Application No. PCT/US2025/035780 mailed on Oct. 16, 2025, 33 pages.

International Search Report and Written Opinion for International Application No. PCT/US2025/035752, mailed on Oct. 29, 2025, 22 pages.

Notice of Allowance mailed on Jul. 17, 2024, for U.S. Appl. No. 18/401,290, 7 pages.

Bougrioua et al., Growth of freestanding GaN using pillar-epitaxial lateral overgrowth from GaN nanocolumns, Journal of Crystal Growth, 2007, 209, pp. 113-120.

Le et al., Controlled coalescence of AlGaN nanowire arrays: An architecture for nearly dislocation-free planar ultraviolet photonic device applications, Advanced Materials, 2016, DOI: 10.1002/adma.201602645, pp. 1-9.

Ema et al., "Influence of Intermediate Layers on Thick InGaN Growth Using Tri-Halide Vapor phase Epitaxy," Japanese Journal of Applied Physics, 2019, vol. 58, p. SC1027-1.

Even, In incorporation improvement in InGaN based active region using InGaN pseudo substrate for monolithic white LED application, Optics, Universite Grenoble Alpes, 2018, HAL Archives, 238 pages.

Even et al., Enhanced In incorporation in full InGaN heterostructure grown on relaxed InGaN pseudo-substrate, Applied Physics Letters, 2017, vol. 110, p. 262103, 6 pages.

Falub et al., Perfect crystals grown from imperfect interfaces, Scientific Reports, Jul. 2013, vol. 3, No. 2276, 6 pages.

Hestroffer et al., Relaxed c-plane InGaN layers for the growth of strain-reduced InGaN quantum wells, Semiconductor Scientific Technology, 2015, vol. 30, 105015, 10 pages.

Hiraski et al., Growth of thick and high crystalline quality InGaN layers on GaN (0001) substrate using tri-halide vapor phase epitaxy, *Journal of Crystal Growth*, 2016, 6 pages.

Hu et al., Growth of InGaN/GaN quantum wells with graded InGaN buffer for green-to-yellow light emitters, Japanese Journal of Applied Physics, 2016, vol. 55, 081001, 6 pages.

Hurni et al., Bulk GaN flip-chip violet light-emitting diodes with optimized efficiency for high-power operation, Applied Physics Letters, 2015, vol. 106, 031101, 4 pages.

Kishino et al., Monolithic Integration of InGaN-based nanocolumn light-emitting diodes with different emission colors, Applied Physics Express, 2013, vol. 6, 012101, 3 pages.

Ponce et al., Microstructure and electronic properties of InGaN alloys Physica Status Solidi, 2003, vol. 240, No. 2, p. 273-284, 12 pages.

Sanchez-Paramo et al., Structural and optical characteristics of intrinsic GaN nanocolumns, Physica E, 13, 2002, pp. 1070-1073, 4 pages.

Scaccabarozzi et al., Photoluminescence study of the strain relaxation of GaAs crystals grown on deeply patterned Si substrates, Journal of Crystal Growth, 2014, 4 pages.

Yin et al., Investigation on epitaxial lateral overgrowth of InGaN/GaN multi-quantum-well nanowires, Journal of Nanoscience and Nanotechnology, Feb. 2013, vol. 13, No. 2, pp. 1389-1391, 3 pages.

International Preliminary Report on Patentability for International Application No. PCT/US/2020/061377, issued on May 17, 2022, 10 pages.

International Search Report and Written Opinion for International Application No. PCT/US2020/061377, mailed on Feb. 22, 2021, 18 pages.

International Search Report and Written Opinion for International Application No. PCT/US2023/086561, mailed on Jun. 10, 2024, 23 pages.

Annex to Form PCT/ISA/206 Communication Relating to the Results of the Partial International Search for PCT/US2023/086561 mailed on Apr. 17, 2024, 17 pages.

(56) References Cited

OTHER PUBLICATIONS

Non-Final Office Action mailed on Mar. 9, 2020, for U.S. Appl. No. 16/689,064, 24 pages.
Final Office Action mailed on Jun. 19, 2020, for U.S. Appl. No. 16/689,064 mailed on Jun. 19, 2020, 15 pages.
Notice of Allowance mailed on Jul. 16, 2020, for U.S. Appl. No. 16/689,064, 9 pages.
Non-Final Office Action mailed on Mar. 28, 2025, for U.S. Appl. No. 17/746,431, 18 pages.
Final Office Action mailed on Nov. 18, 2024, for U.S. Appl. No. 17/746,431, 15 pages.
Non-Final Office Action mailed on Aug. 4, 2021, for U.S. Appl. No. 17/072,333, 8 pages.
Non-Final Office Action mailed on Nov. 4, 2024, for U.S. Appl. No. 18/812,553, 7 pages.

* cited by examiner

| | |
|---|---|
| pt0 | 9.3% |
| pt1 | 9.9% |
| pt2 | 9.6% |
| pt3 | 8.6% |
| pt4 | 8.6% |

| | $N_D$-$N_A$ or $N_A$-$N_D$ ($cm^{-3}$) |
|---|---|
| 8% InGaN: Si | 6e19 |
| 8% InGaN: Mg | 6e18 |

SPONTANEOUS AND STIMULATED EMISSION DEVICES BASED ON RELAXED III-NITRIDE MATERIALS

This application claims the benefit under 35 U.S.C. § 119(e) of U.S. Application No. 63/665,945 filed on Jun. 28, 2024, and U.S. Provisional Application No. 63/755,100 filed on Feb. 6, 2025, each of which is incorporated by reference in its entirety.

RELATED APPLICATIONS

This application is related to U.S. Pat. No. 10,847,625, U.S. Application Publication No. 2022/0285505 A1, PCT International Publication No. WO 2021/102198 A1, U.S. Pat. No. 12,107,113, U.S. Application Publication No. 2024/0413191 A1, and PCT Application Publication No. WO 2024/145658.

FIELD

The present disclosure relates to III-nitride semiconductor spontaneous and stimulated emission devices based on relaxed III-nitride materials, such as InGaN. In particular, the present disclosure relates to light-emitting devices such as light-emitting diodes (LEDs), edge-emitting laser diodes (EELDs), and vertical cavity surface emitting lasers (VCSELs) operating in the visible spectrum from 530 nm to 650 nm and in the infrared spectrum from 380 nm and 1600 nm, and to the application of light emitting devices.

BACKGROUND

Currently, III-nitride light-emitting diodes (LEDs) and laser diodes (LDs) are grown lattice-matched to (binary) gallium-nitride (GaN), for example grown on GaN on sapphire (for LEDs) or on free-standing (FS) GaN substrates (for LDs). This approach has achieved devices having relatively efficient UV-A (405 nm) and blue (450 nm) LED, LD, and VCSEL performance. However, it is challenging to achieve efficient true-green (532 nm to 545 nm) or longer wavelength devices using this approach. Longer wavelengths, such as 545 nm and 615 nm LDs and VCSELs for DCI-P3 green/red performance, have not been achieved.

It is desirable to develop efficient III-nitride LEDs and LDs at wavelengths from 532 nm to 632 nm, and even longer wavelengths.

SUMMARY

This light-emitting devices provided by the present disclosure exploit the advantages of Native InGaN® to provide strain-balanced epitaxial layer stacks that enable improved III-nitride LED and LD performance, especially at longer emission wavelengths greater than 450 nm. In particular, a base structure (e.g., epitaxial template or substrate) of (0001) Native InGaN® is provided, upon which an epitaxial LED or LD stack is deposited, including an underlying cladding layer(s), a waveguide layer(s), an overlying cladding layer(s), and an active layer(s) comprising, for example, one or more quantum wells, within the waveguide layer(s) and between the overlying and underlying, with respect the active layer, cladding layer(s). The Native InGaN® base structure has an in-plane ("a") lattice-parameter chosen such that the device epitaxial stack is in reasonable strain-balance, and not overly tensile (leading to cracking) or overly compressive (resulting in epitaxial layer breakdown). By careful choice of the lattice constant of the base structure, through adjusting alloy composition while allowing the alloy to arrange itself at or near its native (e.g., fully relaxed) lattice constant, a laser diode stack can be engineered for good carrier and optical confinement and to maintain good strain balance. Also, the accessibility of lattice constants larger than that of GaN allows the fabrication of layer stack designs with increased InN molar fractions without running into strain limits. This allows improved device designs compared to what is possible on GaN, leading to higher performance III-nitride laser diodes, including III-nitride laser diodes operating at wavelengths such as greater than 532 nm.

The improved device designs enabled by overall lower strain between the InGaN base structure and the epitaxial stack, compared to devices grown on a GaN base structure, provide improved carrier distribution across the active layer such as across multiple quantum wells and reduced potential barriers due to piezoelectric fields, leading to higher power-conversion efficiency laser diodes. The device designs provided by the present disclosure are uniquely possible due to the lattice engineering provided by the Native InGaN® technology and cannot be achieved when attempted for the crystal lattice spacing provided by GaN with an in-plane "a" lattice parameter of about 3.19 Å.

Also, the availability of lattice engineering means that different color LDs can be integrated together. For example, red (R), green (G), and blue (B) LD or VCSEL epitaxial stacks can be placed on the same substrate, with each colored epitaxial stack having (optionally) a different active region lattice parameter chosen to provide optimal performance at the respective target emission wavelengths. This provides the ability to provide RBG lasers in either a side-by-side or in a stacked configuration that are precisely located on a common substrate, providing for controlled multi-color and/or white emission for applications such as, for example, near-eye ("wearable") displays, head-up displays, projection displays, and general lighting applications.

The LD stacks and other devices provided by the present disclosure are suitable for edge-emission devices such as, for example, edge-emitting laser diodes (EELDs) and for vertical emission devices including vertical-cavity surface-emitting lasers (VCSELs). In particular, the present disclosure teaches improved blue, green and red emitting VCSELs, embodiments for RGB VCSELs within the same wafer, and multi-color emitting VCSELs to achieve RGB emission within the same pixel. Aspects provided by the present disclosure are also suitable for use in LEDs including resonant-cavity (RC) LEDs and photonic crystal (PX) LEDs.

According to the present disclosure, an edge-emitting laser diode comprises: a relaxed InGaN buffer layer, wherein the relaxed InGaN buffer layer has a thickness less than 100 nm: an n-type cladding layer, an n-side InGaN waveguide layer: an InGaN active layer (lattice matched to the relaxed InGaN buffer layer) overlying the n-side InGaN waveguide layer; and a p-side InGaN waveguide layer overlying the InGaN active layer. Overlying the p-side InGaN waveguide layer is a cladding layer which may be p-type InGaN or GaN or a non-III-nitride material such as indium-tin-oxide (ITO). As an alternative to InGaN, In-containing quaternaries (i.e., AlGaInN) or InAlN may be used for the various device layers. In some embodiments, AlGaN or AlN layers may be used.

According to the present invention, a VCSEL comprises: an relaxed InGaN buffer layer, wherein the relaxed InGaN buffer layer has a thickness less than 100 nm: a DBR overlying the undoped relaxed InGaN layer; one or more n-InGaN layers overlying the undoped InGaN layer: a InGaN active layer overlying the one or more n-InGaN layers overlying the undoped InGaN layers; and one or more p-InGaN layers overlying the InGaN active layer.

According to the present disclosure, an integrated multi-wavelength VCSEL comprises a front DBR: a first relaxed n-InGaN layer overlying the front DBR: a first InGaN active layer overlying the first n-InGaN layer: a second relaxed InGaN layer overlying the first InGaN active layer: a second InGaN active layer overlying the second relaxed InGaN layer: a third relaxed n-InGaN layer overlying the second InGaN active layer; and a third InGaN active layer overlying the third relaxed InGaN layer; wherein each of the first InGaN active layer, the second InGaN active layer, and the third InGaN active layer are configured to emit radiation within a different wavelength range. The multi-wavelength VCSEL comprises other layers as required for functionality, such a n- and p-doped layers, and tunnel-junction layer stacks. Also, a backside DBR is provided, which can be a dielectric DBR. The first, second, and third active layers may share operation with the same front DBR, or may be associated with separate DBRs included for each stack. As an alternative to InGaN, In-containing quaternaries (i.e., AlGaInN) or InAlN may be used for the various device layers. In some embodiments, AlGaN or AlN layers may be used. In some embodiments, the front DBR is epitaxially deposited, while it others it is a dielectric deposition after epitaxial liftoff. In some embodiments, the first relaxed InGaN layer may be replaced by GaN, which is acceptable when the first InGaN active layer is designed for blue or shorter-wavelength emission, for example.

According to the present disclosure, an integrated multi-wavelength VCSEL comprises a first DBR, a first relaxed n-InGaN layer overlying the DBR: a first InGaN active layer overlying the first relaxed n-InGaN layer, wherein the first InGaN active layer is configured to emit radiation within a first wavelength range: a second DBR, a second relaxed InGaN layer overlying a portion of the second DBR, a second InGaN active layer overlying a portion of the second InGaN active layer, wherein the second InGaN active layer is configured to emit radiation within a second wavelength range: a third DBR: a third relaxed InGaN layer overlying the third DBR; and a third InGaN active layer overlying the third relaxed InGaN layer, wherein the third InGaN active layer is configured to emit radiation within a third wavelength range. In some embodiments, the first relaxed InGaN layer may be replaced by GaN, which is acceptable when the first InGaN active layer is designed for blue or shorter-wavelength emission, for example.

According to the present invention, an integrated multi-wavelength LED\ comprises a first InGaN active layer configured to emit within a first wavelength range: a second InGaN active layer configured to emit within a second wavelength range overlying the first InGaN active layer; and a third InGaN active layer configured to emit within a third wavelength range overlying the second InGaN layer. According to the present invention, an EELD as substantially shown in FIG. 1.

According to the present invention, a VCSEL as substantially shown in FIG. 5.

According to the present invention, an integrated multi-wavelength VCSEL as substantially shown in FIG. 9.

According to the present invention, an integrated multi-wavelength VCSEL as substantially shown in FIG. 11.

According to the present invention, an integrated multi-wavelength LED as substantially shown in FIG. 12.

According to the present invention, an optoelectronic device comprises an EELD, VCSEL, or LED according to the present invention. The LED may be a resonant-cavity (RC) or photonic-crystal (PX) LED.

According to the present invention, an optical system comprises an EELD, VCSEL or LED according to the present invention, wherein the optical system comprises a laser projector, a laser television, a cinema projector, a head-up display, an augmented reality and/or virtual reality wearable, an augmented reality and/or virtual reality display, high-speed interconnects, a sensing system, a light detection and ranging apparatus (LiDAR) system, a communication system, a medical device, machining equipment, and additive manufacturing equipment.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

Figure 1:
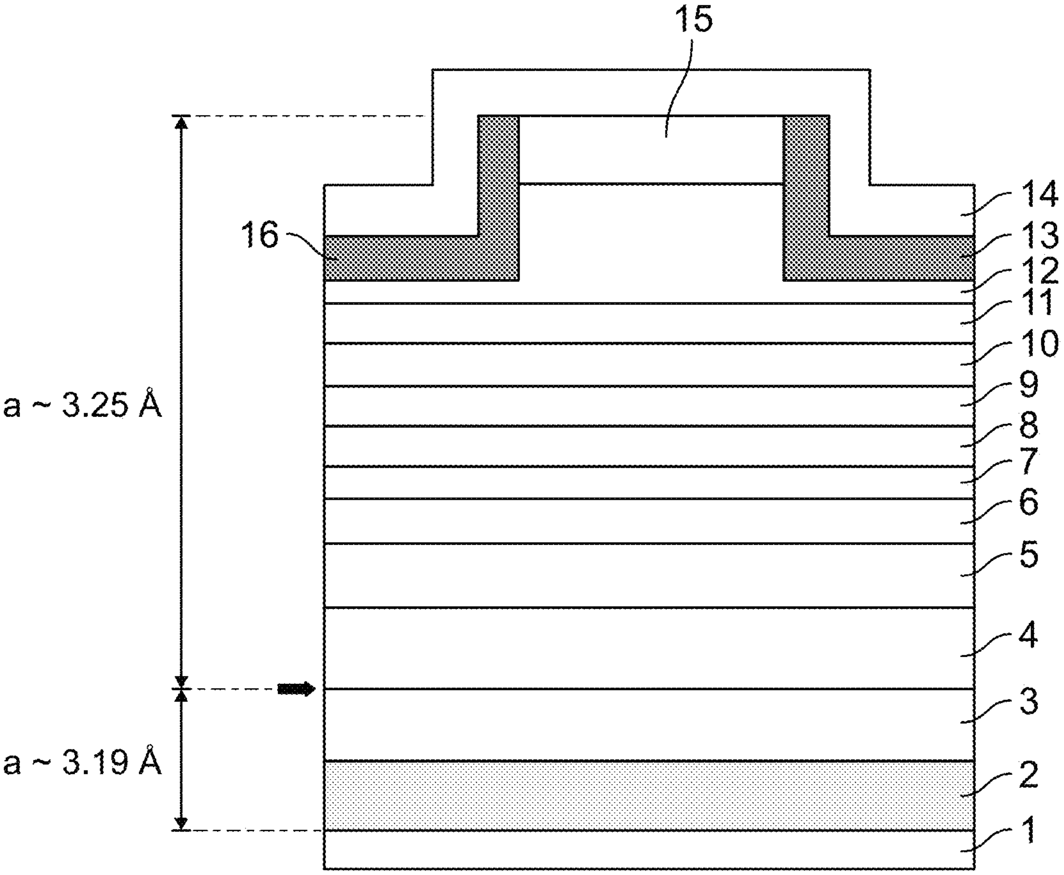
FIG. 1 shows a cross-sectional schematic of an example of a laser diode structure provided by the present disclosure.

A bounded numerical range includes the endpoints of the range as well as any subranges within the disclosed range. For example, a range of from 1 μm to 5 μm, includes, for example, 1 μm, 3 μm, 5 μm, from 1 μm to 3 μm, from 4 μm to 5 μm.

An unbounded numerical range without an upper bound, for example, greater than 1 μm includes the endpoint of 1 μm and extending to a reasonable upper bound consistent with the context of the invention and as would be understood by one skilled in the art. An unbounded numerical range without a lower bound such as, for example, less than 1 μm, includes the endpoint of 1 μm and extends to a lower bound consistent with the context of the disclosure and as would be understood by one skilled in the art.

"Substantially uniform lattice parameter" refers to a semiconductor layer characterized by a local lattice parameter of the semiconductor layer that varies by less than 1% with respect to an average lattice parameter such as, for example, less than 0.5% with respect to an average lattice parameter, or less than 0.1% with respect to an average lattice parameter over an distance of at least 100 mm, at least 1 mm, at least 10 μm, at least 1 μm, at least 100 nm, or at least 10 nm.

Coherent refers to the condition in which the material maintains crystallographic alignment with the underlying substrate, whether lattice-matched or elastically strained Relaxed refers to the property that the in-plane lattice parameter of the material is approximately that of a free-standing, coherent, 100% relaxed version of the material having the same elemental composition. Substantially relaxed refers to a material in which the in-plane lattice parameter of the material is within +0.5% of that of a free-standing, coherent, 100% relaxed version of the material having the same elemental composition. Uniformly refers to the property of having a weakly varying or substantially non-varying in-plane lattice parameter within the wide area, upon which optical and/or electronic device structures can be fabricated.

Relaxed refers to the property that the in-plane a-lattice parameter of the material is approximately that of a free-standing 100% relaxed version of the material having the same crystal structure and elemental composition. Substantially relaxed refers to a material in which the in-plane a-lattice parameter of the material is within +0.5% of that of a free-standing 100% relaxed version of the material having the same elemental composition. Uniformly refers to the property of having a weakly varying or substantially non-varying in-plane a-lattice parameter within the wide area, upon which optical and/or electronic device structures can be fabricated.

"Defect density" refers to the density, in plan-view, of extended defects, such as dislocations, at the termination of a semiconductor layer. The defect density can be determined using, for example, etching and counting the etch pit density (EPD), cathodoluminescence and observing and counting dark spots, atomic force microscopy (AFM) to observe and count small pits, or transmission electron microscopy (TEM) and counting dislocations.

A lattice parameter can be determined using X-ray diffraction (XRD) and reciprocal space map (RSM) analysis. High-angle or near grazing incidence XRD techniques can be used to determine the lattice parameter of upper layers in a structure in which the lattice parameter may vary as a function of depth.

"III-V material" refers to a compound semiconductor material comprising at least one column-III element and at least one column-V element from the Periodic Table. A III-V nitride material includes $In_xAl_yGa_{1-x-y}N$ such as GaN, AlN, InN or InGaN, or (In)(Al)GaN such as GaN, InGaN, AlGaN, InAlN, or InAlGaN.

"III-nitride material" includes GaN, AlN, InGaN, AlGaN, InAlN, and InAlGaN.

"In-containing III-nitride material" includes InGaN, InAlN, and InAlGaN.

"Growth plane" refers to a plane parallel to the deposition plane of material onto a planar surface, such as that of a conventional substrate growth surface.

"Substantially perpendicular to the growth plane" refers to a surface that forms an angle with respect to the growth plane that is approximately 90 degrees such as from 88 degrees to 92 degrees with respect to the growth plane.

Wurtzite GaN, or GaN, is characterized by a Wurtzite crystal structure having bulk room-temperature a- and c-lattice parameters of approximately 3.189 Å, and 5.185 Å, respectively. The crystal plane normal to the c-lattice parameter direction ("c-direction") is the c-plane, which has a Ga-face (0001) and a N-face (000−1). The planes that contain the c-direction and are perpendicular to the a-lattice parameter direction ("a-direction") are the {11−20} planes or "a-planes". The planes that contain the c-direction and are parallel to the a-lattice parameter direction are the {1−100} planes or "m-planes".

A Wurtzite In-containing III-nitride refers to materials such as $In_xAl_yGa_{1-x-y}N$ and $In_xGa_{1-x}N$, where $x>0$ and $0\leq y\leq 1$.

Wurtzite $In_xAl_yGa_{1-x-y}N$ and $In_xGa_{1-x}N$ have the same crystal structure as Wurtzite GaN, but includes a non-zero mole fraction of InN, x, to form a ternary compound where a specified fraction of column-III atoms are In and the remainder are substantially Ga. InN has bulk room-temperature a- and c-lattice parameters of 3.545 Å, and 5.703 Å, respectively, and $In_xGa_{1-x}N$ has room-temperature a- and c-lattice parameters of between that of GaN and InN, and according to the mole fraction, x.

Wurtzite $In_{x1}Al_{y1}Ga_{1-x1-y1}N$ or InAlGaN, has the same crystal structure as Wurtzite GaN, but includes a non-zero mole fraction of InN, x, and/or AlN, y, to form a ternary or quaternary compound wherein a specified fraction of column-III atoms are In and/or Al and the remainder are substantially Ga. AlN has room-temperature a- and c-lattice parameters of approximately 3.112 Å and 4.982 Å, respectively, and $Al_yGa_{1-y}N$ has bulk room-temperature a- and c-lattice parameters between that of GaN and AlN, and according to the mole fraction, y.

Although the present description focuses on growing (0001) InGaN on a GaN surface, the method is applicable to other Wurtzite materials, such as $In_xAl_yGa_{1-x-y}N$ on AlN or GaN, AlGaN on AlN or GaN, and AlGaN on AlN or GaN. Also, the surface itself may be $In_xAl_yGa_{1-x-y}N$. When the surface comprises InGaN, the mole fraction of InN in the overlying InGaN layer can be different than the mole fraction of InN in the InGaN seed surface. For example, the mole fraction of InN in the overlying InGaN layer can be greater than the mole fraction of InN in the InGaN seed surface. Furthermore, the invention is applicable to non-basal-plane Wurtzite structures, such as so-called non- and semi-polar GaN and related materials.

"Relaxed InGaN" refers to InGaN material that exhibits an in-plane a-lattice parameter that is equal to, or nearly equal to, that of the bulk, fully relaxed InGaN material. For example, Wurtzite relaxed $In_xAl_yGa_{1-x-y}N$ with y=0 and x>0 has a room-temperature in-plane a-lattice parameter greater than 3.189 Å (0% InN) and up to 3.545 Å (100% InN). This contrasts with a strained InGaN material, such as InGaN which is grown pseudomorphic to GaN and thus exhibits an in-plane a-lattice parameter equal to, or nearly equal to, that of GaN, of about 3.189 Å (for bulk GaN) or about 3.186 Å (for GaN on sapphire), regardless of the InN mole fraction of the overlying InGaN material.

As used herein, a "relaxed" III-nitride layer such as a relaxed In-containing III-nitride layer refers to a layer with an in-plane lattice constant substantially close to that of the corresponding free-standing, bulk material of the same composition, i.e., the native lattice constant in the absence of external constraint. In practice, even a relaxed buffer layer may experience some residual strain, particularly in cases when thermal expansion mismatch during cooldown induces wafer bowing or tensile/compressive stress. However, the term "relaxed" as used herein is intended to cover these cases as well, i.e., when the in-plane lattice constant may slightly differ from that of the corresponding free-standing, bulk material of the same composition accordingly. Epitaxial layers grown overlying such a relaxed layer are typically lattice-matched to that relaxed buffer and thus adopt and share its in-plane lattice constant. These overlying layers are not necessarily relaxed in their own right but are grown pseudomorphically on the relaxed template and thus often strained. Accordingly, when referring to a "relaxed epitaxial stack." it should be understood that not all layers in the stack are relaxed: rather, the stack is lattice-matched to a relaxed buffer layer that defines the in-plane lattice constant for subsequent growth.

"Pseudomorphic" refers to a layer grown on a base layer or substrate such that the layer is epitaxially aligned to the base layer, even if the native (relaxed) lattice constant of the grown layer is different than that of the base layer or substrate. Pseudomorphic layers are thus substantially fully strained. For Wurtzite crystalline material characterized by c- and a-lattice parameters, a pseudomorphic layer will adjust to match the base layer or substrate, in which case the ratio of c/a for the pseudomorphic layer will be different than that of c/a for the base layer or substrate, depending on the growth direction. For growth in the (0001) direction under compressive strain the ratio of c/a for the pseudomorphic layer will be greater than that of the base layer or substrate, while for tensile strain the ratio of c/a for the pseudomorphic layer will be less than that of the base layer or substrate. For growth in the non-polar directions, e.g., <10−10> or <11−20> directions, under compressive strain the ratio of c/a for the pseudomorphic layer will be less than that of the base layer or substrate, while for tensile strain the ratio of c/a for the pseudomorphic layer will be greater than that of the base layer or substrate. For semipolar growth directions, the strain will depend on whether the growth direction is within 45 degrees of the direction, i.e., more vertical, or more than 45 degrees away from the [0001], i.e., more lateral. For example, for growth in the semi-polar <10−11> directions, under compressive strain the ratio of c/a for the pseudomorphic layer will be less than that of the base layer or substrate, while for tensile strain the ratio of c/a for the pseudomorphic layer will be greater than that of the base layer or substrate.

"In-plane a-lattice parameter" refers to the crystal lattice spacing within the growth plane. For a Wurtzite (0001) material such as InGaN, the in-plane lattice parameter is the a-lattice parameter.

"Lateral growth" refers to growth in a direction other than normal to the growth plane, including parallel to the growth plane.

"Overlying" such as an "overlying layer" refers to a layer such as an epitaxial layer that is situated above an underlying layer. An overlying layer can be contacting or adjoining the underlying layer. An overlying layer such as an overlying InGaN layer can have a homogeneous composition or can have an inhomogeneous composition parallel and/or perpendicular to the growth plane. There can be one or more distinct epitaxial layers between an overlying layer and an underlying layer.

"Layer" such as a p-type $In_xAl_y$ $Ga_{1-x-y}N$ layer or active layer refers to a layer comprising a single layer or comprising one or more sublayers such as, for example, from 1 sublayer to 100 sublayers. Each of the sublayers comprising a layer can have the same elemental composition. At least one of the sublayers can have a different elemental composition than another sublayer. For example, a p-type $In_xAl_yGa_{1-x-y}N$ layer can comprise $In_xAl_yGa_{1-x-y}N$ sublayers having different concentrations of a p-type dopant. Each of the sublayers forming a layer can independently be deposited under the same or different deposition conditions and can independently comprise the same or different elemental composition, especially when the deposited layer local composition depends on the local lattice constant, which may vary across the growth surface. A layer need not be continuous, and may be deposited simultaneously in separate regions, such as in selective-area growth.

"$In_xAl_yGa_{1-x-y}N$" refers to an alloy of gallium and nitrogen, aluminum and nitrogen, and optionally indium and/or aluminum. For example, $In_xAl_yGa_{1-x-y}N$ includes GaN, AlN, $In_xGa_{1-x}N$, $Al_yGa_{1-y}N$, $In_xAl_yN$, and $In_xAl_yGa_{1-x-y}N$ where both x and y may not be 0.

"Simultaneously depositing" or "simultaneously growing" refers to depositing or growing an epitaxial layer over different regions of a growth substrate at the same time in the same reactor and under the same growth conditions such as substrate temperature, gas temperature, reactants, flow rates, and pressures.

"Sequentially depositing" "sequentially growing" refers to depositing or growing an epitaxial layer over different regions of a growth substrate at different times and under the same or different reactor growth conditions such substrate temperature, gas temperature, reactants, flow rates, and pressures.

Although the disclosure is focused on the growth of InGaN, it is to be understood that the structures, devices and methods encompass InAlGaN alloys such as $In_xAl_y$ $Ga_{1-x-y}N$, where x+y is not 0 and y>0. In an alloy $In_xAl_y$ $Ga_{1-x-y}N$, x can be 0 or y can be 0. In an alloy $In_xAl_y$ $Ga_{1-x-y}N$, $0 \le y < 1$, and $x+y \le 1$. In an alloy $In_xAl_yGa_{1-x-y}N$, $0 \le x \le 0.4$, $0 \le y \le 0.4$, and $x+y \le 0.4$. For example, in an alloy $In_xAl_yGa_{1-x-y}N$, x+y can range from 0.01 to 0.4, such as from 0.05 to 0.4, from 0.1 to 0.4, or from 0.2 to 0.4.

Although the disclosure is focused the growth of InGaN overlying a substrate layer(s), a buffer layer(s), a patterned or non-patterned (In) GaN seed regions, or a slip region, and the formation of a relaxed InGaN region, the invention encompasses growth of $In_{x2}Al_{y2}Ga_{1-x2-y2}N$ overlying patterned or non-patterned $In_{x1}Al_{y1}Ga_{1-x1-y1}N$ seed regions or growth of $In_{x2}Al_{y2}Ga_{1-x2-y2}N$ on a slip region, and the formation of a relaxed $In_{x2}Al_{y2}Ga_{1-x2-y2}N$ region, where 0≤x1<1, 0≤y1<1, x1+y1≤1 and is characterized by a Wurtzite III-nitride crystal structure, and where 0≤x2<1, 0≤y2<1, x2+y2≤1 and x2>x1 and is characterized by a Wurtzite III-nitride crystal structure. For example, a seed region can comprise GaN, AlN, InGaN, AlGaN, or InAlGaN, and an overlying growth region can comprise InGaN, AlGaN, InAlN, or InAlGaN and the relaxed (0001) region can comprise InGaN, AlGaN, InAlN, or InAlGaN, respectively. A "mole fraction" in semiconductor alloys such as In(x)Al(y)Ga(1-x-y)N is defined as the ratio of the number of moles of a specific binary nitride component to the total number of moles of all binary nitride components in the mixture. For the quaternary alloy In(x)Al(y)Ga(1-x-y)N: x is the mole fraction of indium nitride (InN); y is the mole fraction of aluminum nitride (AlN); and 1-x-y is the mole fraction of gallium nitride (GaN). These mole fractions indicate the relative proportions of InN, AlN, and GaN in the alloy, and they must sum to 1, e.g., x+y+ (1-x-y)=1. This ensures that the total composition of the alloy is fully accounted for by the three binary nitrides. As an example, for the alloy In(x)Al(y)Ga(1-x-y)N where: x=0.3 (indium nitride, InN), y=0.2 (aluminum nitride, AlN), and 1-x-y=0.5 (gallium nitride, GaN): the alloy is composed of 30% InN, 20% AlN, and 50% GaN by mole. Or stated differently, the alloy has an InN mole fraction of 30%, an AlN mole fraction of 20%, and a GaN mole fraction of 50%. Furthermore, a layer can be intentionally doped or unintentionally doped, such as p-doped or n-doped.

An "interface" refers to both a surface of a semiconductor layer and a termination of a semiconductor layer. A surface of a semiconductor layer refers to an interface that is exposed to the ambient environment and does not adjoin another layer such as another semiconductor layer. A termination of a semiconductor layer refers to an interface that adjoins another layer such as another semiconductor layer.

An "interface region" refers to a region of a semiconductor layer that includes an interface between two adjoining semiconductor layers and a portion of the semiconductor layers extending for example, less than 1 nm, less than 2 nm, less than 5 nm, or less than 10 nm from the termination of the adjoining semiconductor layers.

"Bulk relaxed layer" layer refers to an In-containing III-nitride layer that is substantially relaxed and has a thickness greater than 100 nm.

"Engineered substrate incorporating a III-nitride layer" refers to a composite substrate comprising a base wafer (e.g., silicon, SOI, or sapphire), an optional compliance or buffer layer (e.g., oxide, oxynitride, or ceramic), and a III-nitride template layer such as GaN or AlN.

Substrates include QST® substrates, GaN-on-Si, AlN-on-Si, GaN-on-SOI, and other bonded or layered stacks designed to enable epitaxial growth of III-nitride materials on large-diameter wafers.

"Substantially pit-free" refers to a surface morphology having a pit density less than $1\times10^{7}$ $cm^{-2}$, and/or average pit diameter less than 10 nm, as determined by atomic force microscopy (AFM), scanning electron microscopy (SEM), or cathodoluminescence imaging. For comparison, bulk InGaN layers grown under conventional nitrogen-rich MOCVD conditions on GaN/sapphire templates exhibit pit densities greater than $1\times10^{8}$ $cm^{-2}$ and average pit diameters exceeding 50 nm, while bulk InGaN layers grown under conventional nitrogen-rich MOCVD conditions on free-standing (FS) GaN substrates might have pit densities less than $1\times10^{8}$ $cm^{-2}$ but still exhibit average pit diameters exceeding 50 nm.

Template" refers to one or more layers such as GaN formed on a separate substrate such as a SI, QST or sapphire substrate and the term "engineered substrate" can encompass both. A "template" also encompasses partial layers or regions such as slip regions formed on a layer. A template can includes patterned and non-patterned structures.

A "slip layer" is also referred to as a "slip region".

As used herein, a "slip layer" refers to a material layer or layer portion referred to as a region, which can be crystalline, amorphous, or nanostructured, inserted or disposed between a substrate or base layer and an epitaxial layer, to promote strain relaxation, dislocation generation, bending and/or glide, during or after growth. Suitable slip layer or region materials include, but are not limited to, low-temperature GaN, AlN, InGaN, AlGaN, $SiN_x$, ZnO, TiN, porous GaN, oxide interlayers (e.g., $SiO_2$, $Al_2O_3$), and two-dimensional materials such as graphene or hBN.

Reference is now made in detail to certain embodiments of materials, semiconductor structures, optoelectronic devices, and methods. The disclosed embodiments are not intended to be limiting of the claims. To the contrary, the claims are intended to cover all alternatives, modifications, and equivalents.

Recently, high-quality relaxed InGaN (Native InGaN®) materials have been disclosed, for example, in PCT International Publication Nos. WO 2021/102198 A1 and WO 2024/145658 A1, each of which is incorporated by reference. The availability of high-quality relaxed InGaN as base structures for epitaxial devices provides a breakthrough in design possibilities which is otherwise not possible due to strain limitations imposed when the associated epitaxial layers are locked to the lattice constant of GaN. Not only does strain relief increase the available thickness and InN mole fractions accessible for high quality epitaxial films, but strain relief also allows for increased InN mole fraction in the active region stack, reducing, for example, the differential InN mole fraction between the waveguide and quantum well layers. This allows for improved charge-carrier distribution and lower potential barriers at heterointerfaces compared to conventional structures grown on a GaN substrate. These advantages result in superior optoelectronic device characteristics, such as LEDs having a lower carrier density and thus lower Auger-Meitner recombination, a well-known performance limitation for GaN-based LEDs (sometimes referred to as "droop"), more balanced quantum well utilization especially for longer wavelength devices such as devices emitting at wavelengths greater than 450 nm, and lower forward voltages. With proper design, as detailed in the present disclosure, the advantages combine to achieve very efficient spontaneous- and stimulated-emission devices across the entire visible spectrum, and beyond, for the III-nitride material system.

It is desirable that a III-nitride material have a thickness greater than 100 nm to serve as a growth template for semiconductor epitaxial layers for use in practical devices.

Based on experimental work it was observed that the quality of (0001) $In_xGa_{1-x}N$ grown lattice-matched to GaN deteriorates at layer thicknesses greater than 500 nm for a x=5% film (i.e., 5% InN mole fraction). This suggests a force limit of Exext<382×(3.2068−3.189)/3.2068×500≈1,060 GPa-nm, where "E" is the relevant Young's modulus (c11, about 382 for GaN), "e" is the strain $(a_{InGaN}-a_{GaN})/a_{InGaN}$, and "t" is the film thickness. It is desirable that (0001) InGaN epitaxial layers remain below the Eet force limit, for example, less than 1,000 GPa-nm, throughout the epitaxial stack. Also, it is desirable that the force balance, i.e, the sum of all forces throughout the epitaxial stack, be near neutral, that is, targeting zero but practically within 0±200 GPa-nm, such as within 0±100 GPa-nm.

Based on simulations, it was determined that the refractive index step between a waveguide and cladding layers for an InGaN-based edge-emitting laser diode should be greater than 0.03, such as greater than 0.04, or greater than 0.05.

Based on simulations, it was also determined that the difference in InN mole fraction between the waveguide layers and quantum well layers of an active layer should be less than 10% and preferably less than 7% or less. At higher InN mole fraction differences, the carrier distribution across the quantum wells becomes non-uniform and leads to sub-optimal performance.

Based on these guiding principles a red-emitting laser diode was designed for output near a dominant wavelength of 615 nm, and with maximum luminosity while maintaining the DCI-P3 color gamut standard for red. A free-standing (FS) GaN substrate was used, followed by an epitaxial GaN buffer layer grown as known in the prior art. Then, the in-plane crystal lattice was dilated by forming a relaxed InGaN layer by any one of the methods described, for example, in PCT International Publication Nos. WO 2021/102198 A1, WO 2024/145658 A1, and U.S. Provisional Application No. 63/665,945, each of which is incorporated by reference in its entirety. The remaining stack (based on III-nitride materials) was formed sharing the a-lattice parameter of the relaxed in-plane InGaN layer. That is, up until and through the GaN buffer layer, the in-plane a-lattice parameter is that of GaN, i.e, about 3.19 Å. Above that, the in-plane a-lattice parameter increases, in this example to that of the relaxed InGaN lattice constant for 16% InN, i.e. about 3.25 Å. An example of the composition of the epitaxial stack for a 615 nm laser diode is shown in Table 1.

TABLE 1

[1] Composition of red-emitting laser diode stack.

| Layer Description | Material | InN Mole Fraction | Dopant | Thickness (nm) | a-Lattice parameter (Å) |
|---|---|---|---|---|---|
| p-clad | InGaN | 15% | Mg | 500 | 3.25 |
| EBL | GaN | — | Mg | 10 | 3.25 |
| p-graded | InGaN grade | 28% ≥ 15% | Mg | 50 | 3.25 |
| p-WG | InGaN | 28% | — | 140 | 3.25 |
| QW | InGaN | 35% | — | 5 | 3.25 |
| QB | InGaN | 25% | — | 5 | 3.25 |
| QW | InGaN | 35% | — | 5 | 3.25 |
| n-WG | InGaN | 28% | — | 140 | 3.25 |
| n-graded | InGaN grade | 15% ≥ 28% | Si | 50 | 3.25 |
| n-clad | InGaN | 15% | Si | 1,000 | 3.25 |
| InGaN buffer | InGaN | 16% | Si | 2,000 | 3.25 |
| GaN buffer | GaN | — | Si | 0-5,000 | 3.19 |
| Substrate | FS GaN | — | Si | (thick) | 3.19 |

[1] Clad = cladding layer; EBL = electron blocking layer; graded = graded layer; WG = waveguide layer; QW = quantum well; QB = barrier; p = p doped; n = n doped.

The linearly graded layers between the waveguide and the cladding layers are optional but help to reduce the piezoelectric polarization fields at the interfaces, which improves the mobility of carriers and reduces excess voltage. The graded, waveguide, QW, and QB layers can be un-intentionally doped (UID), n-type, or p-type. While the thicknesses and compositions in Table 1 were used for the simulation, it is understood that in experimental implementation these thicknesses and compositions may undergo engineering adjustments to optimize performance, while remaining within the scope of the present disclosure.

A cross-sectional schematic of the epitaxial stack described in Table 1 is shown in FIG. 1. The epitaxial stack shown in FIG. 1 can include n-electrode 1, (0001) n-GaN FS substrate 2, a 0 μm to 5 μm-thick n-GaN layer 3, a relaxed 2 μm-thick n-InGaN buffer layer 4 having a 16% InN mole fraction, 1 μm thick n-InGaN layer 5 having a 15% InN mole fraction, a 50 nm-thick graded InGaN layer 6 having a 15% to 28% InN mole fraction, a 140 nm-thick InGaN layer 7 having a 28% InN mole fraction, a multiple quantum well structure 8 including a 5 nm-thick layer having a 28% InN mole fraction and a 5 nm-thick layer having a 28% InN mole fraction, a 140 nm-thick InGaN layer 9 having a 28% InN mole fraction, a 50 nm-thick graded InGaN layer 10 having an InN mole fraction from 28% to 15%, a 10-nm thick p-GaN layer 11, a 450 nm-thick p-InGaN layer 12 having a 15% InN mole fraction, a 50 nm-thick p+-InGaN layer 15 having a 15% InN mole fraction, $SiO_2$ regions 13/16, and p-electrode 14.

By careful choice of the thicknesses and compositions of the epitaxial layers, good optical confinement is achieved for layers remaining within the allowed force limits as well as a good overall force balance. The selection of the lattice parameter is important for producing an epitaxial stack within the targeted force limits. A too small lattice parameter leads to excessively high compressive stress, which can result in material breakdown. A too large lattice parameter leads to excessively high tensile stress, and cracking, as shown in FIG. 2.

Figure 2:
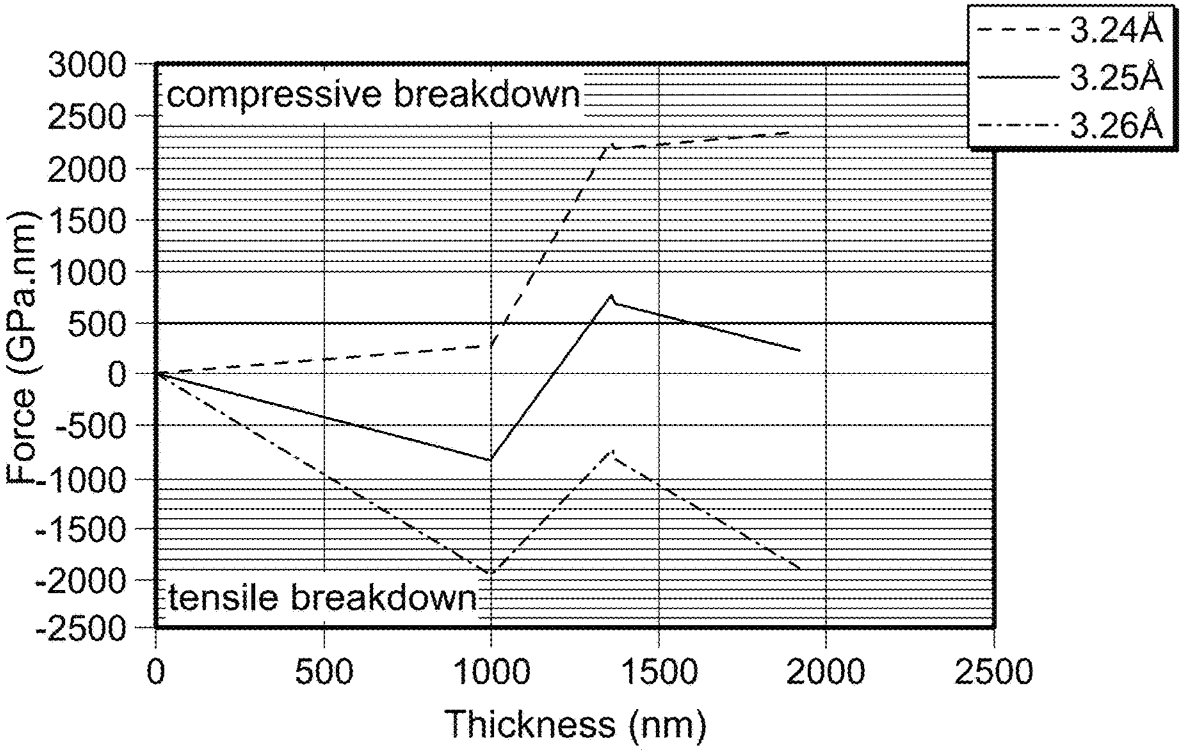
FIG. 2 shows a simulation of the intra-layer forces of InGaN layers having different in-plane a-lattice parameters lattice matched to GaN as a function of the thickness of the InGaN layer.

FIG. 2 shows the inter-layer force in GPa-nm of the epitaxial stack of Table 1 grown on base layers having three different lattice parameters: 3.24 Å, 3.25 Å, and 3.26 Å. At forces greater than +1,000 GPa-nm the stack is subject to compressive breakdown, and at forces less than-1,000 GPa-nm the stack is subject to tensile breakdown. For the semiconductor structure shown in Table 1, the choice of a=3.25 Å keeps the stack within the preferred range of force balance, while base layers at 3.24 Å and 3.26 Å lead to compressive, or tensile breakdown, respectively. Thus, the practicality of the epitaxial stack design depends on the in-plane a lattice parameter of the base layer on which the epitaxial stack is grown. Without such lattice engineering (e.g., being locked to the lattice parameter for GaN), such a structure as shown in Table 1 is not possible to achieve with high quality. This highlights the power of lattice engineering through Native InGaN® technology and the impact that methods and devices provided by the present disclosure will have on the development new III-nitride optoelectronic devices with improved performance throughout the visible spectrum and beyond.

As is clear from this analysis, it is not possible to grow the epitaxial stack shown in FIG. 1 lattice-matched to GaN, which is the main reason that persons skilled in the art have not been able to achieve red laser diodes based on GaN. However, with a suitable choice of the in-plane a lattice parameter, the epitaxial stack shown in FIG. 1 can be fabricated and III-nitride red laser diodes are possible using the teachings provided by the present disclosure. Moreover, this approach can be used to fabricate green laser diodes with improved performance, and also achieve lasing at wavelengths from green to red, and higher. In principle the methods can be used to develop III-nitride laser diodes operating in the near-infrared wavelength regime. Finally, the methods and structures provided by the present disclosure can be exploited to reduce the built-in fields within the active layers of III-nitride LEDs and LDs, and thereby can reduce and more uniformly spread carrier density, leading to reduced Auger-Meitner recombination and thus higher power conversion efficiency at high current densities, i.e., reduced LED "droop". This advantage can be realized in relatively short wavelength devices such as, for example, blue-emitting to green-emitting LEDs and LDs, using the methods and structures provided by the present disclosure.

For some emitter designs, it is beneficial to increase the thickness and/or reduce the InN mole fraction of the p-cladding layer to improve optical confinement. Alternatively, or in combination, a transparent conducting oxide (TCO) layer such as an indium-tin-oxide (ITO) layer can be used as the p-side Ohmic contact, which can improve optical confinement and allow the use of a thinner p-cladding layer.

The LD structure shown in FIG. 1 was derived from a simulation using the SiLENSe® software package (Crosslight Software Inc.). The SiLENSe® software package features a simultaneous Schrödinger and Poisson solver, enabling detailed modeling of carrier distribution, quantum well energy levels, and self-consistent electrostatic potential within the device structure, for analyzing optical mode confinement and charge transport in advanced semiconductor lasers.

Figure 3:
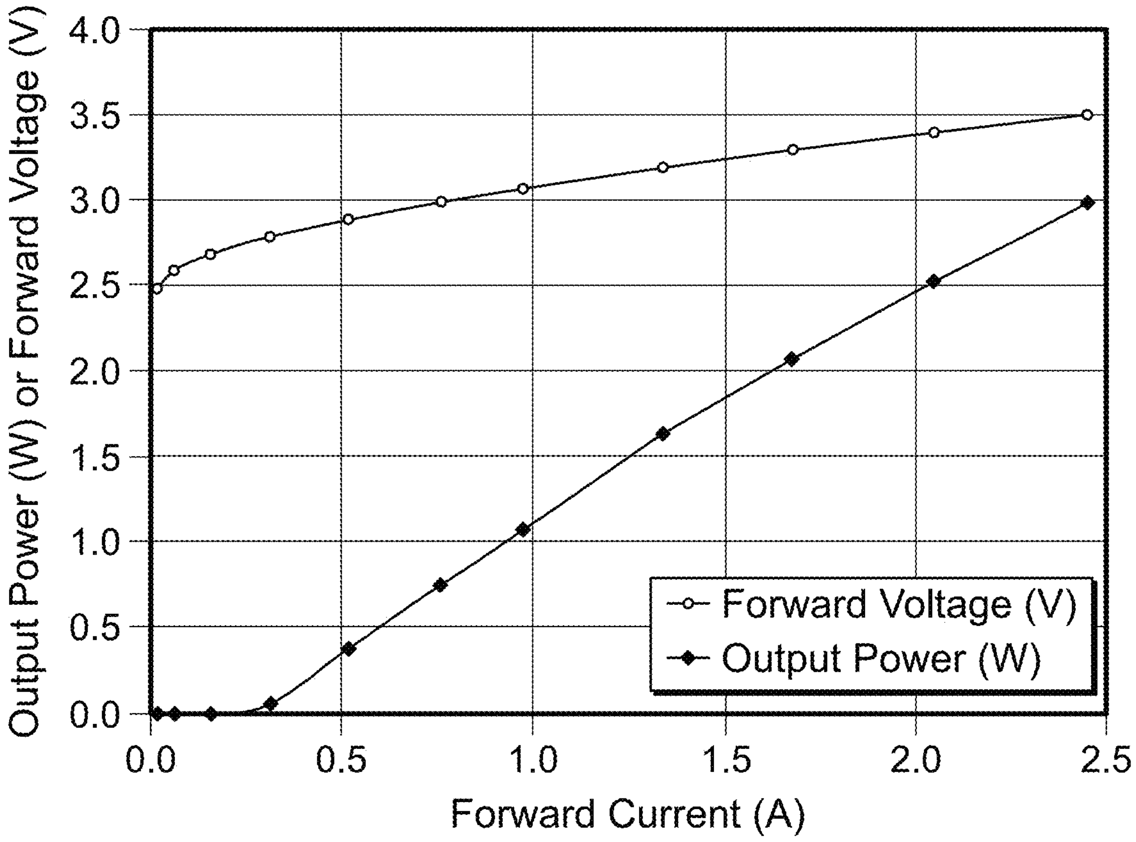
FIG. 3 shows a simulation of the output power and forward voltage of the LD structure of FIG. 1.

For modeling the EELD structure shown in FIG. 1, the ridge width was 20 μm and the cavity length was 1 mm. The back and front facet coating reflectivities were 98%, and 10%, respectively. The lasing wavelength was 613 nm. The simulated forward voltage and output power for the device as a function of forward current is shown in FIG. 3.

is built on a free-standing GaN (FS-GaN) substrate and a GaN buffer layer followed by a relaxed InGaN buffer layer, as for the EELD epitaxial stack shown in FIG. 1. Then, an epitaxial distributed Bragg reflector (DBR) stack is provided overlying the relaxed InGaN layer. For lattice matching to the target in-plane a-lattice parameter such as 3.25 Å for 16% InGaN, the following DBR layer compositions can be used to provide a reasonable refractive index contrast: y=0.32 $In_y Al_{1-y}N$ and x=0.16 $In_xGa_{1-x}N$. For a higher refractive index contrast and staying within the force limits described herein the following DBR layer compositions can be used: y=0.24 $In_yAl_{1-y}N$ and x=0.30 $In_xGa_{1-x}N$. Alternatively, the DBR may be grown on GaN (e.g., y~0.18 $In_yAl_{1-y}N$ and GaN), and the lattice shift (from that of GaN, for example, to 3.25 Å for 16% InGaN) can occur above the DBR. Above the epitaxial DBR are the other layers of the VCSEL structure, including n-type layers, cavity (analogous to waveguide) layers, optical confinement layers (on either side of the active layer), and p-type layers. The active layers can be tuned to adjust the overall cavity thickness for resonance. The p-type electrode comprises an ITO layer. A back dielectric DBR stack such as a $SiO_2/TiO_2$ stack overlies the ITO layer. This DBR is the "back mirror" and can be designed for greater than 99.9% reflectivity. An anti-reflection (AR) coating may be deposited on the bottom side (emitting side) of the substrate.

Figure 5:
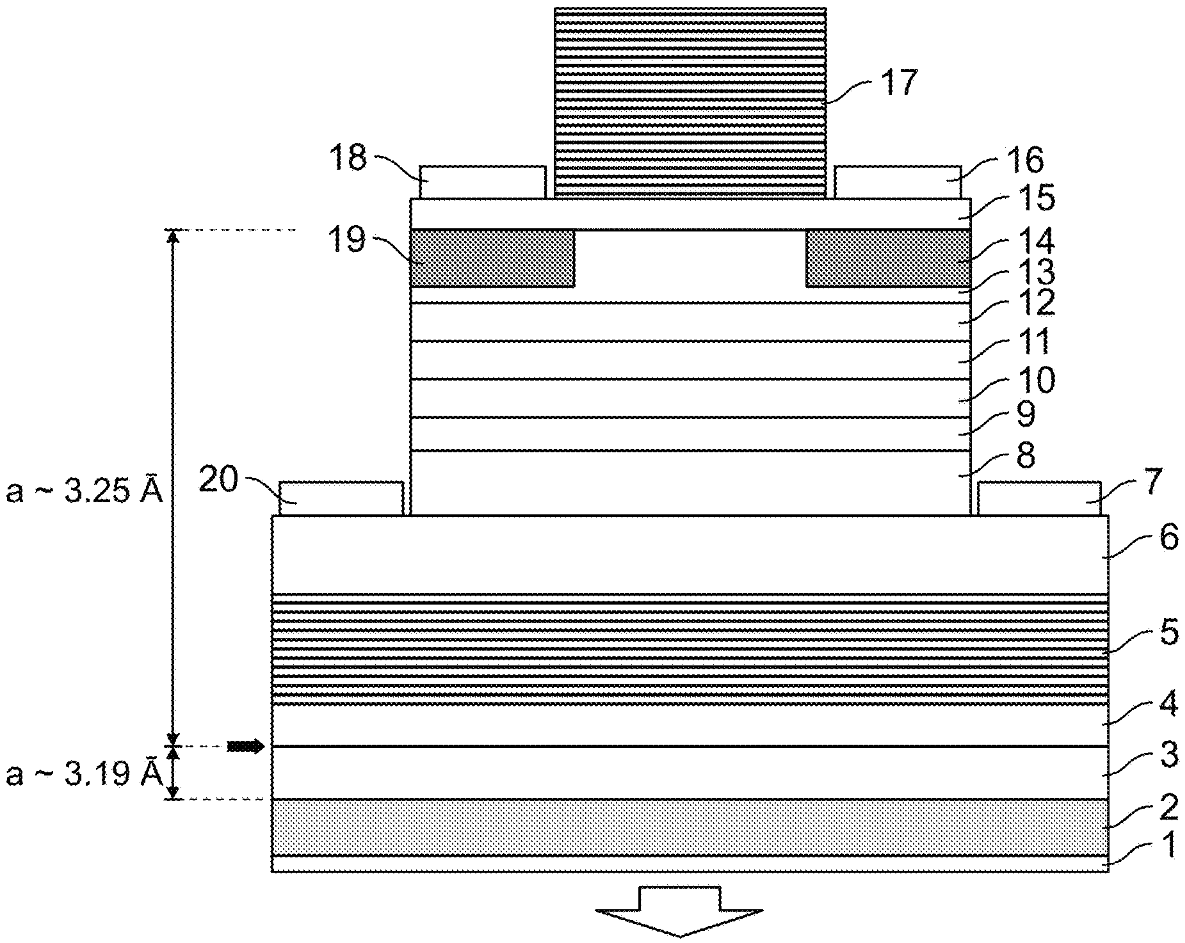
FIG. 5 shows a cross-sectional schematic of an example of a VCSEL structure provided by the present disclosure.

The layers of the VCSEL stack shown in FIG. 5 are summarized in Table 2.

TABLE 2

[1] Composition of red-emitting VCSEL stack.

| Element (FIG. 5) | Layer Description | Material | InN Mole Fraction | Dopant | Thickness (nm) | a-Lattice parameter (Å) |
|---|---|---|---|---|---|---|
| 17 | DBR | InAlN/InGaN | — | — | — | — |
| 15 | Contact | ITO | — | — | — | 3.25 |
| 13 | p-doped | InGaN | 15% | Mg | 450 | 3.25 |
| 12 | EBL | GaN | 0% | Mg | 10 | 3.25 |
| 11 | p-Confinement | InGaN | 28% | — | 150 | 3.25 |
| 10 | MQW (well) | InGaN | 35% | — | 2 | 3.25 |
| 10 | MQW (barrier) | InGaN | 28% | — | 7 | 3.25 |
| 9 | n-Confinement | InGaN | 28% | — | 200 | 3.25 |
| 8 | n-doped | InGaN | 15% | Si | 1,200 | 3.25 |
| 6 | n-doped | InGaN | 16% | Si | 2,000 | 3.25 |
| 5 | DBR | InAlN/InGaN | — | — | — | — |
| 4 | InGaN buffer | InGaN | 16% | Si | 2,000 | 3.25 |
| 3 | GaN buffer | GaN | — | Si | 0-5,000 | 3.19 |
| 2 | Substrate | FS GaN | — | Si | (thick) | 3.19 |

[1] Confinement = confinement layer; EBL = electron blocking layer; graded = graded layer; WG = waveguide layer; MQW = multi-quantum well; DBR = distributed Bragg reflector.

Figure 4:
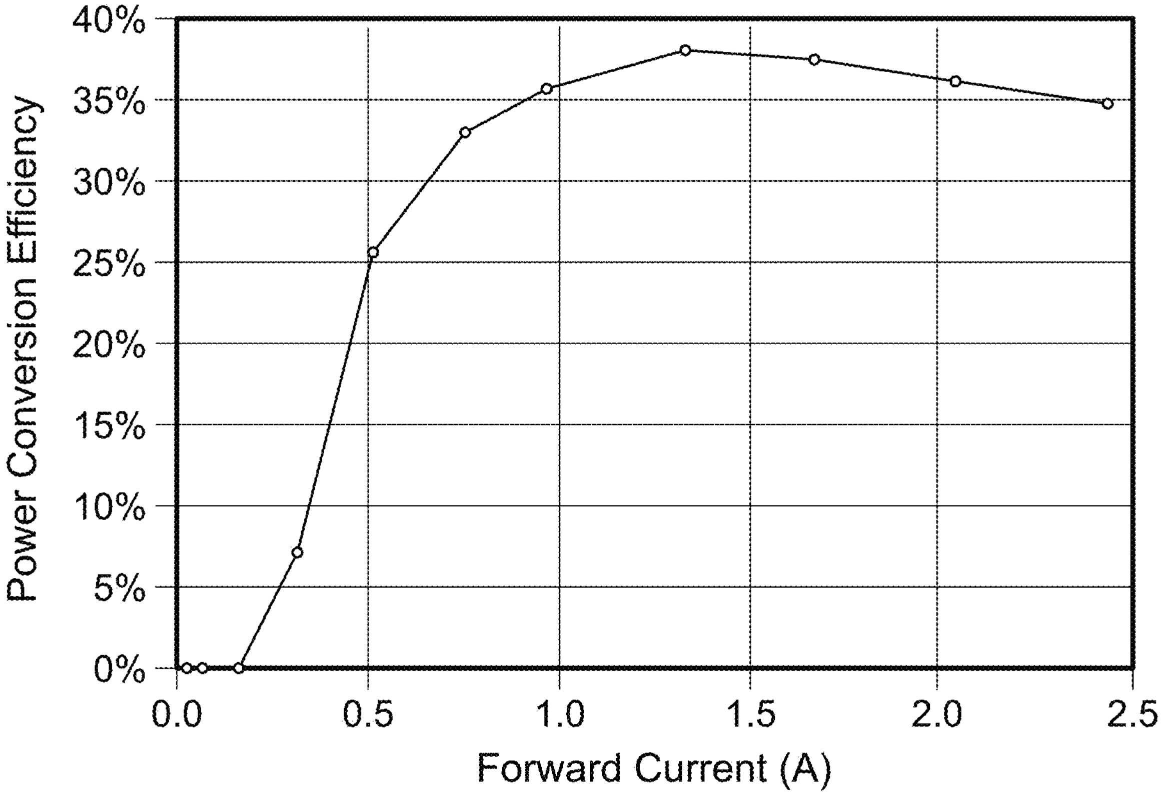
FIG. 4 shows a simulation of the power conversion efficiency of the LD structure of FIG. 1.

The simulated power conversion efficiency vs. forward current for the LD structure shown in FIG. 1 is shown in FIG. 4.

As shown in FIG. 4, this red edge-emitting laser diode has excellent power conversion efficiency (above 35%) and high output power (2.5 W at 2.5 Å) and therefore exhibits performance suitable for visible-spectrum applications in systems such as laser projection, laser TV, cinema projection, head-up displays (HUDs) and augmented/visual reality (AR/VR) wearables, and biomedical applications.

While the following description focuses on VCSELs, multi-color EELD's (either stacked, or side-by-side) are possible extending the following teachings and are within the scope of the present disclosure.

An example of a red-emitting VCSEL structure based on the present disclosure is shown in FIG. 5. The epitaxial stack In addition to the elements identified in Table 2, FIG. 5 also shows anti-reflection coating 1, n-electrodes 7/20, $SiO_2$ regions 14/10, and p-electrodes 16/18.

The MQW may comprise multiple wells (e.g., 2 to 5) although single quantum well (SQW) designs are in principle also possible. The thicknesses and compositions in Table 2 are examples, and it is understood that in experimental implementation these thicknesses and compositions may undergo engineering adjustments to optimize performance, while remaining within the scope of the present disclosure. Also, the layer thicknesses and compositions can be modified to achieve devices with different emission wavelengths.

The reflectivity of the epitaxial "front" DBR can be tuned to achieve a maximum laser output and power conversion efficiency and is preferably in the range from 95% to 99.5%.

Figure 6:
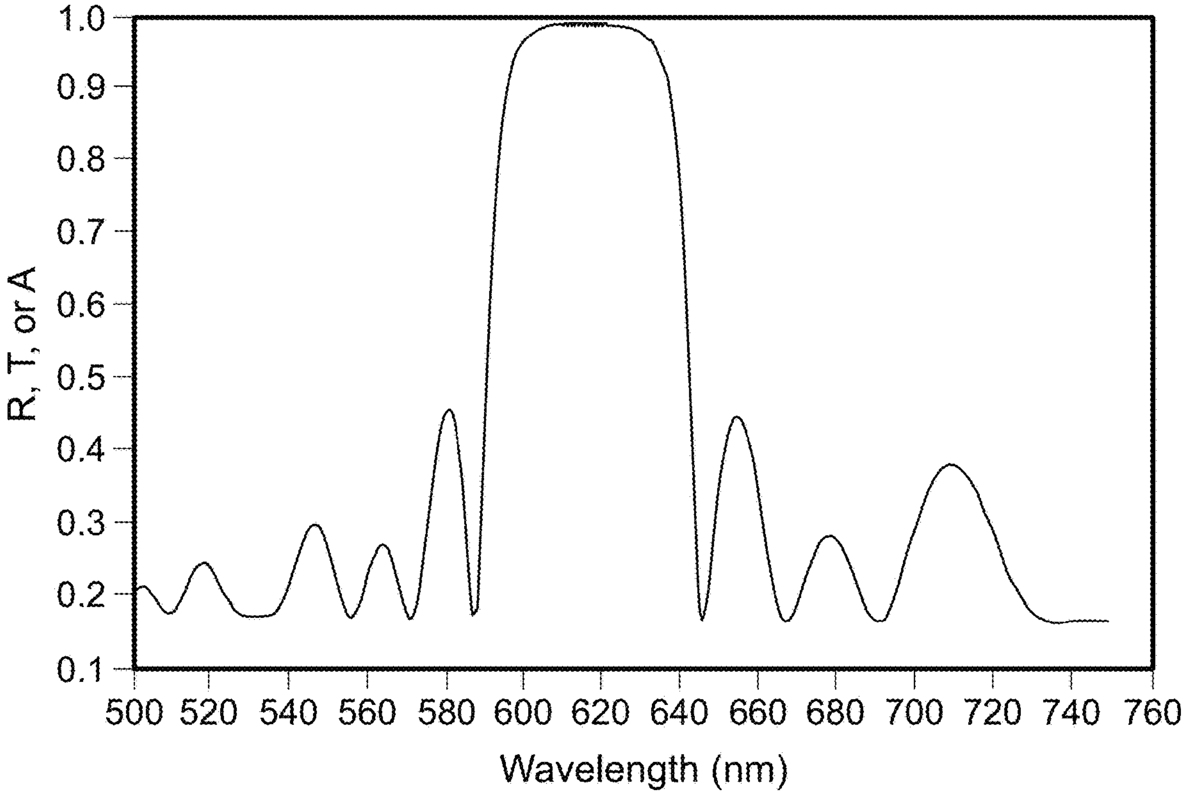
FIG. 6 shows a simulated reflectivity of an example of a DBR structure.

As an example, as shown in FIG. 6, a 30-pair layer stack of y=0.16 $In_y Al_{1-y}N$ and x=0.30 $In_xGa_{1-x}N$ (average lattice spacing of about 3.24 Å), with median thicknesses of 73 nm and 65 nm, respectively, exhibits slightly greater than 99% reflectivity at 615 nm. Slight variations of the median thicknesses of the individual layers can allow other solutions to meet the target reflectivity, and the reflectivity can be adjusted higher or lower by changing the number of layer pairs to optimize the laser outcoupling efficiency and power output. Also, the stack can be adjusted to accommodate different lattice constants, for managing the force balance required for emitters of different emission wavelengths.

The dielectric "back-side" DBR is formed using known methods such as deposition via evaporation and/or sputtering and can include the use of materials such as $SiO_2$ for the low-refractive-index layer, and materials such as $TiO_2$ or $Ta_2O_5$ for the high-refractive-index layers. Use of other dielectric materials is possible. Reflectivities higher than 99.99% can be achieved at wavelengths in the visible and infrared spectrum as known in the art.

In an example of a VCSEL device provided by the present disclosure, the lattice relaxation can be engineered to occur above the epitaxial DBR, but beneath the active layer. The present teaching can be applied to VCSELs with improved performance at other wavelengths such as from blue to green to red, and beyond.

A relaxed In-containing III-nitride layer provided by the present disclosure can underly a DBR and/or can overly a DBR. For example, a DBR can be grown on a relaxed In-containing III-nitride layer. For example, an In-containing III-nitride layer can be grown on the uppermost epitaxial layer of a DBR. A template such as a patterned or non-patterned layer including for example, a relaxation structures such as pyramidal relaxation structures or a slip region can be grown on the uppermost DBR epitaxial layer and can serve as a relaxation template for the overlying relaxed In-containing III-nitride layer.

For example, referring to the VCSEL shown in FIG. 5, layer 4 can be a relaxed In-containing III-nitride layer and layer 6 and DBR 5 can be an InGaN layer lattice-matched to the relaxed In-containing III-nitride layer. As another example, layer 4 can be a relaxed In-containing III-nitride layer, DBR 5 can be lattice matched to relaxed In-containing III-nitride layer 4, and layer 6 can comprise a second relaxed In-containing III-nitride layer having the same or different In content than the first relaxed In-containing III-nitride layer. In another example, layer 4 can be absent or be a III-nitride or In-containing III-nitride layer, and layer 6 can be a relaxed In-containing III-nitride layer.

A DBR provided by the present disclosure can be grown using metal-rich MOCVD growth conditions. The use of metal-rich MOCVD conditions with high growth rates can dramatically reduce the time needed to fabricate an epitaxial DBR.

Methods provided by the present disclosure can enable single-wafer, multi-color VCSELs, as well as other optoelectronic devices, leveraging the Native InGaN® technology.

For example, a multi-wavelength VCSEL device can utilize a shared-wafer design. In a shared-wafer design multiple cavities can be grown in a single stack. For example, three cavities for each of blue, green, and red emission. Other wavelengths can be selected. Then, the wafer can be patterned so that the individual cavities can be contacted and independently operated. Current confinement can be managed, for example, using oxide collars formed by the lateral oxidation of InAlN layers but can also be achieved using standard dielectrics. This design enables compact, high-efficiency VCSELs with apertures as small as on the order of a micron, making the multi-wavelength device suitable for advanced applications such as augmented reality/virtual reality (AR/VR) displays, optical communications, and multi-spectral imaging.

Each cavity can have an independent "front DBR" grown beneath the active layer, for achieving the optimum reflectivity for power conversion efficiency, typically from 95% to 99% reflectivity at the lasing wavelength. Alternatively, a single broadband DBR may be employed below the first active layer. This design allows each cavity to utilize the same "front DBR", simplifying the design of the epitaxial stack. Similarly, the "back DBR" can be a dielectric DBR deposited above each active region, and which can be a single, broadband DBR, or can be three different DBR's chosen for optimum reflectivity at the wavelength of the particular active layer of interest.

The epitaxial structure can be grown, for example, on a silicon substrate with a thickness of approximately 500 μm, although other thicknesses and other substrates such as GaN, sapphire, or SiC can be used, including engineered substrates such as SOI or QST substrates. Large-area substrates from 150 mm, 200 mm, 300 mm and beyond are possible to be used. A silicon substrate or Si-based engineered substrate (e.g., SOI, QST) provides a cost-effective and scalable foundation and is compatible with CMOS backplane integration and is scalable for large-volume production. A silicon substrate can be pre-coated with a nucleation layer such as a sputtered AlN layer or a nucleation layer can be provided during the device epitaxial growth. Coalescence and buffer layers comprising GaN can be deposited on the nucleation layer(s). The bottom DBR mirrors can comprise, for example, InAlN/GaN stacks, which are strain balanced and designed for high refractive index contrast. Designs for optimum reflectivities at specific wavelengths using these materials and latticed matched to GaN, are known in the prior art.

The active layers may be composed of three independent multi-quantum-well (MQW) epitaxial stacks designed for red, green, and blue emission, respectively. The blue MQW stack can be grown first, followed by the green stack, and then the red stack. Each MQW stack can consist of InGaN quantum wells with the indium content tailored for the respective target wavelength. The "front DBRs" for the green and red active layers are grown beneath each active layer, respectively. Interconnection and current spreading for the device can be provided by tunnel junctions (TJ) positioned between the blue and green active layers, and between the green and red active layers. The TJs can be grown before or after the DBRs associated with each of the green and red active layers are grown.

The n+ side of the TJ layers, either as part of the TJ or proximal to the TJ layer, can include In-bearing lattice-relaxation layers such as InGaN layers, to facilitate optimum engineering of the green and red MQWs. For example, above the blue MQW, a relaxed InGaN layer may be incorporated to shift the in-plane a-lattice parameter as appropriate for a green MQW, such as about 3.22 Å or more. Similarly, overlying the green MQW, a relaxed InGaN layer can be incorporated to shift the in-plane a-lattice parameter to a suitable value for a red MQW such as about 3.25 Å or more. The lattice engineering ensures that the green and red MQWs can achieve optimum performance, while compositions of the surrounding layers are designed to be transparent at the wavelengths of interest.

After epitaxial growth, mesas can be defined using ICP/RIE etching, exposing the sidewalls of each active layer, while also providing contact pads for each active layer. A series of etches with different mask designs can be used. The etching process can produce inclined sidewalls, and can be patterned to provide red, green, and blue VCSEL apertures of an appropriate dimension depending on the application. For example, the different colors can be arranged in patterns suitable for display applications.

Layers above each MQW region can comprise conventional p-layers, which can be contacted via an intracavity transparent conductive oxide (TCO) layer such as indium tin oxide (ITO). This design allows for efficient current injection into the red MQW and contributes to the overall performance of the device. The p-layers, exposed both on top and along the sidewalls, are easily fabricated using standard Mg-activation anneals.

The finished multi-wavelength VCSEL structure, including the current confinement structures and tailored DBR mirrors, can support multimode and single mode lasing at red, green, and blue wavelengths. Apertures can be designed to achieve a consistent beam divergence across all colors. This design ensures uniform radiation patterns and high color purity, making the multi-wavelength VCSEL suitable for demanding optical applications.

Figure 11:
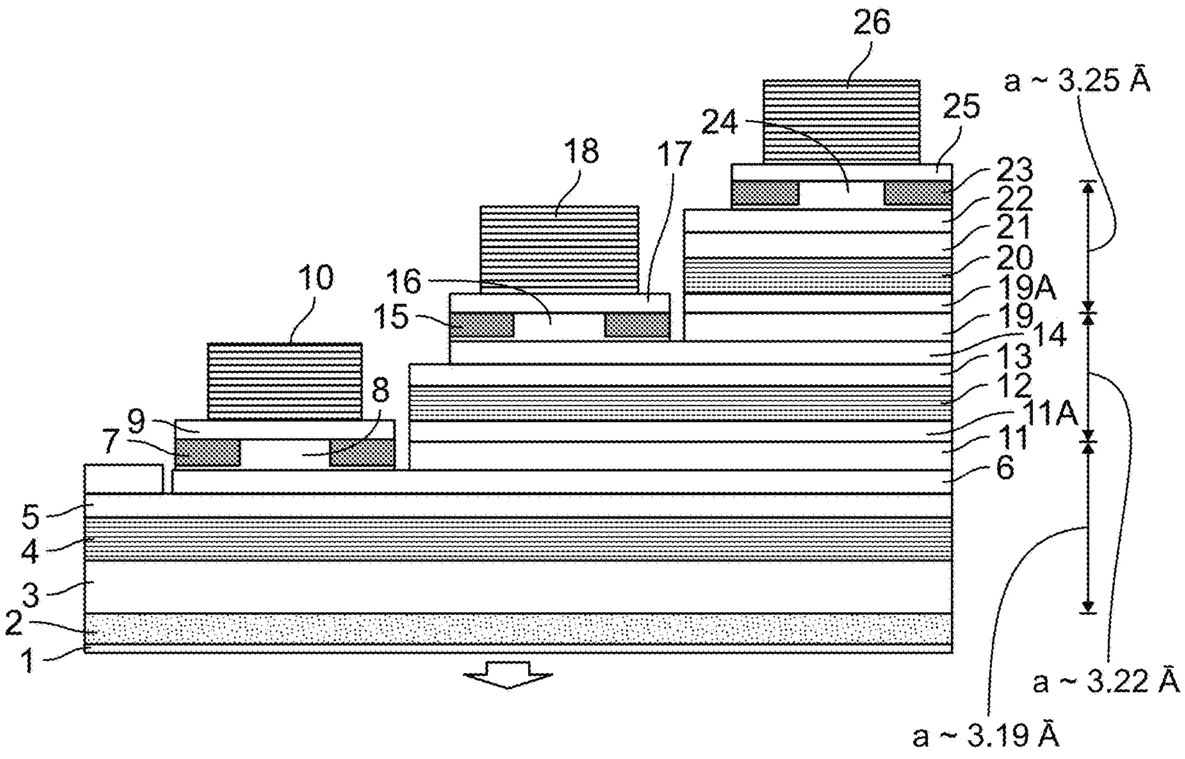
FIG. 11 shows a cross-sectional schematic of an example of a lateral multi-wavelength VCSEL structure provided by the present disclosure.

A cross-sectional schematic view of an embodiment of a portion of a single-wafer multi-wavelength VCSEL is shown in FIG. 11. Each RGB region of the single-wafer multi-wavelength VCSEL is designed as a four-terminal structure, with independent electrical connections to the blue, green, and red MQW regions. To minimize reflective losses, the blue front DBR is designed for minimal reflectivity at the selected green and red wavelengths, while the green front DBR is designed for minimal reflectivity at the selected red wavelength. Appropriate engineering choices ensure that the lasing modes are confined to the active MQW region in operation with minimized overlap with any absorbing structures. This approach can achieve high efficiency and low optical losses in multi-wavelength operation, ensuring efficient lasing while minimizing power consumption and residual absorption.

The multi-color multi-pixel VCSEL shown in FIG. 11 includes a blue-emitting VCSEL (layers 4-10), a green-emitting VCSEL (layers 11-18), and a red-emitting VCSEL (layers 19-26). The blue-emitting VCSEL comprises InAlN/(In) GaN DBR 4, relaxed n-InGaN layer 5, InGaN active layer 6, $SiO_2$ dielectric collar 7 surrounding p-GaN layer 8, transparent conductive oxide layer 9 and back DBR 10. The green-emitting VCSEL comprises p-GaN layer 11, tunnel junction 11A, InAlN/(In) GaN DBR 12, relaxed n-InGaN layer 13, InGaN active layer 14, $SiO_2$ dielectric collar 15 surrounding p-InGaN layer 16, transparent conductive oxide layer 17 and back DBR 18. The red-emitting VCSEL comprises p-InGaN layer 19, tunnel junction 19A InAlN/(In) GaN DBR 20, relaxed n-InGaN layer 21, InGaN active layer 22. $SiO_2$ dielectric collar 23 surrounding p-InGaN layer 24, transparent conductive oxide layer 25 and back DBR 26. The blue and green VCSELs are separated by tunnel junction 11, and the green and red LEDs are separated by tunnel junction 19. The VCSELs overlie GaN buffer layer 3, substrate 2, and anti-reflection coating 1.

The methods provided by the present disclosure can enable single-pixel, multi-color VCSELs leveraging the Native InGaN® technology as well as other optoelectronic devices.

For example, a multi-wavelength VCSEL can utilize a shared-cavity design that incorporates engineered current confinement through oxide collars formed by the lateral oxidation of InAlN layers. The device can support emission at red, green, and blue wavelengths, with each active region configured for independent operation. Other wavelengths can be selected. This design enables compact, high-efficiency VCSELs with apertures as small as on the order of 1 micron, making the device suitable for advanced applications such as AR/VR displays, optical communications, and multi-spectral imaging.

The epitaxial structure can be grown, for example, on a silicon substrate with a thickness of approximately 500 μm, although other substrates such as GaN, sapphire, SiC or engineered substrates can be used. A silicon substrate or Si-based engineered substrate provides a cost-effective and scalable foundation and is compatible with CMOS backplane integration and is scalable for large-volume production. A silicon substrate can be pre-coated with a nucleation layer such as sputtered AlN or a nucleation layer can be provided during the device epitaxial growth. Coalescence and buffer layers comprising GaN can be deposited on the nucleation layer(s). The multi-color VCSEL can include a bottom epitaxial DBR mirror, multiple active regions, oxidation layers for current confinement, and a shared dielectric DBR mirror deposited on the top ("back") of the structure. The bottom DBR mirror can comprise an InAlN/GaN or InAlN/InGaN stack, which is strain balanced and designed for high refractive index contrast, for example, consisting of approximately 60-layer pairs, with each layer having a thickness from 50 nm to 80 nm. A $In_{0.18}Al_{0.82}N$/GaN stack can be designed to independently provide a reflectivity of approximately 98.5% or higher at each of three target wavelengths such as, for example, 463 nm (blue), 545 nm (green), and 615 nm (red). These target wavelengths achieve the DCI-P3 color gamut standard and ensure precise color representation of video content with high luminous efficacy. The detailed dimensions of an InAlN/GaN DBR stack and resulting reflectivity is shown in Table 3.

TABLE 3

Example of dimensions of an InAlN/GaN DBR stack.

| Layer No. | Thickness (nm) | Material |
|---|---|---|
| 1 | 49.7 | $In_{0.18}AlN$ |
| 2 | 45.6 | GaN |
| 3 | 55.4 | $In_{0.18}AlN$ |
| 4 | 49.2 | GaN |
| 5 | 56.5 | $In_{0.18}AlN$ |
| 6 | 48.2 | GaN |
| 7 | 161.0 | $In_{0.18}AlN$ |
| 8 | 48.7 | GaN |
| 9 | 57.0 | $In_{0.18}AlN$ |
| 10 | 49.8 | GaN |
| 11 | 55.6 | $In_{0.18}AlN$ |
| 12 | 45.5 | GaN |
| 13 | 49.9 | $In_{0.18}AlN$ |
| 14 | 44.5 | GaN |
| 15 | 52.9 | $In_{0.18}AlN$ |
| 16 | 47.6 | GaN |
| 17 | 57.5 | $In_{0.18}AlN$ |
| 18 | 62.2 | GaN |
| 19 | 100.9 | $In_{0.18}AlN$ |
| 20 | 81.3 | GaN |
| 21 | 62.7 | $In_{0.18}AlN$ |
| 22 | 48.6 | GaN |
| 23 | 57.0 | $In_{0.18}AlN$ |
| 24 | 55.1 | GaN |
| 25 | 72.3 | $In_{0.18}AlN$ |
| 26 | 74.4 | GaN |
| 27 | 88.3 | $In_{0.18}AlN$ |
| 28 | 64.8 | GaN |

TABLE 3-continued

Example of dimensions of an InAlN/GaN DBR stack.

| Layer No. | Thickness (nm) | Material |
|---|---|---|
| 29 | 60.3 | $In_{0.18}AlN$ |
| 30 | 46.9 | GaN |
| 31 | 50.4 | $In_{0.18}AlN$ |
| 32 | 44.2 | GaN |
| 33 | 51.8 | $In_{0.18}AlN$ |
| 34 | 48.4 | GaN |
| 35 | 58.6 | $In_{0.18}AlN$ |
| 36 | 55.9 | GaN |
| 37 | 69.8 | $In_{0.18}AlN$ |
| 38 | 66.6 | GaN |
| 39 | 77.4 | $In_{0.18}AlN$ |
| 40 | 64.9 | GaN |
| 41 | 68.3 | $In_{0.18}AlN$ |
| 42 | 58.2 | GaN |
| 43 | 66.2 | $In_{0.18}AlN$ |
| 44 | 59.3 | GaN |
| 45 | 68.7 | $In_{0.18}AlN$ |
| 46 | 61.5 | GaN |
| 47 | 69.6 | $In_{0.18}AlN$ |
| 48 | 59.4 | GaN |
| 49 | 63.4 | $In_{0.18}AlN$ |
| 50 | 52.7 | GaN |
| 51 | 58.1 | $In_{0.18}AlN$ |
| 52 | 51.5 | GaN |
| 53 | 59.6 | $In_{0.18}AlN$ |
| 54 | 54.3 | GaN |
| 55 | 63.5 | $In_{0.18}AlN$ |
| 56 | 57.8 | GaN |
| 57 | 67.3 | $In_{0.18}AlN$ |
| 58 | 60.3 | GaN |
| 59 | 68.9 | $In_{0.18}AlN$ |
| 60 | 60.8 | GaN |
| 61 | 68.9 | $In_{0.18}AlN$ |
| 62 | 60.3 | GaN |
| 63 | 67.3 | $In_{0.18}AlN$ |
| 64 | 57.8 | GaN |
| 65 | 63.5 | $In_{0.18}AlN$ |
| 66 | 54.3 | GaN |
| 67 | 59.6 | $In_{0.18}AlN$ |
| 68 | 51.5 | GaN |
| 69 | 58.1 | $In_{0.18}AlN$ |
| 70 | 52.7 | GaN |
| 71 | 63.4 | $In_{0.18}AlN$ |
| 72 | 59.4 | GaN |
| 73 | 69.6 | $In_{0.18}AlN$ |
| 74 | 61.5 | GaN |
| 75 | 68.7 | $In_{0.18}AlN$ |
| 76 | 59.3 | GaN |
| 77 | 66.2 | $In_{0.18}AlN$ |
| 78 | 58.2 | GaN |
| 79 | 68.3 | $In_{0.18}AlN$ |
| 80 | 64.9 | GaN |
| 81 | 77.4 | $In_{0.18}AlN$ |
| 82 | 66.6 | GaN |
| 83 | 69.8 | $In_{0.18}AlN$ |
| 84 | 55.9 | GaN |
| 85 | 58.6 | $In_{0.18}AlN$ |
| 86 | 48.4 | GaN |
| 87 | 51.8 | $In_{0.18}AlN$ |
| 88 | 44.2 | GaN |
| 89 | 50.4 | $In_{0.18}AlN$ |
| 90 | 46.9 | GaN |
| 91 | 60.3 | $In_{0.18}AlN$ |
| 92 | 64.8 | GaN |
| 93 | 88.3 | $In_{0.18}AlN$ |
| 94 | 74.4 | GaN |
| 95 | 72.3 | $In_{0.18}AlN$ |
| 96 | 55.1 | GaN |
| 97 | 57.0 | $In_{0.18}AlN$ |
| 98 | 48.6 | GaN |
| 99 | 62.7 | $In_{0.18}AlN$ |
| 100 | 81.3 | GaN |
| 101 | 100.9 | $In_{0.18}AlN$ |
| 102 | 62.2 | GaN |
| 103 | 57.5 | $In_{0.18}AlN$ |
| 104 | 47.5 | GaN |

TABLE 3-continued

Example of dimensions of an InAlN/GaN DBR stack.

| Layer No. | Thickness (nm) | Material |
|---|---|---|
| 105 | 52.9 | $In_{0.18}AlN$ |
| 106 | 44.5 | GaN |
| 107 | 49.9 | $In_{0.18}AlN$ |
| 108 | 45.5 | GaN |
| 109 | 55.6 | $In_{0.18}AlN$ |
| 110 | 49.8 | GaN |
| 111 | 57.0 | $In_{0.18}AlN$ |
| 112 | 48.7 | GaN |
| 113 | 161.0 | $In_{0.18}AlN$ |
| 114 | 48.2 | GaN |
| 115 | 56.5 | $In_{0.18}AlN$ |
| 116 | 49.2 | GaN |
| 117 | 55.4 | $In_{0.18}AlN$ |
| 118 | 45.6 | GaN |
| 119 | 49.7 | $In_{0.18}AlN$ |
| 120 | 48.2 | GaN |

Figure 7:
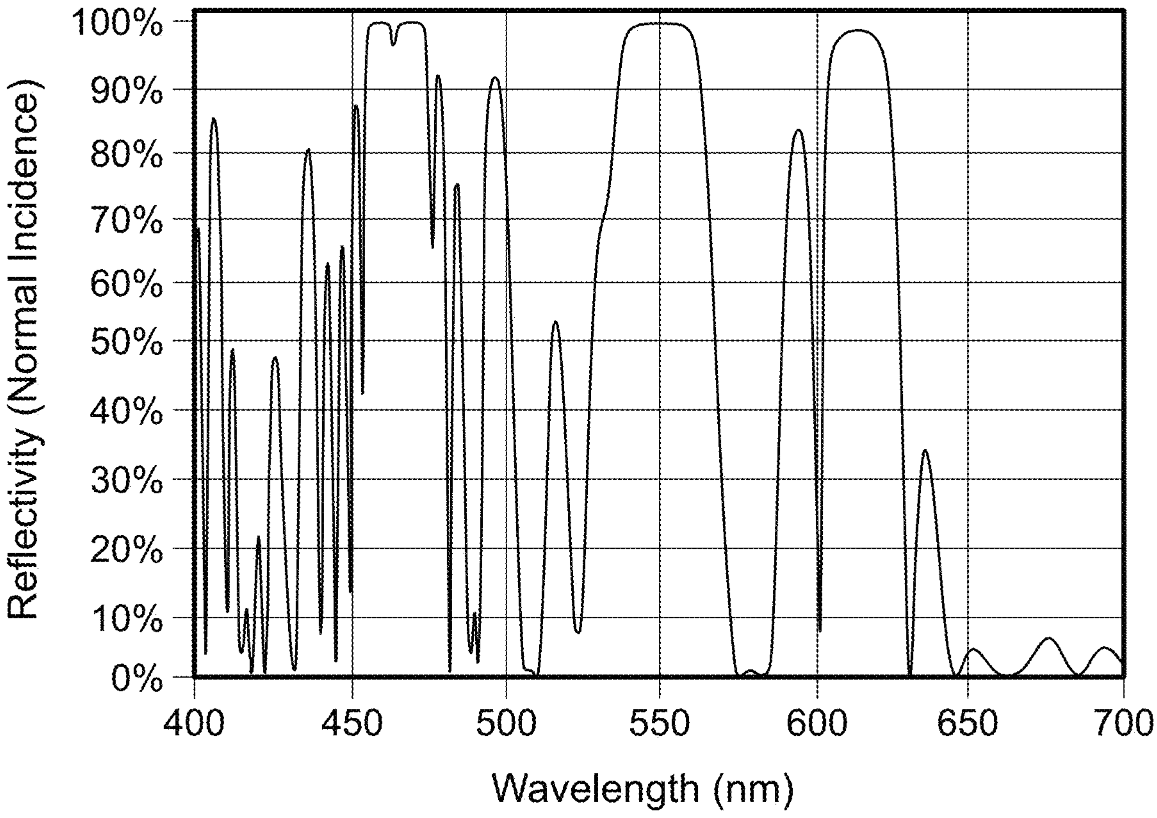
FIG. 7 shows a simulated reflectivity of the DBR structure described in Table 3.

The simulated reflectivity of the DBR stack having the layer structure described in Table 3 is shown in FIG. 7.

The total layer thickness of this DBR is about 7.3 μm, and the stack is lattice-matched to GaN. A thinner outcoupling DBR can be realized by increasing the refractive index contrast between the layer pairs using strained layers, while staying within force balance limits and managing overall strain.

The active layers are composed of three multi-quantum-well (MQW) stacks designed for red, green, and blue emission, respectively. The blue MQW stack can be grown first, followed by the green stack, and then the red stack. Each MQW stack consists of InGaN quantum wells with the indium content tailored for the target wavelength. Spacer layers separate the MQWs, ensuring minimal interaction between the active regions while sharing the same optical cavity. Near each MQW region, InAlN layers with an aluminum-nitride mole fraction ranging from 60% to 90% are strategically incorporated to act as oxidation layers. The InAlN layers are typically from 10 nm to 30 nm thick, providing controlled lateral oxidation properties suitable for forming the oxide collars. The InAlN layers are lattice-matched to the surrounding GaN or InGaN layer and are engineered with specific compositions and thicknesses to control the lateral oxidation rates. The composition of the InAlN layers can be selected to ensure reliable and predictable oxidation to achieve precise current confinement without adversely affecting the optical or electrical properties of the active regions. Interconnection and current spreading for the device is provided by tunnel junctions (TJ) positioned above the oxide collars to allow lateral access for electrical contacts and efficient current injection.

The n+ side or proximal portions of the TJ layers, either as part of the TJ or proximal to the TJ, can include In-bearing lattice-relaxation layers such as InGaN layers, to facilitate optimum engineering of the green and red MQWs. For example, above the blue MQW, a relaxed InGaN layer may be incorporated to shift the in-plane a-lattice constant to a preferred value for a green MQW such as about 3.22 Å. Similarly, overlying the green MQW, a relaxed InGaN layer can be incorporated to shift the in-plane a-lattice constant to a preferred value for a red MQW such as about 3.25 Å. The lattice engineering ensures that the green and red MQWs can achieve optimum performance, while layer compositions for the MQW stacks and surrounding layers are designed to be transparent in the blue wavelength range, except for the green and red QWs.

After epitaxial growth, mesas can be defined using ICP/RIE etching, exposing the sidewalls of the InAlN layers, while also providing contact regions for each active region. A series of etches with different mask designs can be used. With proper design, the etching process creates well-defined oxide collar apertures without interfering with the functionality of the tunnel junctions or the electrical pathways. The etching process can produce inclined sidewalls, with the mesa diameters decreasing from the bottom (blue MQW) to the top (red MQW). By adjusting the composition and/or thickness of the various InAlN oxidation layers, the oxidation process can be tuned to produce apertures for the different active regions that have the same size. Alternatively, the adjustments can be selected to produce smaller apertures for the blue MQW and progressively larger apertures for the green and red MQWs, to match the respective radiation patterns of the different colors during operation. During oxidation, portions of the exposed InAlN layers can be converted to insulating $AlO_x$ through their exposed regions while leaving the surrounding layers unaffected. The oxidation process can be performed, for example, in a water vapor environment at a temperature from about 500° C. to 600° C. for from 10 minutes to 30 minutes, depending on the desired aperture size and layer thickness. The oxidation process can be controlled to create a desired aperture size for each MQW color, aligning with the optical mode and ensuring efficient confinement of current to the lasing regions.

The device uses two TJs to facilitate independent electrical operation of the blue and green MQW regions, with the TJs positioned above the oxide collars to allow lateral access for electrical contacts and efficient current injection. One TJ is positioned above the blue MQW, while the other is above the green MQW. These TJs comprise heavily doped n+/p+ III-nitride layers that enable efficient carrier injection into the underlying MQW regions by recycling holes and electrons. The red MQW region is designed with a conventional p-layer, which is contacted via an intracavity transparent conductive oxide (TCO) layer such as indium tin oxide (ITO). This design allows for efficient current injection into the red MQW and contributes to the overall performance of the device.

The dielectric DBR mirror, located at the top of the device, serves as the shared back mirror for all wavelengths. The dielectric DBR mirror comprises alternating layers of $SiO_2$ and $TiO_2$ with thicknesses ranging from 90 nm to 130 nm optimized to achieve a reflectivity of 99.99% across the target wavelengths. The detailed dimensions of the DBR layer stack are shown in Table 4.

TABLE 4

Examples of layer dimensions of MQW DBR.

| Layer No. | Thickness (nm) | Material |
|---|---|---|
| 1 | 55.3 | $TiO_2$ |
| 2 | 91.7 | $SiO_2$ |
| 3 | 54.4 | $TiO_2$ |
| 4 | 91.8 | $SiO_2$ |
| 5 | 54.6 | $TiO_2$ |
| 6 | 92.9 | $SiO_2$ |
| 7 | 58.5 | $TiO_2$ |
| 8 | 146.7 | $SiO_2$ |
| 9 | 60.5 | $TiO_2$ |
| 10 | 93.4 | $SiO_2$ |
| 11 | 54.6 | $TiO_2$ |
| 12 | 92.1 | $SiO_2$ |
| 13 | 54.4 | $TiO_2$ |
| 14 | 92.5 | $SiO_2$ |
| 15 | 55.5 | $TiO_2$ |
| 16 | 100.1 | $SiO_2$ |
| 17 | 90.6 | $TiO_2$ |
| 18 | 96.0 | $SiO_2$ |
| 19 | 55.3 | $TiO_2$ |
| 20 | 92.2 | $SiO_2$ |
| 21 | 54.4 | $TiO_2$ |
| 22 | 92.3 | $SiO_2$ |
| 23 | 55.1 | $TiO_2$ |
| 24 | 98.9 | $SiO_2$ |
| 25 | 96.3 | $TiO_2$ |
| 26 | 92.8 | $SiO_2$ |
| 27 | 54.5 | $TiO_2$ |
| 28 | 91.4 | $SiO_2$ |
| 29 | 52.2 | $TiO_2$ |
| 30 | 88.9 | $SiO_2$ |
| 31 | 33.6 | $TiO_2$ |
| 32 | 65.9 | $SiO_2$ |
| 33 | 43.5 | $TiO_2$ |
| 34 | 97.9 | $SiO_2$ |
| 35 | 45.2 | $TiO_2$ |
| 36 | 103.3 | $SiO_2$ |
| 37 | 40.5 | $TiO_2$ |
| 38 | 81.8 | $SiO_2$ |
| 39 | 43.0 | $TiO_2$ |

Figure 8:
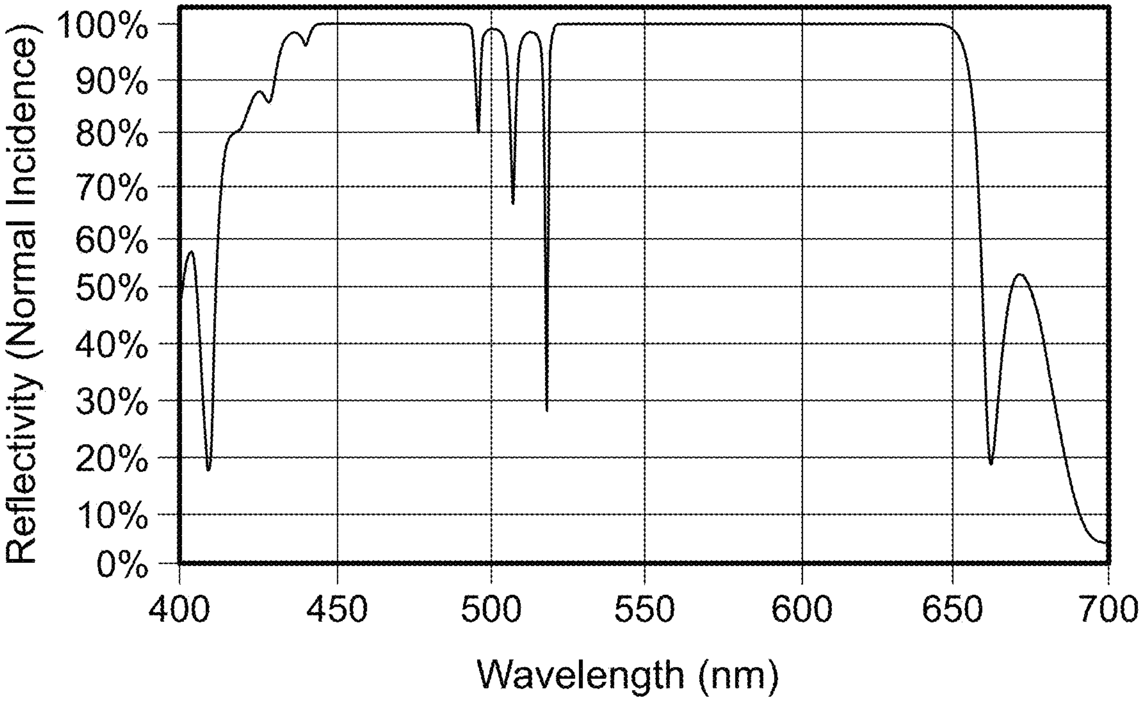
FIG. 8 shows a simulated reflectivity of the DBR structure described in Table 4.

The simulated reflectivity of the DBR stack having the layer structure described in Table 4 is shown in FIG. 8.

The total layer thickness of the dielectric DBR is about 2.9 μm. The high reflectivity of the DBR mirror minimizes optical losses and ensures strong feedback for lasing. The combined structure, including the oxide collars and tailored DBR mirrors, can support multimode and single mode lasing for red, green, and blue wavelengths, with a consistent beam divergence across all colors. This design ensures uniform radiation patterns and high color purity, making the VCSEL suitable for demanding optical applications.

Figure 9:
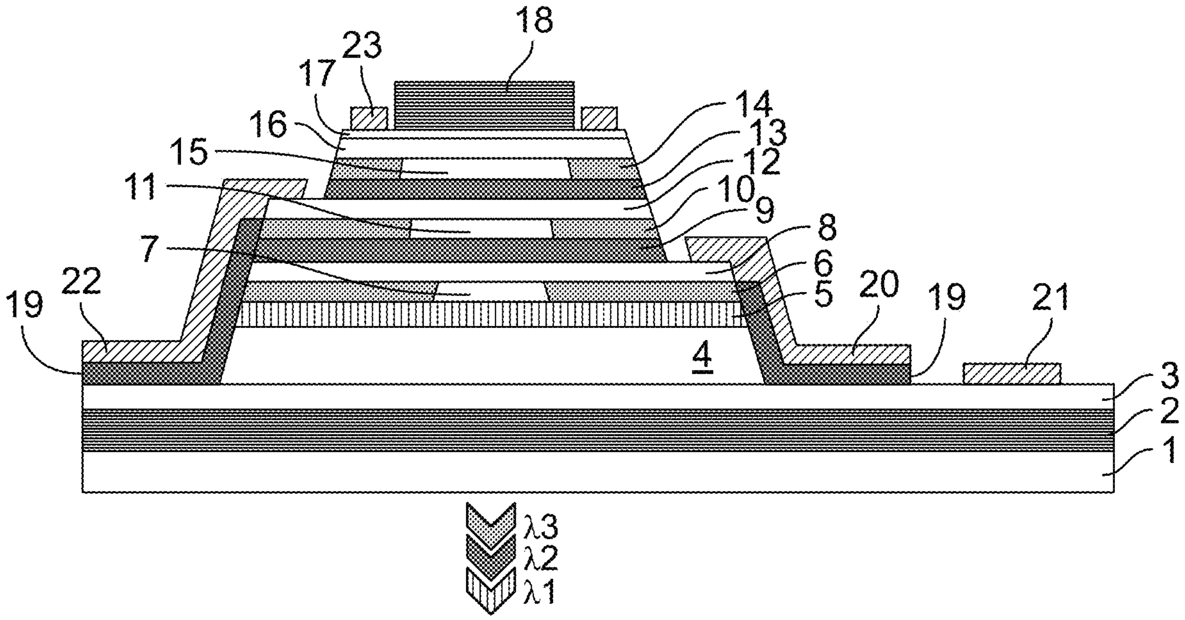
FIG. 9 shows a cross-sectional schematic of an example of a stacked multi-wavelength VCSEL structure provided by the present disclosure.

A cross-sectional schematic view of an example of a multi-wavelength single-pixel VCSEL is shown in FIG. 9. FIG. 9 shows an n-type buffer layer 1, front DBR 2, n-type GaN layer 3, n-type GaN spacer layer 4, blue-emitting InGaN MQW layer 5, InAlN collar layer 6 surrounding $AlO_x$ region 7, tunnel junction 8 including p-type InGaN, optional InGaN relaxation layer, and n-type InGaN layer, green-emitting InGaN MQW layer 9, InAlN collar 10 surrounding $AlO_x$ region 11, tunnel junction 12 including p-type InGaN, optional InGaN relaxation layer, and n-type InGaN layer, a red-emitting InGaN MQW layer 13, InAlN collar 14 surrounding AlOx region 15, p-type InGaN layer 16, transparent conductive oxide layer 17, and back DBR 18. FIG. 9 includes insulator 19, electrodes 20/21 for the blue emitting MQW, electrode 22 for the green-emitting MQW, and electrode 23 for the blue-emitting MQW. The multi-wavelength VCSEL shown in FIG. 9 can be configured to emit radiation at three different wavelengths such as at 21, 22, and 23, which can be in the green, red, and blue wavelength range, respectively.

The multi-wavelength VCSEL shown in FIG. 9 is designed as a four-terminal structure, with independent electrical connections to the blue, green, and red MQW regions. To minimize absorptive losses when the red or green VCSELs are operating, best practices can be implemented to reduce intracavity absorption. This can involve prioritizing cavity design to reduce the optical mode overlap with the unpumped MQWs, ensuring that the lasing mode is primarily confined to the active MQW region in operation. That is, the blue cavity is designed so that the blue QWs are at an anti-node, while the green and red QWs are positioned at nodes, of the blue optical field. That is, the green cavity is designed so that the green QWs are at an anti-node, while the red QWs are positioned at a node, of the green optical field. Finally, the red cavity is designed so that the red QWs are positioned at an anti-node of the red optical field, which does not suffer from absorption from the blue or green QWs. Appropriate engineering choices ensure that the lasing mode is confined to the active MQW region in operation and minimize overlap with any absorbing QWs. This approach can achieve high efficiency and low optical losses in multi-wavelength operation, ensuring efficient lasing while minimizing power consumption and residual absorption.

Figure 10:
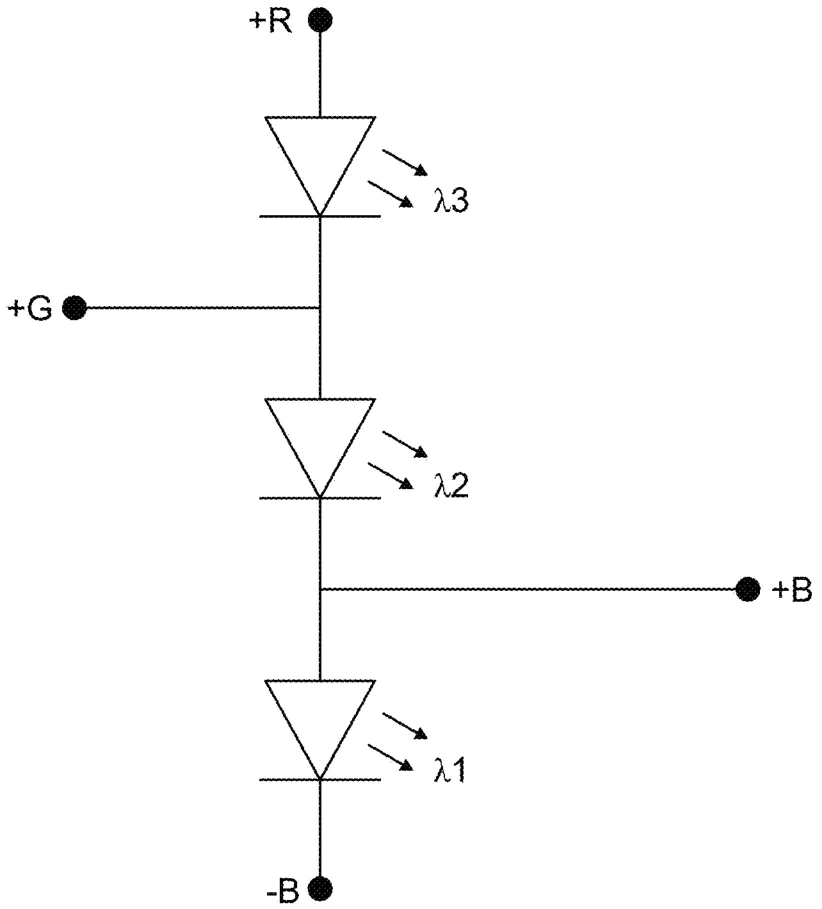
FIG. 10 shows a schematic of an example of a simplified equivalent circuit for a stacked multi-wavelength VCSEL.

An electrical schematic for an example of interconnects for driving a multi-wavelength VCSEL is shown in FIG. 10.

A multi-wavelength VCSEL can be integrated with a CMOS backplane through, for example, flip-chip bonding using fine-pitch solder bumps or copper pillars for electrical and thermal connections. The CMOS backplane incorporates drive electronics and signal routing to independently control each MQW region. Following bonding, the silicon growth substrate can be removed by mechanical grinding and selective wet etching, leaving the epitaxial structure intact. This process exposes the dielectric DBR and facilitates further processing and packaging.

A multi-wavelength VCSEL design provided by the present disclosure combines high efficiency, precise current confinement, and excellent beam quality in a compact structure. The design is compatible with CMOS integration and can enable high-density arrays making it useful for a wide range of applications, including high-resolution AR/VR displays, high-speed optical interconnects, and advanced sensing systems. The approach offers significant advantages over traditional methods by eliminating the need for regrowth and by leveraging the predictable oxidation of InAlN layers for precise aperture control.

Other optoelectronic devices can be fabricated using the general designs and methods provided by the present disclosure. For example, other current confinement approaches, including dielectrics, ion implantation, proton bombardment, or regrowth techniques, might be envisioned. Also, it can be desirable to shift the lattice constant for the blue MQW stack, for example to about 3.20 Å.

Devices provided by the present disclosure can be formed in arrays suitable for displays, such as wearable AR/VR devices. Each multi-color VCSEL can be operated in continuous and/or pulsed mode to provide the necessary color content required by the video information shared. The high efficiency and high directionality of emission allow for very efficient optical designs for imaging the light on the retina of the observer.

A multi-wavelength VCSEL provided by the present disclosure can be easily modified to form a spontaneous emission device. For a spontaneous emission device, the front DBR can be eliminated completely, or can be shorted considerably to provide optimum performance for resonant-cavity (RC) LED operation. The back DBR coverage area can be laterally enlarged (compared to a VCSEL) to capture backward emitting spontaneous emission and redirect light toward the desired outcoupling surface, that is, through the n-type (or buffer) layer and (optionally, if present and transparent) the growth substrate. Also, the sidewall angles can be optimized to maximally direct emission through the outcoupling surface. For a multi-wavelength LED, an oxide current confinement is optional, and suitable current confinement can be achieved using the provided dielectric structures. A cross-section view of an example of a multi-wavelength single-pixel LED provided by the present disclosure is shown in FIG. 12.

Figure 12:
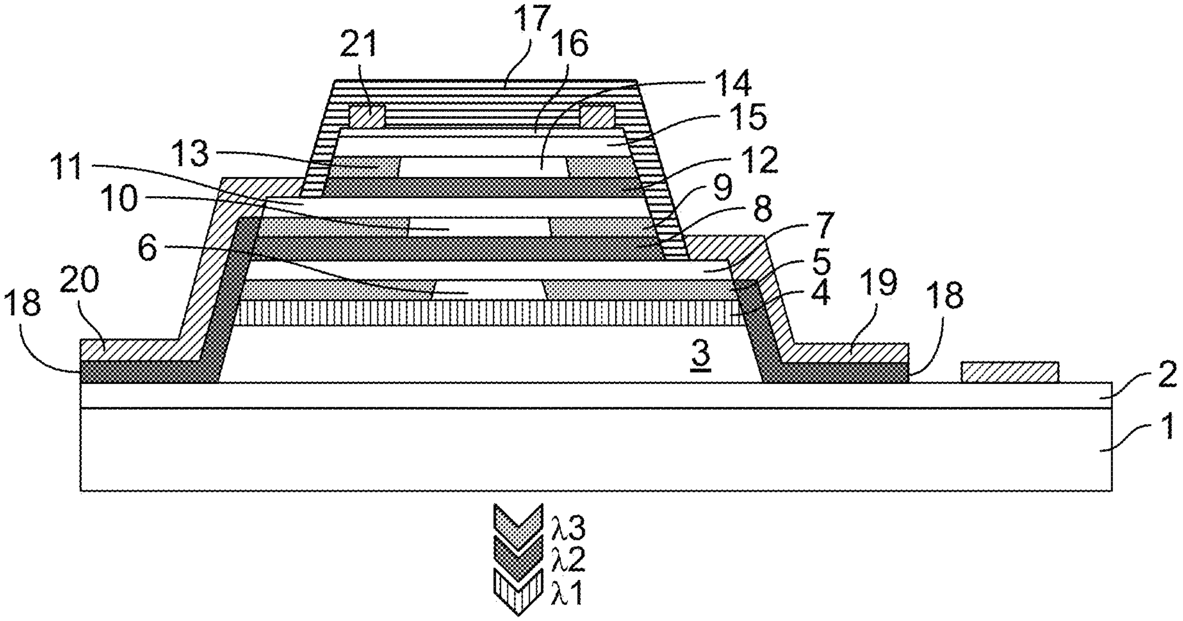
FIG. 12 shows a cross-sectional schematic of an example of a stacked multi-wavelength LED structure provided by the present disclosure.

The multi-wavelength single-pixel LED shown in FIG. 12 includes a blue-emitting LED (layer 4), a green-emitting LED (layer 8), and a red-emitting LED (layer 12). The multi-wavelength single-pixel LED shown in FIG. 12 includes n-type or buffer layer 1, n-type layer 2, n-type spacer layer 3, InGaN active layer 4, optional oxide collar region 5 surrounding oxide region 6, tunnel junction layer 7 including p-type InGaN layer, tunnel junction, optional relaxation layer, an n-type InGaN layer, InGaN active layer 8, optional oxide region 9 surrounding oxide region 10, tunnel junction layer 11 including p-type InGaN, tunnel junction layers, optional relaxation layer and n-InGaN layer, InGaN active layer 12, optional oxide collar region 13 surrounding oxide region 14, p-InGaN layer 15, transparent conductive oxide layer 16, and back DBR 17. The device includes independent electrical contacts to the blue-emitting LED 18, the green-emitting LED 19, and to the red-emitting LED 21. The multi-wavelength LED shown in FIG. 12 can be configured to emit radiation at three different wavelengths such as at 21, 22, and 23, which can be in the green, red, and blue wavelength range, respectively.

A relaxed Wurtzite In-containing III-nitride layer provided by the present disclosure can comprise a thickness, for example, greater than 100 nm; and a first interface region characterized by a single-phase gallium-polar (0001) orientation, a Wurtzite In-containing III-nitride comprising an InN mole fraction greater than 0; and a substantially relaxed in-plane a-lattice parameter.

A relaxed Wurtzite In-containing III-nitride layer provided by the present disclosure can comprise a Wurtzite In-containing III-nitride semiconductor having an InN mole fraction greater than 0.

In a relaxed Wurtzite In-containing III-nitride layer the InN mole fraction can be substantially homogeneous throughout the thickness of the layer.

A relaxed Wurtzite In-containing III-nitride layer, also referred to as a relaxed layer, a relaxed $In_xAl_yGa_{1-x-y}N$ layer, or a relaxed InGaN layer, can comprise an InN mole fraction, for example, from 0.1% to 40%, from 1% to 40%, from 5% to 40%, or from 10% to 40%.

A relaxed layer can comprise an InN mole fraction, for example, from 0.1% to 20%, from 0.1% to 15%, from 0.1% to 10%, or from 0.1% to 5%.

A relaxed layer can comprise an InN mole fraction, for example, from 5% to 40%, from 5% to 35%, from 5% to 30%, from 5% to 25%, from 5% to 20%, or from 5% to 15%.

A relaxed layer can comprise an InN mole fraction, for example, greater than 0.1%, greater than 1%, greater than 5%, greater than 10%, greater than 20%, greater than 30%, or greater than 40%.

A relaxed layer can comprise an InN mole fraction, for example, less than 40%, less than 30%, less than 20%, less than 10%, less than 5%, or less than 1%.

A relaxed layer can have an in-plane a-lattice parameter greater than 3.20 Å, greater than 3.25 Å, greater than 3.30 Å, greater than 3.35 Å, or greater than 3.40 Å.

A relaxed layer can comprise $In_xAl_yGa_{1-x-y}N$, where $0<x<1$ and $0\leq y\leq 1$.

A relaxed layer can comprise $In_xAl_yGa_{1-x-y}N$, where $0<x\leq 0.4$ and $0\leq y\leq 1$.

A relaxed layer can comprise $In_xGa_{1-x}N$, where $0<x<1$, $0.01<x<1$, or $0.02<x<1$.

A relaxed layer can comprise $In_xGa_{1-x}N$, where 0<x≤0.4, 0.01<x≤0.4, or 0.02<x≤0.4.

A relaxed layer can comprise $In_xGa_{1-x}N$, where 0<x<1, 0≤x≤0.04, 0.04≤x≤0.08, 0.08≤x<0.12, 0.12≤x≤0.16, 0.16≤x≤0.20, 0.20≤x≤0.24, 0.24≤x≤0.28, or 0.28≤x≤0.33.

A relaxed layer can be characterized, for example, by a 002 (symmetric) XRD full-width-at-half-maximum (FWHM) of less than 300 arcsec, less than 200 arcsec, or less than 100 arcsec.

A relaxed layer can be characterized, for example, by a 211 asymmetric XRD full-width-at-half-maximum (FWHM) of less than 1,800 arcsec, less than 1,500 arcsec, or less than 1,300 arcsec.

A relaxed layer can be characterized, for example, by an edge dislocation density of less than 1E10 $cm^{-2}$, 1E9 $cm^{-2}$, or less than 1E8 $cm^{-2}$, where the edge dislocation density is determined by electron microscopy and/or by cathodoluminescence.

A relaxed layer can have a maximum lateral dimension, for example, greater than 1 mm, greater than 10 mm, 50 mm, greater than 100 mm, greater than 200 mm, greater than 300 mm greater than 400 mm. Therefore, the bulk relaxed layer is compatible with high-volume manufacturing on substrates such as 200 mm or 300 mm Si substrates, or engineered substrates of similar dimensions.

A relaxed layer can have a maximum lateral dimension, for example, from 1 mm to 500 mm, from 10 mm to 500 mm, from 100 to 400, or from 200 mm to 300 mm.

A relaxed layer can have an area, for example, 1 $mm^2$, greater than 100 $mm^2$, greater than 1,000 $mm^2$, greater than 2,000 $mm^2$, greater than 5,000 $mm^2$, greater than 10,000 $mm^2$, greater than 20,000 $mm^2$, greater than 40,000 $mm^2$, greater than 60,000 $mm^2$, greater than 100,000 $mm^2$, or greater than 200,000 $mm^2$.

A relaxed layer can have maximum lateral dimension, for example, from 1 μm to 1,000 μm, from 1 μm to 800 μm, from 1 μm to 600 μm, from 1 μm to 400 μm, or from 1 μm to 200 μm.

A relaxed layer can have an area, for example, less than 1E6 $\mu m^2$, less than 1E5 $\mu m^2$, less than 1E4 $\mu m^2$, less than 1,000 $\mu m^2$, or less than 100 $\mu m^2$.

A relaxed layer can overlie a template layer and/or substrate.

A relaxed Wurtzite In-containing III-nitride layer can have a thickness, for example, greater than 100 nm, greater than 300 nm, greater than 500 nm, greater than 750 nm, or greater than 1,000 nm.

A relaxed Wurtzite In-containing III-nitride layer can have a thickness, for example, from 100 nm to 2,000 nm, from 500 nm to 1,000 nm, or from 750 nm to 1,000 nm.

A relaxed Wurtzite In-containing III-nitride layer can have a thickness that is sufficiently thick so as to provide a template for high quality overlying epitaxial layers such as high quality $In_xAl_yGa_{1-x-y}N$, layers.

A relaxed Wurtzite In-containing III-nitride layer provided by the present disclosure can comprise a first interface region characterized by a single-phase gallium-polar (0001) orientation.

A relaxed Wurtzite In-containing III-nitride layer provided by the present disclosure can comprise a first interface region characterized by a Wurtzite In-containing III-nitride material having an InN mole fraction greater than 0. A semiconductor layer such as a relaxed Wurtzite In-containing III-nitride layer can have a first interface and a second interface opposite the first interface, where the relaxed Wurtzite In-containing III-nitride layer is bounded by the two interfaces. Growth of the relaxed Wurtzite In-containing III-nitride layer proceeds from the second interface to the first interface. The second interface can adjoin an underlying substrate, planar template, or patterned template. The patterned template can be planar or non-planar.

A first interface region of a relaxed layer can comprise an InN mole fraction, for example, from 0.1% to 40%, from 1% to 40%, from 5% to 40%, or from 10% to 40%.

A first interface region of a relaxed layer can comprise, for example, an InN mole fraction, for example, from 5% to 40%, from 5% to 35%, from 5% to 30%, from 5% to 25%, from 5% to 20%, or from 5% to 15%.

A first interface region of a relaxed layer can comprise InN mole fraction, for example, from 0.1% to 20%, from 0.1% to 15%, from 0.1% to 10%, or from 0.1% to 5%.

A first interface region of a relaxed layer can comprise InN mole fraction, for example, greater than 0.1%, greater than 1%, greater than 5%, greater than 10%, greater than 20%, greater than 30%, or greater than 40%.

A first interface region of a relaxed layer can comprise InN mole fraction, for example, less than 40%, less than 30%, less than 20%, less than 10%, less than 5%, or less than 1%.

A first interface region of a relaxed layer can comprise $In_xAl_yGa_{1-x-y}N$, where 0<x<1 and 0≤y≤1.

A first interface region of a relaxed layer can comprise $In_xAl_yGa_{1-x-y}N$, where 0<x≤0.4 and 0≤y≤1.

A first interface region of a relaxed layer can comprise $In_xGa_{1-x}N$, where 0<x<1, 0.01<x<1, or 0.02<x<1.

A first interface region of a relaxed layer can comprise $In_xGa_{1-x}N$, where 0<x≤0.4, 0.01<x≤0.4, or 0.02<x≤0.4.

A first interface region of a relaxed layer can comprise $In_xGa_{1-x}N$, where 0<x<1, 0≤x≤0.04, 0.04≤x≤0.08, 0.08≤x≤0.12, 0.12≤x≤0.16, 0.16≤x≤0.20, 0.20≤x≤0.24, 0.24≤x<0.28, or 0.28≤x≤0.33.

A first surface of a relaxed layer can be characterized, for example, by a root-mean-square (RMS) roughness of less than 5 nm, less than 2 nm, or less than 1 nm over a 5×5 $\mu m^2$ area, where the roughness is determined by atomic force microscopy.

A first surface of a relaxed layer can be characterized, for example, by a root-mean-square roughness less of than 1 nm, less than 0.5 nm, or less than 0.25 nm over a 1×1 $\mu m^2$ area, where the roughness is determined by atomic force microscopy.

A first surface of a relaxed layer can be characterized, for example, by a pit density of less than 1E9 $cm^{-2}$, less than 1E8 $cm^{-2}$, or less than 1E7 $cm^{-2}$, where the pit density is determined by electron microscopy, atomic force microscopy, and/or cathodoluminescence.

A first surface of a relaxed layer can be characterized, for example, by characterized by an average pit size of less than 10 nm in diameter, less than 5 nm in diameter, or less than 1 nm in diameter where the average pit size is determined by electron microscopy, atomic force microscopy, and/or cathodoluminescence.

A first surface of a relaxed layer can be characterized, for example, by a maximum pit size of less than 10 nm in diameter, less than 5 nm in diameter, or less than 1 nm in diameter, where the maximum pit size is determined by electron microscopy, atomic force microscopy, and/or cathodoluminescence.

A first surface of a relaxed layer can be characterized, for example, by a threading dislocation density of less than 1E9 $cm^{-2}$, less than 1E8 $cm^{-2}$, or less than 1E7 $cm^{-2}$, wherein the threading dislocation density is determined by electron microscopy and/or cathodoluminescence.

A relaxed Wurtzite In-containing III-nitride layer provided by the present disclosure can comprise a first interface region characterized by a substantially relaxed in-plane a-lattice parameter.

A relaxed in-plane a-lattice parameter refers to the property that the in-plane a-lattice parameter of the material is approximately that of a free-standing, coherent, 100% relaxed version of the material having the same elemental composition. For example, substantially relaxed refers to a material in which the in-plane a-lattice parameter of the material is within ±0.5% % of that of a free-standing, coherent, 100% relaxed version of the material having the same elemental composition. Uniformly refers to the property of having a weakly varying or substantially non-varying in-plane a-lattice parameter within the wide area, upon which optical and/or electronic device structures can be fabricated. In addition, the invention is applicable to a wide range of semiconductor crystal systems, including Wurtzite crystal structures, and to high-order alloys including ternary and quaternary alloys. Finally, the invention is suitable for overlying structures grown by a number of growth methods including, for example, molecular beam epitaxy (MBE) and metal-organic chemical vapor deposition (MOCVD).

A first interface region of a relaxed layer can be characterized by an in-plane a-lattice parameter that is, for example, within ±0.2% or ±0.1% that of a fully relaxed in-plane a-lattice parameter of the Wurtzite In-containing III-nitride alloy.

A first interface region of a relaxed layer can be characterized by an in-plane a-lattice parameter that is, for example, within 0.01 Å or within 0.005 Å of a fully relaxed in-plane a-lattice parameter of the Wurtzite In-containing III-nitride alloy.

A semiconductor structure provided by the present disclosure can comprise a relaxed Wurtzite In-containing III-nitride layer provided by the present disclosure.

A semiconductor structure can comprise a substrate having a substrate interface and a relaxed Wurtzite In-containing III-nitride layer overlying the substrate interface. A semiconductor structure can comprise a relaxed layer adjoining the substrate interface.

The substrate interface can be planar, and the adjoining surface of the relaxed layer can be planar.

The substrate can comprise, for example, sapphire, silicon, silicon carbide, AlN, or GaN.

A semiconductor structure provided by the present disclosure can comprise a template, wherein the relaxed Wurtzite In-containing III-nitride layer overlies the template, and the template overlies a substrate.

The template can have a thickness, for example, from 10 nm to 10,000 nm. The template can have a thickness, for example, less than 4,000 nm, less than 3,000 nm, less than 1,000 nm, or less than 100 nm.

The template can have opposing planar interfaces.

The template can comprise, for example, GaN, $In_xGa_{1-x}N$ wherein x>0, or AlN.

A template can comprise a patterned template. A patterned template can have a planar growth surface or a non-planar growth surface.

A patterned template can comprise a plurality of seed regions.

The plurality of seed regions can be randomly disposed on a substrate or template interface. For example, the randomly disposed seed regions can comprise islands comprising GaN or $In_xGa_{1-x}N$ where x>0, or AlN.

The plurality of seed regions can be disposed on a substrate or template surface in the form of an array. For example, the array can be a hexagonal array or a triangular array.

The array of seed regions can be characterized by a pitch, for example, from 1 μm to 10 μm such as from 1 μm to 5 μm. The array of seed regions can be characterized by a pitch, for example, of less than 10 μm, less than 8 μm, less than 6 μm, less than 4 μm, less than 2 μm, or less than 1 μm, where the pitch refers to the center-to-center spacing between nearest seed regions.

The seed regions can be defined by openings in a suitable mask. A mask can comprise, for example, $SiN_x$ or $SiO_x$, and can have a thickness, for example, from 3 nm to 300 nm such as from 10 nm to 100 nm. Openings in the mask can be circular and can have a diameter, for example, from 0.5 μm to 2 μm.

The plurality of seed regions can be randomly disposed on the surface of the substrate or template. The plurality of seed regions can have different dimensions such as width and/or height above the surface of the substrate or template. The plurality of seed regions can be disposed on a regular pitch or on an irregular pitch.

The seed regions can comprise a layer of a seed material such as GaN, $In_xAl_yGa_{1-x-y}N$ where x>0 and 0≤y≤1, $In_xGa_{1-x}N$ where x>0, or AlN.

The seed regions can comprise seed structures. A seed structure refers to a seed region having a non-planar structure.

A seed structure can comprise a pyramidal seed structure. For example, a pyramidal seed structure can have a hexagonal base and six triagonal facets that meet at a common apex. The six trigonal facets can comprise {10−11} crystallographically equivalent triangular facets. Each of the six triangular facets of a pyramidal growth structure can serve as a growth surface for an overlying InGaN layer.

A base of a pyramidal seed structure can have a maximum lateral dimension, for example, from 0.05 μm to 2.0 μm.

A pyramidal seed structure can have a height, for example, from 0.05 μm to 2.0 μm.

A seed structure can comprise, for example, GaN, $In_xAl_yGa_{1-x-y}N$ where x>0 and 0≤y≤1, $In_xGa_{1-x}N$ where x>0, or AlN.

A seed structure such as a pyramidal seed structure can comprise $In_xAl_yGa_{1-x-y}N$ where x>0 and 0≤y≤1.

A seed structure such as a pyramidal seed structure can comprise $In_xAl_yGa_{1-x-y}N$ where 0<x<0.4 and 0≤y≤1.

A seed structure such as a pyramidal seed structure can comprise $In_xGa_{1-x}N$, where x>0.

A seed structure such as a pyramidal seed structure can comprise $In_xGa_{1-x}N$ where 0<x<0.4.

A seed structure such as a pyramidal seed structure can comprise GaN.

A seed structure can comprise a GaN base with an overlying layer of an In-containing III-nitride such as InGaN.

A seed structure can be characterized by a dislocation density, for example, of less than 1E10 $cm^{-2}$, less than 1E9 $cm^{-2}$, less than 1E8 $cm^{-2}$, less than 1E7 $cm^{-2}$, or preferably less than 1E6 $cm^{-2}$.

FIGS. 14A-14E show examples of semiconductor structures with a relaxed Wurtzite In-containing III-nitride layer overlying a substrate or template provided by the present disclosure.

Figure 14A:
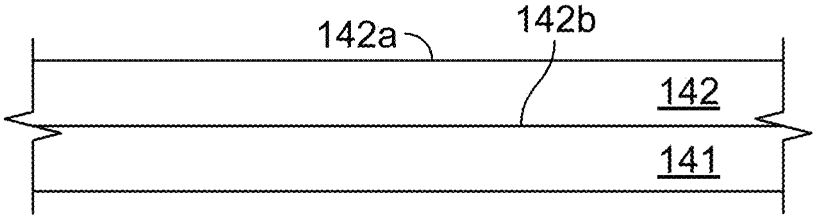
FIGS. 14A-14E show cross-sectional views of semiconductor structures provided by the present disclosure.

FIG. 14A shows an example of a relaxed Wurtzite In-containing III-nitride layer provided by the present disclosure 142 having a planar relaxed first interface **142*a* overlying a substrate 141 and in which a planar second interface 142***b* of the relaxed layer 142 overlies a planar substrate interface.

Figure 14B:
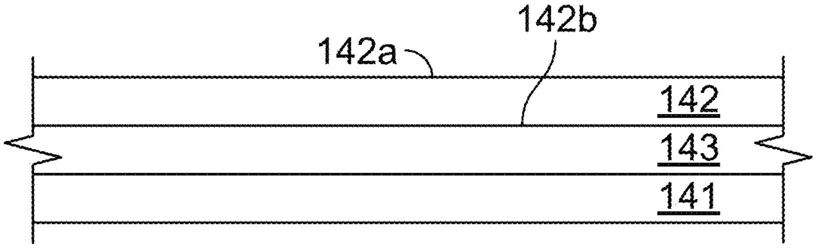

FIG. 14B shows an example of a relaxed layer provided by the present disclosure 142 having a planar relaxed first interface 142*a* overlying a planar template layer 143, which overlies a substrate 141. The template layer 143 is characterized by opposing planar interfaces. Planar second interface 142*b* of the relaxed layer 142 overlies planar template layer 143. For example, substrate 141 can be silicon and template 143 can be GaN.

Figure 14C:
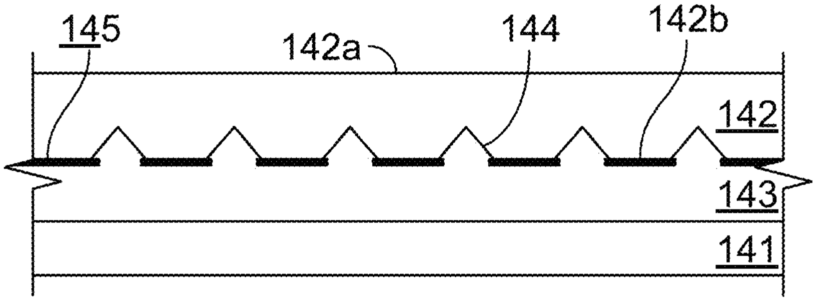

FIG. 14C shows an example of a relaxed layer provided by the present disclosure 142 having a planar relaxed first interface 142*a* overlying a patterned template 143, which overlies a substrate 141. The patterned template interface adjoining relaxed layer 142 comprises non-planar seed regions or seed structures 144 in the form of pyramidal seed structures defined by the openings in a mask 145. The second interface 214*b* of the relaxed layer 142 adjoins the seed structures 144 and the mask 145 and is non-planar and is characterized by a plurality of impressions complimentary to the pyramidal seed structures 144. The pyramidal seed structures 144 in FIG. 14C are shown as having the same pitch and dimensions. However, the pyramidal seed structures 144 can have other dimensions and dispositions on the template 143. For example, the pyramidal seed structures can have different widths, different heights, and can be disposed in different patterns or randomly across the surface of template 143.

Figure 14D:
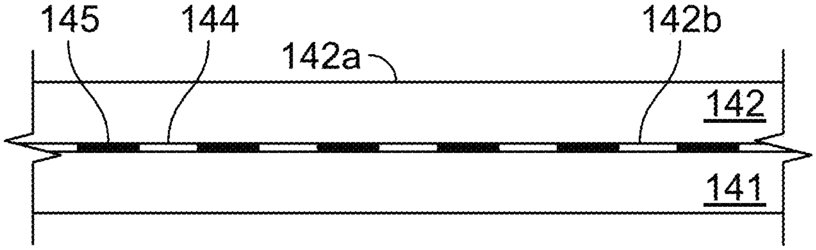

FIG. 14D shows an example of a relaxed layer provided by the present disclosure 142 having a planar relaxed first interface 142*a* overlying a patterned template 143, which overlies a substrate 141. The patterned template 143 adjoining the second interface 142*b* of relaxed layer 142 comprises planar seed regions 144 defined by openings in mask 145. The planar seed regions 144 in FIG. 14D are shown as having the same pitch and dimensions. However, the planar seed regions 144 can have other dimensions and dispositions on the template 143. For example, the planar seed regions can have different widths and can be disposed in different patterns or randomly across the surface of template 143.

Figure 14E:
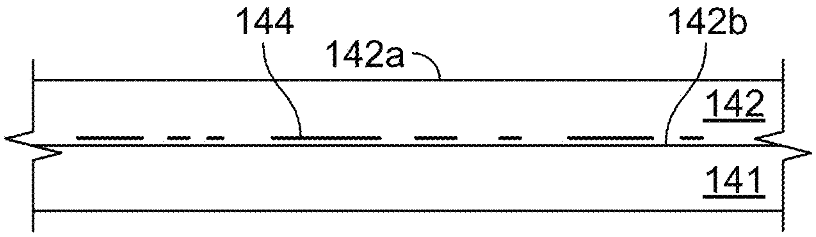

FIG. 14E shows an example of a relaxed layer provided by the present disclosure 142 having a planar relaxed first interface 142*a* overlying a patterned template 144, which overlies a substrate 141. The patterned template 144 adjoining the second interface 142*b* of relaxed layer 142 comprises seed regions 1444 as irregular islands, i.e., irregularly spaced and structure, of a seed material randomly disposed on the substrate interface 142*b*.

The structures described in the present invention may be grown by any suitable epitaxial layer technology, such as metal organic chemical vapor deposition (MOCVD), hydride vapor phase epitaxy (HVPE), and molecular Beam epitaxy (MBE). MOCVD is of commercial significance. Suitable MOCVD reactors include both low-pressure (LP) MOCVD tools, as well as atmospheric-pressure (AP) MOCVD tools.

Suitable substrates for the devices provided by the present disclosure include, for example, GaN, sapphire, silicon, silicon carbide, aluminum nitride, gallium oxide, SQL, QST, and other substrates suitable for epitaxial deposition of III-nitride materials. A GaN buffer layer can be deposited on the substrate prior to forming the Native InGaN® (Opnovix Corporation) layer structure and subsequent device layers.

Multiple lattice constants can be provided in different regions of a vertical epitaxial layer stack. For example, a first in-plane a-lattice parameter can be associated with a GaN buffer layer, followed by a second in-plane a-lattice parameter (greater than the first) associated with a first Native InGaN® layer, which is followed by a third in-plane a-lattice parameter (different than the first and second) associated with a second Native InGaN® layer. Device layers stacks may be inserted in each region above and/or below the respective Native InGaN® layers. In this way, different emission-color devices may be stacked on the same growth substrate, such as to provide combined blue, green, and red laser optoelectronic devices.

Bulk relaxed Wurtzite In-containing III-nitride layers having an interface region characterized by a smooth, substantially pit-free single-phase gallium-polar (0001) orientation are provided using a metal-rich ("MR") MOCVD method. The MR growth regime overcomes the pitted surface morphology observed when Wurtzite In-containing III-nitride layers are grown using conventional MOCVD growth conditions. By addressing the root causes of pit formation during the MOCVD process, MR MOCVD facilitates the growth of thick, high-quality Wurtzite In-containing III-nitride layers without the accompanying surface morphology problems. Furthermore, the approach can be combined with a slip layer or slip regions to allow a thick Wurtzite In-containing III-nitride layer to relax to its native lattice constant (Native InGaN®). By unlocking the full potential of Wurtzite In-containing III-nitride as a growth template, the MR MOCVD growth method provides new opportunities for optoelectronic semiconductor devices.

Figure 15:
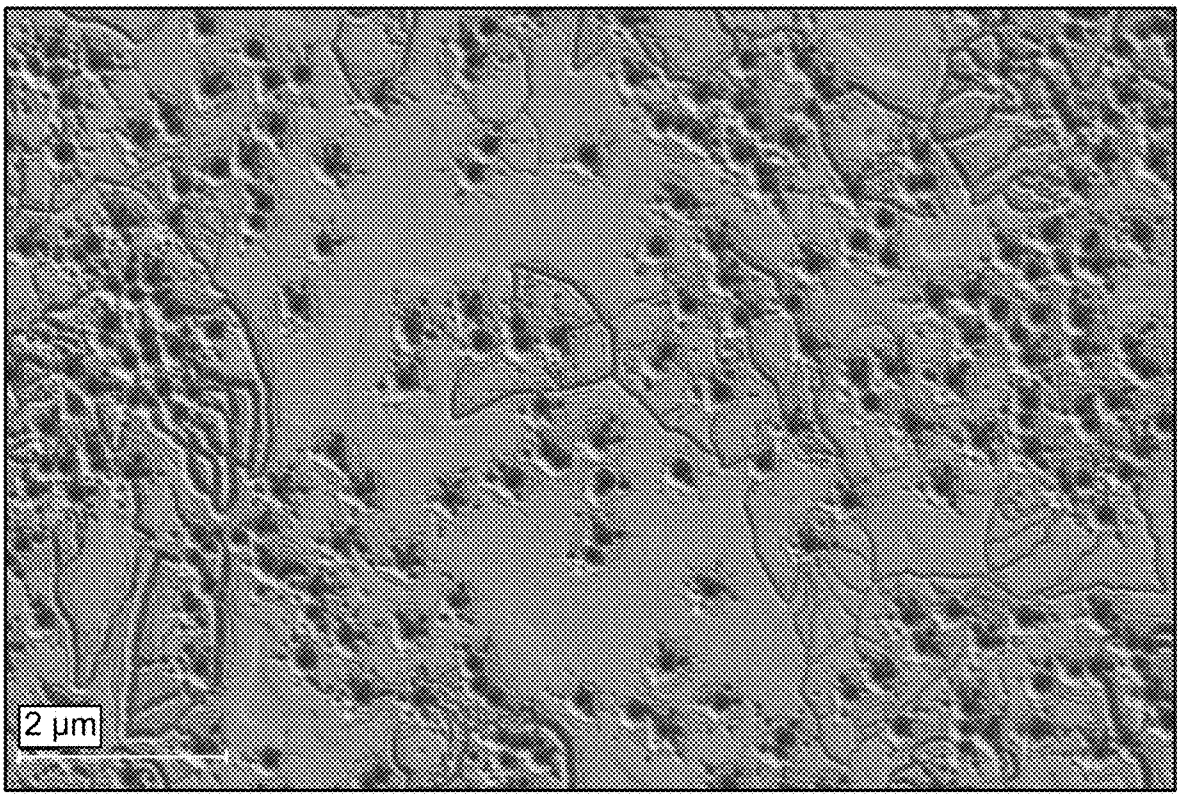
FIG. 15 shows a scanning electron microscopy (SEM) plan-view image of a 400 nm-thick, InGaN layer having an InN mole fraction of 10% grown on GaN/sapphire by MOCVD using ammonia rich ("N-rich") conditions, showing trench defects and large pits (up to about 300 nm in diameter) formed at threading dislocations.

The surface of typical "thick" (e.g., >100 nm) InGaN layers grown on GaN by MOCVD, regardless of underlying substrate, is associated with a morphology as shown, for example, in FIG. 15. InGaN layers grown under conventional MOCVD growth conditions utilize very high V/III ratios (typically >1000), which are referred to herein as ammonia- or nitrogen-rich ("N-rich") MOCVD growth conditions.

Bulk relaxed layers and semiconductor structures comprising a bulk relaxed layer provided by the present disclosure can be used to fabricate electronic and optoelectronic devices including InGaN-based optoelectronic devices such as LEDs, LDs, and VCSELs. LEDs and LDs comprising a bulk relaxed layer provided by the present disclosure can be used in lighting systems and display systems. In particular, for LEDs, devices may be formed on a bulk relaxed layer overlying a substrate and/or a template. The substrate can be thinned by techniques such as grinding, lapping, or etching, and can be diced by means known in the art such as sawing, scribe-and-break, laser scribing and breaking, or stealth-dicing, to provide individual LED chips or dies. More common LED chips or die dimensions can be, for example, from 100×100 $\mu m^2$ to 5×5 $mm^2$. Micro-LEDs can have device dimensions below 100×100 $\mu m^2$, to smaller than 0.5×0.5 $\mu m^2$. Individual LED chips can then be attached to suitable package elements, which provide leads for electrically contacting and heatsinking the devices. Die-attach can be accomplished using any suitable method such as epoxy or silicone attachment, solder-based attach, or mass-transfer techniques in the case of small devices such as, for example, micro-LEDs with a dimension less than 30 μm. Electrical connection for the chip to the package can be completed by using bond wire such as Au or Ag wires or traces, to connect the anode and cathode leads in the package to respective contact metallizations, i.e., electrodes, on the LED chip. In the case of flip-chip devices, electrical contact can be made through an intermediary submount, positioned between the LED chip and package. The chip electrodes can be attached to the submount carrier by means such as solder-attach or Au-bump attach. The submount carrier can be diced and then mounted into the package by any suitable method.

A relaxed In-containing III-nitride layer can support the formation of electrical contacts, including transparent conducting oxides (e.g., ITO), doped GaN contact layers, metal electrodes, or combinations thereof, enabling efficient carrier injection for optoelectronic device operation.

A relaxed In-containing III-nitride layer, semiconductor structure or device provided by the present disclosure can be integrated into systems such as scanning laser projection systems, and micro-display platforms, particularly where red, green, and blue emission wavelengths are targeted. A relaxed In-containing III nitride layer as used as a template for epitaxial layer growth enables high-yield fabrication of visible-wavelength devices by mitigating strain accumulation in overgrown structures, thereby reducing defectivity and improving process uniformity.

Desired emission color from the packaged LED device can be obtained by fabricating and providing a bulk relaxed In-containing-based LED, with a desired peak emission wavelength. Multiple such LED chips, optionally with different peak emission wavelengths, can be included in separate packages, or combined together in a multi-chip package. For example, a single package can include red-emitting, green-emitting, and blue-emitting LED chips, which may be arranged in a circuit and electrically coupled to a driver circuit, either within or outside the package, for operating the LEDs. The circuit details and driver can be selected to allow the different color LEDs to operate separately, or together, to provide a wide range of total emission characteristics, including white light emission for use in illumination applications, or for use as a backlight or front-light for a liquid crystal display (LCD) device, such as a television display, computer monitor, mobile phone display, wearable display device, (e.g., f-LCOS), etc.

Under conventional N-rich MOCVD growth conditions and the low growth temperature required for InGaN growth under these conditions, large pits, nucleated at threading dislocation cores in the underlying III-nitride (e.g., GaN) template, open up in the InGaN layer. Thus, the N-rich MOCVD growth conditions are only useful for very thin layers such as quantum wells, inter-layers, and super-lattices, which have characteristic thickness on the order of tens of nm. However, thick, relaxed InGaN layers that can serve as templates upon which to build semiconductor devices are desired.

Figure 16:
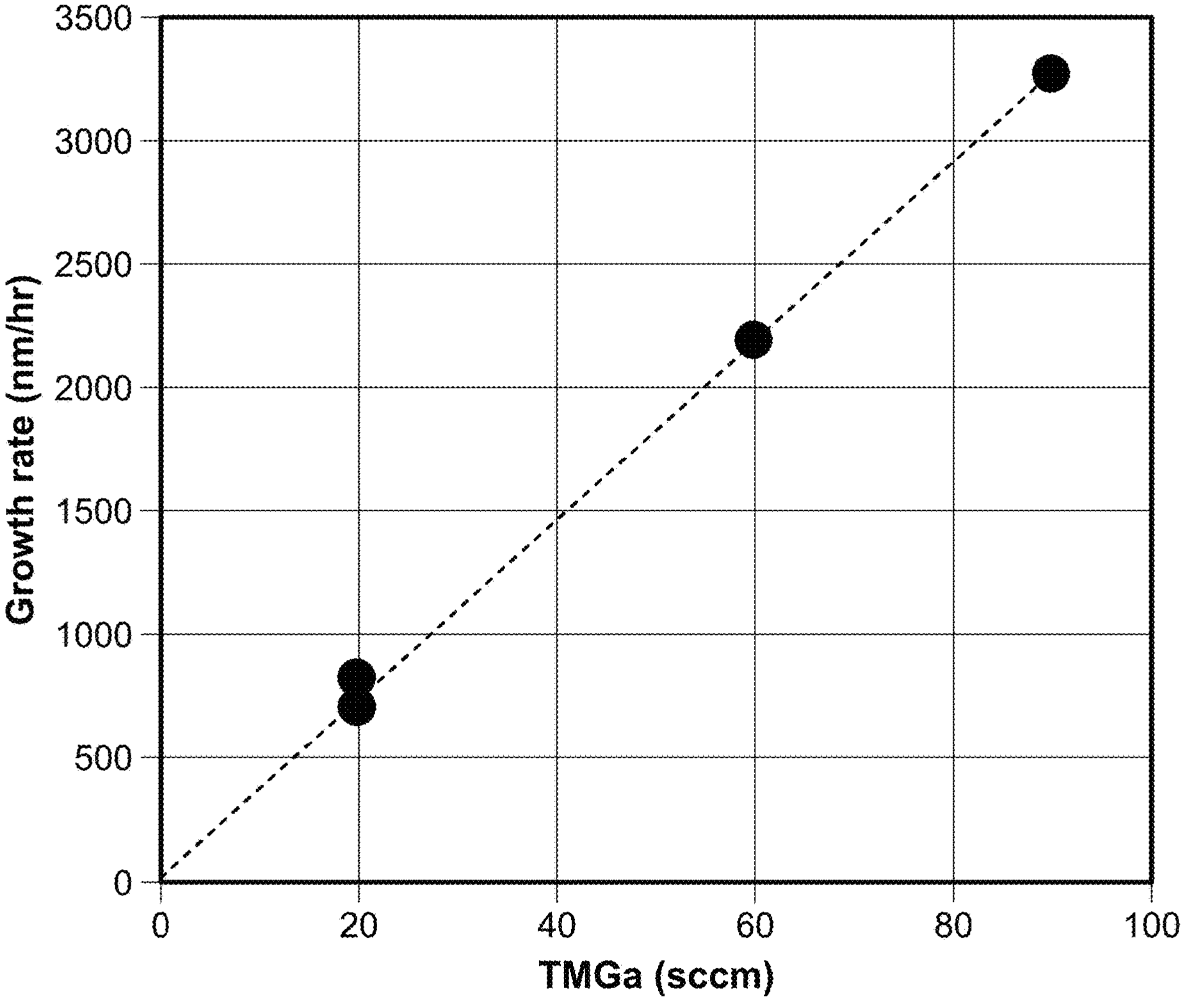
FIG. 16 shows the GaN partial growth rate as a function of TMGa flow rate. The growth rate of InGaN can then be estimated by dividing the TMGa flow rate by the fractional, real TMGa flow rate with respect to the total metalorganic (MO) flow rate.
Figure 17A:
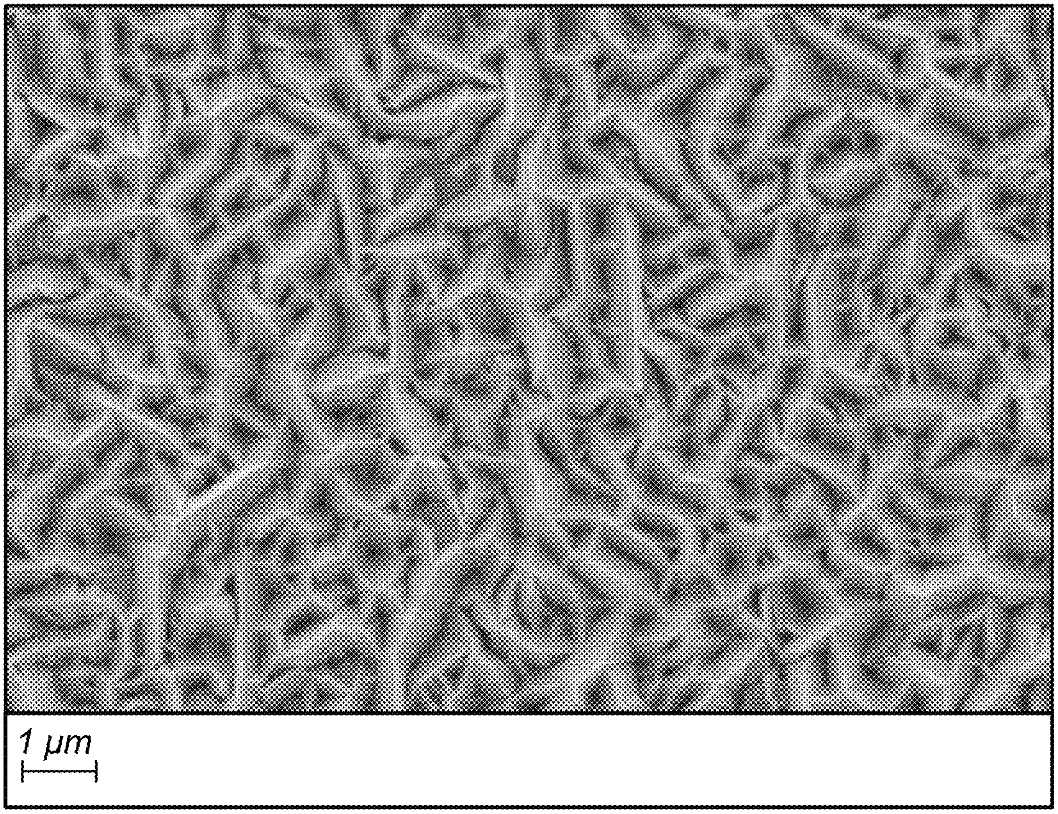
FIGS. 17A-17B shows a plan-view (FIG. 17A) and a cross-sectional view (FIG. 17B) of a thick, relaxed InGaN layer having an InN mole fraction of about 8%, grown by MOCVD under ammonia-rich ("N-rich") conditions, with a rough surface morphology.
Figure 17B:
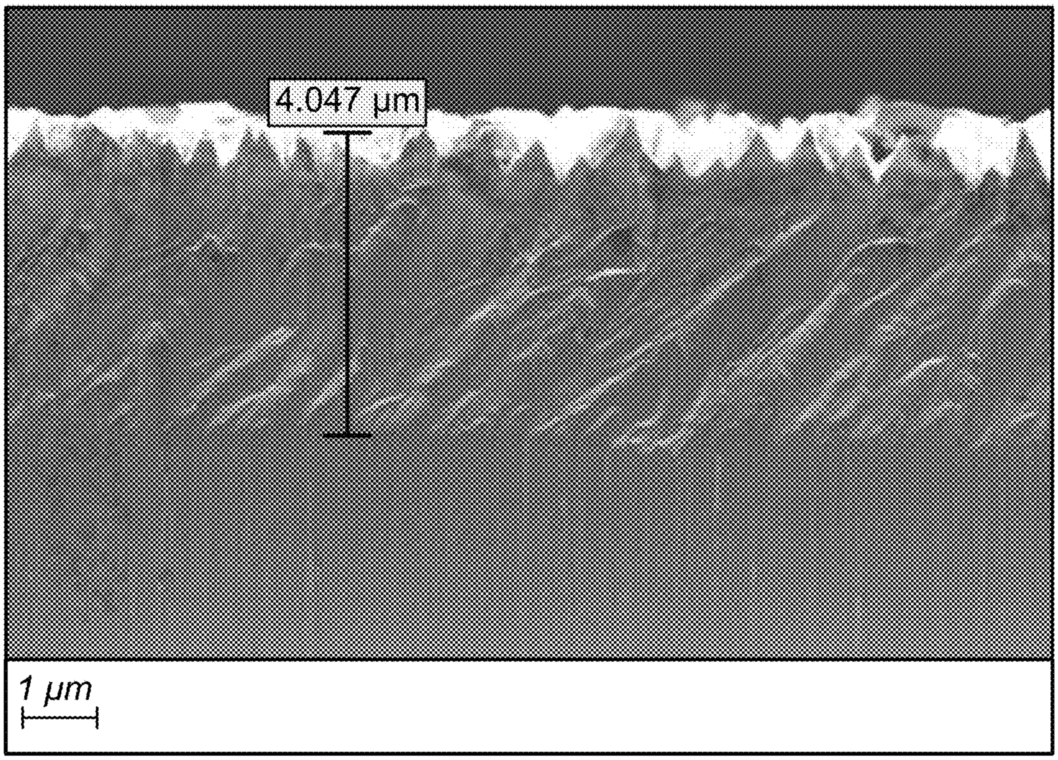

To achieve thick InGaN films, a fast-growth MOCVD method for growing InGaN on GaN or other material using TMG and aiming for high growth rates, for example, of up to 10 μm/hour, such as from 0.5 μm/hour to 5 μm/hour, is provided. The growth can be carried out at a temperature, for example, of about 760° C. under a reactor pressure at 400 mbar. During growth of an InGaN layer, the ammonia flow rate and TMI flow rate can be fixed at 6,000 sccm and 350 sccm, respectively, with $N_2$ used as carrier gas. The total flow rate of TMG flow predominantly determines the growth rate. For example, a TMG flow rate of 50 sccm gives a growth rate of about 2 μm/hour (see FIG. 16). The total gas flow rate (metalorganic, $NH_3$, and carrier gas) entering the reactor can be fixed at 12,000 sccm. The V/III ratio can be about 2,100 (real TMG flow rate is 2.36 sccm, TMI is 0.49 sccm). Thick InGaN films are achieved for these fast-growth MOCVD conditions, and XRD characterization by RSM (not shown) indicates the films are substantially relaxed. However, because the thick InGaN films are formed under N-rich MOCVD conditions, the surface morphology is very rough. FIGS. 17A-17B show a plan-view (FIG. 17A) and a cross-sectional view (FIG. 17B) of a 4 μm-thick, relaxed InGaN layer having an InN mole fraction of about 8%, grown by MOCVD under ammonia-rich ("N-rich") conditions. The rough surface morphology is clearly observed and is not suitable as an InGaN template for growth of optoelectronic devices.

Observing the challenges with N-rich growth, MOCVD growth was initially performed using lower ammonia flows to move to more "metal-rich" (MR) MOCVD conditions, which improved the surface morphology of the relaxed In-containing layer. A "growth window" was identified that provided both a relaxed In-containing III-nitride layer and acceptable surface morphology. For example, MR MOCVD growth can be carried out at 760° C. under a reactor pressure at 400 mbar. The total gas flow (metal oxides (MO), $NH_3$ and carrier gas) in the reactor can be fixed at 8,000 sccm. For a growth rate around 2 μm/hour, the TMG and TMI flows can be fixed at 50 sccm and 350 sccm, respectively, with $N_2$ as the carrier gas. For the growth of a thick MR InGaN layer under these conditions, the ammonia flow used can be fixed at 200 sccm (200 sccm to 400 sccm of ammonia flow). The V/III ratio can be 65 such as with a V/III ratio from 50 to 150. After one hour of MR MOCVD growth, an InGaN layer having a thickness of about 1.75 μm with a smooth and substantially pit-free (0001) oriented InGaN surface can be obtained. The template can be a GaN/sapphire structure, i.e., a GaN layer overlying a sapphire substrate.

The growth regime within the window is referred to as MR MOCVD growth and can be used to provide a "metal rich" (MR) InGaN layer. The smoothness can be characterized by atomic force microscopy (AFM) and can provide an RMS roughness of 4.3 nm (4×4 $\mu m^2$ scan area) for a relaxed MR InGaN layer having an InN mole fraction of about 8% and a thickness of about 1.75 μm on a GaN/sapphire structure. See FIGS. 31A (plan-view) and 31B (cross-sectional view). The RMS roughness of this layer across a 1.5×1.5 $\mu m^2$ scan area is less than 1 nm (about 0.7 nm RMS).

Figure 18:
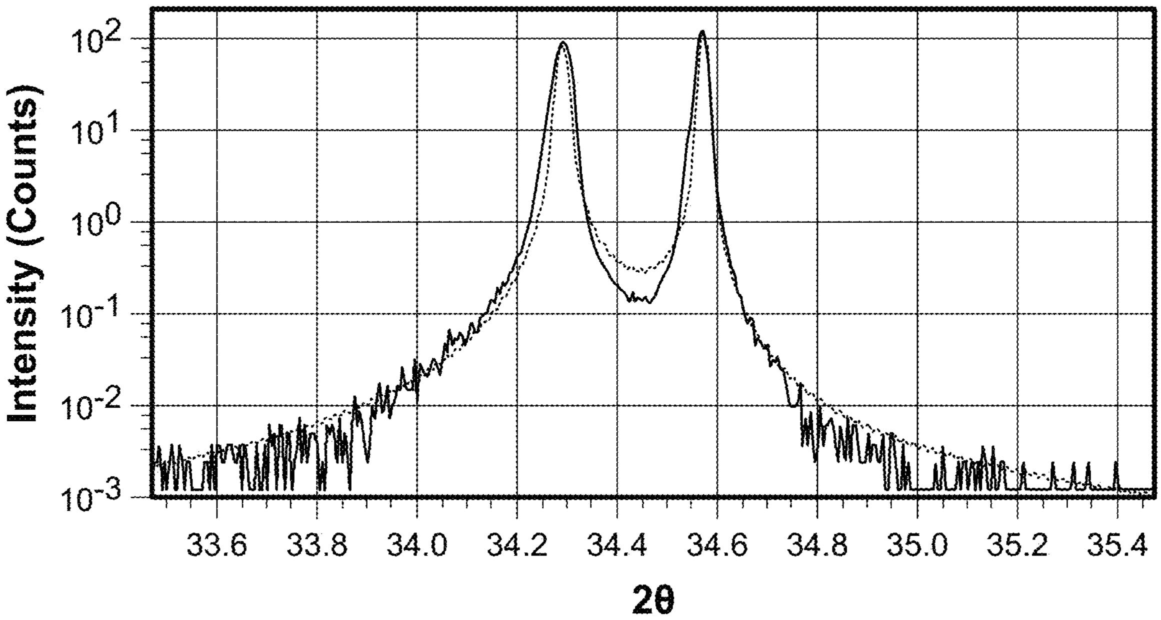
FIG. 18 shows an ω-2θ XRD scan of an MR InGaN layer having an InN mole fraction of about 8% grown on GaN (solid curve), compared to a simulated ω-2θ XRD scan (dotted curve).

X-Ray Diffraction (XRD) data for this MR InGaN layer is characteristic of a high-quality, single-phase layer for the MR InGaN, having an InN mole fraction of about 8% and fully relaxed. The ω-2θ XRD curve is shown in FIG. 18. The 002 (symmetric) diffraction full-width-at-half-maximum (FWHM) is 250 arcsec. The 211 asymmetric (not shown) is 1800 arcsec, suggesting an edge dislocation density greater than 1E10 $cm^{-2}$.

Metal-rich (MR) MOCVD growth conditions refer to semiconductor growth conditions where the ratio of the flow rate of $NH_3$ to the total flow rate of the metalorganics (i.e., the V/III ratio) is less than 200, such as less than 150, or less than 100. For example, the V/III ratio can be between 50 and 150. An example of MR MOCVD growth conditions is summarized in Table 3.

TABLE 5

MR MOCVD Growth Conditions.

| TMI Flow Rate (sccm) | TMG Flow Rate (sccm) | $NH_3$ Flow Rate (sccm) | Tg (° C.) | Result |
|---|---|---|---|---|
| 250-500 | 25-75 | 200-400 | 740-800 | Smooth, substantially pit-free |
| 250-500 | 25-75 | <200 | 740-800 | In droplets |
| 250-500 | 25-75 | >400 | 740-800 | Rough morphology |

The conditions presented in Table 5 refer to growth of InGaN on a planar GaN template overlying a sapphire substrate (GaN/sapphire). For $NH_3$ flow rates of less than 200 sccm droplets of indium formed on the InGaN growth surface. For $NH_3$ flow rates of greater than 400 sccm the InGaN growth surface was characterized by a rough surface morphology and began to exhibit characteristics of N-rich InGaN growth.

The properties of the relaxed InGaN layer obtained using the smooth/substantially pit-free (0001) oriented using the MR MOCVD growth conditions of example Table 3 are summarized in Table 6.

TABLE 6

Relaxed InGaN Layer Properties.

| InN % | Relaxation | Short-range roughness (RMS) | XRD 002 XRD 211 (arcsec) | Thick-ness |
|---|---|---|---|---|
| Up to 16% | 85% to 100% | 4.3 nm (4 × 4 $\mu m^2$)<br><1 nm (1 × 1 $\mu m^2$) | <300<br><1000-3000 | Up to 2 µm |

Under MR MOCVD growth conditions the TMI flow rate can be, for example, from 250 sccm to 500 sccm and the $NH_3$ flow rate can be from 200 sccm to 400 sccm.

Under MR MOCVD growth conditions the TMG flow rate can be, for example, from 25 sccm to 75 sccm and the $NH_3$ flow rate can be from 200 sccm to 400 sccm.

Under MR MOCVD growth conditions the total TMI and TMG flow rate can be, for example, from 225 sccm to 575 sccm and the $NH_3$ flow rate can be from 200 sccm to 400 sccm.

Under MR MOCVD growth conditions the V/III flow rate ratio, can be, for example, from 50 to 150, such as from 75 to 125.

Under MR MOCVD growth conditions the growth temperature can be, for example, from 740° C. to 800° C.

Under MR MOCVD growth conditions the growth temperature can be, for example, from 700° C. to 800° C., from 700° C. to 760° C., from 700° C. to 740° C., or from 700° C. to 720° C.

For example, under MR MOCVD growth conditions the TMI flow rate can be from 250 sccm to 500 sccm, the TMG flow rate can be from 25 sccm to 75 sccm, the $NH_3$ flow rate can be from 200 sccm to 400 sccm, and the growth temperature can be from 700° C. to 800° C. such as from 740° C. to 800° C.

Under MR MOCVD growth conditions the growth rate can be, for example, from 0.5 µm/hour to 10 µm/hour. Under MR MOCVD growth conditions the growth rate can be, for example, less than 5 µm/hour, less than 5 µm/hour, less than 3 µm/hour, or less than 2 µm/hour.

Under MR MOCVD growth conditions the growth temperature can be, for example, from 650° C. to 900° C., such as from 700° C. to 850° C., or from 750° C. to 800° C.

Under MR MOCVD growth conditions the reactor pressure can be, for example, from 200 mbar to 600 mbar, such as from 250 mbar to 550 mbar, or from 300 mbar to 500 mbar.

Under MR MOCVD growth conditions the total gas flow rate can be, for example, 6,000 sccm to 10,000 sccm, from 6,500 sccm to 9,500 sccm, or from 6,000 sccm to 10,000 sccm. The total gas flow rate comprises the sum of the flow rate of the metalorganic, $NH_3$ and a carrier gas. The carrier gas can comprise $N_2$.

Under MR MOCVD growth conditions the TMG flow rate can be, for example, from 25 sccm to 75 sccm.

Under MR MOCVD growth conditions the TMI flow rate can be, for example, from 300 sccm to 400 sccm.

Under MR MOCVD growth conditions the $NH_3$ flow rate can be, for example, from 200 sccm to 250 sccm.

A relaxed Wurtzite In-containing III-nitride layer provided by the present disclosure can be fabricated using MR MOCVD growth conditions and is referred to as an MR layer. The relaxed layer can have a thickness, for example, greater than 100 nm, greater than 500 nm, greater than 1,000 nm, or greater than 2,000 nm. The relaxed layer can have a thickness, for example from 100 nm to 2,000 nm, from 500 nm to 2,000 nm, or from 1,000 nm to 2,000 nm.

Figure 19A:
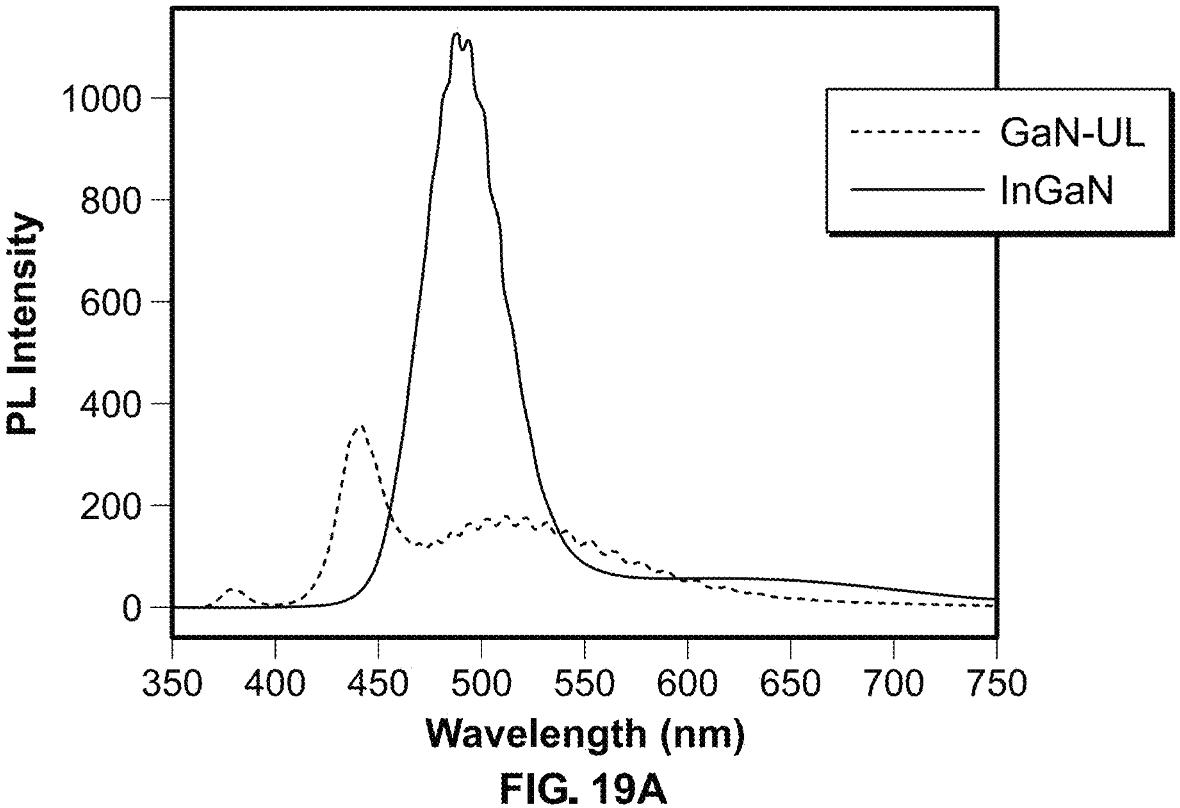
FIGS. 19A-19B show photoluminescence (PL) spectra (FIG. 19A) of MQW structures grown simultaneously on a GaN layer (dashed curve) and on a relaxed MR InGaN layer (InN mole fraction of about 8%) (solid curve); and the corresponding photoluminescence (PL) peak emission wavelength (FIG. 19B) of a series of MQW structures grow as a function of growth temperature (PL excitation wavelength of 325 nm) on the GaN layer, or on a relaxed MR InGaN layer (8% InN mole fraction).
Figure 19B:
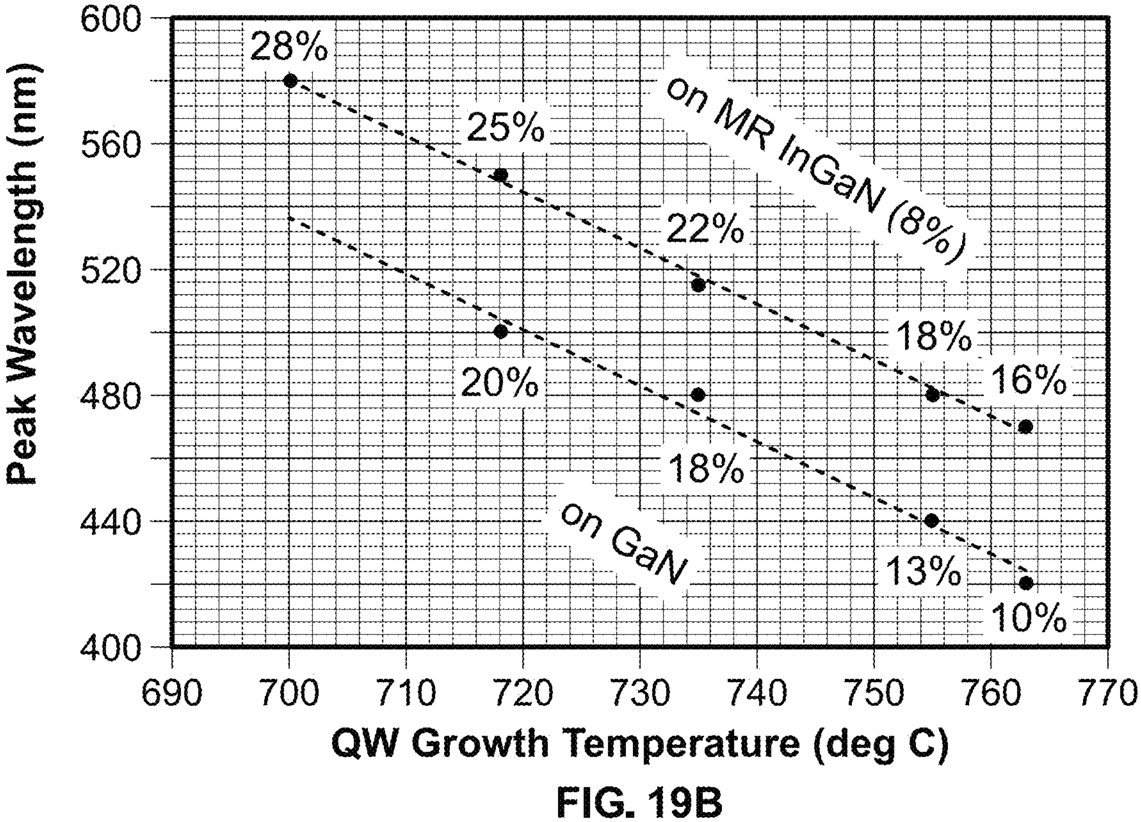

InGaN multiple-quantum-well (MQW) structures were simultaneously grown on MR InGaN templates (8% InN ratio) as well as conventional GaN/sapphire templates. The MQW structures on the MR InGaN template showed a sharp room-temperature photoluminescence (PL) peak with a consistent red-shift of about 50 nm in peak emission wavelength (FIG. 19A solid line) compared to the MQW structures on GaN/sapphire. (FIG. 19A, dashed line) consistent with an increase in MQW InN mole fraction of greater than 5%, demonstrating the benefit of the relaxed InGaN template for facilitating increased InN incorporation in overlying epitaxial device layers. A series of MQW structures grown at different temperatures gave a consistent +50 nm shift in the PL peak emission wavelengths, when grown on relaxed 8% InGaN, compared to GaN, as shown in FIG. 19B.

XRD reciprocal space maps (RSM's) show that for the MQW grown on GaN, each of the MQW layers is pseudomorphic to (e.g., lattice-locked) to GaN. However, in the case of the MR InGaN layer grown on GaN, each of the MQW layers is pseudomorphic to the relaxed MR InGaN base layer. See FIGS. 20A and 20B. Relaxation (e.g., in-plane lattice dilation) in the MR InGaN base layer reduces the strain for the MQW layers compared to the case of growth on GaN, allowing for higher InN mole fraction and/or thicker QWs which can help improve efficiency for both LEDs and LDs, as well as enable achieving longer wavelength emission.

The threading dislocation density of an MR InGaN layer can be reduced using several known methods, such as epitaxial lateral overgrowth (ELOG), growth over in situ $SiN_x$ layers, growth on patterned substrates such as patterned sapphire substrates (PSS), and growth on patterned GaN or InGaN templates. By combining these techniques, high quality relaxed MR InGaN layers can be achieved that can support high performance optoelectronic devices such as LEDs and LDs.

Furthermore, higher InN mole fractions in combination with lower threading dislocation densities can be achieved when MR InGaN layers are grown on relaxed InGaN semipolar (e.g., (10−11)) pyramidal seed regions. For these structures, a GaN/sapphire structure can be patterned with $SiN_x$, leaving openings in a hexagonal array with diameters, for example, from 50 nm to 2.000 nm on a pitch from 50 nm to 2,000 nm. Then, the patterned template can be returned to the MOCVD reactor and growth conditions can be selected to form GaN pyramids that are near or fully apexed and consisting each of six (10−11) pyramidal facets and characterized by a low dislocation density due to the filtering action of the mask and the growth on the pyramidal facets which bends dislocations. Next, InGaN is grown under MR MOCVD growth conditions. Unlike for N-rich InGaN growth on (0001) surfaces, pits do not form, and new dislocations are not created. Nevertheless, the InGaN layers relax, presumably due to "slip" along the $SiN_x$ mask. The method provides a relaxed InGaN layer having a high InN mole fraction with a (0001) semipolar interface region.

A seed region such as a seed region comprising pyramidal seed structures can comprise a planarization layer overlying the seed structures and covering the seed structures. The planarization layer can comprise InGaN having a low In content such as an InN mole fraction such as less than 1% or less than 0.1%. A relaxed In-containing III-nitride layer can be grown over the planarization layer using MR MOCVD growth conditions.

A relaxed In-containing III-nitride layer can be grown over a slip region deposited on a template. The slip region can comprise, for example, one or more non-continuous slip regions.

A slip region refers to a non-continuous area of a dielectric material that overlies the surface of a template prior to growth of the overlying relaxed In-containing III-nitride layer. The relaxed In-containing III-nitride layer is grown on the slip region and regions of the template not covered by the slip region.

In a cross-sectional view of an epitaxial structure in which the relaxed In-containing III-nitride layer is grown over the slip region and the template, a slip region can appear to be embedded in the relaxed In-containing III-nitride layer, embedded in the template, or a combination thereof. The slip region can be randomly disposed across the surface of the template.

A slip region can comprise a dielectric material. Examples of a suitable dielectric material include metal oxides, non-metal oxides, metal nitrides, and non-metal nitrides. For example, a slip region can comprise AlN, TIN, $SiO_x$, $SiN_x$, or a combination of any of the foregoing. For example, a slip region can comprise $SiN_x$.

A slip region can have an average thickness, for example, of less than 6 nm, less than 4 nm, less than 2 nm, or less than 1 nm. A slip region can have an average thickness, for example, from 0.5 nm to 5 nm, from 0.5 nm to 3 nm, from 0.5 nm to 2 nm, or from 0.5 nm to 1 nm.

A slip region can have a maximum thickness, for example, of less than 6 nm, less than 4 nm, less than 2 nm, or less than 1 nm. A slip region can have a maximum thickness, for example, from 0.1 nm to 10 nm, from 10.1 nm to 3 nm, from 0.1 nm to 2 nm, or from 0.1 nm to 1 nm.

A slip region can form, for example, a non-continuous layer on the surface of a template. A slip region can be in the form of islands. A slip region can include irregularly shaped areas.

A slip region can comprise, for example, non-continuous nanoscale platelets. Multiple portions of a slip region can be randomly distributed across the template surface. The slip region can decorate the template surface.

A slip region can cover, for example, greater than 10%, greater than 20%, greater than 30%, greater than 40%, greater than 50%, greater than 60%, greater than 70%, or greater than 80% of a template surface.

A slip region can cover, for example, less than 90%, less than 80%, less than 70%, less than 60%, less than 40%, less than 30%, or less than 20% of a template surface.

A slip region can cover, for example, from 10% to 90% of a template surface, from 10% to 80%, from 10% to 70%, from 10% to 60%, from 10% to 50%, from 10% to 40%, or from 10% to 20% of a template surface.

A slip region can cover, for example, from 80% to 90% of a template surface, from 70% to 90%, from 60% to 90%, from 50% to 90%, from 40% to 90%, from 30% to 90%, or from 20% to 90% of a template surface.

A slip region can cover, for example, from 10% to 90% of a template surface, from 20% to 80%, from 30% to 70%, or from 40% to 60%, of a template surface.

A slip region can be deposited on a template surface in situ in an MOCVD reactor. The slip region can be formed by flowing inorganic precursors into the MOCVD reactor. A slip region can be formed by exposing the template surface with the inorganic precursors for a short period of time such as, for example for less than 10 minutes, less than 8 minutes, less than 6 minutes, less than 4 minutes, less than 2 minutes, or less than 1 minute. During this time the chamber concentration can be from 50 mbar to 100 mbar.

The slip region is optionally not patterned or defined using lithography.

A slip region can be deposited at a MOCVD reactor temperature, for example, from 650° C. to 850° C.

A slip region can be deposited at a MOCVD reactor pressure, for example, from 50 mbar to 100 mbar.

A slip region can be deposited using an inorganic precursor flow rate, for example, of from 60 sccm to 120 sccm.

A slip region can be deposited using a total gas flow rate, for example, of from 6,000 sccm to 10,000 sccm.

A slip region can be deposited using an ammonia flow rate, for example, of from 100 sccm to 300 sccm.

A slip region can be deposited using, for example, $H_2$ as the carrier gas.

A slip region can be deposited by exposing the template surface to the dielectric precursors, for example, for from 1 minute to 10 minutes, For example, the slip region can be $SiN_x$ and the dielectric precursors can be silane and ammonia.

A semiconductor structure provided by the present disclosure can comprise a slip region overlying and adjoining a template surface.

A template can comprise a Wurtzite III-nitride material having a (0001) oriented surface.

A template can comprise, for example, GaN, $In_xGa_{1-x}N$, or $In_xAl_yGa_{1-x-y}N$.

A template surface can be planar and have a (0001) orientation.

A template surface can have an RMS roughness, for example, of less than 10 nm, less than 5 nm, or less than 1 nm RMS over a 1 μm×1 μm area; and/or less than 20 nm, less than 10 nm, or less than 5 nm over a 5 μm×5 μm area.

A semiconductor structure can comprise a relaxed In-containing III-nitride layer overlying and adjoining a slip region and a template surface.

A semiconductor structure can comprise a relaxed In-containing III-nitride layer overlying and adjoining a slip region and a template surface and overlying a substrate.

A substrate can comprise any suitable material such as, for example, silicon, sapphire, silicon carbide, or QST® (Qromis Substrate Technology).

Methods provided by the present disclosure include methods of depositing a slip region on a template surface such as the surface of a III-nitride layer such as a GaN layer.

Depositing a slip region on a III-nitride template surface can comprise depositing a dielectric material in situ in a MOCVD reactor.

Depositing a slip region can comprise exposing a surface of a III-nitride layer with dielectric precursors.

Following depositing a slip region, further methods can comprise annealing the slip region, treating the slip region such as treating the slip region with a surfactant.

FIGS. 32A-32D show plan-views of relaxed InGaN layers grown under different growth conditions.

Figure 32A:
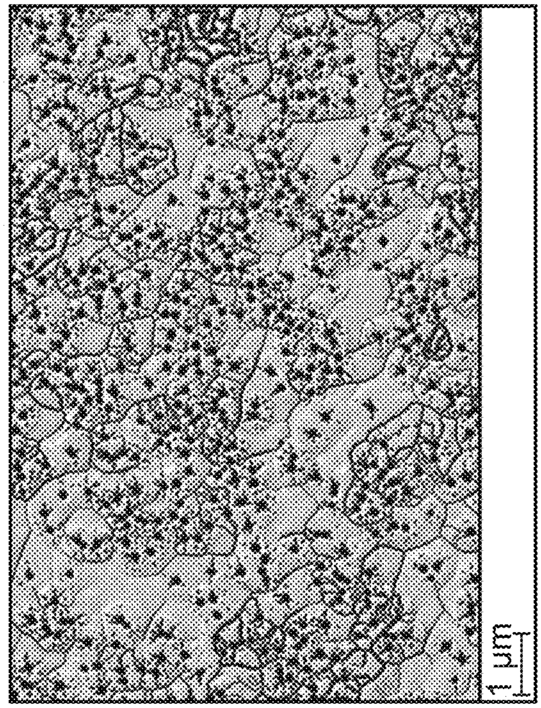
FIGS. 32A-32D show plan-view SEM images of thick relaxed InGaN layer having an InN mole fraction of about 8% grown under nitrogen-rich MOCVD conditions (FIGS. 32A and 32B) or under metal-rich MOCVD conditions (FIGS. 32C and 32D), without a slip layer between the InGaN layer and the underlying GaN growth surface (FIGS. 32A and 32C), or with a slip layer between the InGaN layer and the underlying GaN growth surface (FIGS. 32B and 32D).

FIG. 32A shows a plan-view of a InGaN layer having an about 8% InN mole fraction grown directly on a GaN template under conventional ammonia-rich MOCVD growth conditions. The thickness was about 430 nm.

Figure 32B:
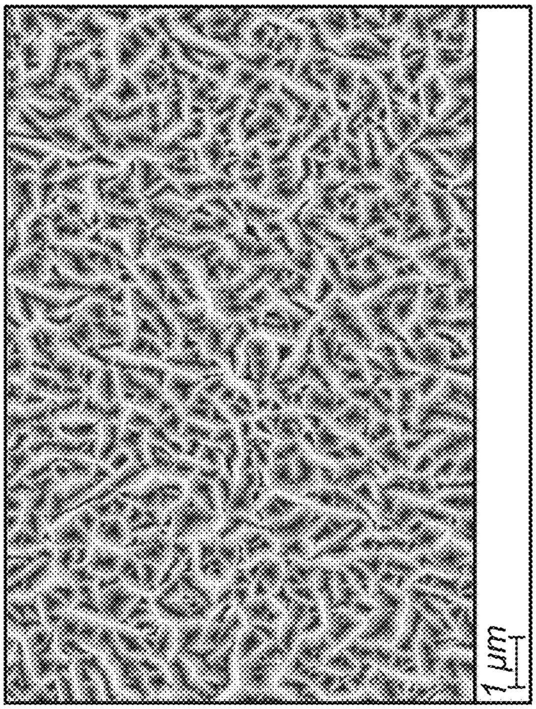

FIG. 32B shows a plan-view of a InGaN layer having an about 8% InN mole fraction grown on a GaN template with a slip region under ammonia-rich MOCVD growth conditions. The relaxed InGaN surface is characterized by a surface having a highly non-uniform and rough morphology and with a non-uniform InN mole percent across the InGaN surface. The thickness was about 2.3 μm.

Figure 32C:
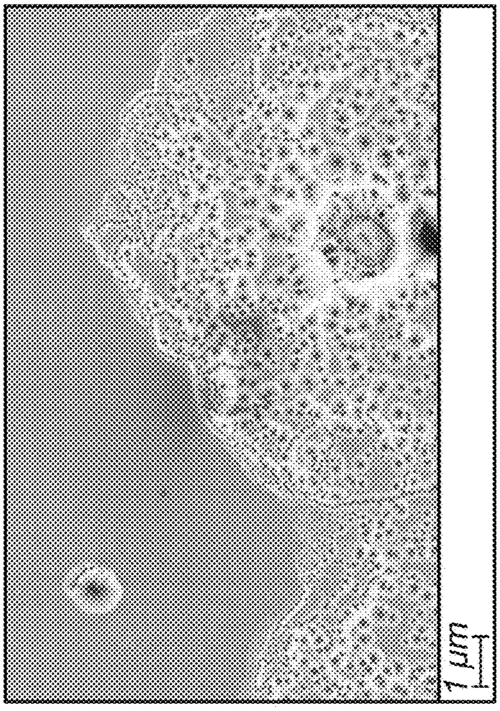

FIG. 32C shows a plan-view of a InGaN layer having an about 8% InN mole fraction grown directly on a planar GaN template under MR MOCVD growth conditions but with no slip region included at the GaN/InGaN interface. The relaxed InGaN surface is characterized by a mix of regions, including some that are relaxed with rough morphology and others that are smooth pseudomorphic regions. The thickness was about 1.1 μm.

Figure 32D:
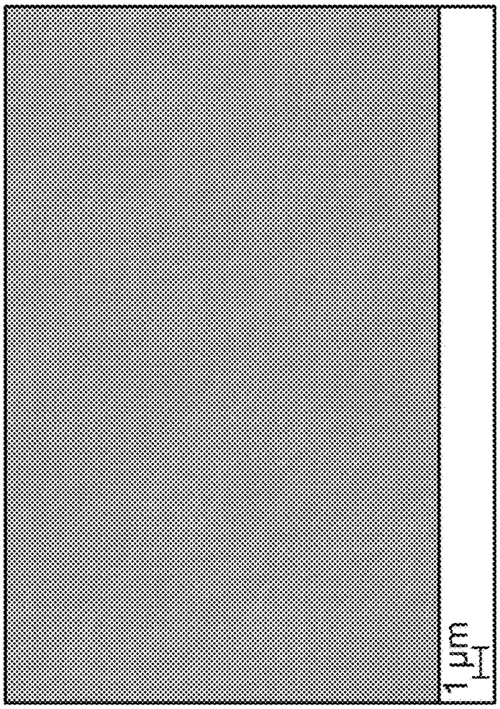

FIG. 32D shows a plan-view of a relaxed InGaN layer having an about 8% InN mole fraction grown on a planar GaN template with a slip region under MR MOCVD growth conditions. The relaxed InGaN surface is smooth, substantially free of pits and has a uniform InN mole fraction across the InGaN surface. The thickness was about 2.25 μm.

In summary FIGS. 32A-32D show scanning electron microscope (SEM) images of InGaN layers grown under four different conditions to systematically evaluate the effect of gas-phase chemistry and interfacial engineering on the morphology of thick InGaN films. The images are arranged in a 2×2 table, where the rows distinguish between ammonia-rich (upper row) and metal-rich (lower row) growth conditions and the columns denote the presence (right column) or absence (left column) of a slip layer. In each case an InN mole fraction of about 8% and thickness above 100 nm was targeted.

Figure 33A:
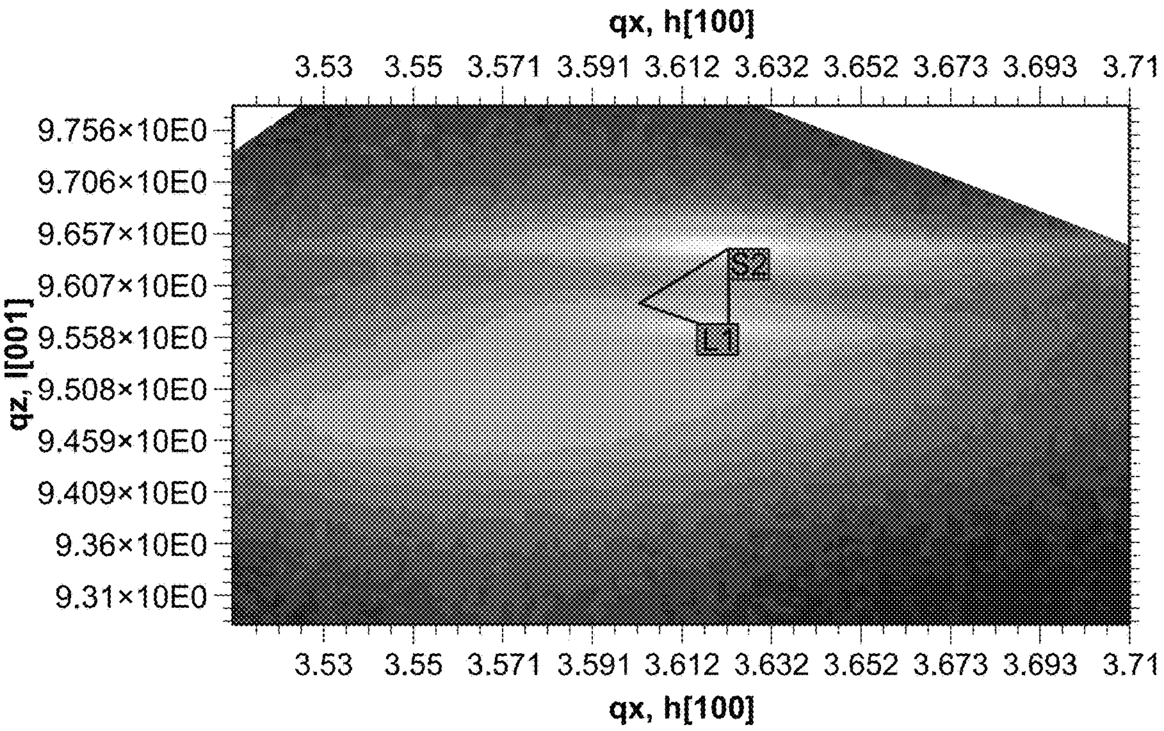
FIGS. 33A-33B show XRD RSM images of a mixed-strain (relaxed and pseudomorphic) InGaN layer grown directly on a GaN surface without an intervening slip layer (FIG. 33A) and a relaxed InGaN layer grown on a GaN surface having an intervening slip layer (FIG. 33B) under MR-MOCVD growth conditions.
Figure 33B:
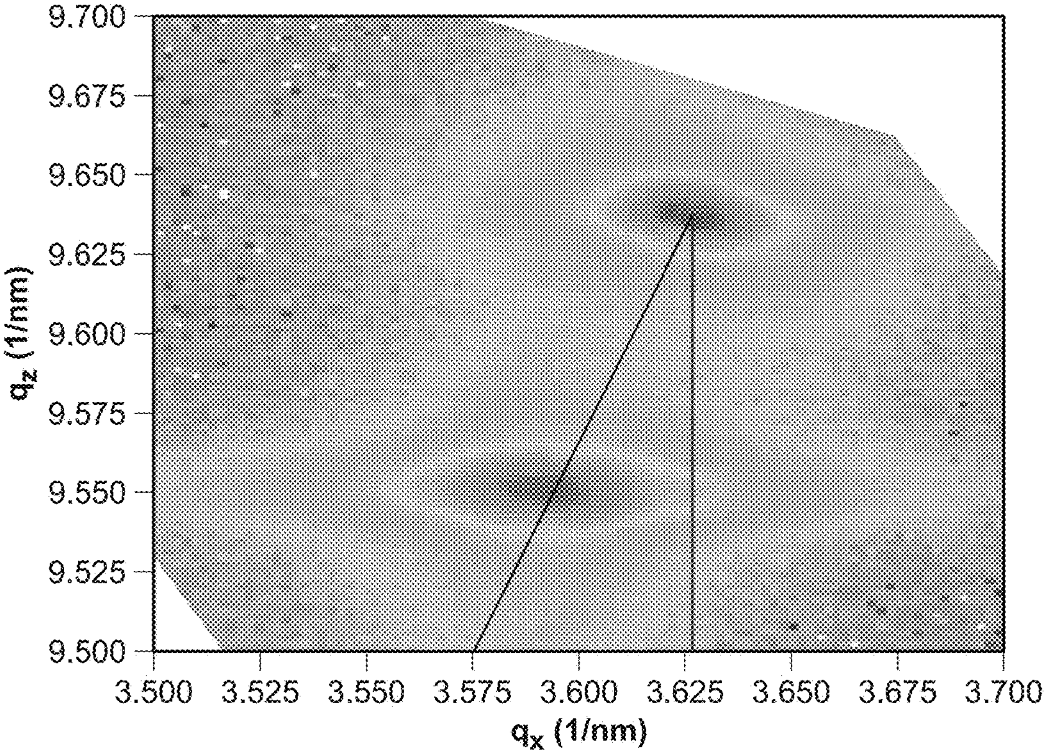

FIGS. 33A-33B show reciprocal space maps (RSMs) obtained via X-ray diffraction (XRD) for InGaN layers grown under metal-rich conditions, with and without the use of a slip layer, corresponding to the layers of FIGS. 32D and 32C, respectively. In FIG. 33A, the InGaN layer was grown directly on a GaN template without a slip layer. The XRD peak associated with the InGaN is partially shifted, indicating incomplete relaxation, and a large pseudomorphic component. In FIG. 33B the introduction of a slip layer results in a fully relaxed InGaN layer, as evidenced by the alignment of the InGaN peak along the relaxation line in reciprocal space, consistent with the requisite shift in the a-lattice parameter. The data confirm that the slip layer enables full strain relaxation in a high-quality epitaxial layer. Strain relaxation may occur through one or more mechanisms, including misfit dislocation formation, glide-assisted dislocation motion, and elastic relaxation.

Figure 34B:
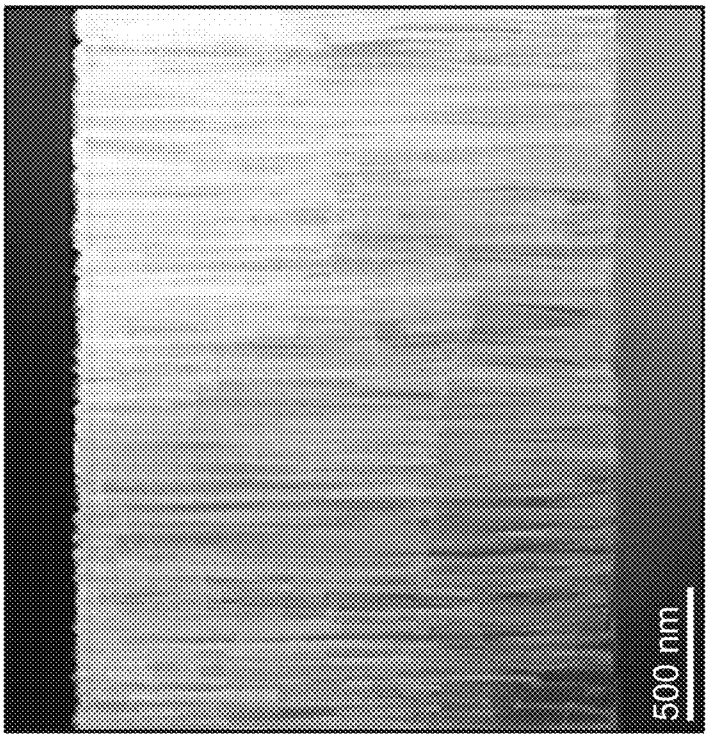
FIGS. 34A-34B show TEM images of a mixed-strain (pseudomorphic) InGaN layer grown directly on a GaN surface without an intervening slip layer (FIG. 34A) and a relaxed InGaN layer grown on a GaN surface having an intervening slip layer (FIG. 34B) under MR-MOCVD growth conditions.
Figure 34A:
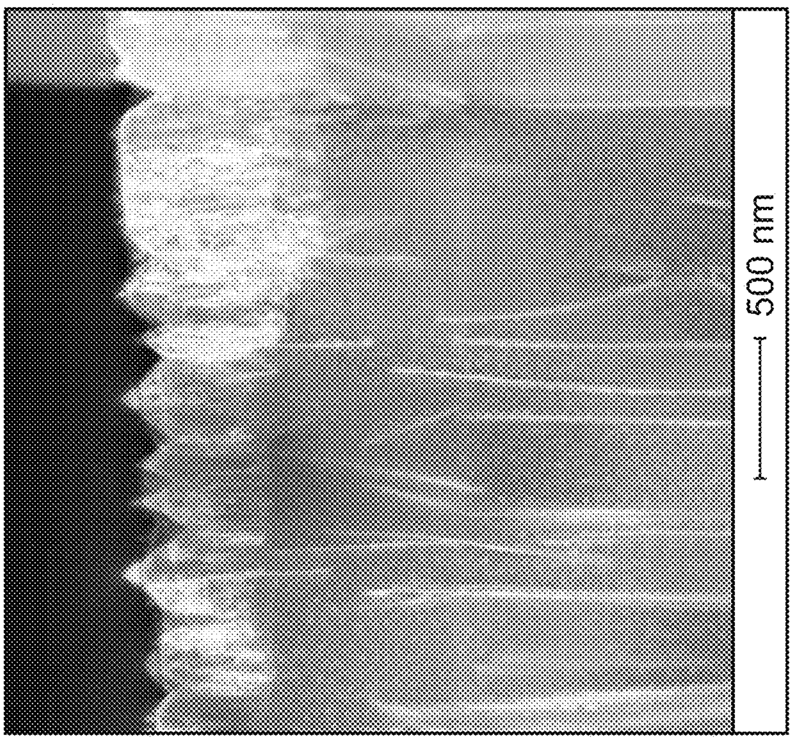

FIGS. 34A-34B show cross-sectional TEM images of the same samples characterized in FIGS. 33A-33B. The image in FIG. 34A shows a non-planar, faceted InGaN film grown under metal-rich conditions without a slip layer, revealing inconsistent layer thickness and poor surface quality in this uncontrolled strain-relief situation. In contrast, the image in FIG. 34B illustrates a flat, uniform InGaN film grown with a slip layer under identical metal-rich conditions. The layer is thick (more than two microns) and flat. The vertical striations are due to the presence of edge dislocations created at the interface to allow relaxation to occur. (The small pits at the surface are due to the presence of a MQW test structure grown under conventional ammonia-rich conditions.) These results confirm that the slip layer promotes both relaxation and morphology stabilization in thick InGaN films.

A relaxed In-containing III-nitride material can comprise $In_xAl_yGa_{1-x-y}N$ wherein x>1, and 0≤y≤1.

A relaxed In-containing III-nitride material can have an in-plane a-lattice parameter that differs from the in-plane a-lattice parameter of an underlying III-nitride template, for example, greater than +0.1%, greater than ±0.5%, greater than ±1%, greater than ±1%, greater than ±2%, or greater than ±5%.

A III-nitride template can comprise, for example, GaN, AlN, or $In_xAl_yGa_{1-x-y}N$ wherein x>1, and 0≤y≤1 such as $In_xGa_{1-x}N$.

Figure 35B:
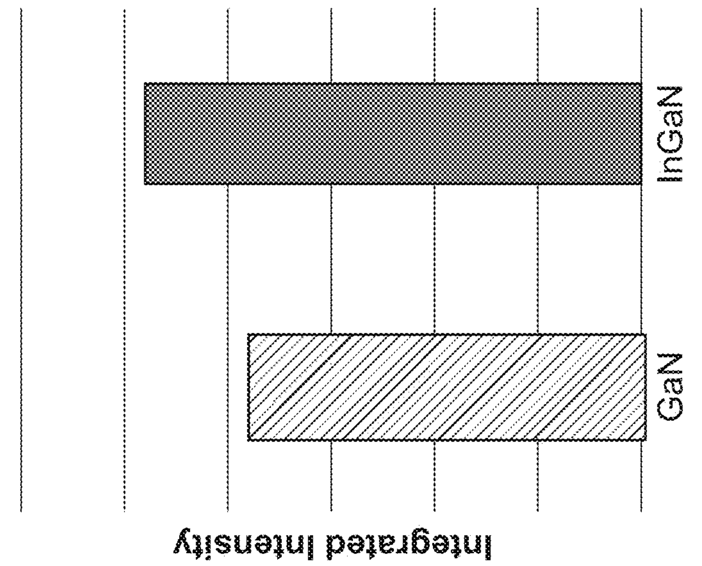
FIG. 35B shows the integrated photoluminescence (PL) intensity (325 nm excitation) of the emission from the MQW structures grown simultaneously on a GaN layer (left) or on the relaxed InGaN (InN mole fraction of about 8%) layer (right) described for FIG. 35A.
Figure 35A:
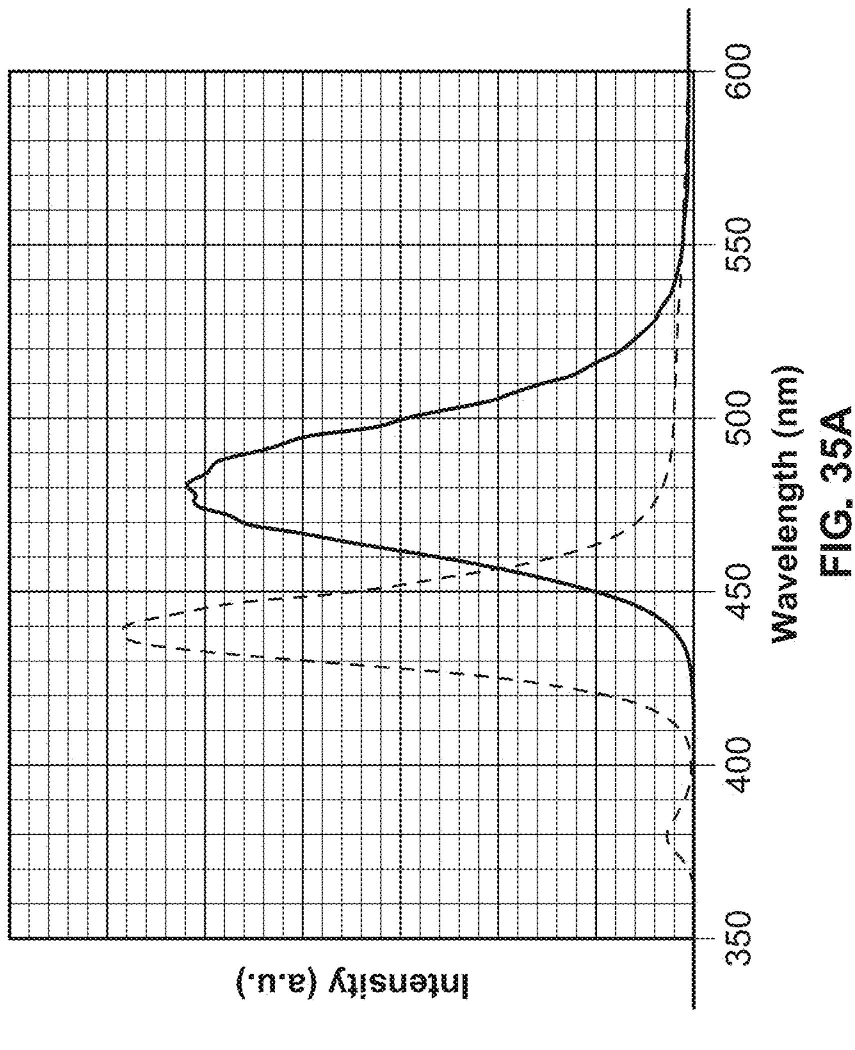
FIG. 35A shows photoluminescence (PL) spectra of MQW structures grown simultaneously on relaxed InGaN layer (InN mole fraction of about 8%-solid curve), or on GaN layer (dashed curve)

Photoluminescence spectra of relaxed InGaN layer grown directly on a planar GaN template (dashed line) under MR MOCVD growth conditions and an InGaN layer grown on a planar GaN template decorated with a $Si_3N_4$ slip region (solid line), are shown in FIG. 35A. FIG. 35B shows the integrated photoluminescence for the spectra shown in FIG. 35A.

FIGS. 35A-35B show 325-nm-excitation photoluminescence (PL) spectra from identical MQW structures grown simultaneously in the same reactor on two different templates: (1) conventional GaN and (2) 8% smooth, relaxed (Native) InGaN. Both were excited at 325 nm. The MQW on GaN (dashed line) shows expected PL emission in the blue. The MQW on 8% Native InGaN® exhibits a peak emission wavelength red-shifted by approximately 50 nm relative to that on GaN, and also shows higher integrated PL intensity (table at right). This result demonstrates that the relaxed base layer of Native InGaN® modifies the strain state increases In incorporation in the MQW, resulting in longer wavelength emission and enhanced radiative efficiency compared to the typical case under highly strained conditions, which degrade radiative recombination efficiency due to the QCSE. Interesting, this bright PL emission is observed for the MQW on the 8% Native InGaN® despite having a much higher threading dislocation density than the case of growth on GaN.

Figure 36:
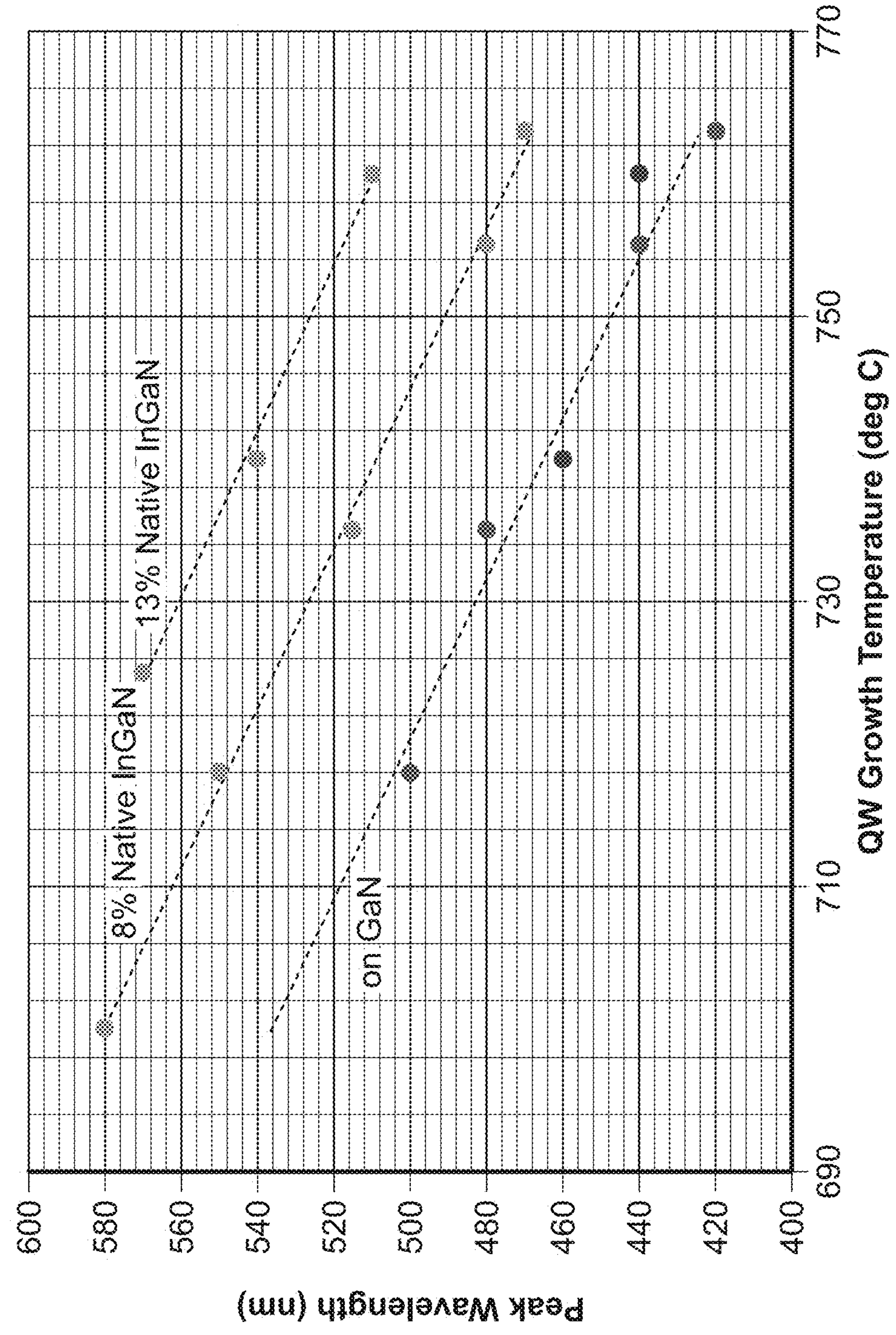
FIG. 36 shows the simulated photoluminescence (PL) peak emission wavelength of a series of MQW structures grown on GaN, relaxed 8% InGaN, and relaxed 13% InGaN layers as a function of growth temperature (PL excitation wavelength of 325 nm). The solid circles represent measurements.

FIG. 36 shows the relationship between MQW growth temperature and peak PL emission wavelength for three substrate conditions: GaN, 8% Native InGaN, and 13% Native InGaN®. Each dataset shows a linear trend, with Native InGaN®-based templates producing MQW emission red shifts of approximately 50 nm (8%) and 80 nm (13%), respectively, relative to growth on GaN. Additionally, the relaxed lattice constant of Native InGaN permits MQWs to be grown at higher temperatures for the same emission wavelength, e.g., 500 nm emitters can be grown at about 760° C. on 13% Native InGaN® compared to about 20° C. on GaN. This increase in growth temperature (about 40° C. in this example) allows for better adatom mobility and improved optical and structural quality. Even higher temperature (and further improved quality) growth can be expected for growth using Atmospheric Pressure (AP) MOCVD.

Figure 37:
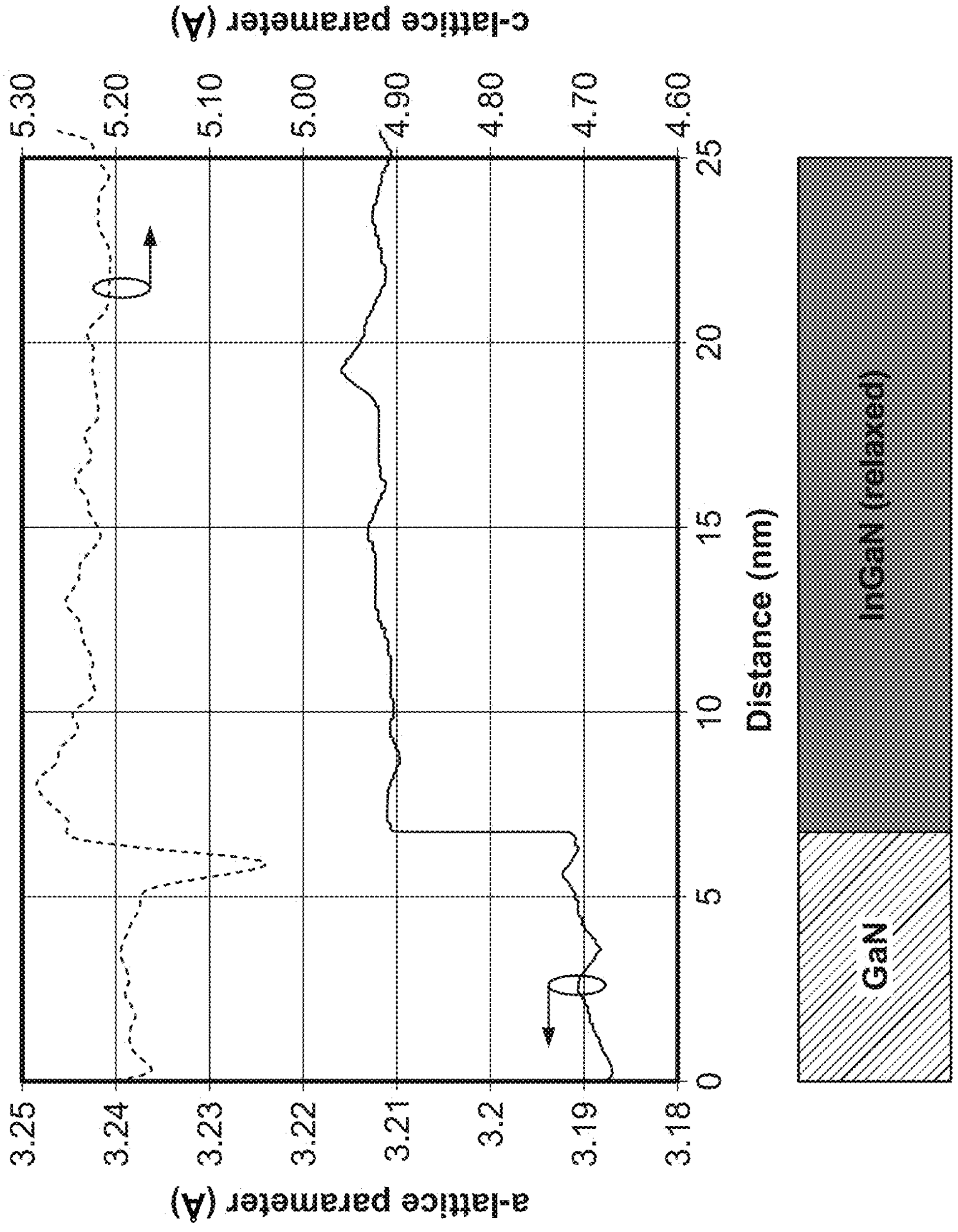
FIG. 37 shows the in-plane a-lattice parameter (solid line) and the c-lattice parameter (dashed line) of a semiconductor structure comprising a GaN layer, a relaxed InGaN layer, and a slip region (not shown) at the interface between the GaN layer and the InGaN layer, wherein the InGaN layer is grown under MR MOCVD conditions.

FIG. 37 shows a schematic representation of a GaN/InGaN stack lined up with (above) a high-resolution TEM strain map showing the a- and c-lattice parameters as a function of depth across the interface. The GaN region exhibits standard, expected lattice parameters for the a- and c-lattices. Near the interface, the c-lattice parameter compresses as the film accommodates compressive stress from InGaN. Almost simultaneously, the a-lattice parameter abruptly dilates over a very narrow region (<2 nm), followed by release of the c-lattice. This transition marks the onset of full relaxation in the InGaN film, confirming that strain decoupling is abrupt and localized, enabled by the presence of the slip layer which is present between the GaN and InGaN layers. The InGaN layer is grown under metal-rich conditions and is fully relaxed and smooth. The average a-lattice parameter for the InGaN layer is 3.212 Å, bounded by a measurement range of 3.210 Å to 3.216 Å.

Before growing the InGaN layer, a slip region was applied to the surface of the GaN template to partially cover the planar (0001) oriented GaN surface.

A semiconductor structure provided by the present disclosure can comprise one or more slip regions. For example, a semiconductor structure provided by the present disclosure can comprise one, two, three, four, or more slip regions. Each of the slip regions can be substantially the same or different. For example, each of the slip regions can comprise a different dielectric material, a different dielectric strength, a different average thickness, a different surface coverage, and/or can be deposited under different conditions.

A semiconductor structure can comprise a first slip region and a second slip region overlying a template such as a III-nitride template.

The first and second slip region can independently overly and adjoin, for example, a template, a relaxed In-containing III-nitride layer an In-containing III-nitride layer, or other epitaxial layer.

For example, a first slip region can overlie a template, one or more epitaxial layers can overly the slip region and the template, and a second slip region can overlie the one or more epitaxial layers and can partially cover and adjoin the uppermost epitaxial layer.

A semiconductor structure can comprise, for example, a III-nitride template, a first slip region adjoining the III-nitride template surface, a first relaxed In-containing III-nitride layer adjoining the first slip region and a portion of the III-nitride template surface, optional one or more epitaxial layers overlying the first relaxed In-containing III-nitride layer, a second slip region adjoining the first relaxed In-containing III-nitride layer surface or uppermost epitaxial layer, and a second relaxed In-containing nitride layer adjoining the second slip region and a portion of the first relaxed In-containing III-nitride layer or uppermost epitaxial layer not covered by the second slip region.

A semiconductor structure can comprise, for example, a first III-nitride epitaxial layer, a first slip region adjoining the first III-nitride epitaxial layer surface, a first relaxed In-containing nitride layer adjoining the first slip region and a portion of the III-nitride epitaxial layer surface not covered by the first slip region, one or more first III-nitride epitaxial layers overlying the first relaxed In-containing III-nitride layer, a second slip region adjoining the uppermost of the one or more first III-nitride epaxial layers, a second relaxed In-containing III-nitride layer adjoining the second slip region and a portion of the uppermost of the one or more III-nitride epitaxial layers.

The semiconductor structure can further comprise, for example, a substrate underlying the first III-nitride epitaxial layer and/or one or more epitaxial layers overlying the second relaxed In-containing III-nitride layer.

Each of the first relaxed In-containing III-nitride layer and the second relaxed In-containing III-nitride layer can have a thickness greater than 100 nm and/or the surface can be substantially free of pits.

Each of the first relaxed In-containing III-nitride layer and the second relaxed In-containing III-nitride layer can have the same or different InN mole fraction.

Each of the first relaxed In-containing III-nitride layer and the second relaxed In-containing III-nitride layer can have a surface with the same or different in-plane a-lattice parameter.

Each of the one or more first epitaxial layers and the second one or more epitaxial layers can independently comprise an active region.

Each active region can comprise the same InN mole fraction or a different InN mole fraction.

Each active region can be configured to emit radiation within a different wavelength range.

Figure 38A:
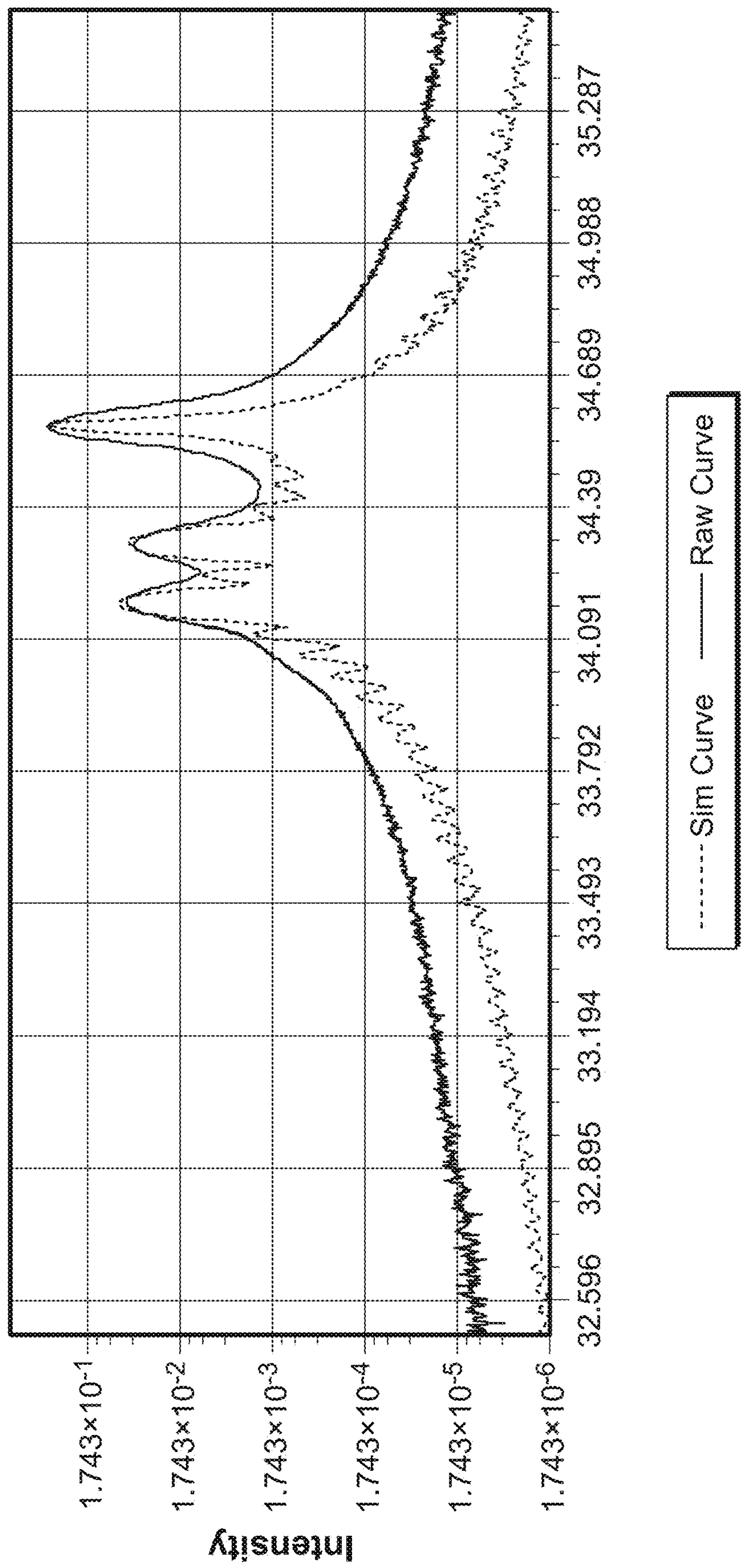
FIGS. 38A-38C show a semiconductor structure having a GaN template, and first slip region, a first relaxed InGaN layer having a 7.5% InN mole fraction, a second slip region, and a second relaxed InGaN layer having a 11.5% InN mole fraction. XRD RSM measurements of the monolithic structure shown in FIG. 38B, and a ω-2θ XRD measurement of the structure is shown in FIG. 38A (solid line) compared to a simulated ω-2θ XRD scan (dotted line). The monolithic stack layout is shown in FIG. 38C.

An example of a semiconductor structure is shown in FIG. 38A. As shown in FIG. 38A, a first slip region overlies a GaN template having an in-plane a-lattice parameter of 3.186 Å grown on a planar GaN template with a slip region. A 180 nm-thick first relaxed InGaN layer having a 7.5% InN mole fraction and a characteristic in-plane a-lattice parameter of 3.215 Å overlies the first slip region. A second slip region overlies the planar surface of the first relaxed InGaN layer, and a second 200 nm-thick relaxed InGaN layer having an 11.5% InN mole fraction and a characteristic in-plane a-lattice parameter of 3.229 Å is grown. The semiconductor structure represents a fully planar, monolithic element, with thick InGaN layers having different in-plane a-lattice parameters, and both dilated with respect to the GaN template in-plane a-lattice parameter.

Although the first and second slip regions are shown as continuous layers in FIG. 38A, it will be understood that the first and second slip regions are non-continuous decorated areas partially covering the surface of the underlying material. Also, the layers shown in FIG. 38A are not drawn to scale.

Figure 38B:
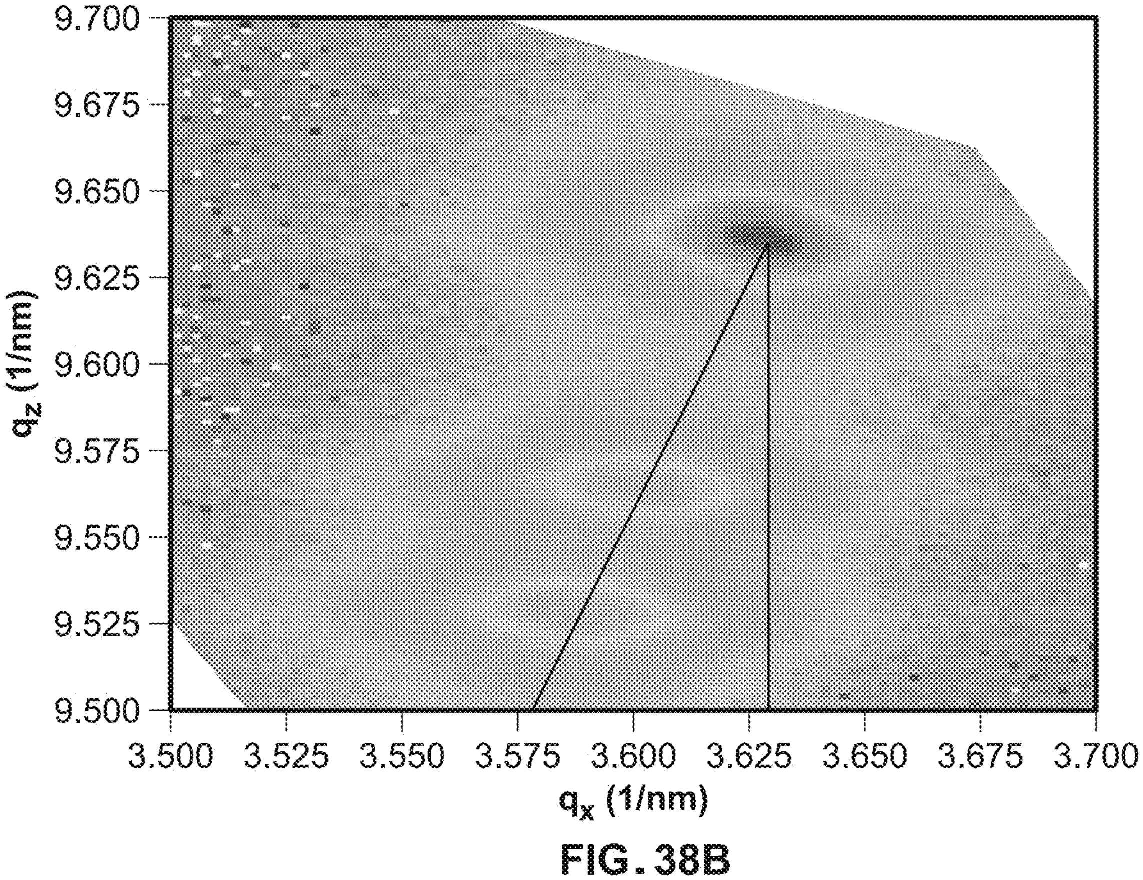

FIG. 38B shows an XRD RSM of a structure containing two relaxed InGaN layers of different compositions, grown in sequence with an intermediate (second) slip layer between them. The starting surface is GaN (0001). The first region is about 7.5% InGaN with a thickness of about 180 nm, grown on the GaN with a first slip-region in between. The second layer is about 11.5% InGaN with a thickness of about 200 nm, grown on the first region with the second slip-layer in between. XRD analysis gives the a-lattice parameters for the two layers as 3.215 Å, and 3.229 Å, respectively. The RSM shows two distinct Bragg peaks for the InGaN layers, shifted from the GaN pseudomorphic line, indicating that each layer has its own unique relaxed lattice constant. This evidence confirms that the invention enables the engineering of vertically stacked, compositionally distinct, relaxed InGaN layers: an unprecedented capability in III-nitride epitaxy.

Figure 38C:
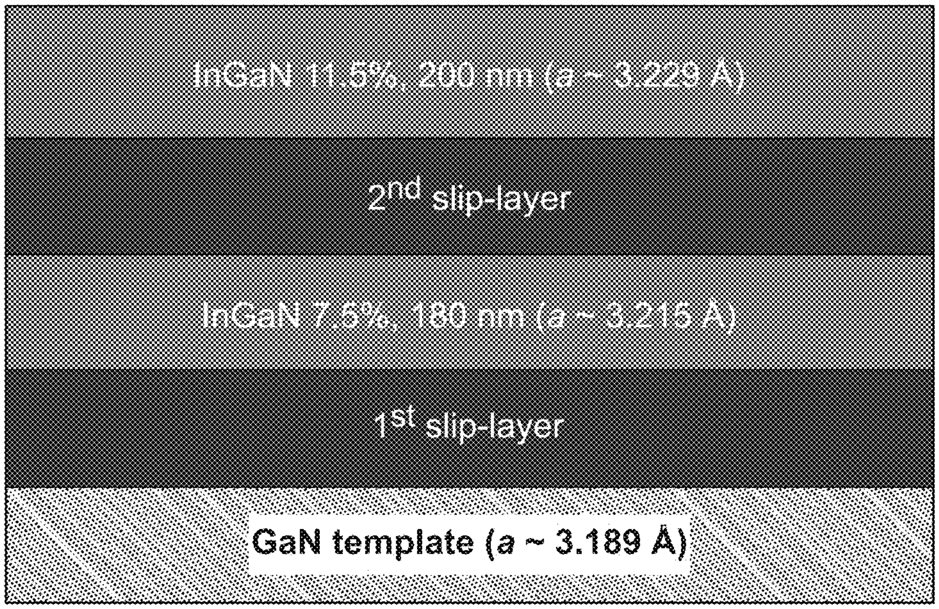

FIG. 38C shows a ω-2θ XRD scan of the semiconductor structure shown in FIG. 38A. The ω-2θ XRD scan shows diffraction peaks associated with each two relaxed InGaN layers and the GaN template.

Figures 39A, 39B:
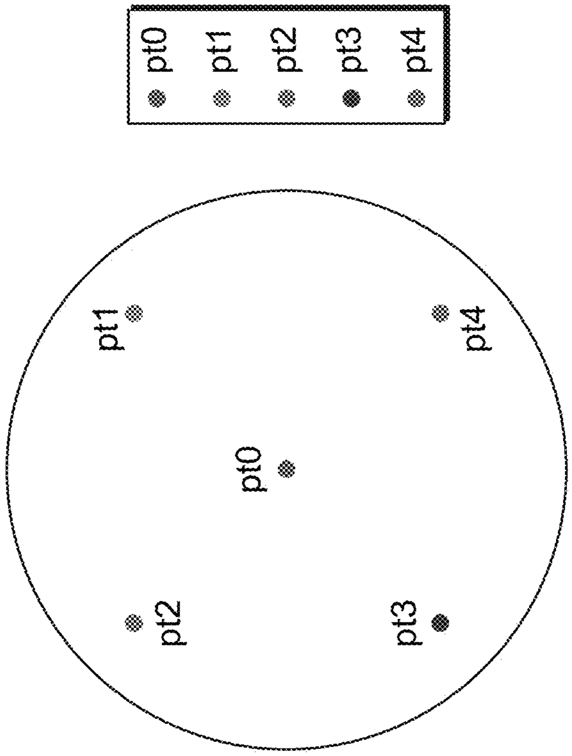
FIG. 39A shows locations on a 50 mm-diameter relaxed InGaN layer having a nominal 9% InN mole fraction and grown under MR-MOCVD conditions on a GaN layer with an intervening slip region.
FIG. 39B shows the InN mole fractions (as determined by XRD fitting) of the relaxed InGaN layer at the various positions (pt0-pt5) of the wafer shown in FIG. 39A.

FIG. 39A shows locations on a 50 mm-diameter relaxed InGaN layer having a nominal 9% InN mole fraction and grown under MR-MOCVD conditions on a GaN layer with an intervening slip region.

FIG. 39B shows the InN mole fraction of the relaxed InGaN layer at the various positions (pt0-pt5) of the wafer shown in FIG. 39A as determined by XRD fitting.

Figure 39D:
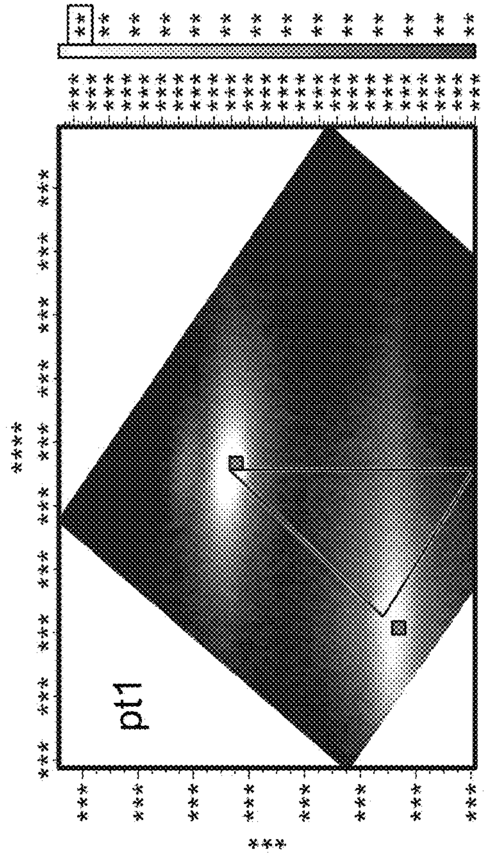
FIG. 39C-39E show XRD RSM images at three locations (pt0, pt1, pt3) of a 50 mm-diameter wafer with a thick relaxed InGaN layer.
Figure 39C:
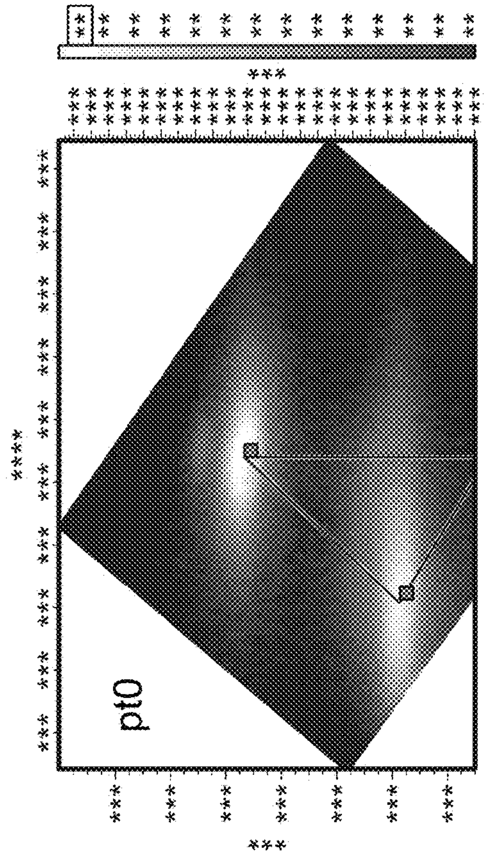
Figure 39E:
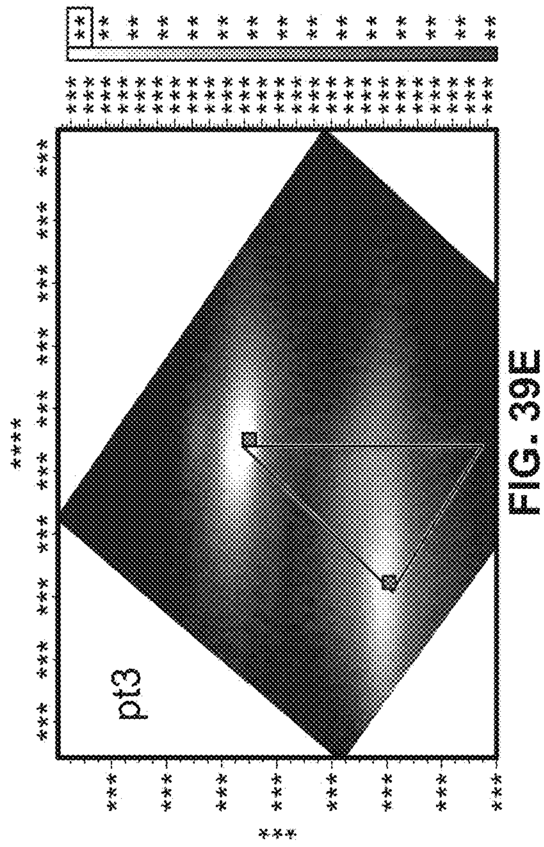

FIG. 39C-39E show XRD RSM images at three locations (pt0, pt1, pt3) on a 50 mm-diameter wafer with a thick relaxed InGaN layer.

Figure 39F:
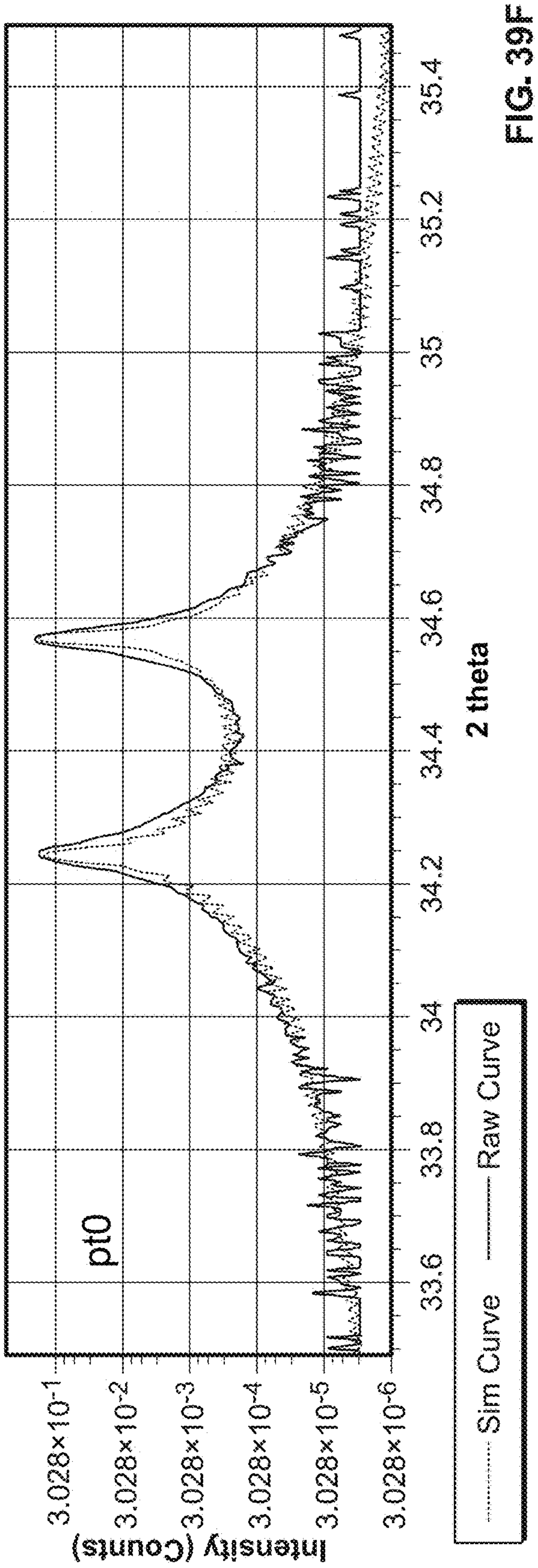
FIG. 39F-39H show ω-2θ XRD scans at the three locations (pt0, pt1, pt3) of the 50 mm-diameter wafer with a thick relaxed InGaN layer having a nominal 9% InN mole fraction and grown under MR-MOCVD conditions on a GaN layer with an intervening slip region.
Figure 39G:
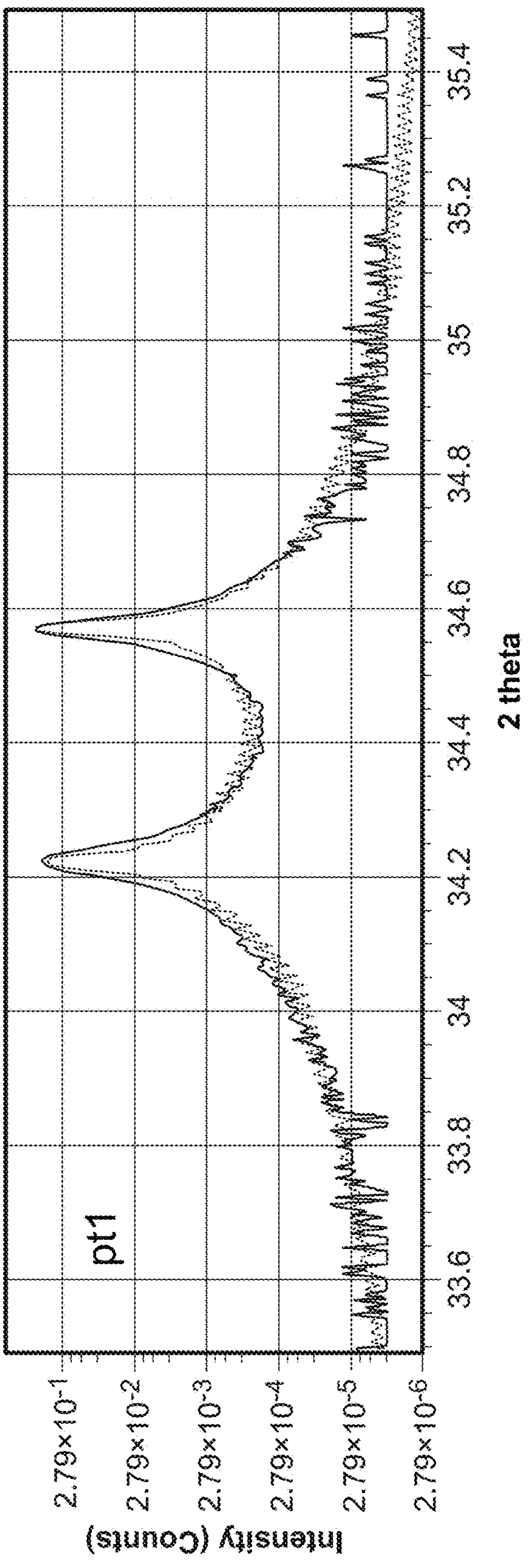
Figure 39H:
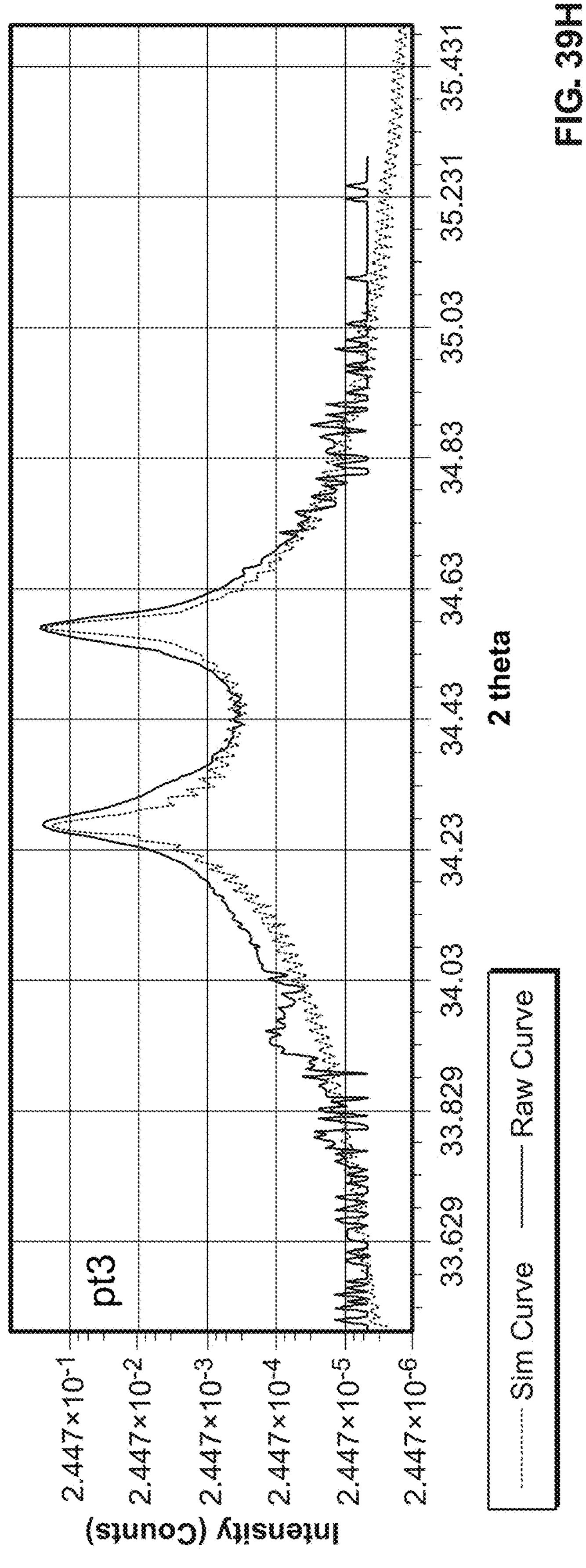

FIG. 39-39H show ω-2θ XRD scans at the three locations (pt0, pt1, pt3) on the 50 mm-diameter wafer with a thick relaxed InGaN layer having a nominal 9% InN mole fraction and grown under MR-MOCVD conditions on a GaN layer with an intervening slip region.

In summary the results shown in FIGS. 39A-39H demonstrate wafer-scale uniformity across a 50 mm diameter substrate, which is fully extendable to larger area substrates and templates. XRD data were collected at five locations including the center and around the edge. InN content across these points ranged from 8.6% to 9.9%, with all regions showing approximately 100% relaxation as determined by XRD RSM. These results validate the uniform planar growth of thick Native InGaN® layers across the usable substrate area, facilitated by metal-rich growth conditions and the slip layer. The film thickness (>50 nm) also provides strong XRD signal quality.

Figure 23:
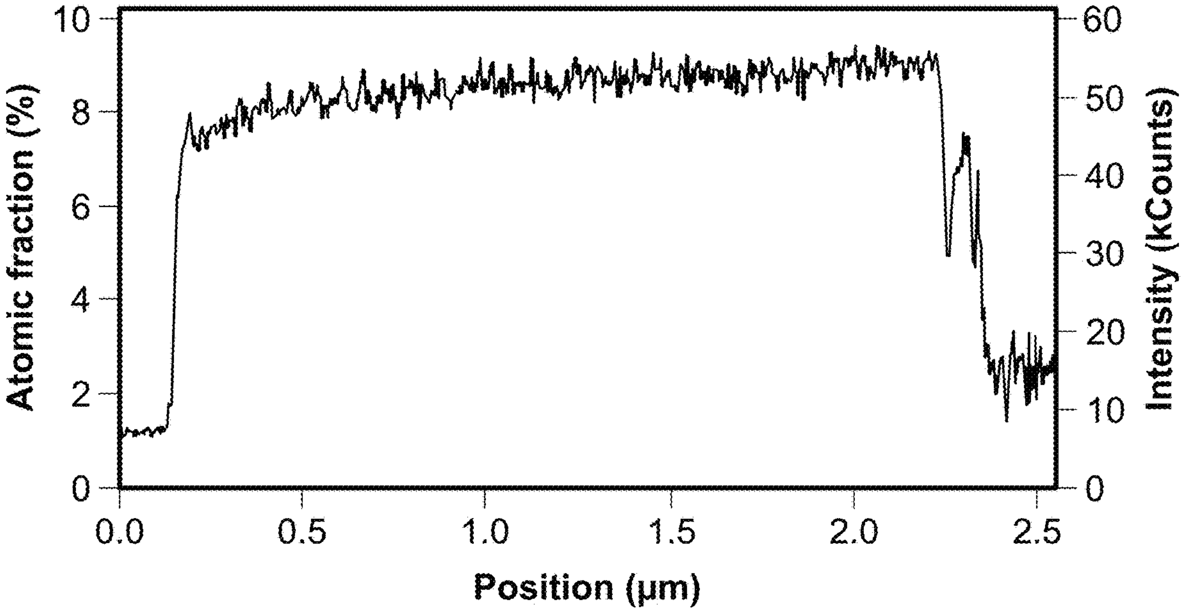
FIG. 23 shows the InN mole fraction in an MR InGaN layer as a function of thickness.
Figure 24A:
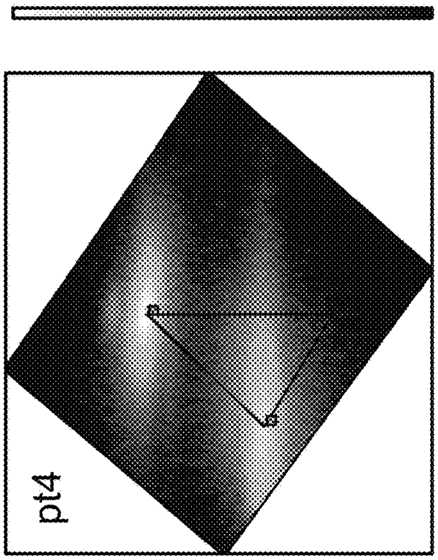
FIG. 24A-24F show XRD RSM images at five regions (pt0-pt4) of a 50 mm-diameter wafer having an about 2 μm-thick InGaN layer (9% InN mole fraction) grown on a GaN/sapphire template as described in Example 4 using MR MOCVD.
Figure 24B:
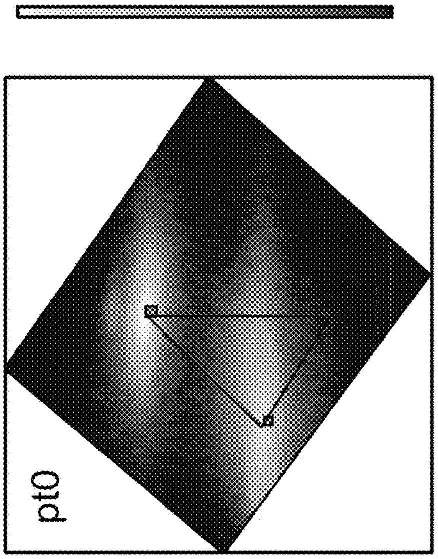
Figure 24C:
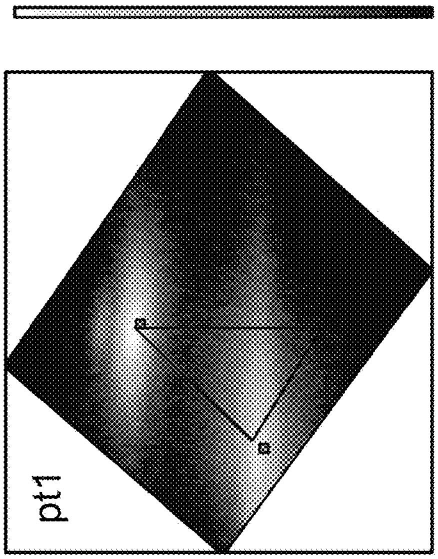
Figure 24D:
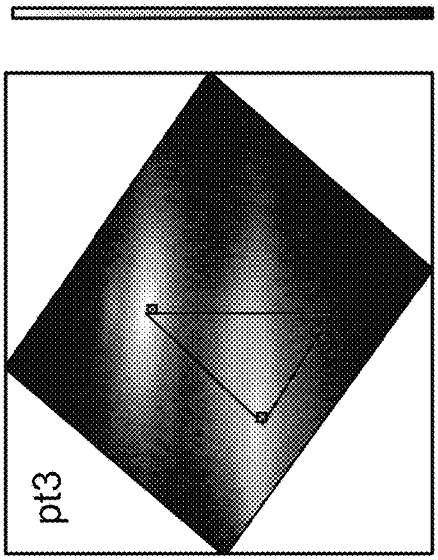
Figure 24E:
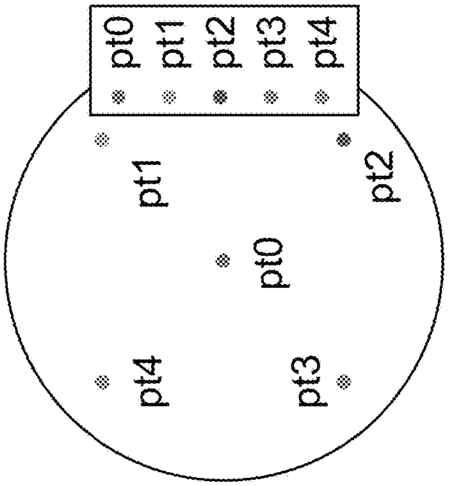
Figure 24F:
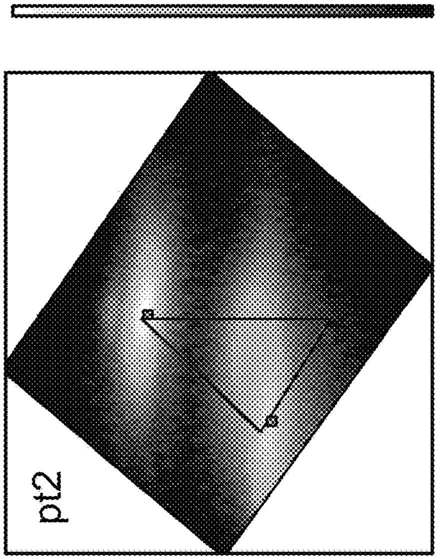
Figure 25A:
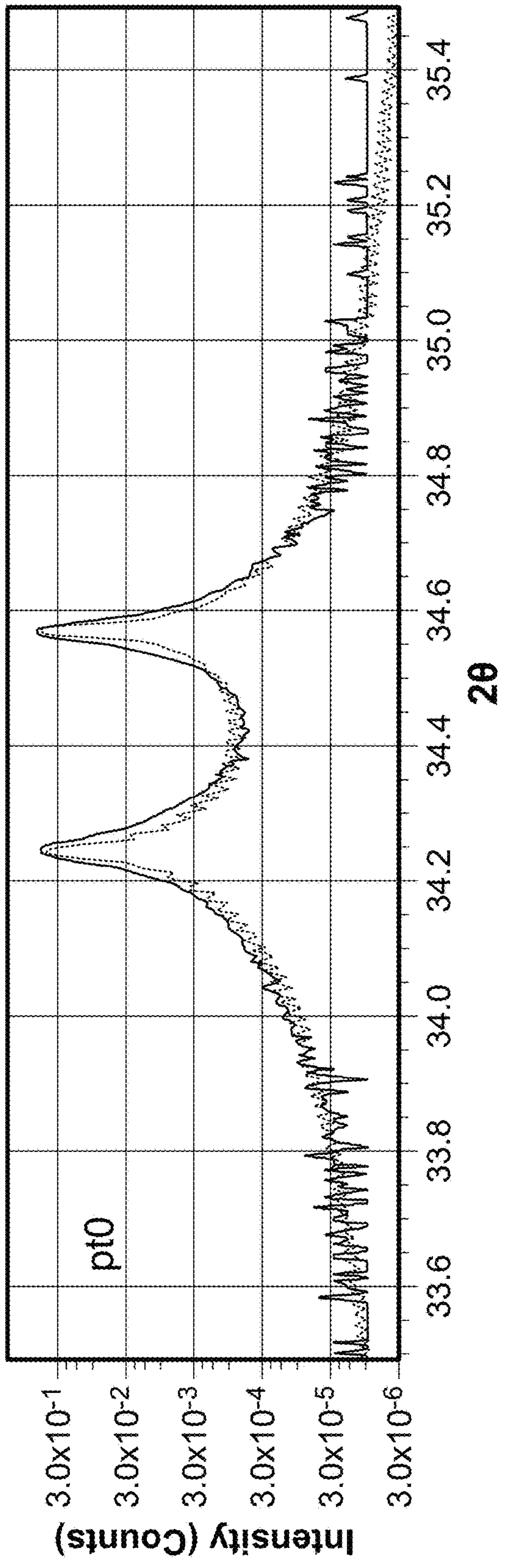
FIG. 25A-25E show ω-2θ XRD scans at the five regions (pt0 to pt4) of the 50 mm-diameter wafer of an MR InGaN layer described in FIG. 27A having an InN mole fraction of about 8% grown on a GaN/sapphire template, compared to a simulated ω-2θ XRD scan (dotted curve).
Figure 25B:
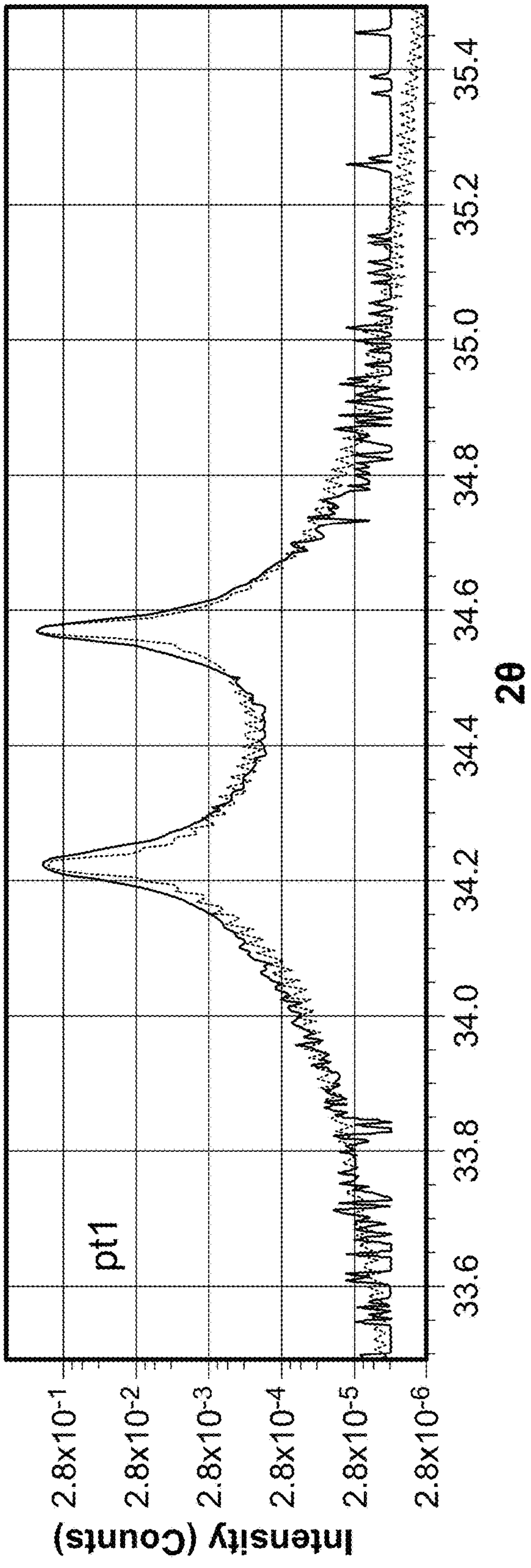
Figure 25C:
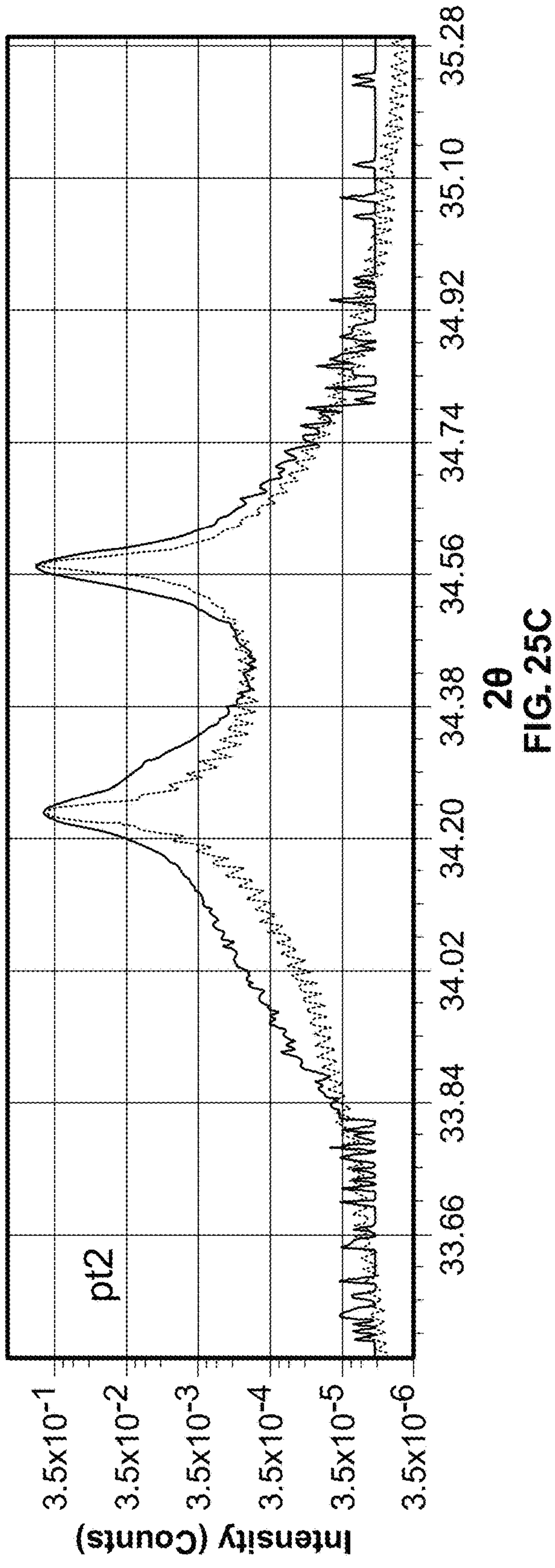
Figure 25D:
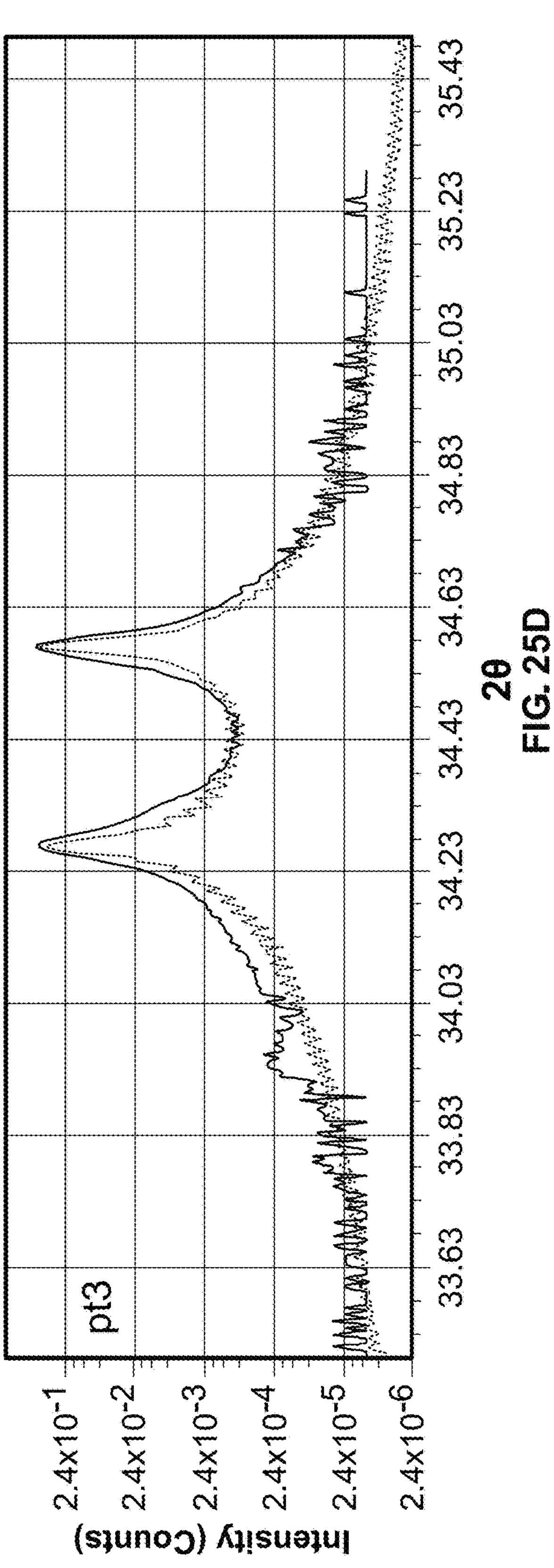
Figure 25E:
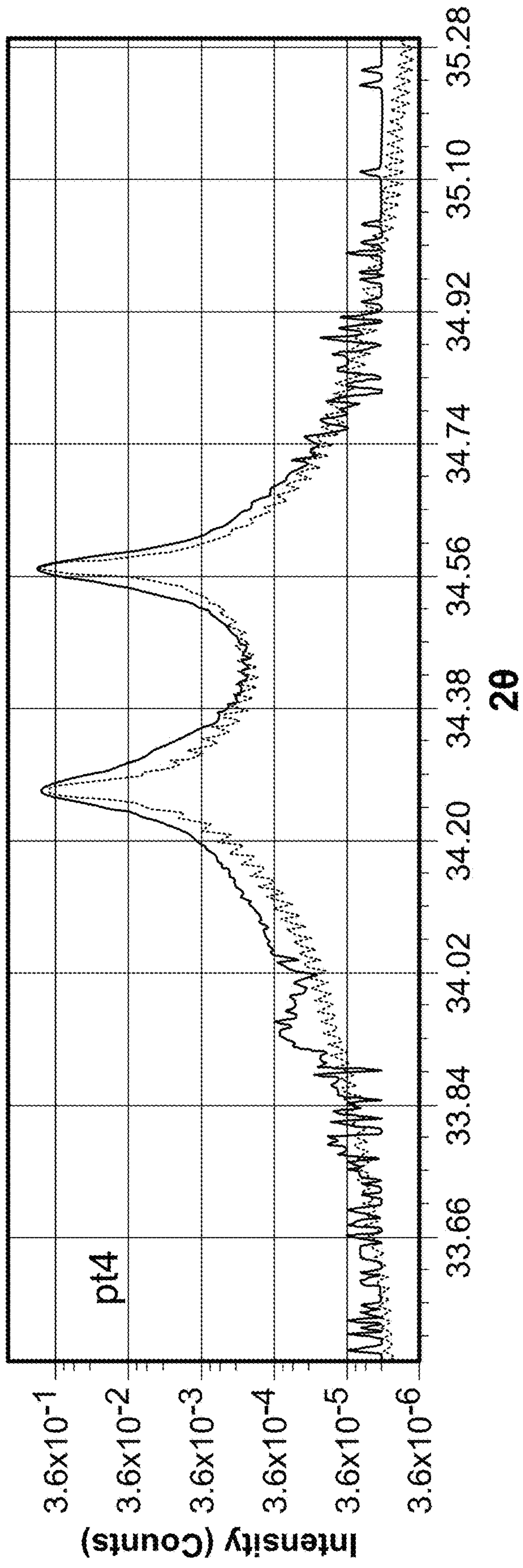
Figure 40:
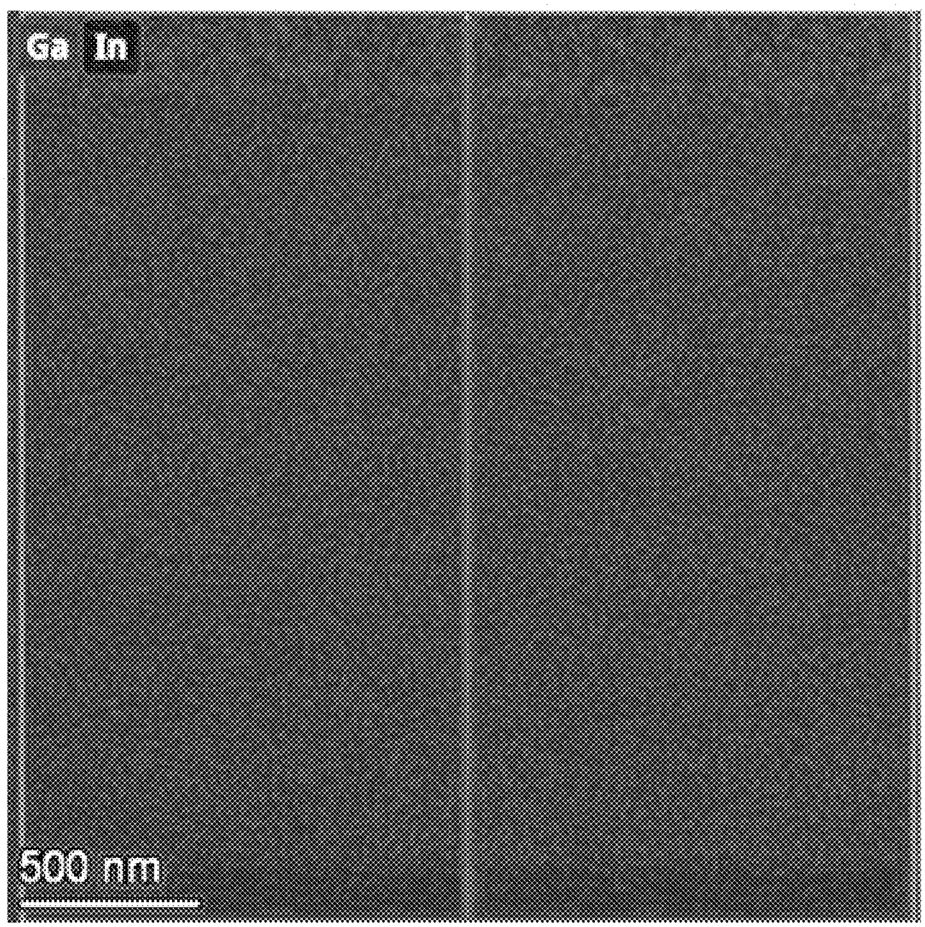
FIG. 40 shows a 2-dimensional EDX elemental map (left) across a greater than 2 μm thick Native InGaN® layer grown on GaN with an intervening slip layer. The corresponding line scan is shown in FIG. 23.

FIG. 40 shows a 2D EDX elemental map (left) across a greater than 2 μm thick Native InGaN® film grown on GaN with a slip region. The corresponding line scan of the In content is shown in FIG. 23. The EDX map shows uniform distribution of indium and gallium, confirming the formation of a homogeneous random alloy. The line scan shown in FIG. 23 reveals a relatively stable InN mole fraction of about 8% to 9% throughout the main body of the relaxed InGaN layer. Additional features in the upper portion of the scan are attributed to a test structure deposited on top. These results demonstrate compositional uniformity and absence of In clustering and phase separation in thick Native InGaN® films.

Figure 41:
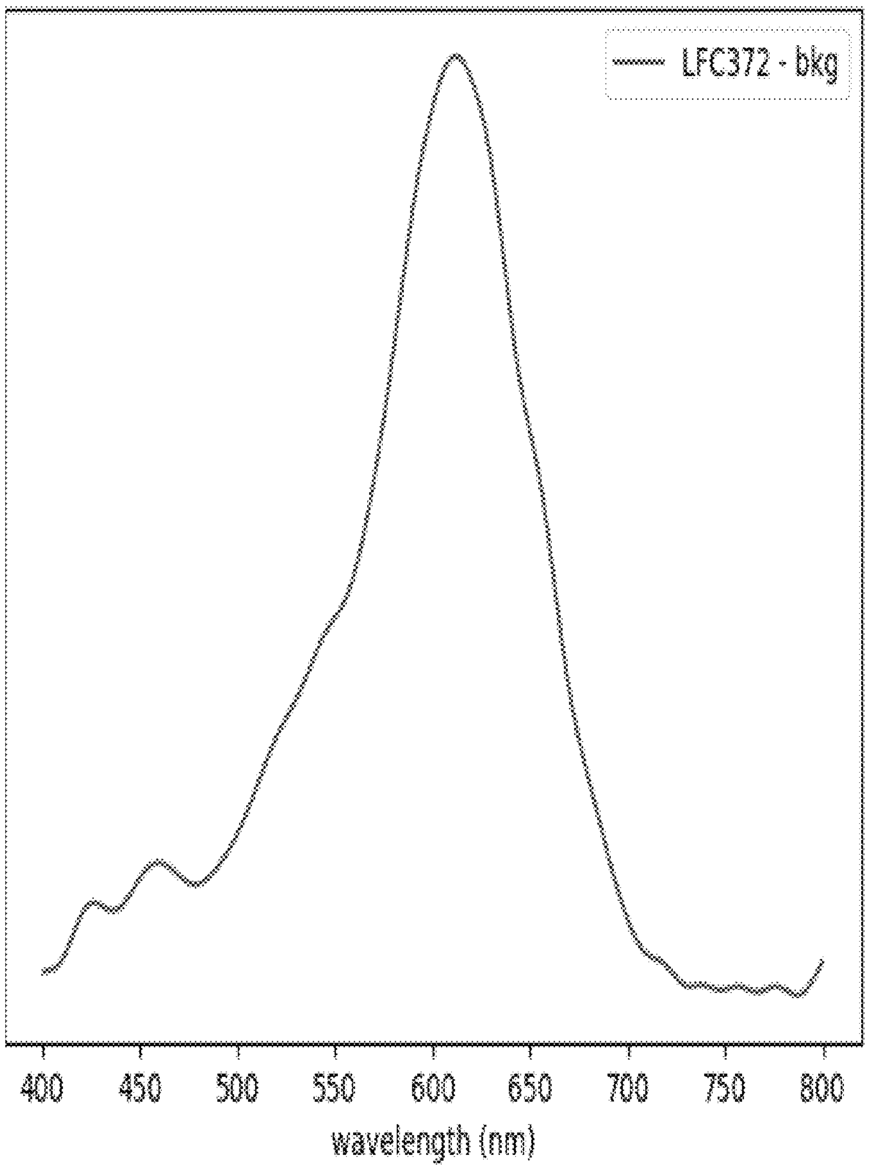
FIG. 41 shows a photoluminescence spectrum from a single quantum well (SQW) structure grown on a Native InGaN® template having an InN mole fraction of 8% with an overlying AlGaN layer having an AlN mole fraction of about 13%.

FIG. 41 shows a photoluminescence spectrum from a single quantum well (SQW) structure grown on an 8% Native InGaN® template with a ~13% AlGaN cap layer. The PL is excited at 325 nm and emission is observed centered at 612 nm with a full width at half maximum (FWHM) of approximately 60 nm. For comparison, a similar structure grown on GaN without the AlGaN cap would emit in the green around 530 nm. Defect-related luminescence from the underlying Native InGaN® was digitally subtracted to isolate the SQW contribution. This result demonstrates that the invention enables orange-red emission from SQW structures using relaxed InGaN templates and indicates much longer wavelengths are available using the combination of higher InN mole fraction Native InGaN® base layers along with advanced MQW stack design.

Figure 42:
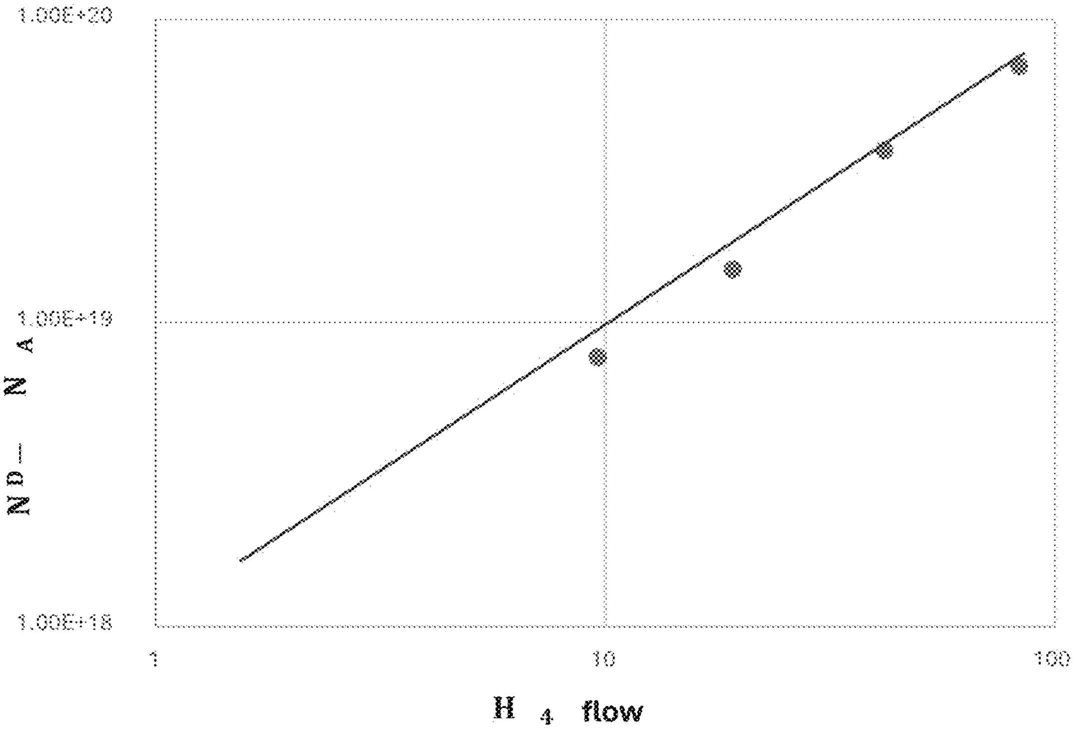
FIG. 42 shows an example of electrical doping characteristics of n-type and p-type Native InGaN® grown under metal-rich conditions.

FIG. 42 summarizes electrical doping characteristics of n-type and p-type Native InGaN grown under metal-rich conditions. For n-type doping, silane is used, and the net donor concentration vs silane flow from C-V measurements is shown in the chart at the top. In one embodiment, Si-doped 8% Native InGaN films showed net donor concentration of approximately $6 \times 10^{19}$ $cm^{-3}$, despite elevated carbon and oxygen levels associated with the lower growth temperatures (compensation estimated at about 5E18 $cm^{-3}$). For p-type doping, the use of triethylgallium (TEG) instead of trimethylgallium (TMG) significantly reduced C and O contamination. Mg-doped InGaN films achieved net acceptor concentrations on the order of $6 \times 10^{18}$ $cm^{-3}$ (C-V data not shown). These results confirm that both conduction types can be achieved in thick, relaxed metal-rich InGaN grown using the techniques disclosed herein, paving the way for optoelectronic devices such as LEDs, EELDs, VCSELs, etc.

A slip region can be a patterned slip region. For example, multiple slip regions can be deposited in areas defined by a mask. Each of the multiple slip regions can comprise the same or different dielectric material or a different dielectric material.

Methods provided by the present disclosure include methods of depositing a slip region on the surface of semiconductor layer such as a III-nitride layer.

The III-nitride layer can comprise any suitable III-nitride material including GaN, AlN, $In_xGa_{1-x}N$, and $In_xAl_yGa_{1-x-y}N$, where 0<x<1, and 0≤y≤1, each of which can be undoped or doped.

A surface of the III-nitride material can be planar and can have a (0001) orientation.

A slip region can be deposited on the III-nitride layer surface in situ in a MOCVD reactor.

The slip region can be deposited using the following MOCVD reactor conditions: a temperature from 650° C. to 850° C., a $SiH_4$ flow rate from 60 sccm to 120 sccm, a $NH_3$ flow rate from 100 sccm to 300 sccm, $H_2$ as the carrier gas, a total gas flow rate of from 6,000 sccm to 10,000 sccm, a reactor pressure of from 50 mbar to 100 mbar, and a growth time from 1 minute to 10 minutes.

A slip region can be deposited by flowing silane and ammonia with no trimethylgallium into the MOCVD reaction chamber.

A method can comprise, for example, forming a slip region on a surface of a III-nitride layer; and growing a relaxed In-containing III-nitride layer such a $In_xAl_yGa_{1-x-y}N$ layer or a $In_xGa_{1-x}N$ layer, on the slip region and on the portions of the III-nitride layer not covered by the slip region. The surface of the III-nitride layer can be characterized by a first in-plane a-lattice parameter and the surface of the In-containing III-nitride layer can be characterized by a second in-plane a-lattice parameter, where the first and second in-plane a-lattice parameters are different. The relaxed In-containing III-nitride layer can have a different InN mole fraction than that of the III-nitride layer.

The slip region can be formed with or without lithographic patterning.

The method can comprise, before depositing the slip region, providing a III-nitride layer.

Growing a relaxed In-containing III-nitride layer can comprise growing the In-containing III-nitride layer to a thickness greater than 100 nm, such as from 0.1 μm to 4 μm, or from 0.1 μm to 10 μm.

The method can comprise growing an additional III-nitride layer over the relaxed In-containing III-nitride layer, wherein the additional III-nitride layer has a different InN mole fraction than that of the relaxed In-containing III-nitride layer. The additional III-nitride layer can have a higher compressive strain than the relaxed In-containing III-nitride layer. The additional III-nitride layer is configured to emit electromagnetic radiation at a different wavelength than and underlying active region.

Light-emitting devices provided by the present disclosure have a wide range of applications and can be included in products or systems, including, for example, displays such as AR/VR wearables, projection, laser TV, and head-up displays, general lighting, light-based communication, medical therapies such as dermatology treatments, machining such as welding, cutting, and engraving, additive manufacturing such as three-dimensional (3D) printing including 3D printing of biocompatible material, and light detection and ranging (LiDAR). Thes light emitting devices provided by the present disclosure offer unique advantages at wavelengths of operation greater than 532 nm for III-nitride devices and offer higher power density and improved thermal performance compared to III-arsenide or III-phosphide based devices.

Multi-color VCSEL arrays, whether implemented as a single-pixel RGB panel or as separate red, green, and blue panels, can be integrated into augmented reality (AR) eyeglasses to enable an efficient, lightweight, and long-battery-life display system suitable for a vast majority of users. The display module can be embedded within the temple of the eyeglasses, projecting light through various architectures such as waveguides, holographic optical elements (HOEs), liquid crystal on silicon (LCOS), laser beam scanning (LBS), or direct retinal projection to create a high-resolution image within the user's field of view. These methods allow for compact and efficient light delivery, ensuring optimal brightness and color accuracy while minimizing power consumption.

Figure 13A:
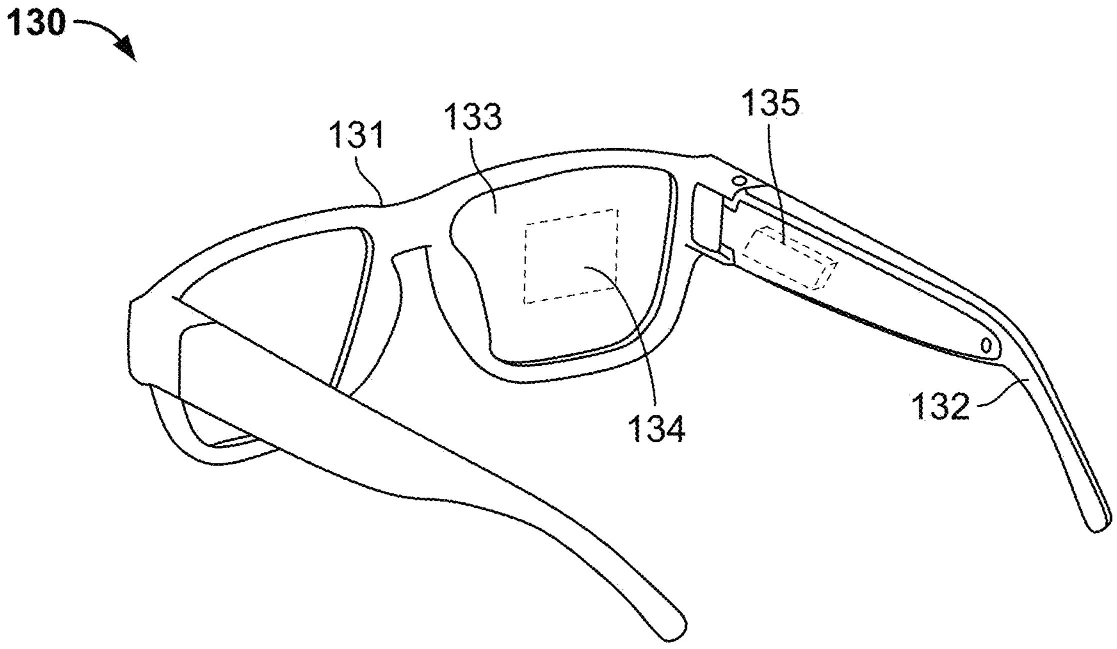
FIG. 13A shows a perspective view of an example of a wearable device.
Figure 13B:
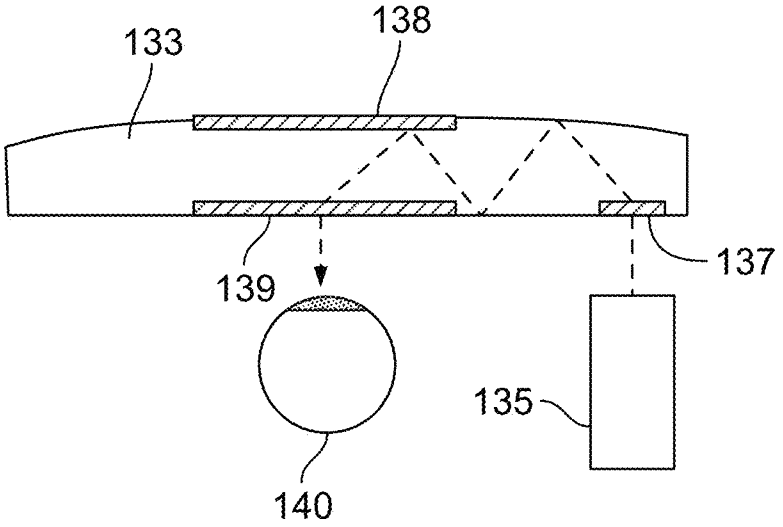
FIG. 13B shows a view of an example of optical components for use in a wearable device.

FIGS. 13A-13B illustrate a pair of augmented reality (AR) eyeglasses with an integrated display module positioned in the temple, an optical path guiding the image towards a designated image area on one of the lenses, and light coupling elements that direct the projected image to the user's eye (for example, through in-coupling, folding, and outcoupling surfaces based on diffractive elements). This architecture supports a wide range of AR applications, including real-time information overlays, immersive visual experiences, and interactive virtual environments, all while maintaining a lightweight and ergonomic design. FIG. 13A shows a pair of AR glasses 130, having a frame 131, temple 132, an imaging area 134 in/on lens 133 and a display 135. FIG. 13B shows a schematic of the display optics including display 135, in-coupling surface 137 in/on lens 133, folding surface 138, outcoupling surface 139 and eye 140. A trajectory of the image from display 135 to eye 140 is shown. Other geometries and optical solutions, including free-space imaging (i.e., no waveguides), are also possible. The AR eyeglasses system will have other necessary components (e.g., compute, interconnect, battery, etc.) not shown in FIGS. 13A-13B but are known in the art.

By leveraging the efficiency, coherence and compactness of VCSEL sources, the system minimizes power consumption and maximizes optical efficiency, making it ideal for extended wear applications. The integration of high-density VCSEL arrays further allows for improved resolution and brightness control, with the capability to dynamically adjust individual color contributions for enhanced image fidelity. Additionally, because the VCSEL light sources can be directly modulated at high speeds, the system supports advanced holographic and 3D display techniques, enabling depth-enhanced visualization and improved user immersion.

This innovative approach to AR displays offers significant advantages over traditional micro-LED and OLED-based solutions by providing superior coherence, better beam collimation, and enhanced integration with optical waveguide technologies. With its compact form factor, power efficiency, and high-speed modulation capabilities, the multi-wavelength VCSEL display is well-positioned to become a core enabling technology for next-generation AR eyewear and head-mounted display systems.

A semiconductor structure provided by the present disclosure can be used in a semiconductor device such as an optoelectronic device.

A semiconductor structure or optoelectronic device provided by the present disclosure can be configured to emit electromagnetic radiation across the visible spectrum, from approximately 430 nm to 650 nm, and at wavelengths greater than 650 nm.

Example of suitable optoelectronic devices include light-emitting diodes (LED), edge-emitting laser diodes (EELD), vertical-cavity surface-emitting lasers (VCSEL), LEDs, and resonant-cavity LEDs (RCLED).

An optoelectronic device can be configured to emit electromagnetic wavelength range or can be configured to emit electromagnetic radiation in multiple wavelength ranges.

A multiwavelength optoelectronic device can be a single-pixel (shared pixel) optoelectronic device in which two or more active regions are vertically stacked, and where each of the active regions is configured to emit electromagnetic radiation within a different wavelength range. The different active regions can be characterized, for example, by a different InN mole fraction and an in-plane a-lattice parameter. Each of the different active regions can overlie a different relaxed In-containing III-nitride material wherein each of the different relaxed In-containing III-nitride material has a different InN mole fraction and a different in-plane a-lattice parameter.

A multiwavelength optoelectronic device can be a multi-pixel optoelectronic device in which optoelectronic devices configured to emit within a different wavelength range are situated in a side-by-side configuration.

A multiwavelength optoelectronic device can be an integrated monolithic multiwavelength optoelectronic device in which optoelectronic devices configured to emit within a single wavelength range are fabricated on a single substrate and comprises one or more common epitaxial layers.

A multiwavelength optoelectronic device can comprise two or more discrete stripes or pixels, each comprising a relaxed In-containing III-nitride layer and an active region, wherein the stripes or pixels are configured to emit electromagnetic radiation at different wavelengths.

A monolithic optoelectronic wafer can comprise multiple light-emitting devices selected, for example, from LEDs, VCSELs, RCLEDs, or EELDs, where each of the devices independently comprises a relaxed In-containing III-nitride layer. Each of the light emitting devices can have the same or different InN mole fraction and in-plane a-lattice parameter.

An optoelectronic device comprising a relaxed In-containing III-nitride layer can be used, for example, in display, augmented reality, virtual reality, head-up display, projection, television, monitor, or automotive lighting systems and application applications.

An optoelectronic device provided by the present disclosure can comprise drive circuitry for independent addressable control of each active region or pixel.

An optoelectronic device provided by the present disclosure can comprise CMOS-compatible drive circuitry.

It will be understood that when reference is made to a semiconductor device or semiconductor device, the device can comprise layers, interconnections, and ancillary structure not necessarily recited in the claims. For example, it is understood that a device comprising a relaxed In-containing III-nitride layer or semiconductor structure provided by the present disclosure, includes electrical contacts and other elements that can render the device operable as, for example, a light-emitting device.

Semiconductor devices provided by the present disclosure can comprise a slip region between a III-nitride layer and a relaxed In-containing III-nitride layer.

A semiconductor device provided by the present disclosure can comprise a III-nitride layer, a slip region overlying the III-nitride layer, and a relaxed In-containing III-nitride layer overlying the slip region and portions of the III-nitride layer not covered by the slip region.

A semiconductor device provided by the present disclosure can comprise one or more epitaxial layers overlying the relaxed In-containing III-nitride layer such as a relaxed InGaN layer. One or more of the overlying epitaxial layers can be an In-containing III-nitride layer such as an InGaN layer. Each of the overlying epitaxial layers can be lattice matched to the relaxed In-containing III-nitride layer. A semiconductor device provided by the present disclosure can comprise one or more relaxed In-containing III-nitride layers where each of the one or more relaxed In-containing III-nitride layers overlies a slip region and a portion of a III-nitride layer that is not covered by the slip region. Each of the one or more relaxed In-containing III-nitride layers can have the same or different thickness and/or the same or different InN mole fraction.

One or more epitaxial layers can independently overlie each of the relaxed In-containing III-nitride layers.

For example, referring to the edge emitting laser diode shown in FIG. 1, a slip region can be disposed between n-GaN layer 3 and relaxed InGaN layer 4. For example, referring to the VCSEL shown in FIG. 5, a slip region can be disposed between GaN layer 3 and relaxed InGaN layer 4.

For example, referring to the VCSEL shown in FIG. 5 a relaxation region such as a slip region can be disposed between relaxed layer 4 and layer 3. For example, referring to the multiwavelength multi-pixel VCSEL shown in FIG. 11, a slip region can be disposed between Bragg grating 4 and relaxed InGaN layer 5, between Bragg grating 12 and relaxed InGaN layer 13, and between Bragg grating 20 and relaxed InGaN layer 21.

In semiconductor structures according to the present disclosure a slip region provided by the present disclosure can be disposed between any two epitaxial layers. Accordingly, a device provided by the present disclosure can comprise a slip region between two epitaxial layers.

MR MOCVD growth such as described herein can be exploited to realize the deposition of variable composition III-V compound semiconductor alloys with high quality on a single growth substrate. Controlled crystal lattice engineering refers to the ability to fabricate high quality relaxed layers of III-V materials using a patterned growth layer that allows for the incorporation of different InN content determined by the configuration of the patterned growth layer to provide optoelectronic devices configured to emit radiation within a desired wavelength range.

In one method of fabricating a multi-color optoelectronic device, groups of optoelectronic elements, where each optoelectronic element within the group is characterized by a similar in-plane a-lattice parameter and a similar InN content, can be serially fabricated on the same growth substrate such as a GaN layer For example, a first group of optoelectronic elements can be fabricated on a first portion of a growth substrate, a second group of optoelectronic elements can be fabricated on a second portion of the growth substrate, and a third group of optoelectronic elements can be fabricated on a third portion of the growth substrate. Each of the first group, the second group, and third group of optoelectronic elements can be characterized by a different in-plane a-lattice parameter and a different InN content and can be configured to emit radiation within a different wavelength range.

Control over the in-plane a-lattice parameter allows active regions with different compositions to have similar strain states that are optimal for device performance. For example, optimum strain states for InGaN-based emitters are between about 1% and about 3%, preferably between 1% and 2%, of compressive strain, regardless of emission wavelength. One way to have the emitters exhibit similar, beneficial strain states, while allowing the InGaN composition of the respective active regions to differ and thereby emit electromagnetic radiation at different wavelengths such as from blue to green to red wavelength ranges, is to adjust the in-plane a-lattice parameter of the underlying material on which the InGaN-based emitters are grown.

A III-nitride epitaxial layer on a growth substrate can be selectively patterned with a dielectric material using known deposition, lithography (including nanolithography), and etching techniques to define GaN seed regions. The patterning can be intentionally selected to produce a desired strain state of a relaxed InGaN growth layer grown on the plurality of GaN seed regions.

Because the in-plane a-lattice parameters of the relaxed InGaN growth layers overlying the various patterned GaN seed regions are different, the incorporated InN mole fraction in each relaxed InGaN growth layer will be different, even though the epitaxial TMI/III ratio and growth temperature used to deposit the InGaN layers overlying each of the respected relaxed InGaN growth layers are the same. Using this method, it is possible to selectively grow multi-colored active regions simultaneously on a single growth substrate in a single growth run, with micron or even sub-micron scale resolution.

Methods provided by the present disclosure include growing a Wurtzite In-containing III-nitride material using MR MOCVD.

A method of fabricating a relaxed Wurtzite In-containing III-nitride layer can comprise growing $In_xAl_yGa_{1-x-y}N$ wherein x>0 and 0≤y≤1, such as $In_xGa_{1-x}N$ where 0<x<1 or 0<x<0.4, using MOCVD.

Growing $In_xAl_yGa_{1-x-y}N$ can comprise growing $In_xAl_yGa_{1-x-y}N$ on a substrate or on a template.

Growing $In_xGa_{1-x}N$ where 0<x≤0.15 can comprise growing on a planar substrate surface or growing on a planar template surface.

Growing $In_xGa_{1-x}N$ where 0.15≤x<1 can comprise growing on a surface of a patterned template.

A relaxed In-containing layer can be grown using MR MOCVD growth conditions.

A semiconductor structure provided by the present disclosure can comprise: a III-nitride base layer: a plurality of dielectric portions disposed non-uniformly on or proximate to a surface of the III-nitride base layer, the dielectric portions being formed without lithographic patterning; and a relaxed $In_xAl_yGa_{1-x-y}N$ layer grown over the base layer and dielectric portions, wherein the relaxed $In_xAl_yGa_{1-x-y}N$ layer planarizes topographical features of the base layer and provides a substantially smooth growth surface for subsequent epitaxy.

A method provided by the present disclosure can comprise: providing a III-nitride base layer; forming dielectric portions on or near a surface of the base layer without lithographic patterning; epitaxially growing a first relaxed $In_xAl_yGa_{1-x-y}N$ layer over the base layer and dielectric portions; and epitaxially growing a second III-nitride layer over the first layer, the second III-nitride layer having a higher indium content and compressive strain relative to the first layer.

A light-emitting structure provided by the present disclosure can comprise: a first relaxed $In_xAl_yGa_{1-x-y}N$ layer disposed over a III-nitride layer: a first active region disposed over the first relaxed layer: a second relaxed $In_xAl_yGa_{1-x-y}N$ layer disposed over the first active region; and a second active region disposed over the second relaxed layer, wherein the first and second relaxed layers have different in-plane lattice constants and enable emission at different wavelengths.

A III-nitride semiconductor structure provided by the present disclosure can comprise a relaxed $In_xAl_yGa_{1-x-y}N$ layer disposed over a III-nitride base layer, the improvement comprising: a plurality of non-lithographically defined dielectric portions positioned on or proximate to the surface of the base layer, wherein the relaxed layer is grown over the dielectric portions and exhibits an in-plane lattice constant different from that of the base layer.

Use of a III-nitride semiconductor structure provided by the present disclosure can comprise a relaxed $In_xAl_yGa_{1-x-y}N$ layer grown over a base layer with interspersed, non-lithographically defined dielectric portions, for enabling wavelength-stable emission from a light-emitting device selected from a LED, EELD, VCSEL, or RCLED.

A semiconductor wafer provided by the present disclosure can comprise a relaxed In-containing III-nitride layer provided by the present disclosure, a semiconductor structure provided by the present disclosure and/or a device such as optoelectronic device provided by the present disclosure.

A semiconductor wafer can comprise any suitable material and/or dimensions used in semiconductor manufacturing.

A semiconductor wafer can comprise a wafer substrate and epitaxial layers that include a relaxed In-containing III-nitride layer at any stage in a semiconductor manufacturing process.

A semiconductor wafer provided by the present disclosure can at least comprise a semiconductor layer such as a III-nitride layer on which a slip region according to the present disclosure is deposited or grown.

A semiconductor wafer provided by the present disclosure can comprise a semiconductor structure according to the present disclosure.

A semiconductor wafer provided by the present disclosure can comprise a relaxed In-containing III-nitride layer overlying a III-nitride layer according to the present disclosure.

A semiconductor wafer provided by the present disclosure can comprise a semiconductor layer such as, for example, a relaxed In-containing III-nitride layer fabricated using metal-rich MOCVD conditions.

A semiconductor wafer provided by the present disclosure can comprise a device such as an optoelectronic device according to the present disclosure.

A semiconductor layer provided by the present disclosure can comprise a semiconductor layer fabricated using metal-rich MOCVD according to the present disclosure.

A semiconductor layer grown using metal-rich MOCVD growth conditions includes any semiconductor layer, such as, for example a III-nitride layer or an In-containing III-nitride layer grown using metal-rich MOCVD growth conditions.

A semiconductor layer provided by the present disclosure can comprise a semiconductor layer decorated with a slip region provided by the present disclosure.

A semiconductor structure provided by the present disclosure can comprise a first semiconductor layer, an overlying second semiconductor layer, and a slip region provided by the present disclosure disposed between the first and second semiconductor layers. As disclosed herein, the slip region can cover a portion of the first semiconductor layer, and the overlying second semiconductor layer can adjoin the slip region and the first semiconductor layer in areas not covered by the slip region.

A semiconductor device provided by the present disclosure can comprise a semiconductor layer comprising a slip region or a semiconductor structure comprising a slip region provided by the present disclosure.

Methods provided by the present disclosure comprise fabricating a semiconductor layer using metal-rich MOCVD growth conditions.

Growing a semiconductor layer using metal-rich MOCVD growth conditions can comprise growing the semiconductor layer using the MOCVD reactor conditions listed in Table 7.

TABLE 7

Examples of Metal-Rich MOCVD Growth Conditions

| Reactor Parameter | Parameter Value |
|---|---|
| Reactor Temperature | 740° C. to 800° C. |
| TMI Flow Rate | 250 sccm to 500 sccm |
| TMG Flow Rate | 25 sccm to 75 sccm |
| $NH_3$ Flow Rate | 200 sccm to 400 sccm |
| Total Gas Flow Rate | 6,000 sccm to 10,000 sccm |
| Chamber Pressure | 300 mbar to 500 mbar |
| V/III Ratio | 50 to 150 |

Growing a semiconductor layer under metal-rich MOCVD growth conditions can comprise growing a layer comprising a III-nitride material or an In-containing III-nitride material.

Methods provided by the present disclosure include methods of deposition a slip region provided by the present disclosure. Method of depositing a slip region using in situ MOCVD growth conditions provided by the present disclosure are summarized in Table 8.

TABLE 8

Examples of in-situ MOCVD Conditions for Depositing a Slip Region.

| Reactor Parameter | Parameter Value |
|---|---|
| Chamber Temperature | 650° C. to 850° C. |
| $SiH_4$ Flow Rate | 60 sccm to 120 sccm |
| $NH_3$ Flow Rate | 100 sccm to 300 sccm |
| Carrier Gas | $H_2$ |
| Total Gas Flow Rate | 6000 sccm to 10,000 sccm |
| Reactor Pressure | 50 mbar to 100 mbar |
| Growth Time | 1 minute to 10 minutes |

Methods of fabricated relaxed In-containing III-nitride layers, semiconductor structures, and devices provided by the present disclosure are compatible with wafer-scale growth processes and can be fabricated on substrates 150 mm or greater in diameter, including 200 mm or 300 mm silicon substrates, or engineered substrates, thereby enabling scalable device manufacturing.

ASPECTS OF THE INVENTION

The invention is further defined by one or more of the following aspects.

Aspect 1. An edge-emitting laser diode (EELD), wherein the EELD comprises: a relaxed InGaN buffer layer, wherein the relaxed InGaN buffer layer is characterized by a relaxed in-plane a-lattice parameter within 100 nm of an adjoining underlying epitaxial layer: an n-InGaN waveguide layer; a InGaN active layer overlying the n-doped InGaN waveguide layer; and a p-InGaN waveguide layer overlying the InGaN active layer.

Aspect 2. The EELD of aspect 1, wherein the InGaN active layer comprise a quantum well layer.

Aspect 3. The EELD of any one of aspects 1 to 2, wherein each of the layers is characterized by substantially the same in-plane a-lattice parameter.

Aspect 4. The EELD of any one of aspects 1 to 3, wherein the InGaN active layer is configured to emit radiation at a wavelength within a wavelength range from 350 nm and 650 nm.

Aspect 5. The EELD of any one of aspects 1 to 4, wherein the p-InGaN waveguide layer and the n-InGaN waveguide layer have an In content that is less than 10% the In content of the InGaN active layer.

Aspect 6. The EELD of any one of aspects 1 to 5, wherein the p-InGaN waveguide layer and the n-InGaN waveguide layer have an In content that is less than 7% the In content of the InGaN active layer.

Aspect 7. The EELD of any one of aspects 1 to 6, wherein the adjoining underlying epitaxial layer is characterized by an in-plane a-lattice parameter that is different than that of the relaxed InGaN layer.

Aspect 8. The EELD of any one of aspects 1 to 7, wherein the EELD does not comprise a patterned template layer underlying the relaxed InGaN layer.

Aspect 9. The EELD of any one of aspects 1 to 8, wherein the relaxed InGaN layer adjoins an underlying substrate layer, wherein the substrate layer comprises GaN, silicon, sapphire, or SiC.

Aspect 10. The EELD of any one of aspects 1 to 9, wherein the EELD comprises a plurality of InGaN epitaxial layers overlying the relaxed InGaN layer, wherein each of the InGaN epitaxial layers is characterized by substantially the same in-plane a-lattice parameter.

Aspect 11. The EELD of any one of aspects 1 to 10, wherein, the relaxed InGaN layer is characterized by an in-plane a-lattice parameter; and each of the overlying InGaN epitaxial layers is characterized by the same in-plane a-lattice parameter.

Aspect 12. The EELD of aspect 10, wherein the plurality of InGaN layers comprise InGaN, n-InGaN, p-InGaN, graded InGaN, n+-InGaN, or $p^-$-InGaN.

Aspect 13. A vertical-cavity surface-emitting laser (VCSEL), wherein the VCSEL comprises: a relaxed InGaN buffer layer, wherein the relaxed InGaN buffer layer is characterized by a in-plane a-lattice parameter within 100 nm of an adjoining underlying epitaxial layer: a DBR overlying the relaxed InGaN layer; one or more n-InGaN layers overlying the relaxed InGaN layer: a InGaN active layer overlying the one or more n-InGaN layers overlying the relaxed InGaN layers; and one or more p-InGaN layers overlying the InGaN active layer.

Aspect 14. The VCSEL of aspect 13, wherein each of the relaxed InGaN layer, the one or more n-InGaN layers, the InGaN active layer, and the one or more p-InGaN layers are characterized by substantially the same in-plane a-lattice parameter.

Aspect 15. The VCSEL of any one of aspects 13 to 14, wherein the InGaN active layer is configured to emit radiation at a wavelength within a wavelength range from 350 nm and 650 nm.

Aspect 16. The VCSEL of any one of aspects 13 to 15, wherein the relaxed InGaN layer is characterized by an in-plane a-lattice parameter greater than 3.20 Å.

Aspect 17. The VCSEL of any one of aspects 13 to 16, comprising a dielectric DBR overlying the one or more p-InGaN layers overlying the InGaN active layers.

Aspect 18. The VCSEL of any one of aspects 13 to 17, wherein the dielectric DBR comprises alternating layers of $SiO_2$ and $TiO_2$, or $SiO_2$ and $Ta_2O_5$.

Aspect 19. The VCSEL of any one of aspects 13 to 18, wherein the InGaN active layer comprises a multi-quantum well.

Aspect 20. The VCSEL of any one of aspects 13 to 19, wherein the DBR comprises alternating layers of InAlN and InGaN.

Aspect 21. The VCSEL of any one of aspects 13 to 20, comprising: a p-InGaN confinement layer overlying the InGaN active layer; and an n-InGaN confinement layer underlying the InGaN active layer, wherein the p-InGaN confinement layer and the n-InGaN confinement layer have an In content that is less than 10% an In content of the InGaN active layer.

Aspect 22. The VCSEL of any one of aspects 13 to 21, wherein the p-InGaN confinement layer, the n-InGaN confinement layer, and the InGaN active layer have substantially the same in-plane a-lattice parameter.

Aspect 23. The VCSEL of any one of aspects 13 to 22, wherein the adjoining underlying layer is characterized by a in-plane a-lattice parameter that is different than that of the relaxed InGaN layer.

Aspect 24. The VCSEL of any one of aspects 13 to 23, wherein the VCSEL comprises a plurality of InGaN epitaxial layers overlying the relaxed InGaN layer, wherein each of the InGaN epitaxial layers is characterized by substantially the same in-plane a-lattice parameter.

Aspect 25. The VCSEL of any one of aspects 13 to 24, wherein, the relaxed InGaN layer is characterized by an in-plane a-lattice parameter; and each of the overlying InGaN epitaxial layers is characterized by the in-plane a-lattice parameter.

Aspect 26. The VCSEL of aspect 24, wherein the plurality of InGaN layers comprise n-InGaN, p-InGaN, graded InGaN, n+-InGaN, or $p^-$-InGaN.

Aspect 27. The VCSEL of any one of aspects 13 to 26, wherein the VCSEL does not comprise a patterned template layer underlying the relaxed InGaN layer.

Aspect 28. The VCSEL of any one of aspects 13 to 27, wherein the relaxed InGaN layer adjoins an underlying substrate layer, wherein the substrate layer comprises GaN, silicon, sapphire, or SiC.

Aspect 29. An integrated multi-wavelength VCSEL, wherein the integrated multi-wavelength LED comprises: a front distributed Bragg reflector (DBR): a first relaxed n-InGaN layer overlying the front DBR: a first InGaN active layer overlying the first n-InGaN layer: a second relaxed n-InGaN layer overlying the first active layer: a second InGaN active layer overlying the second relaxed n-InGaN layer: a third relaxed n-InGaN layer overlying the second InGaN active layer; and a third InGaN active layer overlying the third relaxed n-InGaN layer, wherein each of the first InGaN active layer, the second InGaN active layer, and the third InGaN active layer are configured to emit radiation within a different wavelength range.

Aspect 30. The integrated multi-wavelength VCSEL of aspect 29, comprising a back DBR overlying the third InGaN active layer.

Aspect 31. The integrated multi-wavelength VCSEL of any one of aspects 29 to 30, comprising: a first tunnel junction overlying the first InGaN active layer and underlying the second InGaN active layer; and a second tunnel junction overlying the second InGaN active layer and underlying the third InGaN active layer.

Aspect 32. The integrated multi-wavelength VCSEL of any one of aspects 29 to 31, comprising: a first oxide layer overlying the first InGaN active layer and underlying the second InGaN active layer; and a second oxide layer overlying the second InGaN active layer and underlying the third InGaN active layer.

Aspect 33. The integrated multi-wavelength VCSEL of any one of aspects 29 to 32, comprising an n-type InGaN layer underlying the first InGaN active layer.

Aspect 34. The integrated multi-wavelength VCSEL of any one of aspects 29 to 33, wherein each of the first InGaN active layer, the second InGaN active layer, and the third InGaN active layer independently comprises a multi-quantum well.

Aspect 35. The integrated multi-wavelength VCSEL of any one of aspects 29 to 34, wherein the adjoining underlying layer is characterized by an in-plane a-lattice parameter that is different than that of the relaxed InGaN layer.

Aspect 36. The integrated multi-wavelength VCSEL of any one of aspects 29 to 35, wherein each of the relaxed InGaN layers is characterized by a relaxed in-plane a-lattice parameter within 100 nm of an adjoining underlying layer.

Aspect 37. The integrated multi-wavelength VCSEL of any one of aspects 29 to 36, wherein each of the InGaN active layers is configured to emit radiation through the front DBR.

Aspect 38. The integrated multi-wavelength VCSEL of any one of aspects 29 to 37, wherein each of the InGaN active layers is configured to be independently addressable.

Aspect 39. An integrated multi-wavelength VCSEL, wherein the integrated multi-wavelength VCSEL comprises: a first DBR: a first relaxed n-InGaN layer overlying the first DBR: a first InGaN active layer overlying the first relaxed n-InGaN layer, wherein the first InGaN active layer is configured to emit radiation within a first wavelength range: a second DBR overlying a portion of the first relaxed InGaN layer: a second relaxed n-InGaN layer overlying a portion of the second DBR: a second InGaN active layer overlying a portion of the second InGaN active layer, wherein the second InGaN active layer is configured to emit radiation within a second wavelength range: a third DBR overlying a portion of the second InGaN active layer: a third relaxed n-InGaN layer overlying the third DBR; and a third InGaN active layer overlying the third relaxed n-InGaN layer, wherein the third InGaN active layer is configured to emit radiation within a third wavelength range.

Aspect 40. The integrated multi-wavelength VCSEL of aspect 39, wherein each of the first wavelength range, the second wavelength range, and the third wavelength range is a different wavelength range.

Aspect 41. The integrated multi-wavelength VCSEL of any one of aspects 39 to 40, wherein, the first wavelength range is a blue wavelength range: the second wavelength range is a green wavelength range; and the third wavelength range is a red wavelength range.

Aspect 42. The integrated multi-wavelength VCSEL of any one of aspects 39 to 41, comprising a first tunnel junction overlying a portion of the first InGaN active layer and underlying the second DBR.

Aspect 43. The integrated multi-wavelength VCSEL of any one of aspects 39 to 42, comprising a second tunnel junction overlying a portion of the second InGaN active layer and underlying the third DBR.

Aspect 44. The integrated multi-wavelength VCSEL of any one of aspects 39 to 43, comprising: a first dielectric DBR overlying the first InGaN active layer: a second dielectric DBR overlying the second InGaN active layer; and a third dielectric DBR overlying the third InGaN active layer.

Aspect 45. The integrated multi-wavelength VCSEL of any one of aspects 39 to 44, comprising a substrate underlying the first DBR, wherein the substrate is substantially transparent in the first wavelength range, the second wavelength range, and the third wavelength range.

Aspect 46. The integrated multi-wavelength VCSEL of any one of aspects 39 to 45, wherein, the first DBR, the first relaxed n-InGaN layer, and the first InGaN active region are characterized by a first in-plane a-lattice parameter: the second DBR, the second relaxed n-InGaN layer, and the second InGaN active region are characterized by a second in-plane a-lattice parameter; and the third DBR, the third relaxed n-InGaN layer, and the third InGaN active region are characterized by a third in-plane a-lattice parameter.

Aspect 47. The integrated multi-wavelength VCSEL of any one of aspects 39 to 46, wherein, the third in-plane a-lattice parameter is greater than the second in-plane a-lattice parameter; and the second in-plane a-lattice parameter is greater than the first in-plane a-lattice parameter.

Aspect 48. The integrated multi-wavelength VCSEL of any one of aspects 39 to 47, wherein, the first in-plane a-lattice parameter is about 3.19 Å: the first in-plane a-lattice parameter is about 3.22 Å; and the first in-plane a-lattice parameter is about 3.25 Å.

Aspect 49. The integrated multi-wavelength VCSEL of any one of aspects 39 to 48, wherein, each relaxed InGaN layer is characterized by an in-plane a-lattice parameter within 100 nm of an adjoining underlying epitaxial layer; and the adjoining underlying epitaxial layer characterized by a in-plane a-lattice parameter that is different than that of the relaxed InGaN layer.

Aspect 50. The integrated multi-wavelength VCSEL of any one of aspects 39 to 49, wherein the adjoining underlying epitaxial layer is a DBR.

Aspect 51. The integrated multi-wavelength VCSEL of any one of aspects 39 to 50, wherein each of the relaxed InGaN layers is characterized by a relaxed in-plane a-lattice parameter within 100 nm of an adjoining underlying layer.

Aspect 52. The integrated multi-wavelength VCSEL of any one of aspects 39 to 51, wherein each of the InGaN active layers is configured to emit radiation through a different portion of the first DBR.

Aspect 53. The integrated multi-wavelength VCSEL of any one of aspects 39 to 52, wherein each of the InGaN active layers is configured to be independently addressable.

Aspect 54. The integrated multi-wavelength VCSEL of any one of aspects 39 to 53, wherein the integrated multi-wavelength VCSEL comprises a GaN buffer layer underlying the first DBR and a substrate underlying the GaN buffer layer.

Aspect 55. The integrated multi-wavelength VCSEL of any one of aspects 39 to 54, wherein the integrated multi-wavelength VCSEL comprises: a first tunnel junction layer overlying the first InGaN active layer and underlying the second DBR; and a second tunnel junction layer overlying the second InGaN active layer and underlying the third DBR.

Aspect 56. An integrated multi-wavelength light-emitting diode (LED), wherein the integrated multi-wavelength LED comprises: a first InGaN active layer configured to emit within a first wavelength range: a second InGaN active layer configured to emit within a second wavelength range overlying the first InGaN active layer; and a third InGaN active layer configured to emit within a third wavelength range overlying the second relaxed InGaN layer.

Aspect 57. The integrated multi-wavelength LED of aspect 56, wherein each of the first wavelength range, the second wavelength range, and the third wavelength range is a different wavelength range.

Aspect 58. The integrated multi-wavelength LED of any one of aspects 56 to 57, wherein, the first wavelength range is a blue wavelength range: the second wavelength range is a green wavelength range; and the third wavelength range is a red wavelength range.

Aspect 59. The integrated multi-wavelength LED of any one of aspects 56 to 58, comprising a first tunnel junction overlying the first InGaN active layer and underlying the second InGaN active layer.

Aspect 60. The integrated multi-wavelength LED of any one of aspects 56 to 59, comprising a second tunnel junction overlying the second InGaN active layer and underlying the third InGaN active layer.

Aspect 61. The integrated multi-wavelength LED of any one of aspects 56 to 60, comprising: a first oxide layer overlying the InGaN active layer: a second oxide layer overlying the InGaN active layer; and/or a third oxide layer overlying the InGaN active layer; wherein each of the first oxide layer, the second oxide layer, and the third oxide layer independently comprises an oxide collar region surrounding an inner oxide region.

Aspect 62. The integrated multi-wavelength LED of any one of aspects 56 to 61, comprising a back DBR overlying the third InGaN active layer.

Aspect 63. The integrated multi-wavelength LED of any one of aspects 56 to 62, wherein each of the first InGaN active layer, the second InGaN active layer, and the third InGaN active layer, emit radiation within substantially the same aperture.

Aspect 64. The integrated multi-wavelength LED of any one of aspects 56 to 63, comprising: a first relaxed InGaN layer underlying the first InGaN active layer: a second relaxed InGaN layer underlying the second InGaN active layer; and a third relaxed InGaN layer underlying the third InGaN active layer; wherein each of the relaxed InGaN layers is characterized by a different in-plane a-lattice parameter.

Aspect 65. The integrated multi-wavelength LED of any one of aspects 56 to 64, wherein, each relaxed InGaN layer is characterized by a relaxed in-plane a-lattice parameter within 100 nm of an adjoining underlying epitaxial layer; and the adjoining underlying epitaxial layer characterized by a relaxed in-plane a-lattice parameter that is different than that of the relaxed InGaN layer.

Aspect 66. The integrated multi-wavelength LED of any one of aspects 56 to 65, wherein each of the relaxed InGaN layers is characterized by a relaxed in-plane a-lattice parameter within 100 nm of an adjoining underlying layer.

Aspect 67. The integrated multi-wavelength LED of any one of aspects 56 to 66, wherein each of the InGaN active layers is configured to emit radiation through the same aperture.

Aspect 68. The integrated multi-wavelength LED of any one of aspects 56 to 66, wherein each of the InGaN active layers is configured to be independently addressable.

Aspect 69. The EELD, VCSEL, or LED of any one of aspects 1 to 68, wherein the InGaN active layer comprises an InN mole fraction from 0.1% to 40%.

Aspect 70. The EELD, VCSEL, or LED of any one of aspects 1 to 68, wherein the InGaN active layer comprises an InN mole fraction from 1% to 40%.

Aspect 71. The EELD, VCSEL, or LED of any one of aspects 1 to 68, wherein the InGaN active layer comprises an InN mole fraction from 5% to 40%.

Aspect 72. The EELD, VCSEL, or LED of any one of aspects 1 to 68, wherein the InGaN active layer comprises an InN mole fraction from 10% to 40%.

Aspect 73. The EELD, VCSEL, or LED of any one of aspects 1 to 72, wherein the InGaN active layer comprises $In_xAl_yGa_{1-x-y}N$, wherein $0<x<0.4$ and $0\leq y<1$.

Aspect 74. The EELD, VCSEL, or LED of any one of aspects 1 to 72, wherein the InGaN active layer comprises $In_xGa_{1-x}N$, wherein $0<x<0.4$.

Aspect 75. The EELD, VCSEL, or LED of any one of aspects 1 to 74, wherein the in-plane a-lattice parameter of the InGaN active layer is within ±0.1% that of a fully relaxed in-plane a-lattice parameter of the InGaN alloy.

Aspect 76. The EELD, VCSEL, or LED of any one of aspects 1 to 75, wherein the in-plane a-lattice parameter of the InGaN active layer is within 0.005 Å of a fully in-plane a-lattice parameter of the InGaN alloy.

Aspect 77 The EELD, VCSEL, or LED of any one of aspects 1 to 76, wherein the InGaN active layer is characterized by an InN mole fraction from $0\%<x<4\%$, and the InGaN active layer is configured to emit radiation with a peak emission wavelength between 380 nm and 500 nm.

Aspect 78. The EELD, VCSEL, or LED of any one of aspects 1 to 76, wherein the InGaN active layer is characterized by an InN mole fraction from $4\%<x<8\%$, and the InGaN active layer is configured to emit radiation with a peak emission wavelength between 430 nm and 530 nm.

Aspect 79. The EELD, VCSEL, or LED of any one of aspects 1 to 76, wherein the InGaN active layer is characterized by an InN mole fraction from $8\%<x<12\%$, and the InGaN active layer is configured to emit radiation with a peak emission wavelength between 450 nm and 575 nm.

Aspect 80. The EELD, VCSEL, or LED of any one of aspects 1 to 76, wherein the InGaN active layer is characterized by an InN mole fraction from $12\%<x<16\%$, and the InGaN active layer is configured to emit radiation with a peak emission wavelength between 475 nm and 600 nm.

Aspect 81. The EELD, VCSEL, or LED of any one of aspects 1 to 76, wherein the InGaN active layer is characterized by an InN mole fraction from $16\%<x<20\%$, and the InGaN active layer is configured to emit radiation with a peak emission wavelength between 500 nm and 650 nm.

Aspect 82. The EELD, VCSEL, or LED of any one of aspects 1 to 76, wherein the InGaN active layer is characterized by an InN mole fraction from $20\%<x<24\%$, and the InGaN active layer is configured to emit light with a peak emission wavelength between 530 nm and 680 nm.

Aspect 83. The EELD, VCSEL, or LED of any one of aspects 1 to 76, wherein the InGaN active layer is characterized by an InN mole fraction from $24\%<x<28\%$, and the InGaN active layer is configured to emit light with a peak emission wavelength between 560 nm and 720 nm.

Aspect 84. The EELD, VCSEL, or LED of any one of aspects 1 to 76, wherein the InGaN active layer is characterized by an InN mole fraction from $28\%<x<32\%$, and the InGaN active layer is configured to emit light with a peak emission wavelength between 600 nm and 800 nm.

Aspect 85. The EELD, VCSEL, or LED of any one of aspects 1 to 76, wherein the InGaN active layer is characterized by an InN mole fraction from $28\%<x<32\%$, and the InGaN active layer is configured to emit light with a peak emission wavelength between 630 nm and 850 nm.

Aspect 86. An EELD as substantially shown in FIG. 1.

Aspect 87. A VCSEL as substantially shown in FIG. 5.

Aspect 88. An integrated multi-wavelength VCSEL as substantially shown in FIG. 9.

Aspect 89. An integrated multi-wavelength VCSEL as substantially shown in FIG. 11.

Aspect 90. An integrated multi-wavelength LED as substantially shown in FIG. 12.

Aspect 91. An optoelectronic device comprising the EELD, VCSEL, or LED of any one of aspects 1 to 90.

Aspect 92. An optical system comprising the EELD, VCSEL or LED of any one of aspects 1 to 90, wherein the optical system comprises a laser projector, a laser television, a cinema projector, a head-up display, an augmented reality and/or virtual reality wearable, an augmented reality and/or virtual reality display, high-speed interconnects, a sensing system, a light detection and ranging apparatus (LiDAR) system, a communication system, a medical device, machining equipment, and additive manufacturing equipment.

The invention is further defined by one or more of the following aspects.

Aspect 1. An edge-emitting laser diode (EELD), wherein the EELD comprises:

a III-nitride layer comprising a III-nitride surface; and a relaxed In-containing III-nitride layer overlying the III nitride surface, wherein the relaxed In-containing III-nitride layer comprises a first InN mole fraction that is greater than 0:

a first cladding layer overlying the relaxed In-containing III-nitride layer:

an active region overlying the first cladding layer; and a second cladding layer overlying the active region, wherein the first cladding layer, the active region, and the second cladding layer comprise an In-containing III-nitride material; and the first cladding layer, the active region, and the second cladding layer are lattice matched to the relaxed In-containing III-nitride layer, wherein the relaxed In-containing III-nitride layer has a relaxed surface characterized by a single-phase gallium-polar (0001) orientation and a substantially relaxed in-plane a-lattice parameter.

Aspect 2. A monolithic multi-wavelength EELD, wherein the multi-wavelength EELD comprises:

a III-nitride base layer;

a first EELD of aspect 1 overlying a first portion of the III-nitride base layer; and a second EELD comprising a III-nitride layer:

wherein the relaxed In-containing III-nitride layer of the first EELD and the III-nitride layer of the second EELD have different InN mole fractions.

Aspect 3. The EELD of aspect 2, wherein the III-nitride layer of the second EELD comprises an In-containing III-nitride layer.

Aspect 4. The EELD of aspect 2, wherein the III-nitride layer of the second EELD comprises a relaxed In-containing III-nitride layer.

Aspect 5. The EELD of aspect 2, wherein the second EELD comprises an EELD according to aspect 1.

Aspect 6. The EELD of aspect 2, wherein the second EELD overlies a second portion of the III-nitride base layer.

Aspect 6A. The EELD of aspect 2, wherein the second EELD does not overlie a second portion of the III-nitride base layer.

Aspect 7. A multi-wavelength EELD comprising:

a first III-nitride layer:

a first active region comprising a III-nitride layer lattice-matched to the first III-nitride layer:

a second III-nitride layer overlying the first active region, wherein the second III-nitride layer comprises a relaxed In-containing III-nitride layer:

a second active region comprising an In-containing III-nitride layer lattice-matched to the second III-nitride layer:

wherein the first active region is configured to emit electromagnetic radiation within a first wavelength range, and the second active region is configured to emit electromagnetic radiation within a second wavelength range; and wherein the second relaxed In-containing III-nitride layer has a relaxed surface characterized by a single-phase gallium-polar (0001) orientation and a substantially relaxed in-plane a-lattice parameter.

Aspect 8. The multi-wavelength EELD of aspect 7, wherein the first III-nitride layer comprises an In-containing III-nitride layer.

Aspect 9. The multi-wavelength EELD of aspect 7, wherein the first III-nitride layer comprises a relaxed In-containing III-nitride layer.

Aspect 10. The multi-wavelength EELD of aspect 7, comprising:

a third III-nitride layer overlying the second active region, wherein, the third III-nitride layer comprises a third relaxed In-containing III-nitride layer; and a third active region overlying the third III-nitride layer, wherein the third active region is lattice-matched to the third relaxed In-containing III-nitride layer, wherein the third active region is configured to emit electromagnetic radiation within a third wavelength range.

Aspect 11. The multi-wavelength EELD of any one of aspects 1 to 10, wherein the multi-wavelength EELD comprises an n-doped electrode and p-doped electrodes.

Aspect 12. The multi-wavelength EELD of any one of aspects 1 to 11, wherein each active region independently comprises a quantum well or multi-quantum well stack.

Aspect 13. The multi-wavelength EELD of any one of aspects 1 to 12, wherein the first cladding layer is positively doped and the second cladding layer is negatively doped, or the first cladding layer is negatively doped and the second cladding layer is positively doped.

Aspect 14. The multi-wavelength EELD of any one of aspects 1 to 13, wherein a III-nitride layer comprises $In_xAl_yGa_{1-x-y}N$ wherein $0 \leq x \leq 1$, $0 \leq y \leq 1$, and $x+y<1$.

Aspect 15. The multi-wavelength EELD of any one of aspects 1 to 13, wherein an In-containing III-nitride layer comprises $In_xAl_yGa_{1-x-y}N$, wherein $0<x \leq 0.4$ and $0 \leq y \leq 1$.

Aspect 16. The multi-wavelength EELD of any one of aspects 1 to 14, wherein the relaxed In-containing III-nitride layer has a thickness greater than 100 nm and comprises $In_xAl_yGa_{1-x-y}N$, where $0<x \leq 0.4$ and $0 \leq y \leq 1$.

Aspect 17. The multi-wavelength EELD of any one of aspects 1 to 14, wherein the relaxed In-containing III-nitride layer has a thickness greater than 100 nm and comprises $In_xGa_{1-x}N$, where $0<x \leq 0.4$.

Aspect 18. The multi-wavelength EELD of any one of aspects 1 to 17, wherein a surface of a relaxed In-containing III-nitride layer is characterized by:

a root-mean-square surface roughness less than 1 nm over a 1×1 $\mu m^2$ area; and a pit density less than $1 \times 10^9$ $cm^{-2}$, as determined by atomic force microscopy or electron microscopy.

Aspect 19. The multi-wavelength EELD of any one of aspects 1 to 18, wherein a relaxed In-containing III-nitride layer has a substantially relaxed in-plane a-lattice parameter is within ±0.5% that of a fully relaxed in-plane a-lattice parameter of the In-containing III-nitride material.

Aspect 20. The multi-wavelength EELD of any one of aspects 1 to 19, comprising a template underlying a relaxed In-containing III-nitride layer, wherein the relaxed In-containing III-nitride layer adjoins the template.

Aspect 21. The multi-wavelength EELD of aspect 20, wherein the template comprises a patterned template.

Aspect 22. The multi-wavelength EELD of aspect 21, wherein the patterned template comprises a plurality of pyramidal seed structures.

Aspect 23. The multi-wavelength EELD of aspect 20, wherein the template comprises a slip region.

Aspect 24. The multi-wavelength EELD of any one of aspects 1 to 23, wherein an EELD is configured to emit electromagnetic radiation with a dominant wavelength between 525 nm and 550 nm.

Aspect 25. The multi-wavelength EELD of any one of aspects 1 to 23, wherein an EELD is configured to emit electromagnetic radiation with a dominant wavelength between 600 nm and 640 nm.

Aspect 26. The multi-wavelength EELD of any one of aspects 1 to 25, wherein, an active region comprises an In-containing III-nitride waveguide region and at least one In-containing III-nitride quantum well; and a difference in InN mole fraction between the at least one In-containing III-nitride quantum well and the waveguide region is less than 10%.

Aspect 27. A wafer comprising the EELD of any one of aspects 1 to 26.

Aspect 28. The wafer of aspect 27, wherein the wafer comprises a substrate and each EELD overlies the substrate.

Aspect 29. The wafer of aspect 28, wherein the substrate is selected from silicon, silicon-on-insulator (SOI), or a bonded engineered substrate incorporating a III-nitride layer.

Aspect 30. The wafer of any one of aspects 27 to 29, wherein the substrate has a diameter of greater than 150 mm.

Aspect 31. A method of fabricating an edge-emitting laser diode (EELD), comprising:

growing a relaxed In-containing III-nitride layer overlying a III nitride layer:

growing a first cladding layer overlying the relaxed In-containing III-nitride layer:

growing an active region overlying the first cladding layer; and growing a second cladding layer overlying the active region, wherein, the relaxed In-containing III-nitride layer has an InN mole fraction greater than 0; and the relaxed In-containing III-nitride layer has a single-phase gallium-polar (0001) orientation and a substantially relaxed in-plane a-lattice parameter.

Aspect 32. A method of fabricating a multi-wavelength EELD, comprising:

growing first EELD epitaxial layers overlying a first portion of a substrate:

growing a relaxed In-containing III-nitride layer overlying a second portion of the substrate; and growing second EELD epitaxial layers overlying the relaxed In-containing III-nitride layer;

wherein, the first and second EELD epitaxial stacks are configured to emit electromagnetic radiation within different wavelength ranges, the relaxed In-containing III-nitride layer has an InN mole fraction greater than 0; and the relaxed In-containing III-nitride layer has a single-phase gallium-polar (0001) orientation and a substantially relaxed in-plane a-lattice parameter.

Aspect 33. The method of aspect 32, comprising, before growing the first EELD epitaxial layers, growing a first III-nitride layer, and growing the first EELD epitaxial layers on the first III-nitride layer.

Aspect 34. The method of aspect 32, comprising, before growing the first EELD epitaxial layers, growing a first relaxed In-containing III-nitride layer, and growing the first EELD epitaxial layers on the first relaxed In-containing III-nitride layer.

Aspect 35. The method of any one of aspects 32 to 34, comprising, before growing a relaxed In-containing III-nitride layer, growing a III-nitride layer, and growing the relaxed In-containing III-nitride layer on the III-nitride layer.

Aspect 36. A method of fabricating a multi-wavelength EELD, comprising:

growing or providing a III nitride layer:

growing first EELD epitaxial layers overlying the first III-nitride layer:

growing a second III-nitride layer overlying the first EELD epitaxial layers wherein the second III-nitride layer comprises a relaxed In-containing III-nitride layer; and growing second EELD epitaxial layers overlying the second III-nitride layer:

wherein, the first III-nitride layer and the second III-nitride layer comprise different InN mole fractions;

the first and second EELD epitaxial stacks are configured to emit electromagnetic radiation within different wavelength ranges;

the second III-nitride layer has an InN mole fraction greater than 0; and the second III-nitride layer has a single-phase gallium-polar (0001) orientation and a substantially relaxed in-plane a-lattice parameter.

Aspect 37. The method of aspect 36, wherein the first III-nitride layer comprises an In-containing III-nitride layer.

Aspect 38. The method of aspect 36, wherein the first III-nitride layer comprises a relaxed In-containing III-nitride layer.

Aspect 39. The method of any one of aspects 31 to 38, wherein growing a relaxed In-containing III-nitride layer comprises growing using metal-rich MOCVD.

Aspect 40. The method of any one of aspects 31 to 39, wherein growing a relaxed In-containing III-nitride layer comprises growing the relaxed In-containing III-nitride layer on a template overlying the III-nitride layer.

Aspect 41. The method of aspect 40, wherein the template comprises a patterned template.

Aspect 42. The method of aspect 41, wherein the patterned template comprises a plurality of pyramidal seed structures.

Aspect 43. The method of aspect 40, wherein the template comprises a slip region.

Aspect 44. The method of any one of aspects 31 to 43, wherein the method comprises growing an n-doped electrode and p-doped electrode.

Aspect 45. The method of any one of aspects 31 to 44, wherein the method comprises growing an active region.

Aspect 46. The method of any one of aspects 31 to 45, wherein the active region comprises a quantum well or multi-quantum well stack.

Aspect 47. The method of any one of aspects 31 to 46, wherein the method comprises growing a positively doped cladding layer and growing a negatively doped cladding layer.

Aspect 48. A vertical-cavity surface-emitting laser (VCSEL) device, wherein the VCSEL comprises:
- a III-nitride layer comprising a III-nitride surface; and
- a first distributed Bragg reflector (DBR) stack overlying the III-nitride layer:
- a relaxed In-containing III-nitride layer, wherein the relaxed In-containing III-nitride layer underlies and/or overlies the first DBR stack:
- an active region overlying the relaxed In-containing III-nitride layer; and
- a second DBR stack overlying the active region:

wherein,
- the active region comprises at least one In-containing III-nitride quantum well;
- the active region is lattice matched to the relaxed In-containing III-nitride layer;
- the relaxed In-containing III-nitride layer has an InN mole fraction greater than 0; and
- the relaxed In-containing III-nitride layer has a single-phase gallium-polar (0001) orientation and a substantially relaxed in-plane a-lattice parameter.

Aspect 49. The VCSEL device of aspect 48, wherein the first DBR stack overlies a relaxed In-containing III-nitride layer, such that the in-plane a-lattice parameter of the first DBR stack is associated with the substantially relaxed in-plane a-lattice parameter of the relaxed In-containing III-nitride layer.

Aspect 50. The VCSEL device of aspect 48, wherein a relaxed In-containing III-nitride layer overlies the first DBR stack and the active region is lattice matched to the relaxed In-containing III-nitride layer overlying the first DBR stack.

Aspect 51. A monolithic multi-wavelength (MW) VCSEL, wherein the MW VCSEL comprises:
- a base III-nitride layer;
- a first VCSEL epitaxial stack overlying the base III-nitride layer, wherein the first VCSEL epitaxial stack comprises:
  - a first DBR overlying the base III-nitride layer;
  - a first III-nitride layer overlying and/or underlying the first DBR; and
  - a first active region overlying the first III-nitride layer, wherein the first active region is lattice matched to the first III-nitride layer; and
- a second VCSEL epitaxial stack overlying a second portion of the base III-nitride layer, wherein the second VCSEL epitaxial stack comprises:
  - a second DBR overlying the first active region;
  - a second III-nitride layer overlying and/or underlying the second DBR, wherein the second III-nitride layer comprises a relaxed In-containing III-nitride layer; and
  - a second active region overlying the second III-nitride layer,
  - wherein the second active region is lattice matched to the second III-nitride layer; wherein,
  - the first active region comprises one or more first multiple quantum wells;
  - the second active region comprises one or more second multiple quantum wells;
  - the first active region and the second active region are configured to emit electromagnetic radiation in different wavelength ranges;
  - the relaxed In-containing III-nitride layer has an InN mole fraction greater than 0; and
  - the relaxed In-containing III-nitride layer has a single-phase gallium-polar (0001) orientation and a substantially relaxed in-plane a-lattice parameter.

Aspect 52. The VCSEL of aspect 51, wherein the first VCSEL stack does not overlie the base III-nitride layer.

Aspect 53. The VCSEL of aspect 51, wherein the first VCSEL stack overlies a first portion of the base III-nitride layer.

Aspect 54. The VCSEL of aspect 51, wherein the first III-nitride layer comprises an In-containing III-nitride layer.

Aspect 55. The VCSEL of aspect 51, wherein the first III-nitride layer comprises a relaxed In-containing III-nitride layer.

Aspect 56. A monolithic integrated multi-wavelength (MW) VCSEL device, comprising:
- a III-nitride layer:
- a first DBR overlying the III-nitride layer:
- a first relaxed In-containing III-nitride layer underlying and/or overlying the first DBR:
- a first quantum well active region overlying a first portion of the first DBR:
- a second DBR overlying the first quantum well active region:
- a third DBR overlying a second portion of the first DBR:
- a second relaxed In-containing III-nitride layer overlying and/or overlying the third DBR:
- a second quantum well active region overlying the second relaxed In-containing III-nitride layer; and
- a fourth DBR overlying a first portion of the second quantum well active region;

wherein,
- the first quantum well active region is configured to emit electromagnetic radiation within a first wavelength range;
- the first DBR and the second DBR are configured to reflect electromagnetic radiation in the first wavelength range:
- the second quantum well active region is configured to emit electromagnetic radiation within a second wavelength range;
- the third DBR and the fourth DBR are configured to reflect electromagnetic radiation in the second wavelength range; and
- each of the first and second relaxed In-containing III-nitride layers independently has an InN mole fraction greater than 0; and
- each of the first and second relaxed In-containing III-nitride layers independently has a single-phase gallium-polar (0001) orientation and a substantially relaxed in-plane a-lattice parameter.

Aspect 57. The monolithic integrated multi-wavelength (MW) VCSEL device of aspect 56, wherein the second DBR and fourth DBR comprise the same dielectric Bragg layer stack and are deposited simultaneously.

Aspect 58. A multi-wavelength VCSEL comprising:
- a base III-nitride layer;
- a first DBR overlying the base III-nitride layer;
- a first III-nitride layer overlying and/or underlying the first DBR:
- a first active region overlying the first III-nitride layer:
- a second III-nitride layer overlying the first active region, wherein the second III-nitride layer comprises a relaxed In-containing III-nitride layer:
- a second active region overlying the second III-nitride layer; and
- a second DBR overlying the second active region:

wherein,
- the first active region is lattice-matched to the first III-nitride layer;

the second active region is lattice-matched to the second III-nitride layer:

the first active region is configured to emit electromagnetic radiation within a first wavelength range;

the second active region is configured to emit electromagnetic radiation within a second wavelength range; and the second III-nitride layer has a single-phase gallium-polar (0001) orientation and a substantially relaxed in-plane a-lattice parameter.

Aspect 59. The VCSEL of aspect 58, wherein the first III-nitride layer comprises an In-containing III-nitride layer.

Aspect 60. The VCSEL of aspect 58, wherein the first III-nitride layer comprises a relaxed In-containing III-nitride layer.

Aspect 61. The VCSEL of any one of aspects 48 to 60, wherein the VCSEL comprises an n-doped electrode and a p-doped electrode.

Aspect 62. The VCSEL of any one of aspects 48 to 61, wherein the active region comprises a quantum well or multi-quantum well stack.

Aspect 63. The VCSEL of any one of aspects 48 to 62, wherein the first and second III-nitride layers independently comprise $In_xAl_yGa_{1-x-y}N$ wherein $0 \leq x \leq 1$, $0 \leq y \leq 1$, and $x+y<1$.

Aspect 64. The VCSEL of any one of aspects 48 to 63, wherein the first and second III-nitride layers independently comprise GaN, $In_xGa_{1-x}N$ wherein $x>0$, $In_yAl_{1-y}N$ wherein $y>0$, or AlN.

Aspect 65. The VCSEL of any one of aspects 48 to 64, wherein the relaxed In-containing III-nitride layer has a thickness greater than 100 nm and comprises $In_xAl_yGa_{1-x-y}N$, where $0<x \leq 0.4$ and $0 \leq y \leq 1$.

Aspect 66. The VCSEL of any one of aspects 48 to 65, wherein the relaxed In-containing III-nitride layer has a thickness greater than 100 nm and comprises $In_xGa_{1-x}N$, where $0<x \leq 0.4$.

Aspect 67. The VCSEL of any one of aspects 48 to 66, wherein the relaxed In-containing III-nitride layer comprises a relaxed surface characterized by:

(a) a root-mean-square surface roughness less than 1 nm over a $1 \times 1$ $\mu m^2$ area; and (b) a pit density less than $1 \times 10^9$ $cm^{-2}$, as determined by atomic force microscopy or electron microscopy.

Aspect 68. The VCSEL of any one of aspects 48 to 67, wherein the substantially relaxed in-plane a-lattice parameter is within ±0.5% that of a fully relaxed in-plane a-lattice parameter of the In-containing III-nitride material.

Aspect 69. The VCSEL of any one of aspects 48 to 67, comprising a template underlying the relaxed In-containing III-nitride layer; and the relaxed In-containing III-nitride layer adjoins the template.

Aspect 70. The VCSEL of aspect 69, wherein the template comprises a patterned template.

Aspect 71. The VCSEL of aspect 70, wherein the patterned template comprises a plurality of pyramidal seed structures.

Aspect 73. The VCSEL of aspect 69, wherein the template comprises a slip region.

Aspect 74. The VCSEL of any one of aspects 48 to 73, wherein the VCSEL is configured to emit electromagnetic radiation with a dominant wavelength between 525 nm and 550 nm.

Aspect 75. The VCSEL of any one of aspects 48 to 74, wherein the VCSEL is configured to emit electromagnetic radiation with a dominant wavelength between 600 nm and 640 nm.

Aspect 76. A wafer comprising the VCSEL of any one of aspects 48 to 75.

Aspect 77. The wafer of aspect 76, wherein the wafer comprises a substrate and the VCSEL overlies the substrate.

Aspect 78. The wafer of aspect 77, wherein the substrate is selected from silicon, silicon-on-insulator (SOI), or a bonded engineered substrate incorporating a III-nitride layer.

Aspect 79. The wafer of any one of aspects 76 to 78, wherein the substrate has a diameter of greater than 150 mm.

Aspect 80. A method of fabricating a VCSEL, comprising:

(a) growing a relaxed In-containing III-nitride layer overlying a III nitride layer, wherein the relaxed In-containing III-nitride layer has an in-plane a-lattice parameter that is different than the in-plane a-lattice parameter of the III-nitride layer;

(b) growing and/or depositing a first DBR underlying and/or overlying the relaxed In-containing III-nitride layer:

(c) growing an active region overlying the relaxed In-containing III-nitride layer, wherein the active region comprises multiple quantum wells; and (d) growing or depositing a second DBR overlying the active region, wherein, the active region is lattice matched to the relaxed In-containing III-nitride layer;

the relaxed In-containing III-nitride layer has an InN mole fraction greater than 0; and the relaxed In-containing III-nitride layer has a single-phase gallium-polar (0001) orientation and a substantially relaxed in-plane a-lattice parameter.

Aspect 81. A method of fabricating a multi-color VCSEL comprising:

(a) fabricating a first VCSEL overlying a first portion of a III-nitride layer comprising:

growing a first relaxed In-containing III-nitride layer overlying a first portion of a III-nitride layer;

growing and/or depositing a first DBR underlying and/or overlying the first relaxed In-containing III-nitride layer; and growing a first active region comprising multiple quantum wells overlying the first relaxed In-containing III-nitride layer, wherein the first active region is lattice-matched to the first In-containing III-nitride layer; and (b) fabricating a second VCSEL overlying a second portion of a III-nitride layer comprising:

growing a second relaxed In-containing III-nitride layer overlying a second portion of a III-nitride layer;

growing and/or depositing a second DBR underlying and/or overlying the second relaxed In-containing III-nitride layer;

growing a second active region comprising multiple quantum wells overlying the second relaxed In-containing III-nitride layer, wherein the second active region is lattice-matched to the second In-containing III-nitride layer; and depositing a third DBR overlying the first active region and the second active region, and wherein the first active region and the second active region are configured to emit electromagnetic radiation in a different wavelength range.

Aspect 82. The method of aspect 81, wherein the third DBR is configured to reflect light of both the first active region and the second active region.

Aspect 83. A method of fabricating a monolithic integrated multi-wavelength VCSEL, comprising:

growing and/or depositing a first DBR underlying and/or overlying a first relaxed In-containing III-nitride layer:

growing a first relaxed In-containing III-nitride layer overlying the first relaxed In-containing III-nitride layer:

growing a first quantum well active region overlying a first portion of the first relaxed In-containing III-nitride layer:

growing and/or depositing a second DBR overlying a second portion of the first relaxed In-containing III-nitride layer:

growing a second relaxed In-containing III-nitride layer overlying the second DBR:

growing a second quantum well region overlying a first portion of the second relaxed In-containing III-nitride layer; and depositing a third DBR above the first quantum well active region and the second quantum well region;

wherein, the first multiple quantum well active region is configured to emit electromagnetic radiation in a first wavelength range;

the second multiple quantum well active region is configured to emit electromagnetic radiation in a second wavelength range:

the first DBR is configured to reflect electromagnetic radiation in the first wavelength range;

the second DBR is configured to reflect electromagnetic radiation in the second wavelength range;

the third DBR is configured to reflect light of both the first quantum well active region and the second quantum well region; and each of the relaxed In-containing III-nitride layers independently has an InN mole fraction greater than 0; and each of the relaxed In-containing III-nitride layers independently has a single-phase gallium-polar (0001) orientation and a substantially relaxed in-plane a-lattice parameter.

Aspect 84. A method of fabricating a monolithic integrated multi-wavelength VCSEL, comprising:

growing a first DBR overlying a III-nitride layer:

growing and/or depositing a first relaxed In-containing III-nitride layer underlying and/or overlying the first DBR:

growing a first active region overlying the first relaxed In-containing III-nitride layer:

growing a second relaxed In-containing III-nitride layer overlying the first active region:

growing a second active region overlying the second relaxed In-containing III-nitride layer; and depositing a second DBR overlying the second active region, wherein, the first active region is lattice-matched to the first relaxed In-containing III-nitride layer;

the second active region is lattice-matched to the second relaxed In-containing III-nitride layer:

the first active region is configured to emit electromagnetic radiation within a first wavelength range;

the second active region is configured to emit electromagnetic radiation within a second wavelength range;

each of the relaxed In-containing III-nitride layers independently has an InN mole fraction greater than 0; and each of the relaxed In-containing III-nitride layers independently has a single-phase gallium-polar (0001) orientation and a substantially relaxed in-plane a-lattice parameter.

Aspect 85. The method of any one of aspects 80 to 84, wherein growing a relaxed In-containing III-nitride layer comprises growing using metal-rich MOCVD.

Aspect 86. The method of any one of aspects 80 to 85, wherein growing a relaxed In-containing III-nitride layer comprises growing the relaxed In-containing III-nitride layer on a template overlying the III-nitride layer.

Aspect 87. The method of aspect 86, wherein the template comprises a patterned template.

Aspect 88. The method of aspect 87, wherein the patterned template comprises a plurality of pyramidal seed structures.

Aspect 89. The method of aspect 86, wherein the template comprises a slip region.

Aspect 90. The method of any one of aspects 80 to 89, wherein the method comprises growing an n-doped electrode and a p-doped electrode.

Aspect 91. The method of any one of aspects 80 to 90, wherein an active region comprises a quantum well or a multi-quantum well stack.

The invention is further defined by one or more of the following aspects.

Aspect. 1. An edge-emitting laser diode (EELD) device, wherein the EELD comprises:

a III-nitride layer; and a relaxed In-containing III-nitride layer overlying the III nitride layer and comprising a III-nitride surface, wherein the relaxed In-containing III-nitride layer comprises a first InN mole fraction that is greater than 0;

a first cladding layer overlying the relaxed In-containing III-nitride layer:

an active region overlying the first cladding layer; and a second cladding layer overlying the active region, wherein, the first cladding layer, the active region, and the second cladding layer comprise an In-containing III-nitride material; and the first cladding layer, the active region, and the second cladding layer are lattice matched to the relaxed In-containing III-nitride layer, wherein the relaxed In-containing III-nitride layer is characterized by a single-phase gallium-polar (0001) orientation and a substantially relaxed in-plane a-lattice parameter.

Aspect. 2. The EELD device of aspect 1, wherein a III-nitride layer comprises $In_xAl_yGa_{1-x-y}N$ wherein $0 \leq x \leq 1$, $0 \leq y \leq 1$, and $x+y \leq 1$.

Aspect. 3. The EELD device of any one of aspects 1 to 2, wherein the relaxed In-containing III-nitride layer comprises $In_xAl_yGa_{1-x-y}N$, wherein $0<x \leq 0.4$ and $0 \leq y \leq 1$.

Aspect. 4. The EELD device of any one of aspects 1 to 3, wherein the relaxed In-containing III-nitride layer comprises $In_xGa_{1-x}N$, where $0<x \leq 0.4$.

Aspect. 5. The EELD device of any one of aspects 1 to 4, wherein the relaxed In-containing III-nitride layer has a thickness greater than 100 nm.

Aspect. 6. The EELD device of any one of aspects 1 to 5, wherein the relaxed In-containing III-nitride layer has an in-plane a-lattice parameter is greater than 3.20 Å.

Aspect. 7. The EELD device of any one of aspects 1 to 6, wherein the relaxed In-containing III-nitride layer has material composition and is characterized by a substantially relaxed in-plane a-lattice parameter that is within ±0.5% that of a fully relaxed in-plane a-lattice parameter of the In-containing III-nitride material composition.

Aspect. 8. The EELD device of any one of aspects 1 to 7, wherein a surface of the relaxed In-containing III-nitride layer is characterized by an in-plane a-lattice parameter is greater than 3.20 Å.

Aspect. 9. The EELD device of any one of aspects 1 to 8, wherein the III-nitride surface of the relaxed In-containing III-nitride layer is characterized by a root-mean-square surface roughness less than 1 nm over a 1×1 $\mu m^2$ area.

Aspect. 10. The EELD device of any one of aspects 1 to 9, wherein the III-nitride surface of the relaxed In-containing III-nitride layer is characterized by a pit density less than $1\times10^9$ $cm^{-2}$, as determined by atomic force microscopy or electron microscopy.

Aspect. 11. The EELD device of any one of aspects 1 to 10, wherein a surface of the relaxed In-containing III-nitride layer has a substantially relaxed in-plane a-lattice parameter that is within ±0.5% that of a fully relaxed in-plane a-lattice parameter of the In-containing III-nitride material.

Aspect. 12. The EELD device of any one of aspects 1 to 11, comprising a template underlying a relaxed In-containing III-nitride layer, wherein the relaxed In-containing III-nitride layer is overlying the template.

Aspect. 13. The EELD device of aspect 12, wherein the template comprises a patterned template.

Aspect. 14. The EELD device of aspect 13, wherein the patterned template comprises a plurality of pyramidal seed structures.

Aspect. 15. The EELD device of aspect 12, wherein the template comprises a slip region.

Aspect. 16. The EELD device of any one of aspects 1 to 15, wherein the active region comprises a quantum well or multi-quantum well stack.

Aspect. 17. The EELD device of any one of aspects 1 to 16, wherein the first cladding layer includes a first dopant, and the second cladding layer includes a second dopant of opposite conductivity type to the first dopant.

Aspect. 18. The EELD device of any one of aspects 1 to 17, comprising a first electrode and a second electrode, wherein, the first electrode is electrically connected to the first cladding layer; and the second electrode is electrically connected to the second cladding layer.

Aspect. 19. The EELD device of any one of aspects 1 to 18, wherein the EELD device is configured to emit electromagnetic radiation with a dominant wavelength between 525 nm and 550 nm.

Aspect. 20. The EELD device of any one of aspects 1 to 18, wherein the EELD device is configured to emit electromagnetic radiation with a dominant wavelength between 600 nm and 640 nm.

Aspect. 21. A wafer comprising the EELD device of any one of aspects 1 to 20.

Aspect. 22. The wafer of aspect 21, wherein the wafer comprises a substrate and the EELD device overlies the substrate.

Aspect. 23. The wafer of aspect 22, wherein the substrate is selected from silicon, silicon-on-insulator (SOI), or a bonded engineered substrate incorporating a III-nitride layer.

Aspect. 24. The wafer of any one of aspects 21 to 23, wherein the substrate has a diameter of greater than 150 mm.

Aspect. 25. A system comprising the EELD device of any one of aspects 1 to 21.

Aspect. 26. A method of fabricating an edge-emitting laser diode (EELD) device, comprising:

growing a relaxed In-containing III-nitride layer overlying a III nitride layer:

growing a first cladding layer overlying the relaxed In-containing III-nitride layer:

growing an active region overlying the first cladding layer; and growing a second cladding layer overlying the active region, wherein, the relaxed In-containing III-nitride layer has an InN mole fraction greater than 0; and the relaxed In-containing III-nitride layer has a single-phase gallium-polar (0001) orientation and a substantially relaxed in-plane a-lattice parameter.

Aspect. 27. The method of aspect 26, wherein the III-nitride layer comprises an In-containing III-nitride layer.

Aspect. 28. The method of any one of aspects 26 to 27, wherein the III-nitride layer comprises a relaxed In-containing III-nitride layer.

Aspect. 29. The method of any one of aspects 26 to 28, wherein growing a relaxed In-containing III-nitride layer comprises growing using metal-rich MOCVD conditions.

Aspect. 30. The method of any one of aspects 26 to 29, wherein, comprising growing or depositing a template on the III-nitride surface; and growing the relaxed In-containing III-nitride layer comprises growing the relaxed In-containing III-nitride layer on the template.

Aspect. 31. The method of aspect 30, wherein the template comprises a patterned template.

Aspect. 32. The method of aspect 31, wherein the patterned template comprises a plurality of pyramidal seed structures.

Aspect. 33. The method of aspect 30, wherein the template comprises a slip region.

Aspect. 34. The method of any one of aspects 26 to 33, wherein the method comprises:

growing an n-doped electrode electrically connected to one of the cladding layers; and growing a p-doped electrode electrically connected to the other cladding layer.

Aspect. 35. A vertical-cavity surface-emitting laser (VCSEL) device, wherein the VCSEL comprises:

a III-nitride layer; and a first distributed Bragg reflector (DBR) stack overlying the III-nitride layer:

a relaxed In-containing III-nitride layer comprising a III-nitride surface, wherein the relaxed In-containing III-nitride layer underlies or overlies the first DBR stack:

an active region overlying the relaxed In-containing III-nitride layer; and a second DBR stack overlying the active region;

wherein, the active region comprises at least one In-containing III-nitride quantum well;

the active region is lattice matched to the relaxed In-containing III-nitride layer;

the relaxed In-containing III-nitride layer has an InN mole fraction greater than 0; and the relaxed In-containing III-nitride layer has a single-phase gallium-polar (0001) orientation and a substantially relaxed in-plane a-lattice parameter.

Aspect. 36. The VCSEL device of aspect 35, wherein a III-nitride layer comprises $In_xAl_yGa_{1-x-y}N$ wherein 0≤x≤1, 0≤y≤1, and x+y≤1.

Aspect. 37. The VCSEL device of any one of aspects 35 to 36, wherein the relaxed In-containing III-nitride layer comprises $In_xAl_yGa_{1-x-y}N$, wherein 0<x≤0.4 and 0≤y≤1.

Aspect. 38. The VCSEL device of any one of aspects 35 to 37, wherein the relaxed In-containing III-nitride layer comprises $In_xGa_{1-x}N$, where 0<x≤0.4.

Aspect. 39. The VCSEL device of any one of aspects 35 to 38 wherein the relaxed In-containing III-nitride layer has a thickness greater than 100 nm.

Aspect. 40. The VCSEL device of any one of aspects 35 to 39, wherein the relaxed In-containing III-nitride layer has an in-plane a-lattice parameter is greater than 3.20 Å.

Aspect. 41. The VCSEL device of any one of aspects 35 to 40, wherein the relaxed In-containing III-nitride layer has a substantially relaxed in-plane a-lattice parameter that is within ±0.5% that of a fully relaxed in-plane a-lattice parameter of the In-containing III-nitride material.

Aspect. 42. The VCSEL device of any one of aspects 35 to 41, wherein a surface of the relaxed In-containing III-nitride layer is characterized by an in-plane a-lattice parameter is greater than 3.20 Å.

Aspect. 43. The VCSEL device of any one of aspects 35 to 42, wherein the III-nitride surface of the relaxed In-containing III-nitride layer is characterized by a root-mean-square surface roughness less than 1 nm over a 1×1 $\mu m^2$ area.

Aspect. 44. The VCSEL device of any one of aspects 35 to 43, wherein the III-nitride surface of the relaxed In-containing III-nitride layer is characterized by a pit density less than $1\times10^9$ $cm^{-2}$, as determined by atomic force microscopy or electron microscopy.

Aspect. 45. The VCSEL device of any one of aspects 35 to 44, wherein a surface of the relaxed In-containing III-nitride layer has a substantially relaxed in-plane a-lattice parameter that is within ±0.5% that of a fully relaxed in-plane a-lattice parameter of the In-containing III-nitride material.

Aspect. 46. The VCSEL device of any one of aspects 35 to 45, comprising a template underlying a relaxed In-containing III-nitride layer, wherein the relaxed In-containing III-nitride layer is overlying the template.

Aspect. 47. The VCSEL device of aspect 45, wherein the template comprises a patterned template.

Aspect. 48. The VCSEL device of aspect 46, wherein the patterned template comprises a plurality of pyramidal seed structures.

Aspect. 49. The VCSEL device of aspect 45, wherein the template comprises a slip region.

Aspect. 50. The VCSEL device of any one of aspects 35 to 49, wherein the active region comprises a quantum well or multi-quantum well stack.

Aspect. 51. The VCSEL device of any one of aspects 35 to 50, wherein the first cladding layer includes a first dopant, and the second cladding layer includes a second dopant of opposite conductivity type to the first dopant.

Aspect. 52. The VCSEL device of any one of aspects 35 to 51, comprising a first electrode and a second electrode, wherein, the first electrode is electrically connected to the first cladding layer; and the second electrode is electrically connected to the second cladding layer.

Aspect. 53. The VCSEL device of any one of aspects 35 to 52, wherein the VCSEL device is configured to emit electromagnetic radiation with a dominant wavelength between 525 nm and 550 nm.

Aspect. 54. The VCSEL device of any one of aspects 35 to 52, wherein the VCSEL device is configured to emit electromagnetic radiation with a dominant wavelength between 600 nm and 640 nm.

Aspect. 55. A wafer comprising the VCSEL device of any one of aspects 35 to 54.

Aspect. 56. The wafer of aspect 55, wherein the wafer comprises a substrate and the EELD device overlies the substrate.

Aspect. 57. The wafer of aspect 56, wherein the substrate is selected from silicon, silicon-on-insulator (SOI), or a bonded engineered substrate incorporating a III-nitride layer.

Aspect. 58. The wafer of any one of aspects 55 to 57, wherein the substrate has a diameter of greater than 150 mm.

Aspect. 59. A system comprising the VCSEL device of any one of aspects 35 to 54.

Aspect 60. A method of fabricating a VCSEL device, comprising:

(a) growing a relaxed In-containing III-nitride layer overlying a III nitride layer, wherein the relaxed In-containing III-nitride layer has an in-plane a-lattice parameter that is different than the in-plane a-lattice parameter of the III-nitride layer;

(b) growing or depositing a first DBR underlying or overlying the relaxed In-containing III-nitride layer:

(c) growing an active region overlying the relaxed In-containing III-nitride layer, wherein the active region comprises multiple quantum wells; and (d) growing a second DBR overlying the active region, wherein, the active region is lattice matched to the relaxed In-containing III-nitride layer;

the relaxed In-containing III-nitride layer has an InN mole fraction greater than 0; and the relaxed In-containing III-nitride layer has a single-phase gallium-polar (0001) orientation and a substantially relaxed in-plane a-lattice parameter.

Aspect. 61. The method of aspect 60, wherein the III-nitride layer comprises an In-containing III-nitride layer.

Aspect. 62. The method of any one of aspects 60 to 61, wherein the III-nitride layer comprises a relaxed In-containing III-nitride layer.

Aspect. 63. The method of any one of aspects 60 to 62, wherein growing a relaxed In-containing III-nitride layer comprises growing using metal-rich MOCVD conditions.

Aspect. 64. The method of any one of aspects 60 to 63, wherein, comprising growing or depositing a template on the III-nitride surface; and growing the relaxed In-containing III-nitride layer comprises growing the relaxed In-containing III-nitride layer on the template.

Aspect. 65. The method of aspect 64, wherein the template comprises a patterned template.

Aspect. 66. The method of aspect 65, wherein the patterned template comprises a plurality of pyramidal seed structures.

Aspect. 67. The method of aspect 64, wherein the template comprises a slip region.

Aspect. 68. The method of any one of aspects 60 to 67, wherein the method comprises:

growing an n-doped electrode electrically connected to one of the cladding layers; and growing a p-doped electrode electrically connected to the other cladding layer.

EXAMPLES

The following examples describe in detail relaxed Wurtzite In-containing III-nitride layers (Native InGaN®) provided by the present disclosure, semiconductor structures comprising relaxed InGaN layers, semiconductor devices comprising the relaxed InGaN layers, and methods of making the relaxed InGaN layers, semiconductor structures, and semiconductor devices provided by the present disclosure. It will be apparent to those skilled in the art that many modifications, both to materials and methods, may be practiced without departing from the scope of the invention.

Comparative Example 1

Fast-Growth MOCVD of InGaN on GaN

"Thick" (e.g., >100 nm) InGaN layers grown on GaN regardless of the underlying substrate by MOCVD are associated with large pits and a high dislocation density.

FIG. 15 shows a SEM plan-view of an about 400 nm-thick, InGaN layer having an InN mole fraction of about 10% on GaN/sapphire grown by MOCVD using conventional (N-rich) conditions, showing trench defects and large pits (up to about 300 nm in diameter) formed at threading dislocations.

Due to the conventional (N-rich) growth conditions and low temperature growth required for InGaN under these conditions, large pits open up in the layer, nucleating at threading dislocation cores in the GaN template. As a result, N-rich InGaN growth conditions are only useful for providing very thin InGaN layers such as quantum wells, interlayers, and super-lattices.

Comparative Example 2

Fast-Growth MOCVD of InGaN on GaN

To achieve thick, substantially pit-free InGaN films, fast-growth MOCVD of InGaN on GaN by using TMG was explored for high growth rates of up to 4 μm/hr. The growth was carried out at 760° C. under a reactor pressure at 400 mbar. During growth, the ammonia flow rate and TMI flow rate were fixed at 6,000 sccm and 350 sccm, respectively, with $N_2$ used as the carrier gas. The total flow rate of TMG predominantly determined the growth rate. For example, a TMG of about 50 sccm provided a growth rate of about 2 μm/hour. See FIG. 16. The total gas flow rate (metalorganic, $NH_3$ and carrier gas) entering the reactor was fixed at 12,000 sccm. The V/III ratio was about 2100 (real TMG flow rate was 2.36 sccm, TMI flow rate was 0.49 sccm).

These growth conditions resulted in a bulk, substantially relaxed, InGaN film having an InN mole fraction of about 10% (as determined XRD RSM—not shown), but with a rough surface morphology.

Example 3

Metal-Rich MOCVD Growth of InGaN on GaN

Relaxed InGaN films having improved surface morphology compared to InGaN films grown using fast-growth MOCVD conditions as in Example 2 were grown on GaN templates using "metal-rich" MOCVD growth conditions with lower ammonia flow rates.

InGaN growth on a 1.75 μm-thick GaN template was carried out at 760° C. under a reactor pressure at 400 mbar. The total gas flow rate (MO, $NH_3$ and carrier gas) in the reactor was fixed at 8,000 sccm. For a growth rate of around 2 μm/hour, the TMG and TMI flow rates were fixed at 50 sccm and 350 sccm, respectively, with $N_2$ used as the carrier gas. For growth of this MR InGaN thick layer, the ammonia flow rate was fixed at 200 sccm. The V/III flow rate ratio was 65. After one hour of growth, an approximately 1.75 μm-thick, smooth and substantially pit-free InGaN layer was obtained. The template was a GaN/sapphire structure, i.e., a planar GaN template overlying a sapphire substrate.

Figure 31A:
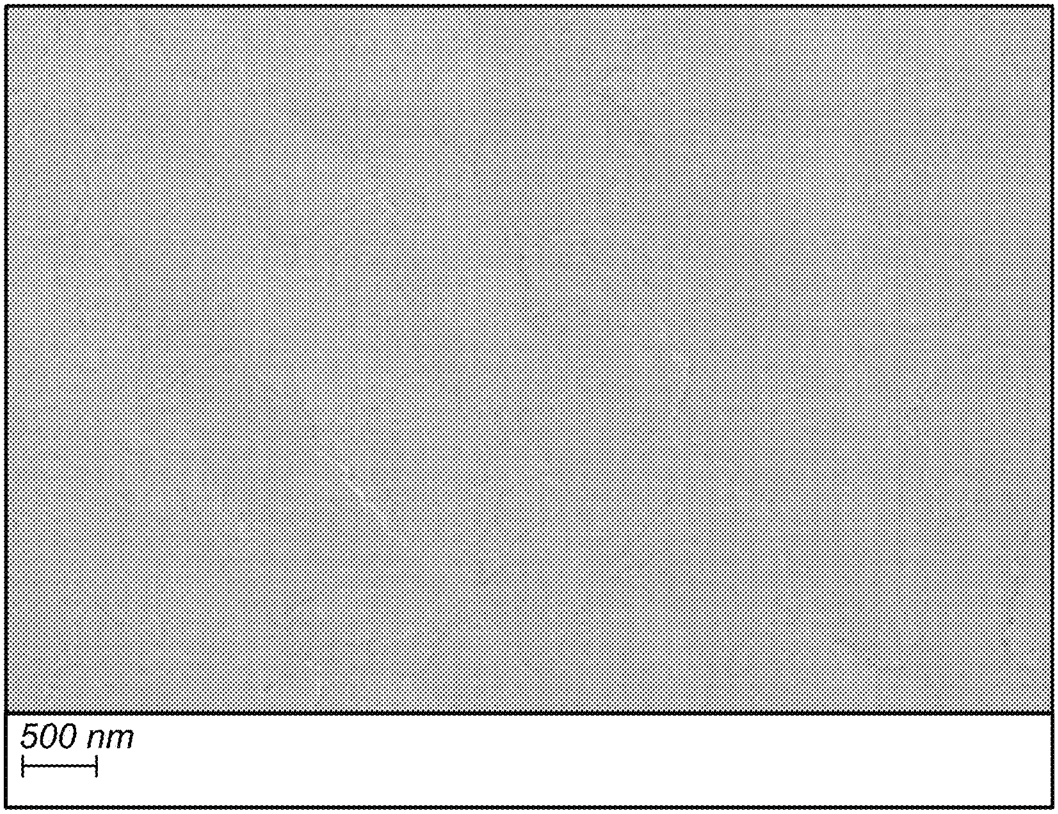
FIGS. 31A-31B show a plan-view (FIG. 31A) and a cross-sectional view (FIG. 31B) of a thick, relaxed MR InGaN layer having an InN mole fraction of about 8% grown by MOCVD under metal-rich (MR) MOCVD conditions, having a smooth and substantially pit-free surface morphology.
Figure 31B:
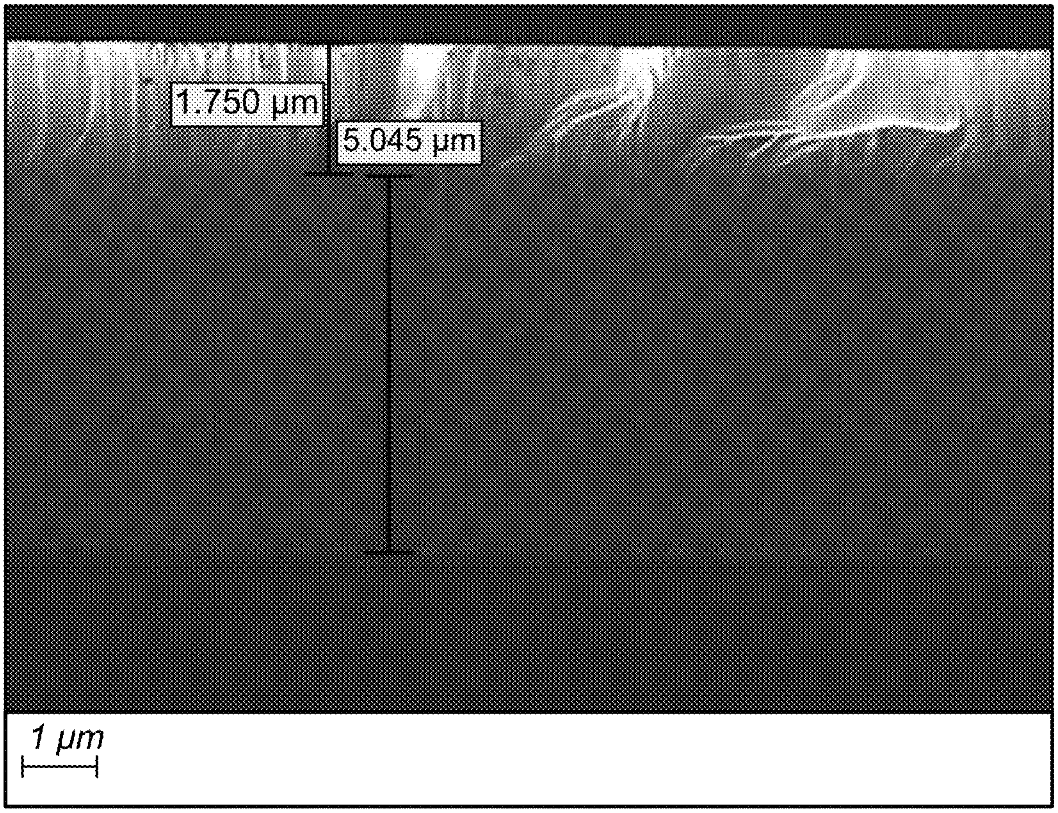

A plan-view and a cross-sectional view of a thick relaxed InGaN layer having an InN mole fraction of about 8% is shown in FIGS. 31A and 31B, respectively. The GaN template was 5.045 μm thick and the relaxed InGaN layer had a thickness of 1.75 μm.

The growth regime within this window is referred to as "metal rich" (MR) InGaN.

The surface smoothness was characterized by atomic force microscopy (AFM) and had an RMS roughness of 4.3 nm over a scanning area of 4×4 $\mu m^2$, and 0.7 nm over a scanning area of 1.5×1.5 $\mu m^2$ for a 1.75 μm-thick relaxed InGaN layer having an InN mole fraction of 8%. The interface region was smooth and free of pits.

X-ray diffraction (XRD) analysis of the InGaN layer shown in FIGS. 31A-31B was consistent with high-quality, single-phase layer for the MR InGaN, of about 8% InGaN and fully relaxed. The ω-2θXRD curve is shown in FIG. 18. The 002 (symmetric) diffraction full-width-at-half-maximum (FWHM) is 250 arcsec. The 211 asymmetric (not shown) was 1,800 arcsec, suggesting an edge dislocation density of greater than 1E10 $cm^{-2}$.

InGaN multiple-quantum-well (MQW) structures were simultaneously grown on MR InGaN templates (InN mole fraction of about 8%) and on conventional GaN/sapphire templates. As shown in FIG. 19A, the MQW structures grown on the relaxed MR InGaN film showed a sharp room-temperature photoluminescence (PL) peak with a consistent red shift of about 50 nm in peak emission wavelength compared to the MQW structures grown on GaN/sapphire, consistent with an increase in MQW InN mole fraction of greater than 5%. This result demonstrates that the relaxed InGaN interface region can facilitate increased In incorporation in overlying device layers. See FIG. 19B. FIG. 19B shows the peak wavelength of MQW well structures grown on GaN or on a relaxed InGaN layer grown under metal-rich MOCVD conditions at various temperatures. The solid dots represent experimental measurements.

Figure 20A:
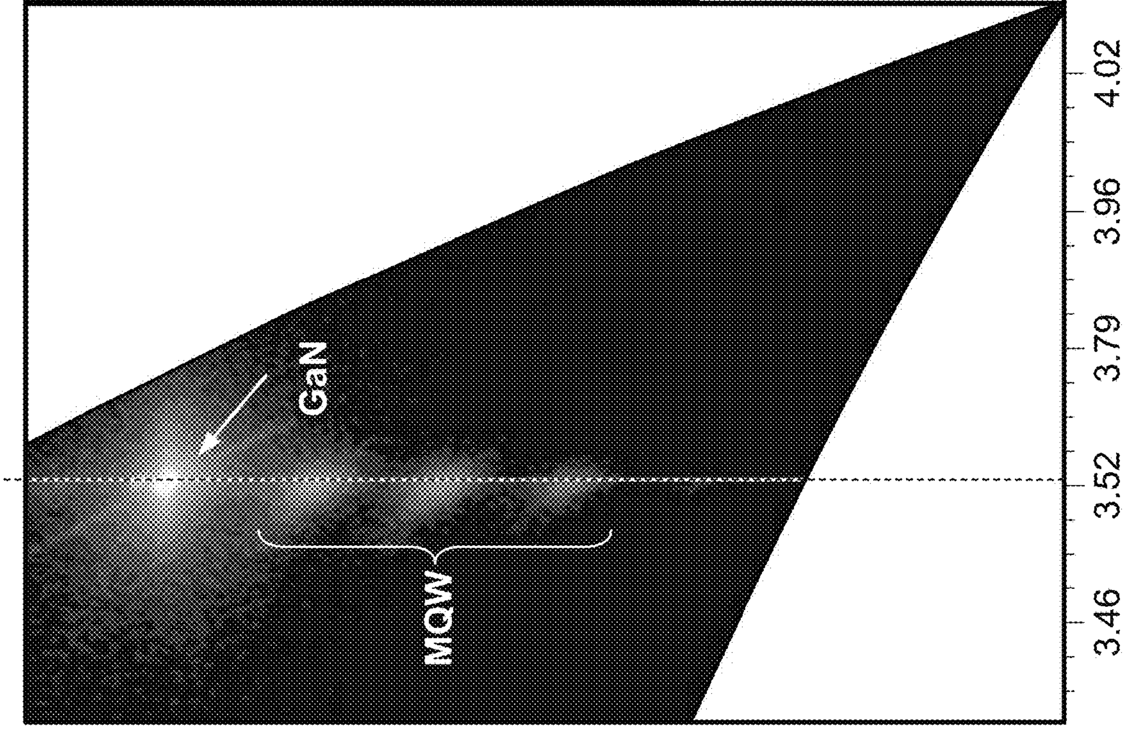
FIGS. 20A-20B show XRD RSM images of MQW structures grown simultaneously on GaN (FIG. 20A) and on a relaxed MR InGaN layers (8% InN mole fraction) (FIG. 20B).
Figure 20B:
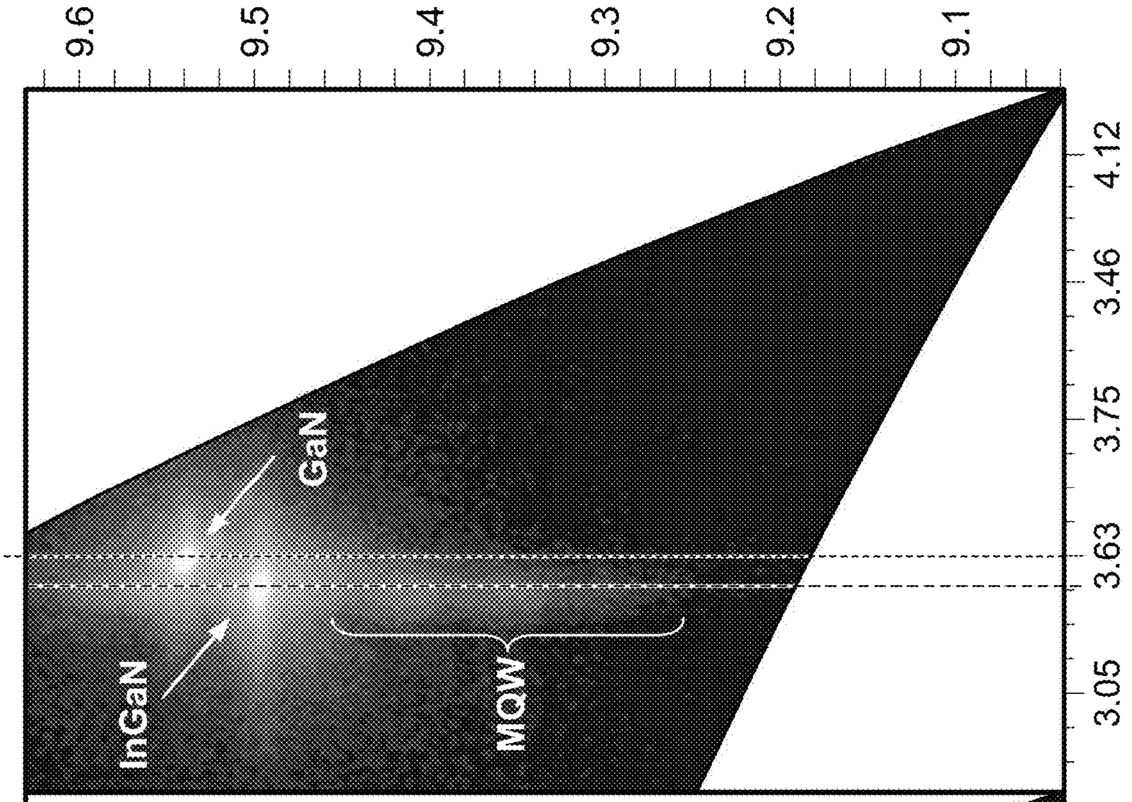

As shown in FIG. 20A, XRD reciprocal space maps (RSMs) of the MQWs grown on GaN show that the MQW layers were pseudomorphic to (e.g., lattice-locked) to GaN. In contrast, as shown in FIG. 20B, the MQWs grown on MR InGaN were pseudomorphic to the underlying relaxed MR InGaN base layer.

Relaxation (e.g., in-plane lattice dilation) in the MR InGaN base layer reduces the strain of the MQW layers compared to the MQW layers grown on GaN under the same conditions. Epitaxial growth on MR InGaN allows for incorporation of a higher InN mole fraction and/or thicker quantum wells which can improve device efficiency as well as enable achieving longer wavelength emission.

A thick MR InGaN layer was grown on a GaN/sapphire template at a growth temperature of 760° C. with a reactor pressure at 400 mbar. The total gas flow (MO, $NH_3$ and carrier gas) was 8,000 sccm. The TMG and TMI flows were fixed at 50 sccm and 350 sccm, respectively, with $N_2$ used as the carrier gas (real TMG flow rate was 2.36 sccm; real TMI flow rate was 0.49 sccm). The ammonia flow rate was fixed at 250 sccm. The V/III ratio was about 88. After one hour of MR MOCVD growth, an InGaN layer with an interface region having a smooth and substantially pit-free morphology was obtained. XRD RSM data (not shown) indicated the relaxed InGaN layer as about 100% relaxed with an a-lattice spacing of about 3.22 Å, corresponding to an InN mole fraction of about 9%. An InGaN spacer layer (about 110 nm thickness) and a 5×MQW stack (3 nm InGaN wells, separated by 8 nm GaN barriers) was grown on the thick, relaxed InGaN layer. This film was characterized by TEM and EDX.

Figure 21:
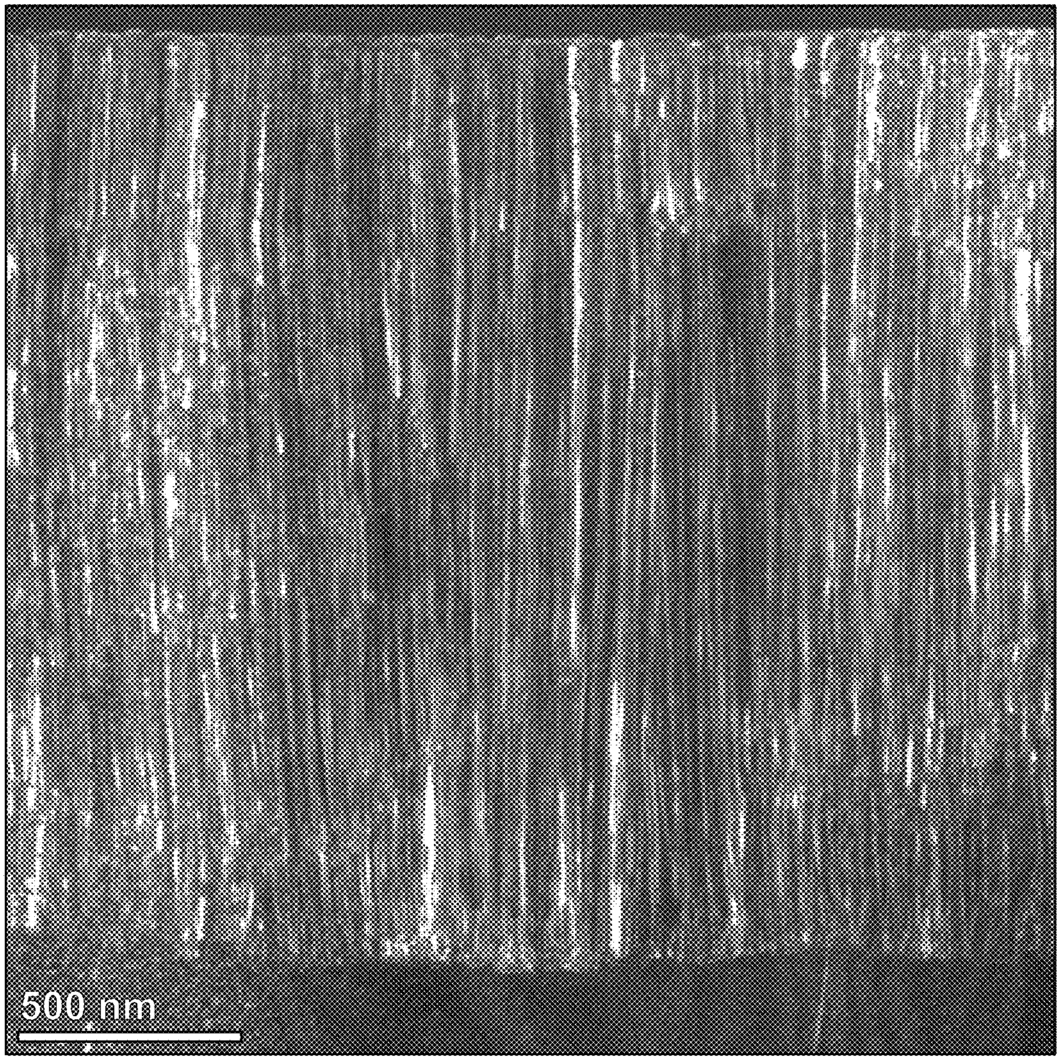
FIG. 21 shows a bright field transmission electron microscopy (TEM) image of a GaN/InGaN heterojunction.

Weak-beam dark field TEM showed that the total structure thickness was about 2.1 μm. Bright-field TEM with g=(1−210) showed a high density of edge dislocations from the GaN/InGaN interface region and propagating upward throughout the thickness of the relaxed InGaN film. See FIG. 21.

Figure 22:
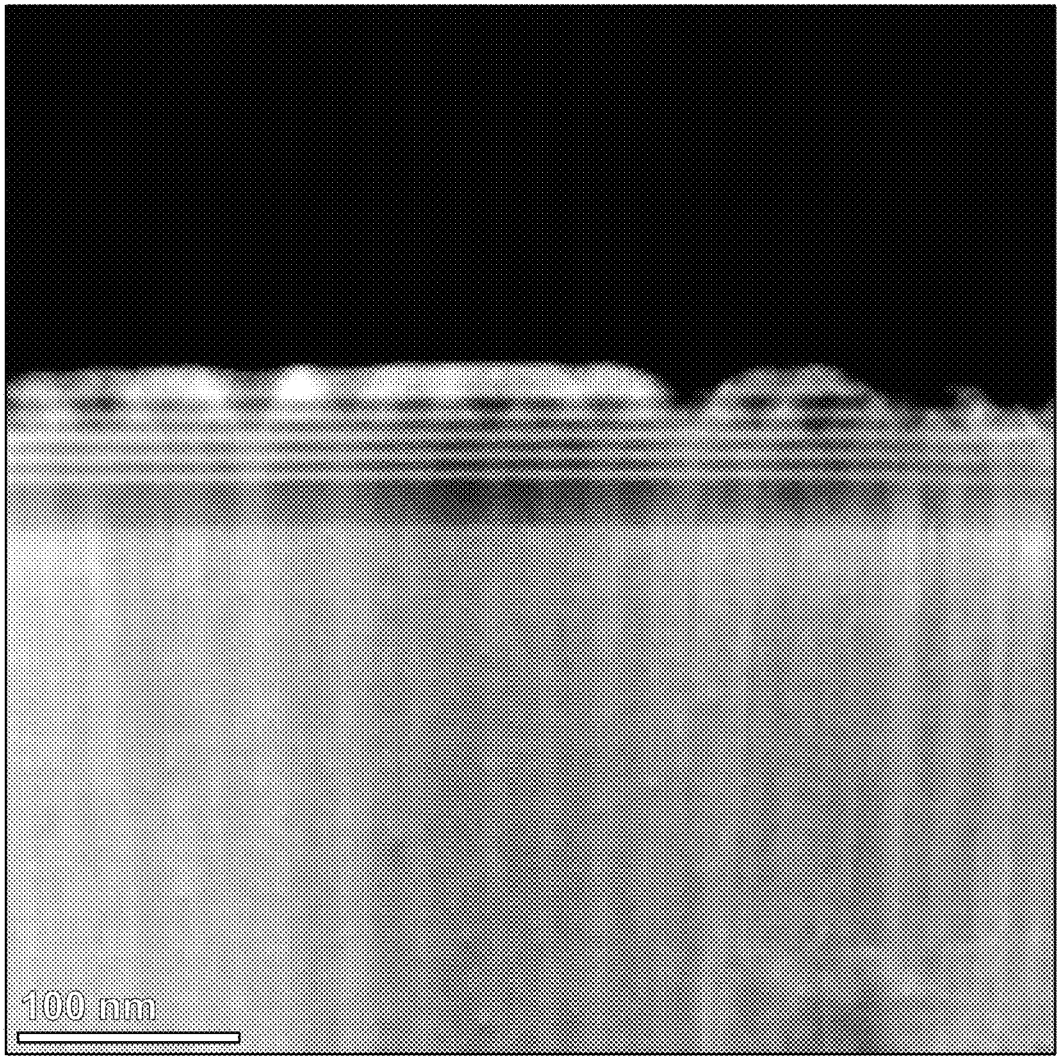
FIG. 22 shows a high-angle annular dark-field (HAADF) scanning transmission electron microcopy (STEM) image obtained using the Z-contrast method with zone axis diffraction condition [1−100] of a multi-quantum well stack grown on MR InGaN.

Despite the high edge dislocation density, as confirmed using High-Angle Annular Dark-Field (HAADF) Scanning Transmission Electron Microscopy (STEM) and Z-contrast method with zone axis diffraction condition [1−100], the structure of the MQW stack was observed to be of high quality as shown in FIG. 22. Also note the smoothness of the surface of the underlying relaxed InGaN layer.

Referring to FIG. 22, the corrugated surface at the top of the structure is due to V-pits which open up at dislocations during MQW growth, which was performed under standard N-rich MOCVD conditions, as opposed to the underlying InGaN layer grown using metal-rich conditions. Nevertheless, as is evident by the first three QWs, the QW structure was intact, of high quality, and exhibited smooth interfaces. The QWs exhibited bright peak emission at about 500 nm under PL excitation at 325 nm (data not shown).

A vertical line-scan using Energy Dispersive X-ray Spectroscopy (EDX) was performed on the structure, and confirmed a relatively uniform InGaN mole fraction, from about 8% to about 9% throughout the thickness of the MR InGaN layer, as shown in FIG. 23, consistent with the XRD RSM data.

Example 4

MR MOCVD Growth of InGaN on GaN/Sapphire Wafer

Another relaxed InGaN growth was carried out essentially similar to that of Example 3. In this example, the growth was carried out across the full face of a 50 mm diameter GaN/sapphire template and was characterized at (5) different locations (pt0 to pt4) across the wafer surface. The morphology across the entire resulting full 50-mm diameter epi-wafer was glass smooth. XRD RSM (FIGS. 24A-24F) at the different locations show an about 2 μm-thick, relaxed InGaN layer with an InN mole fraction of about 9%. ω-2θ XRD scans at each position are shown in FIGS. 25A-25E and clearly show that the diffraction peak associated with the crystalline relaxed InGaN layer is distinct from the diffraction peak associated with the underlying GaN layer (solid curve is measured; dotted curve is simulated).

In assessing the quality of the relaxed InGaN film, a reliable metric involves analyzing the ω-2θ XRD scan for specific characteristics. High-quality films typically exhibit sharp, Lorentzian-like diffraction profiles without any "bulges" or "side lobes," which are indicative of a uniform and well-ordered crystal structure. Conversely, the presence of these features in an XRD profile suggests lower quality, often due to faceting and mixed composition, typically resulting in a composition deviation of about twice the target value for InGaN. The metric entails examining the diffraction intensity of the relaxed film at a position 40 away from its peak intensity, where 40 is the angular difference, in degrees, between the GaN (substrate or template) XRD peak and the XRD peak of relaxed InGaN film. At this location, in the direction opposite that of the GaN peak, the intensity should drop to at least three, for example, at least four or more, orders of magnitude lower than the XRD peak intensity of the relaxed InGaN film. Alternatively, a reduction in intensity should at least be within 10× of the intensity reduction of the diffracted peak intensity measured at an angular distance 40 away from the GaN layer peak intensity in a direction opposite that of the XRD peak of the relaxed InGaN film. If the intensity at A0 does not exhibit this significant reduction in intensity, the film has structural imperfections and compositional inconsistencies, that is, characteristic of a lower quality film.

Energy-dispersive X-ray (EDX) spectroscopy was performed at each of the five positions and the average values of the InN mole fraction is shown in Table 9.

TABLE 9

InN Mole Fraction.

| Region | InN Mole Fraction |
|---|---|
| pt0 | 9.3% |
| pt1 | 9.9% |
| pt2 | 9.6% |
| pt3 | 8.6% |
| pt4 | 8.6% |

The surface of the epi-wafer at each position is characterized by smooth, substantially pit-free morphology.

Example 5

Fabrication of Patterned Template Comprising Pyramidal GaN Seed Structures

A planar layer of nominally undoped (0001) GaN layer on a (flat) (0001) sapphire substrate was provided. The total thickness of the GaN layer was about 3 μm and was deposited by metalorganic chemical vapor deposition (MOCVD).

A 45 nm-thick masking layer of plasma-enhanced chemical vapor deposition (PECVD) $SiN_x$ was deposited onto the surface of the GaN layer. The masked substrate was then coated with photoresist and patterned using laser-lithography to define nominally 1.5 μm-diameter circular holes on a 3.5 μm-pitch in a hexagonal pattern. The patterned wafer was then subjected to dry etching in a fluorine ($CHF_3/O_2$) chemistry to remove the $SiN_x$ masking layer and to expose the underlying GaN layer in the regions defined by the holes. The photoresist was then removed by inserting the wafer into a photoresist-stripper Microposit™ Remover 1165 (Dow Chemical Company) at 70° C. for 2 hours followed by an ultrasonic bath cleaning and rinsing step using deionized water.

The template with the patterned mask layer was then placed in a MOCVD reactor for growing the pyramidal GaN structures on the exposed GaN layer such that each pyramidal GaN structure was nominally a fully formed pyramid with a single sharp apex and consisting of six terminated (10−11) GaN facets. The GaN pyramid growth was initiated by flowing ammonia a trimethylgallium (TMGa) into the MOCVD reactor at 900° C. for 1 min and then the temperature was ramped to 1,020° C., after which the growth continued for 11 mins. The temperature ramp-up lasted for 3 min without interruption of growth. During GaN growth the ammonia flow rate and TMGa flow rate were fixed at 3,600 sccm and 10 sccm respectively, with $H_2$ used as carrier gas with a flow rate of 4,400 sccm under a reactor pressure at 150 mbar. The hexagonal base of the pyramidal GaN structures was grown to extend slightly beyond the diameter of the holes in the mask layer.

Figure 26A:
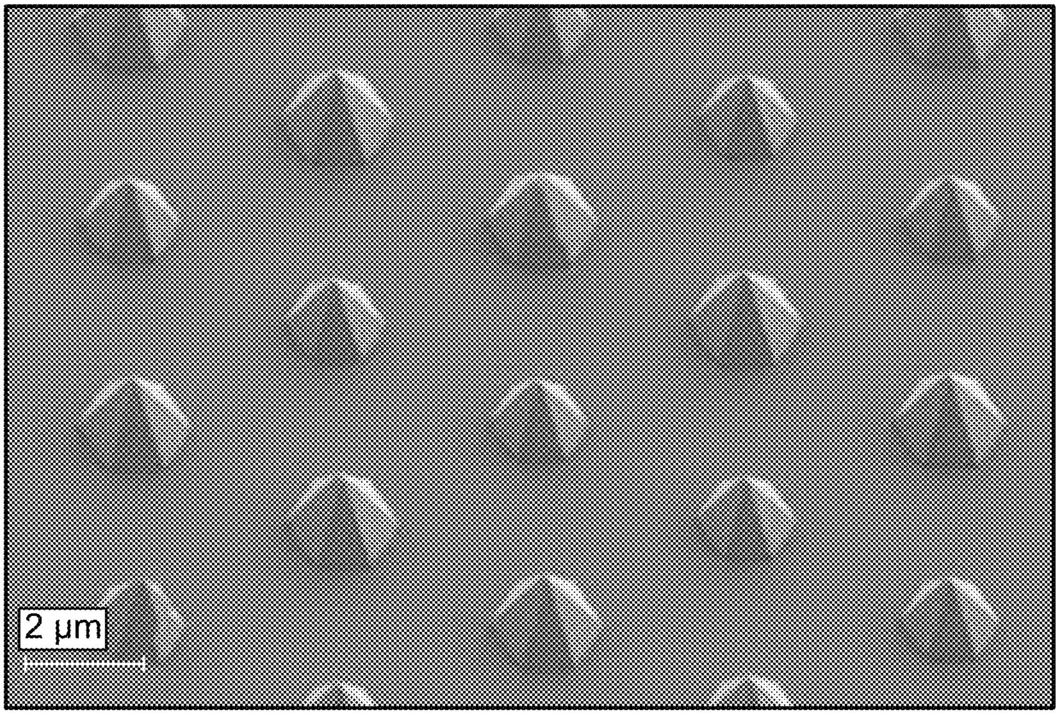
FIGS. 26A-26B show a perspective view (FIG. 26A) and a plan-view (FIG. 26B) of a patterned GaN template consisting of a hexagonal array of pyramidal GaN structures having a height of about 1.5 μm on a pitch of about 3.5 μm.
Figure 26B:
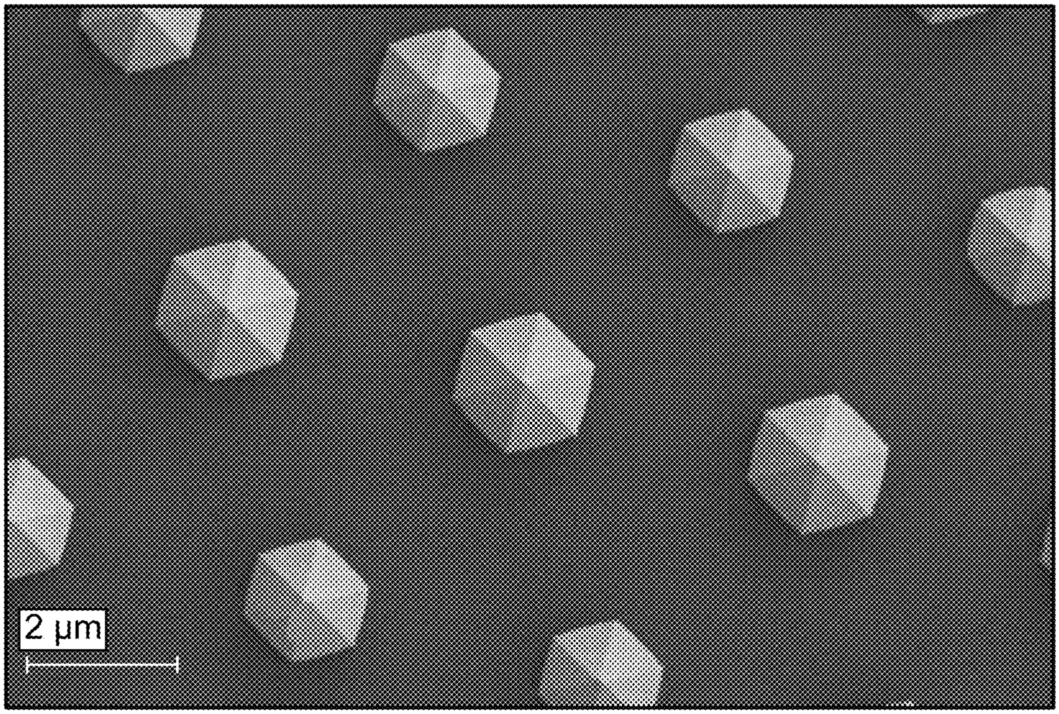

The resulting GaN pyramidal structures are shown (from a stop-growth perspective) in the plan-view SEM micrographs shown in FIGS. 26A-26B.

Figure 27:
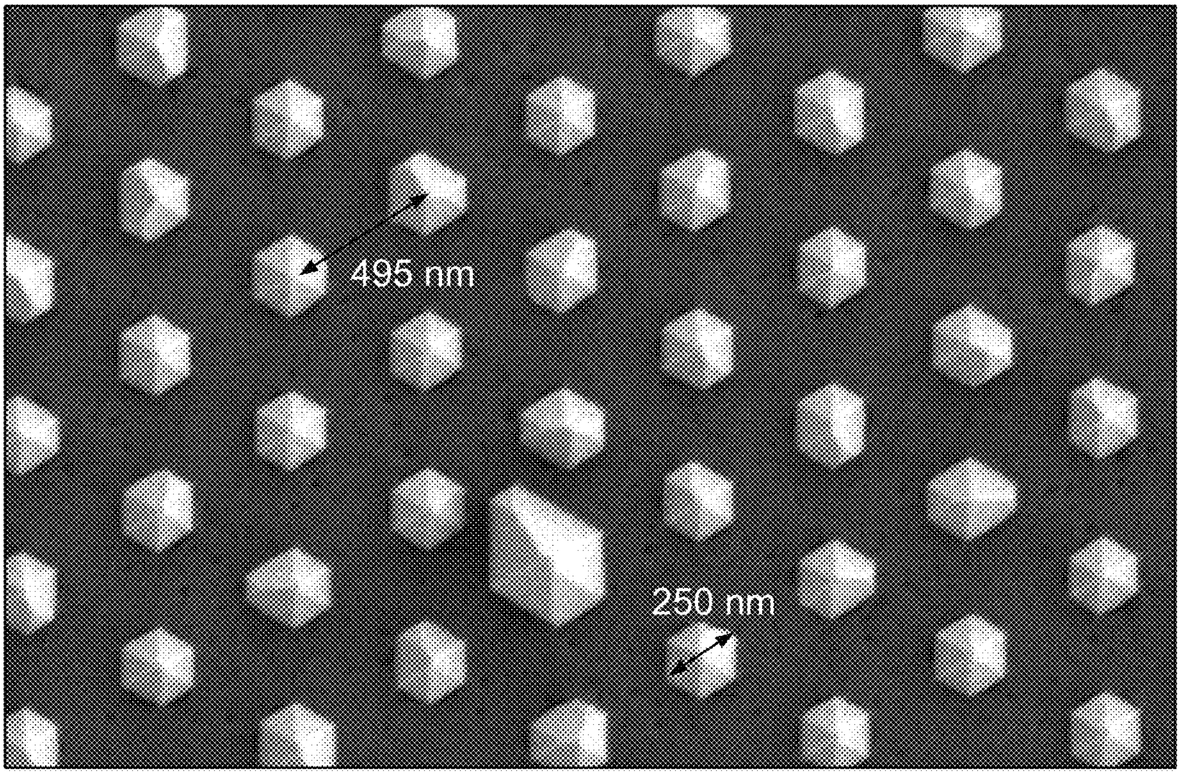
FIG. 27 shows a patterned GaN template consisting of a hexagonal array of nano-pyramidal GaN structures having a width of about 250 nm on a pitch of about 500 nm.

A similar processing and growth procedure can be used to generate nano-scale pyramids. For example, a stepper aligner was used to lithographically define the mask pattern, and then about 250 nm-wide pyramidal GaN protrusions on a pitch of about 500 nm, in a hexagonal arrangement, were grown on a $SiN_x$ patterned GaN template. A SEM plan-view of these nano-pyramid structures is shown in FIG. 27.

Example 6

Fabrication of a Relaxed InGaN Layer

The reactor growth conditions were changed for growing InGaN having a high InN mole fraction, such as an InN mole fraction greater than 5% on the {10−11} facets of the GaN pyramidal structures provided in Example 5. The InGaN growth was performed at 760° C. under a 400-mbar reactor pressure. The hydride source was $NH_3$ (6.000 sccm) and the metalorganic sources were triethylgallium (TEGa) (70 sccm) and trimethylindium (TMIn) (75 sccm). The carrier gas was pure $N_2$ (6,000 sccm). Different samples with increasing thicknesses of InGaN where grown corresponding to growth times of about 230 sec 3.8 min), about 1,380 sec (23 min), and about 8,280 sec (138 min), corresponding to InGaN layer thicknesses of about 20 nm, about 120 nm, and about 400 nm, respectively. After InGaN growth was terminated the pyramidal InGaN/GaN structures were characterized by scanning electron microscopy (SEM), and X-ray diffraction (XRD).

Figure 28A:
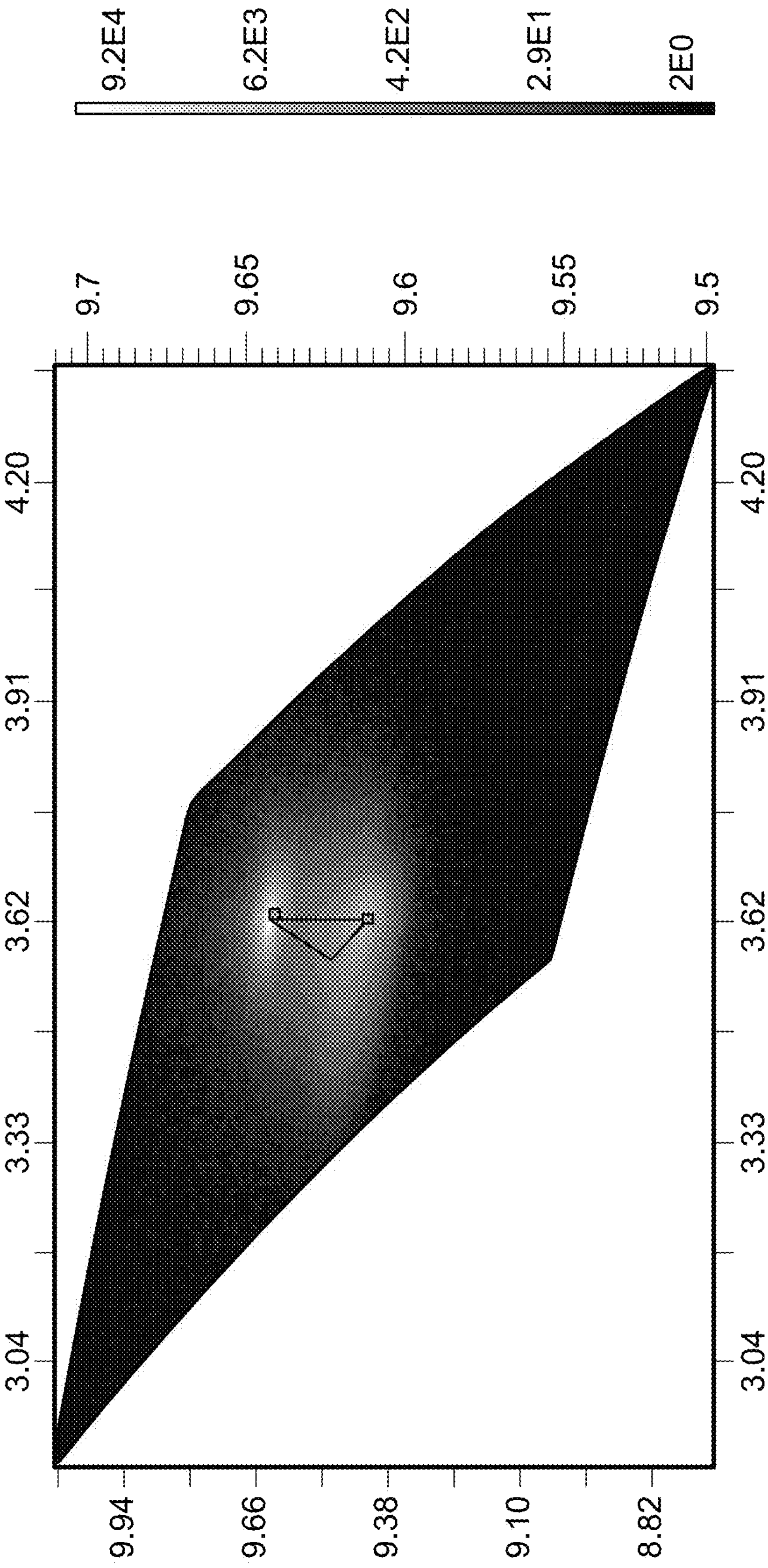
FIGS. 28A-28B show XRD RSM images of a 400 nm-thick InGaN layer (14% InN mole fraction, substantially strained) grown on planar GaN (FIG. 28A) and a 400 nm-thick InGaN layer (11% to 12% InN mole fraction, substantially relaxed) grown on the GaN pyramidal structures (FIG. 28B) described in Example 6 using MR MOCVD.
Figure 28B:
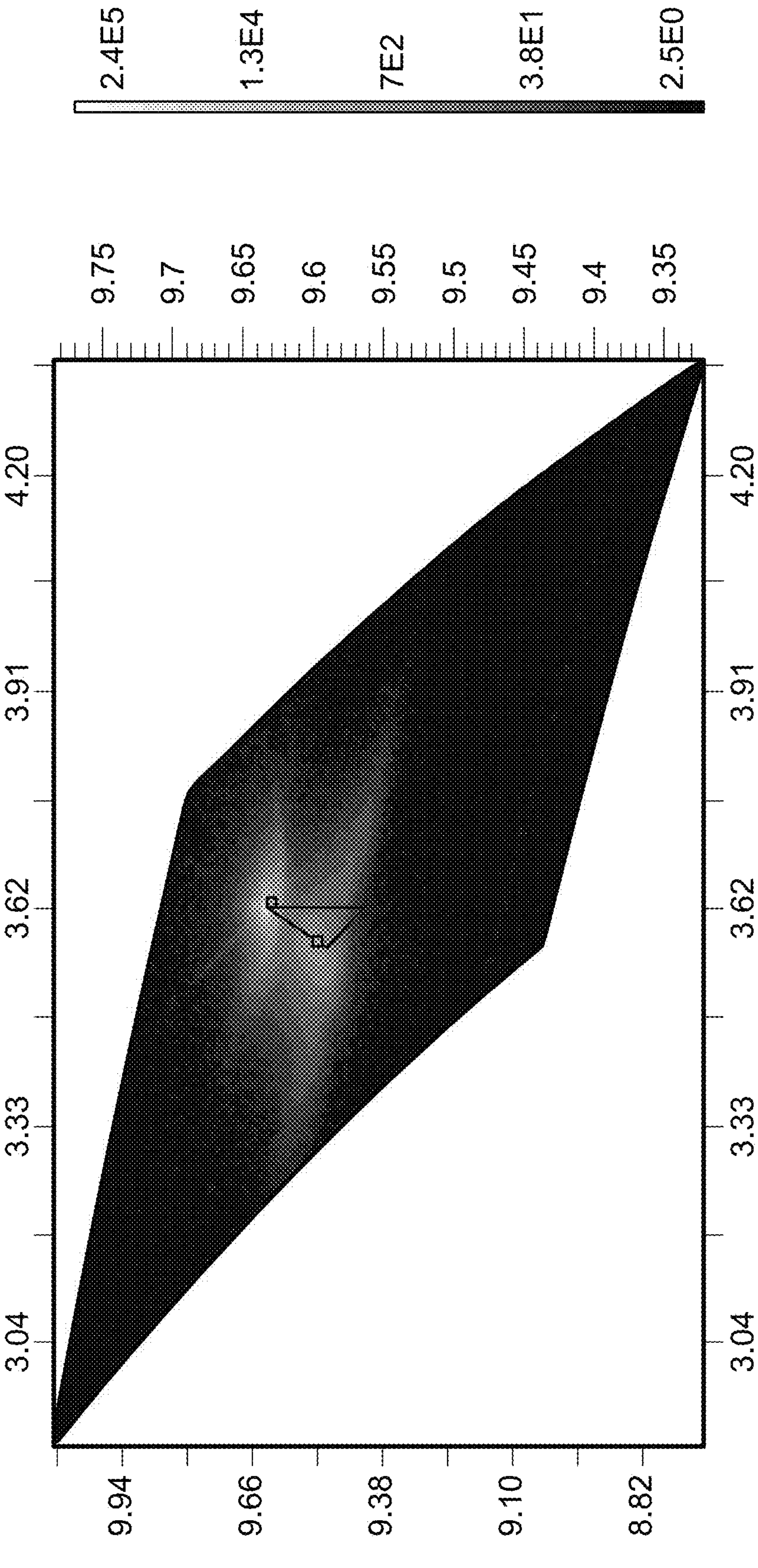

XRD reciprocal space maps (RSM's) were generated for the 400 nm thick InGaN/GaN pyramidal structures and compared to InGaN grown under the same conditions, but on a planar (0001) GaN template. For the latter, an about 90% pseudomorphic (i.e., nearly fully strained) InGaN layer, with a calculated InN mole fraction of 14%, was observed (see FIG. 28A). For the InGaN/GaN pyramidal structures, a shifted InGaN peak was observed in the RSM, and is consistent with a nearly completely relaxed InGaN layer with an InN mole fraction of about 12% (see FIG. 28B). Considering the low fill-factor and thickness of the InGaN layer compared to the underlying pyramidal GaN template, the brightness of the RSM signal suggests the formation of high quality InGaN growth and that the InGaN grown on each of the GaN structures has a similar morphology and composition. The in-plane a-lattice parameter of the relaxed InGaN layers was calculated to be 3.23 Å, assuming 3.189 Å for the underlying pyramidal GaN structure (consistent with the estimate typical for GaN on sapphire).

To elucidate more details about the InGaN layer relaxation, a "sandwich" structure was grown and analyzed. For this sandwich structure, after the array of pyramidal GaN structures with {10−11} facets were formed, a first multiple-quantum-well (MQW) "marker" stack was grown overlying the GaN structures, followed by a relatively thick InGaN layer having an InN mole fraction of about 14%, and followed by a second "MQW "marker" stack. The two MQW stacks had identical epitaxial structures with 10 periods of GaN/InGaN pairs (growth time of 45 sec and 25 sec, respectively, corresponding to 4.8 nm-thick GaN and 2.7 nm-thick InGaN layers). The first MQW was grown at 780° C. immediately after the pyramidal GaN structures were formed. The thick InGaN layer was grown at 760° C. for 183 mins to a thickness of about 500 nm. The second MQW was grown at 780° C. Apart from the growth temperature and the switch-off of the TEGa source during GaN growth, all other growth conditions for this MQW sandwich stack were the same as those for InGaN growth on the pyramidal GaN structures.

Figure 29:
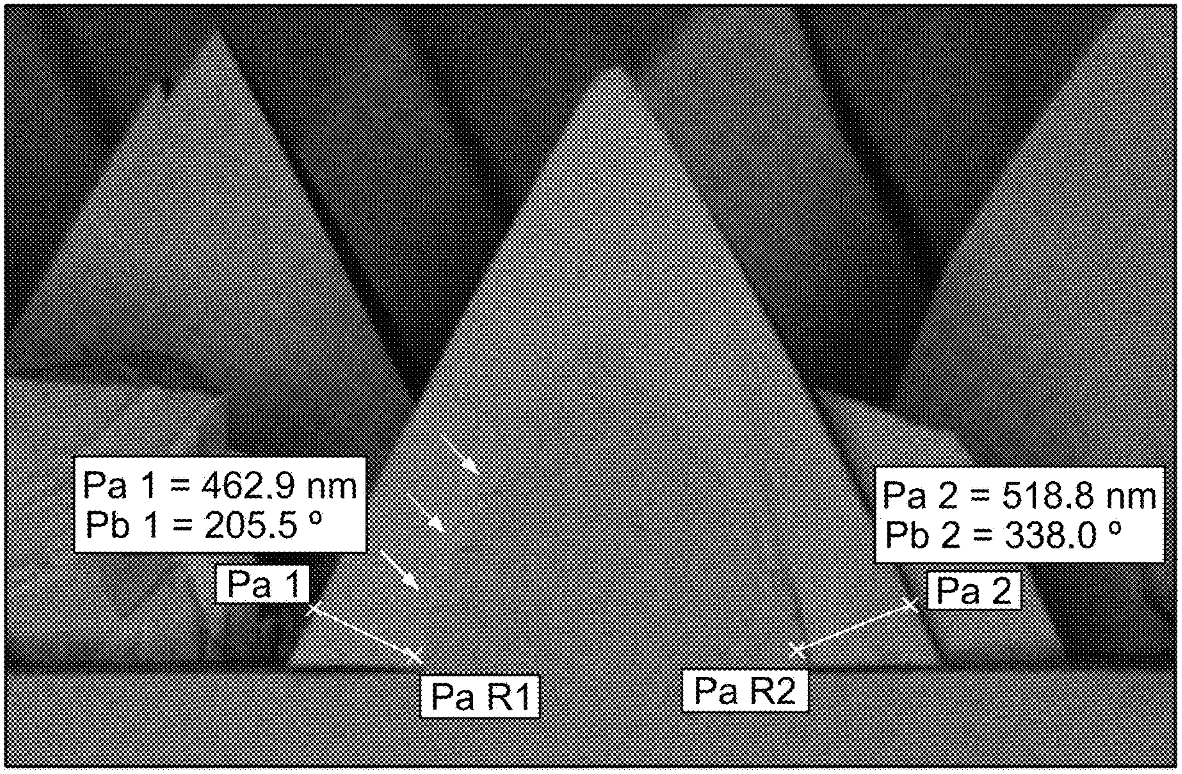
FIG. 29 shows a SEM micrograph of a cleaved cross-section through an InGaN/GaN heterojunction that is parallel to (10−11) pyramid facets.

A SEM micrograph of a cleaved cross-section through the MQW sandwich structure is shown in FIG. 29. This image shows the brightness contrast between the GaN and InGaN layer(s).

TEM analysis was performed on a portion of the sandwich structure where the pyramidal GaN structure was not fully apexed. That is, the triangular facets did meet at a common apex and the pyramidal GaN structure had a planar top portion with a (0001) GaN facet.

Figure 30:
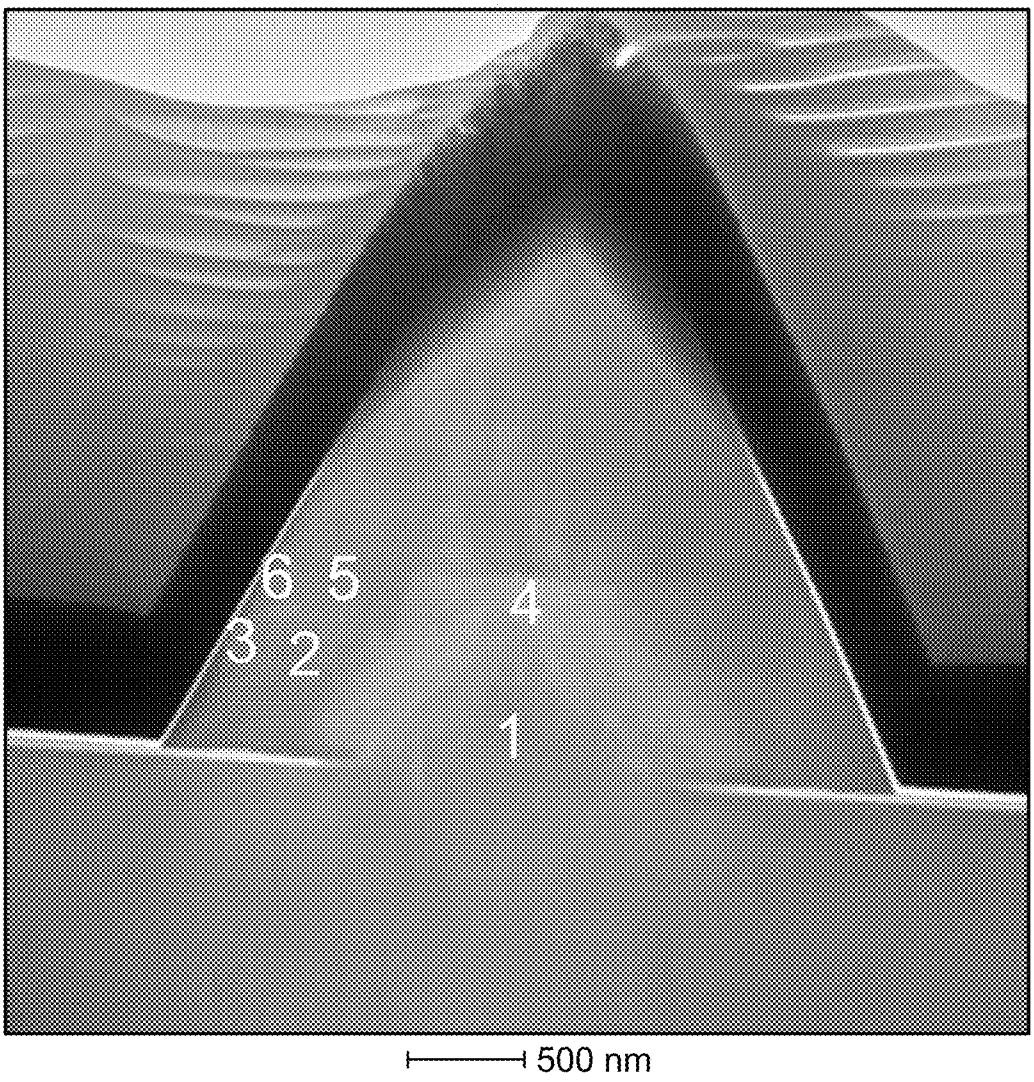
FIG. 30 shows a TEM image of a sandwich structure with identified regions 1-6 that were analyzed using electron diffraction.

Strain relaxation was also analyzed using electron diffraction, by determining the ratio of the (0001) c-(out-of-plane) and a-(in-plane) lattice parameters in the sample characterized by TEM. Analysis of the c/a ratio was performed at the locations indicated in FIG. 30. The spot area examined by the electron diffraction analysis is estimated to be about 150 nm. Clear differences in the c/a ratio were observed, as summarized in Table 10. Specifically, within the GaN regions (1) and (4) (FIG. 30), the c/a ratio is similar at 1.6365 and 1.6351, respectively. In GaN regions (2) and (5), near the first "marker" stack, the c/a ratio changes to 1.6200 and 1.6262, respectively, indicating a distortion in the crystalline unit cell consistent with pseudomorphic strain, that is, a widening of the a-lattice parameter along with constriction for the c-lattice parameter, for this semi-polar (10−11) orientation. Then, at regions (3) and (6), near the second "marker" stack which is grown after the thick InGaN growth, the c/a ratio changes again to 1.6426 and 1.6386, respectively. This indicates that in this region the constriction along the c-direction has been released, and the dilation of the unit cells in addition to a return to c/a ratios similar to the GaN seed region, are consistent with complete or near-complete relaxation of the InGaN. This conclusion is further supported by the magnitude of the a-lattice dilation of about 1.5%, which is consistent with an a-lattice parameter of 3.235 Å for the relaxed InGaN region, which is very close to the a-lattice parameter estimated from the XRD RSM data discussed with respect to FIGS. 28A and 28B.

There was no evidence of dislocations generated along the (10−11) InGaN growth, suggesting that relaxation occurs by slip along the $SiN_x$ mask.

TABLE 10

Lattice parameters determined using electron diffraction.

| Position | C (pix) | A (pix) | c (Å) | a (Å) | c/a |
|---|---|---|---|---|---|
| 1 | 273.3 | 516.5 | 5.3176 | 3.2495 | 1.6365 |
| 2 | 272.0 | 508.8 | 5.3437 | 3.2986 | 1.6200 |

TABLE 10-continued

Lattice parameters determined using electron diffraction.

| Position | C (pix) | A (pix) | c (Å) | a (Å) | c/a |
|---|---|---|---|---|---|
| 3 | 271.0 | 514.0 | 5.3634 | 3.2653 | 1.6426 |
| 4 | 273.3 | 516.0 | 5.3183 | 3.2526 | 1.6351 |
| 5 | 270.8 | 508.5 | 5.3674 | 3.2306 | 1.6262 |
| 6 | 269.8 | 510.5 | 5.3873 | 3.2876 | 1.6386 |
| Error | 0.6 | 0.5 | 0.0117 | 0.0027 | — |

Example 7

Fabrication of Slip Region

A (0001) GaN/sapphire template is provided for the starting surface. An in situ (MOCVD) $SiN_x$ layer was deposited at 770° C. with $SiH_4$ and $NH_3$ flows of 87 sccm (calculated as $SiH_4$_source/($SiH_4$_source+ $SiH_4$_dilute)) and 200 sccm, respectively. $H_2$ was used as the carrier gas and the reactor pressure was 75 mbar. The total gas flow into the reactor (MO+$NH_3$+ carrier gas) was 8000 sccm. A growth rate of 0.75 nm/h was obtained using these growth conditions. The growth time affects the quality of the relaxed InGaN layer. For a SiNx layer a 4-min growth time under these conditions deposits an about one-quarter monolayer, which is considered to correspond to a fill-factor of about 25%, as the layer is discontinuous.

The temperature was then ramped down to 760° C., and the reactor pressure was ramped up to 400 mbar for the InGaN growth. To achieve a relaxed InGaN layer without v-pits opening and kinetic roughening, much higher (TMGa+TMIn)/$NH_3$ ratio was required compared to the common InGaN growth conditions, where excess ammonia is always supplied to ensure the film quality and enhanced indium incorporation. Thus, in this method the relaxed InGaN layer is grown under metal-rich MOCVD conditions.

To grow the relaxed InGaN layer, the $NH_3$ was kept below 250 sccm, especially during the initial 60 seconds of growth. The TMGa flow used was 50 sccm and the TMIn flow was 350 sccm to achieve a relaxed InGaN layer having an InN mole fraction of about 8% without excess indium droplets on the surface.

In other methods, the TMIn flow, ammonia flow and temperature was adjusted slightly (TMIn up to 500 sccm, ammonia flow in 150-250 sccm and temperature of greater than 745° C.) to achieve a relaxed InGaN layer having an InN mole fraction of up to 12-13%.

Example 8

InGaN Surface Morphology Grown on Different Surfaces and Under Different Growth Conditions The morphology of surfaces of thick InGaN layers grown on different surfaces and under different growth conditions are compared in FIGS. 32A-32D.

FIG. 32A shows a SEM plan-view of an about 430 nm-thick, InGaN layer having an InN mole fraction of about 10% grown directly on a planar (0001) oriented GaN/sapphire template using MOCVD under conventional (N-rich) conditions. The surface shows trench defects and large pits (up to about 300 nm in diameter) formed at threading dislocations and has a non-uniform InN mole percent.

FIG. 32B shows a SEM plan-view of an about 2.3 μm-thick InGaN layer having an InN mole fraction of about 10% grown on a planar (0001) oriented GaN/sapphire decorated with slip regions using MOCVD under conventional (N-rich) conditions. The surface is rough.

FIG. 32C shows a SEM plan view of an about 1.1 μm-thick InGaN layer having an InN mole fraction of about 10% grown directly on a planar (0001) oriented GaN/sapphire template under MR MOCVD conditions. The surface exhibits areas of relaxed and In-containing III-nitride (pseudomorphic) InGaN.

FIG. 32D shows a SEM plan-view of an about 2.25 μm-thick, InGaN layer having an InN mole fraction of about 10% grown on a planar (0001) oriented GaN/sapphire decorated with slip regions using MR MOCVD growth conditions. The surface relaxed, substantially pit-free and has a uniform InN mole fraction across the surface area.

The XRD RSM diffraction images of the InGaN surfaces grown under MR MOCVD conditions directly on a GaN/sapphire template (FIG. 33A) and on a dielectric decorated GaN/sapphire template (FIG. 33B).

Bright field transmission electron microscopy (TEM) images of a cross-section of a InGaN layer grown directly on a planar GaN template under MR MOCVD growth conditions directly on a GaN/sapphire template (FIG. 34A) and on a GaN/sapphire template decorated with a slip region (FIG. 34B). Note that the structure shown in FIG. 34B shows a MQW structure grown over the relaxed InGaN layer. Because the MQW structure is not well-formed the MQW surface is rougher than the surface of the underlying relaxed InGaN layer.

Example 9

MR MOCVD Growth of Relaxed InGaN on Slip Regions

A relaxed InGaN growth was carried out essentially similar to that of Example 3. In this example, the growth was carried out across the full face of a 50 mm diameter GaN/sapphire template and the relaxed InGaN layer was then characterized at (5) different locations across the wafer (FIG. 39A).

The morphology across the surface of the full 50-mm diameter epi-wafer was glass smooth.

XRD RSM (FIGS. 39A-39C) at three different locations show an about 2 μm-thick, relaxed InGaN layer with an InN mole fraction of about 9%. ω-2θ XRD scans at each position are shown in FIGS. 39F-39H and clearly demonstrate that the diffraction peak associated with the crystalline relaxed InGaN layer is distinct from the diffraction peak associated with the GaN layer (solid curve is measured; dotted curve is simulated).

Energy-dispersive X-ray (EDX) spectroscopy was performed at each of the five positions and the average values of the InN mole fraction across the wafer is shown in Table 11.

TABLE 11

InN Mole Fraction.

| Region | InN Mole Fraction |
|---|---|
| pt0 | 9.3% |
| pt1 | 9.9% |
| pt2 | 9.6% |
| pt3 | 8.6% |
| pt4 | 8.6% |

The surface of the epi-wafer at each position is characterized by smooth, substantially pit-free morphology.

Finally, it should be noted that there are alternative ways of implementing the embodiments disclosed herein. Accordingly, the present embodiments are to be considered as illustrative and not restrictive, and the claims are not to be limited to the details given herein but may be modified within the scope and equivalents thereof.

What is claimed is:

1. A vertical-cavity surface-emitting laser (VCSEL) device, wherein the VCSEL device comprises:
- a III-nitride layer;
- a first distributed Bragg reflector (DBR) stack overlying the III-nitride layer;
- a relaxed In-containing III-nitride layer comprising a relaxed In-containing III-nitride surface, wherein the relaxed In-containing III-nitride layer underlies or overlies the first DBR stack;
- an active region overlying the relaxed In-containing III-nitride layer; and
- a second DBR stack overlying the active region;

wherein,
- the active region comprises at least one In-containing III-nitride quantum well;
- the active region is lattice matched to the relaxed In-containing III-nitride layer;
- the relaxed In-containing III-nitride layer has an InN mole fraction greater than 0; and
- the relaxed In-containing III-nitride layer has a single-phase gallium-polar (0001) orientation and a substantially relaxed in-plane a-lattice parameter.

2. The VCSEL device of claim 1, wherein the III-nitride layer comprises $In_xAl_yGa_{1-x-y}N$ wherein $0 \leq x \leq 1$, $0 \leq y \leq 1$, and $x+y \leq 1$.

3. The VCSEL device of claim 1, wherein the relaxed In-containing III-nitride layer comprises $In_xAl_yGa_{1-x-y}N$, wherein $0 < x \leq 0.4$ and $0 \leq y \leq 1$.

4. The VCSEL device of claim 1, wherein the relaxed In-containing III-nitride layer has a thickness greater than 100 nm.

5. The VCSEL device of claim 1, wherein the relaxed In-containing III-nitride layer has an in-plane a-lattice parameter greater than 3.20 Å.

6. The VCSEL device of claim 1, wherein the relaxed In-containing III-nitride layer comprises an In-containing III-nitride material and has a substantially relaxed in-plane a-lattice parameter that is within ±0.5% that of a fully relaxed in-plane a-lattice parameter of the In-containing III-nitride material.

7. The VCSEL device of claim 1, wherein the relaxed In-containing III-nitride surface is characterized by a root-mean-square surface roughness less than 1 nm over a 1×1 $\mu m^2$ area.

8. The VCSEL device of claim 1, wherein the relaxed In-containing III-nitride surface is characterized by a pit density less than $1 \times 10^9$ $cm^{-2}$, as determined by atomic force microscopy or electron microscopy.

9. The VCSEL device of claim 1, wherein
- the VCSEL device comprises a first cladding layer underlying the active region and a second cladding layer overlying the active region;
- the first cladding layer comprises a first dopant; and
- the second cladding layer comprises a second dopant of opposite conductivity type to the first dopant.

10. The VCSEL device of claim 9, comprising a first electrode and a second electrode, wherein,
- the first electrode is electrically connected to the first cladding layer; and
- the second electrode is electrically connected to the second cladding layer.

11. The VCSEL device of claim 1, wherein the VCSEL device is configured to emit electromagnetic radiation with a dominant wavelength between 525 nm and 550 nm.

12. The VCSEL device of claim 1, wherein the VCSEL device is configured to emit electromagnetic radiation with a dominant wavelength between 600 nm and 640 nm.

13. A wafer comprising the VCSEL device of claim 1.

14. A system comprising the VCSEL device of claim 1.

* * * * *